US008625344B2

(12) United States Patent
Lee et al.

(10) Patent No.: US 8,625,344 B2
(45) Date of Patent: Jan. 7, 2014

(54) MEMORY SYSTEM AND METHOD OF ACCESSING A SEMICONDUCTOR MEMORY DEVICE

(75) Inventors: Jaesoo Lee, Hwaseong-si (KR); Kangho Roh, Seoul (KR); Wonhee Cho, Anyang-si (KR); Hojun Shim, Seoul (KR); Youngjoon Choi, Seongnam-si (KR); Jaehoon Heo, Gunpo-si (KR); Je-Hyuck Song, Seoul (KR); Seung-Duk Cho, Seoul (KR); Seontaek Kim, Suwon-si (KR); Moonwook Oh, Seoul (KR); Jong Tae Park, Hwaseong-si (KR); Wonmoon Cheon, Hwaseong-si (KR); Chanik Park, Hwaseong-si (KR); Yang-sup Lee, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 150 days.

(21) Appl. No.: 13/137,425

(22) Filed: Aug. 15, 2011

(65) Prior Publication Data
US 2011/0302476 A1 Dec. 8, 2011

Related U.S. Application Data

(62) Division of application No. 12/457,485, filed on Jun. 12, 2009, now Pat. No. 8,027,194.
(60) Provisional application No. 61/061,335, filed on Jun. 13, 2008, provisional application No. 61/129,241, filed on Jun. 13, 2008, provisional application No. 61/129,242, filed on Jun. 13, 2008, provisional application No. 61/129,249, filed on Jun. 13, 2008, provisional application No. 61/129,248, filed on Jun. 13, 2008, provisional application No. 61/073,632, filed on Jun. 18, 2008, provisional application No. 61/129,600, filed on Jul. 8, 2008.

(30) Foreign Application Priority Data

| Jun. 13, 2008 | (KR) | 10-2008-0055637 |
|---|---|---|
| Jun. 13, 2008 | (KR) | 10-2008-0055639 |
| Jun. 13, 2008 | (KR) | 10-2008-0055641 |
| Jun. 13, 2008 | (KR) | 10-2008-0055642 |
| Jun. 13, 2008 | (KR) | 10-2008-0055643 |
| Jun. 17, 2008 | (KR) | 10-2008-0056871 |
| Jun. 26, 2008 | (KR) | 10-2008-0061001 |

(51) Int. Cl.
*G11C 16/04* (2006.01)
(52) U.S. Cl.
USPC ............. 365/185.03; 365/185.09; 365/185.11
(58) Field of Classification Search
USPC .......................... 365/185.03, 185.09, 185.11
See application file for complete search history.

(56) References Cited

U.S. PATENT DOCUMENTS

| 5,530,828 A | 6/1996 | Kaki et al. |
|---|---|---|
| 5,537,358 A | 7/1996 | Fong |

(Continued)

FOREIGN PATENT DOCUMENTS

| CN | 101197189 | 6/2008 |
|---|---|---|
| JP | 05-181779 | 7/1993 |

(Continued)

OTHER PUBLICATIONS

Office Action for corresponding U.S. Appl. No. 13/137,401 dated Feb. 13, 2013.

(Continued)

*Primary Examiner* — Pho M Luu
(74) *Attorney, Agent, or Firm* — Harness, Dickey & Pierce, P.L.C.

(57) ABSTRACT

A memory system is provided with a processor, a main memory, and a flash memory. Performance of the memory system is improved through achievement of speed-up and high data reliability. The memory system includes a nonvolatile memory device and a controller configured to drive a control program to control the nonvolatile memory device. The control program executes a second access operation for the nonvolatile memory device even before a first access operation to the nonvolatile memory device is completed.

15 Claims, 91 Drawing Sheets

(56) References Cited

U.S. PATENT DOCUMENTS

| | | |
|---|---|---|
| 6,198,663 B1 | 3/2001 | Takizawa |
| 6,209,078 B1 * | 3/2001 | Chiang et al. ............... 712/36 |
| 6,335,878 B1 | 1/2002 | Yamada et al. |
| 6,636,937 B2 | 10/2003 | Peter |
| 6,725,342 B1 | 4/2004 | Coulson |
| 6,728,133 B2 | 4/2004 | Shimizu |
| 6,788,572 B2 | 9/2004 | Yamada et al. |
| 6,810,495 B2 | 10/2004 | Castelli et al. |
| 6,831,872 B2 | 12/2004 | Matsuoka |
| 6,877,118 B2 | 4/2005 | Oshima et al. |
| 7,032,103 B2 * | 4/2006 | Eslick et al. ............... 712/226 |
| 7,073,029 B2 | 7/2006 | Uysal et al. |
| 7,193,896 B2 | 3/2007 | Shiga |
| 7,277,355 B2 | 10/2007 | Tanzawa |
| 7,405,988 B2 | 7/2008 | Tran et al. |
| 7,529,905 B2 | 5/2009 | Sinclair |
| 7,594,157 B2 | 9/2009 | Choi et al. |
| 7,596,022 B2 | 9/2009 | Chae et al. |
| 7,672,162 B2 | 3/2010 | Hwang |
| 7,755,950 B2 | 7/2010 | Yu et al. |
| 7,765,367 B2 * | 7/2010 | Sung et al. ............... 711/154 |
| 7,831,846 B2 * | 11/2010 | Ishidera et al. ............... 713/300 |
| 7,843,732 B2 | 11/2010 | Lee et al. |
| 7,970,981 B2 | 6/2011 | Cheon et al. |
| 8,027,194 B2 * | 9/2011 | Lee et al. ............... 365/185.03 |
| 8,332,573 B2 | 12/2012 | Jeong et al. |
| 2005/0144516 A1 | 6/2005 | Gonzalez et al. |
| 2005/0166087 A1 | 7/2005 | Gorobets |
| 2007/0035997 A1 | 2/2007 | Shibata et al. |
| 2007/0036016 A1 | 2/2007 | Takeuchi et al. |
| 2008/0013371 A1 | 1/2008 | Shiga |
| 2008/0068883 A1 | 3/2008 | Kang et al. |
| 2008/0094893 A1 | 4/2008 | Choi |
| 2011/0307646 A1 | 12/2011 | Lee et al. |

FOREIGN PATENT DOCUMENTS

| | | |
|---|---|---|
| JP | 08-279295 | 10/1996 |
| JP | 08-339693 | 12/1996 |
| JP | 10-154101 | 6/1998 |
| JP | 2001-319493 | 11/2001 |
| JP | 2002-108716 | 4/2002 |
| JP | 2002-278828 | 9/2002 |
| JP | 2004-185745 | 7/2004 |
| JP | 2006-039877 | 2/2006 |
| JP | 2006-196078 | 7/2006 |
| JP | 2006-294126 | 10/2006 |
| JP | 2007-048410 | 2/2007 |
| JP | 2007-257109 | 10/2007 |
| JP | 2008-010046 | 1/2008 |
| KR | 10-2001-0037694 | 4/2001 |
| KR | 10-0303217 | 7/2001 |
| KR | 10-2001-0100939 | 11/2001 |
| KR | 10-2004-0048870 | 6/2004 |
| KR | 10-2005-0027233 | 3/2005 |
| KR | 10-2005-0064887 | 6/2005 |
| KR | 10-2005-0091230 | 9/2005 |
| KR | 10-2006-0091358 | 8/2006 |
| KR | 10-2006-0124755 | 12/2006 |
| KR | 10-2007-0008403 | 1/2007 |
| KR | 10-2007-0019575 | 2/2007 |
| KR | 10-2007-0031647 | 3/2007 |
| KR | 10-0771521 | 10/2007 |
| KR | 10-0799688 | 1/2008 |
| KR | 10-0806343 | 2/2008 |
| WO | WO 97/31318 | 8/1997 |
| WO | WO 2006/026645 | 3/2006 |

OTHER PUBLICATIONS

Office Action for corresponding U.S. Appl. No. 13/137,409 dated Apr. 29, 2013.
Office Action for corresponding U.S. Appl. No. 13/137,422 dated Mar. 12, 2013.

* cited by examiner

Fig. 17

PPN    LB 201

| 0 | Page 2 |
| 1 | Page 0 |
| 2 |        |
| 3 |        |

PPN

| 0 | Page 0 |
| 1 | Page 1 |
| 2 | ~~Page 2~~ |
| 3 | Page 3 |

DB 104

(a)

Page Mapping Table

| Page 2<br>of DB 104 | PPN 0<br>of LB 201 |
|---|---|
| Page 4<br>of DB 104 | PPN 1<br>of LB 201 |

(b)

3031 : Write Operation
3032 : Copy Operation
3033 : Read Operation
3034 : ETC

Fig. 73B

| | Even | Odd | Even | Odd |
|---|---|---|---|---|
| WL31 | 252 254 / 244 246 | 253 255 / 245 247 | 252 254 / 244 246 | 253 255 / 245 247 |
| WL30 | 248 250 / 236 238 | 249 251 / 237 239 | 248 250 / 236 238 | 249 251 / 237 239 |
| WL29 | 240 242 / 228 230 | 241 243 / 229 231 | 240 242 / 228 230 | 241 243 / 229 231 |
| WL28 | 232 234 / 220 222 | 233 235 / 221 223 | 232 234 / 220 222 | 233 235 / 221 223 |
| ⋮ | ⋮ | ⋮ | ⋮ | ⋮ |
| WL2 | 24 26 / 12 14 | 25 27 / 13 15 | 24 26 / 12 14 | 25 27 / 13 15 |
| WL1 | 16 18 / 4 6 | 17 19 / 5 7 | 16 18 / 4 6 | 17 19 / 5 7 |
| WL0 | 8 10 / 0 2 | 9 11 / 1 3 | 8 10 / 0 2 | 9 11 / 1 3 |

| M1 | M2 |
|---|---|
| L1 | L2 |

MEMORY SYSTEM AND METHOD OF ACCESSING A SEMICONDUCTOR MEMORY DEVICE

CROSS-REFERENCE TO RELATED APPLICATIONS

This application is a divisional of U.S. application Ser. No. 12/457,485 filed Jun. 12, 2009 now U.S. Pat. No. 8,027,194, which (1) claims priority under 35 U.S.C. §119 of Korean Patent Application Nos. 10-2008-55637 filed on Jun. 13, 2008, 10-2008-55641 filed on Jun. 13, 2008, 10-2008-55639 filed on Jun. 13, 2008, 10-2008-55642 filed on Jun. 13, 2008, 10-2008-55643 filed on Jun. 13, 2008, 10-2008-56871 filed on Jun. 17, 2008 and 10-2008-61001 filed on Jun. 26, 2008, and (2) also claims priority under 35 U.S.C. §119 of U.S. Provisional Application Nos. 61/061,335 filed on Jun. 13, 2008, 61/129,241 filed on Jun. 13, 2008, 61/129,242 filed on Jun. 13, 2008, 61/129,249 filed on Jun. 13, 2008, 61/129,248 filed on Jun. 13, 2008, 61/073,632 filed on Jun. 18, 2008 and 61/129,600 filed on Jul. 8, 2008; the entire contents of all of the above are hereby incorporated by reference.

BACKGROUND

1. Technical Field

The present invention disclosed herein relates to a semiconductor memory device, and more particularly, to a memory system and a method of accessing a semiconductor memory device.

2. Description of Related Art

A semiconductor memory device is a storage device that can store data and read the stored data when required. Semiconductor memory devices may be mainly classified into volatile memory devices and nonvolatile memory devices.

Volatile memory devices loose stored data when power supply is interrupted. In contrast, nonvolatile memory devices retain stored data even if power supply is interrupted. Examples of nonvolatile memory devices are a read only memory (ROM), a programmable ROM (PROM), an erasable PROM (EPROM), an electrically erasable PROM (EEPROM), a flash memory device, a phase change random access memory (PRAM), a magnetic RAM (MRAM), a resistance RAM (RRAM), a ferroelectric RAM (FRAM), and so forth.

SUMMARY

The present invention provides a nonvolatile memory system that can respond in real time. The present invention further provides a method of accessing a nonvolatile memory device.

The present invention also provides a nonvolatile memory system providing a multithreading function, and an associated method of accessing a nonvolatile memory device.

Embodiments of the present invention provide memory systems including: a nonvolatile memory device; and a controller driving a control program that controls the nonvolatile memory device, wherein the control program executes a second access operation to the nonvolatile memory device even before a first access operation to the nonvolatile memory device is completed.

In some embodiments, the control program generates a response signal indicating the completion of the first access operation when a time assigned to the first access operation is over before the first access operation is completed.

In other embodiments, the control program stores progression degree of the first access operation when the first access operation is suspended.

In still other embodiments, the control program suspends the first access operation when a time assigned to the first access operation is over before the first access operation is completed. The control program resumes the suspended first access operation when an idle time occurs.

In even other embodiments, the control program executes the second access operation when a request for the second access operation is transferred after the first access operation is suspended. When the second access operation is completed before a time assigned to the second access operation is over, the control program resumes the first access operation until the time assigned to the second access operation is over.

In yet other embodiments, the control program resumes the first access operation until a request for the second access operation is transferred after the first access operation is suspended.

In further embodiments, the first access operation is a first write operation, and the second access operation is a second write operation or read operation. The control program executes the read operation when a request for the read operation is transferred after the first write operation is suspended. The control program executes the second write operation to a buffer when a request for the second write operation is transferred after the first write operation is suspended. The control program writes data written to the write buffer to the nonvolatile memory device when an idle time occurs.

In still further embodiments, the nonvolatile memory device and the controller are integrated into one semiconductor device.

In even further embodiments, the nonvolatile memory device and the controller form a semiconductor disk device.

In yet further embodiments, the nonvolatile memory device is a flash memory device, and the control program is a flash translation layer.

In other embodiments, the control program is firmware stored in the controller nonvolatilely.

In still other embodiments, the control program is configured with a logic circuit.

In even other embodiments of the present invention, methods of accessing a nonvolatile memory device include: executing a first access operation according to a request for a first access operation; suspending the first access operation when a time assigned to the first access operation is over although the first access operation is not completed; and resuming the suspended first access operation when an idle time occurs.

In yet other embodiments, the resuming of the first access operation is executed until a request for a second access operation is transferred.

In further embodiments, the resuming of the first access operation is performed until a time assigned to the second access operation is over, when the second access operation according to a request for the second access operation is completed before the time assigned to the second access operation is over.

In still further embodiments of the present invention, memory systems include: a nonvolatile memory device; and a controller driving a control program that controls the nonvolatile memory device. Herein, when a time assigned to a first access operation to the nonvolatile memory device is over, the control program transmits a response signal indicating the completion of the first access operation to a host even before the first access operation is completed.

In even further embodiments, when the time assigned to the first access operation is over, the control program suspends the first access operation and executes a second access operation.

In yet further embodiments, the control program resumes the suspended first access operation when an idle time occurs.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 17(a) and FIG. 17(b) illustrate a page mapping relationship between a data block and a log block of FIG. 16.

FIGS. 73A and 73B are diagrams for illustrating a programming sequence when 4 bits are stored in a memory cell.

DETAILED DESCRIPTION OF THE EMBODIMENTS

Figure 1:
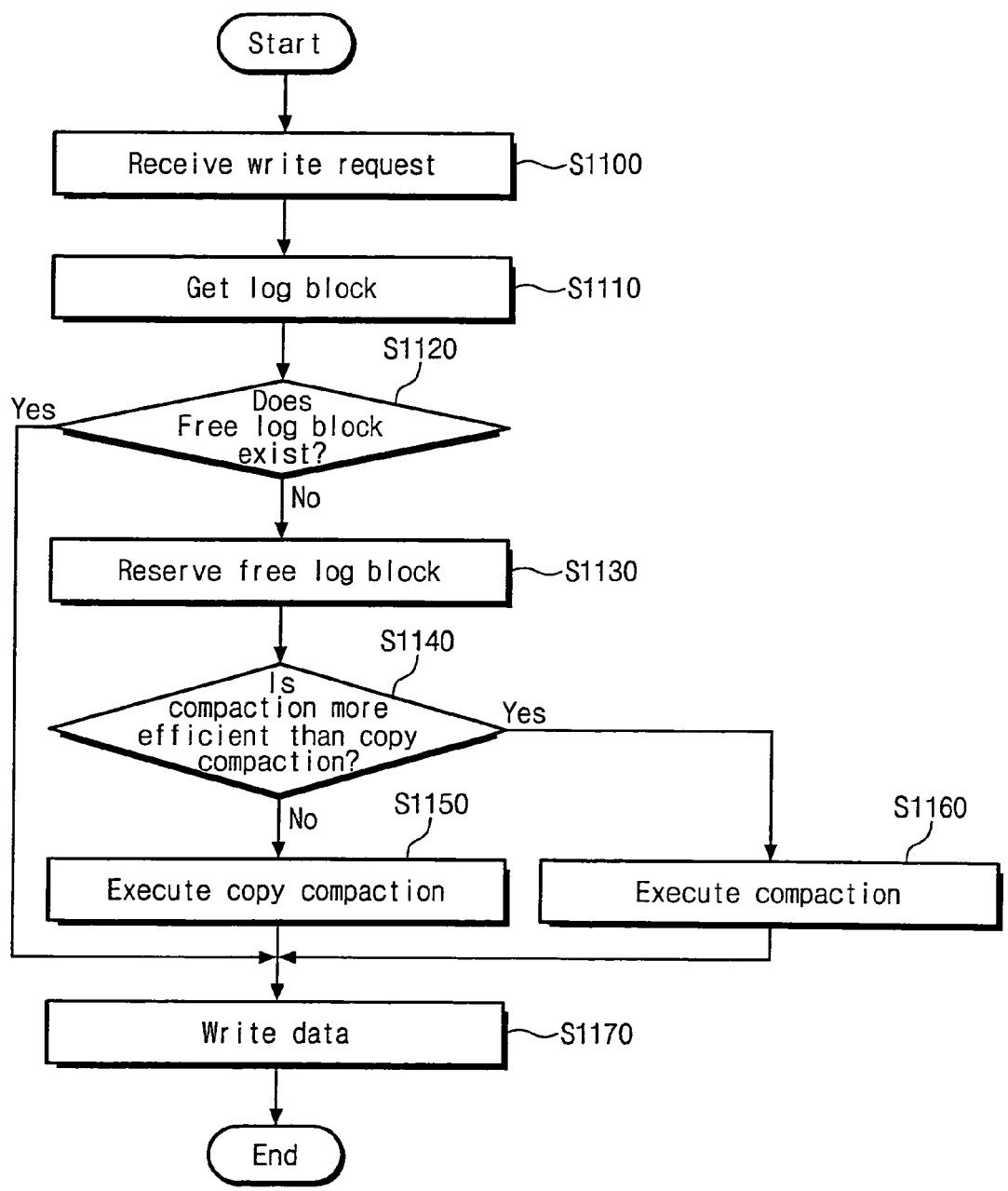
FIG. 1 is a flowchart illustrating operation of a general flash memory system.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A flash memory system includes hardware such as a processor, a main memory, and a flash memory. The flash memory system may further include a temperature sensor, an accelerator, and an ECC circuit to enhance its performance. These components will be described below in detail. Moreover, the flash memory system includes software such as a user application, an operating system (O/S), file system and a flash translation layer (FTL).

A flash memory system according to embodiments of the present invention may achieve speed-up or ensured data reliability by means of the above-mentioned hardware or software. In the meantime, a typical flash memory system may suffer from degraded data reliability while increasing its operating speed or suffer from decreased operating speed while ensuring data reliability.

Various embodiments for speed-up of a flash memory system will now be described below in detail with reference to accompanying drawings. And various embodiments for data reliability of the flash memory system will now be described below in detail with reference to accompanying drawings. The flash memory system according to embodiments of the present invention may improve a performance through achievement of speed-up and high data reliability.

I. Speed Up of Flash Memory System

Embodiment 1

Flash Memory System Performing Multi-Thread Function

A flash memory device has erase-before-write characteristics. That is, to store data in the flash memory device, a corresponding storage space should be erased in advance. In the flash memory device, a unit of a write operation differs from that of an erase operation. The unit of the write operation is a page, whereas the unit of the erase operation is a block in the flash memory device. The number of erasing times of the flash memory device is restricted to about a hundred thousand. Because of such a characteristic of the flash memory device, additional operations besides the write operation are executed during the write operation of the flash memory device. For example, a garbage collection and a wear leveling operation may be additionally performed during the write operation of the flash memory device.

As described above, the number of erasing times is restricted to a hundred thousand. Therefore, although an erase request for data is transferred from a host, the data are not erased but set to invalid data. Write data transferred from the host are written to a free block where data are not stored. That is, a write or overwrite operation to the flash memory device uses a free block of the flash memory device.

When a write or update operation on the flash memory device is repeated, most of free blocks of the flash memory device may be used. When a write request is transferred in the case where the number of available free blocks is smaller than a preset number, a flash memory system executes a garbage collection. The garbage collection includes a merge, a compaction and a garbage block get. The garbage collection copies valid data of a log block (also, this is called a physical block) storing valid and invalid data to a free block, and sets the valid data of the log block to invalid data. Afterwards, the log block where the invalid data are stored is erased, and thus set to a free block. That is, when the garbage collection is executed, the number of free blocks to which data can be written is increased.

A wear leveling operation prevents the number of erasing times of a specific log block of the flash memory device from being increased more than a reference value. That is, the wear leveling operation prevents a specific log block of the flash memory device from being rapidly deteriorated in comparison with other log blocks. The wear leveling operation sets a log block, of which the number of erasing times is the least of log blocks where invalid data are stored, to a free block.

That is, when a write quest is transferred from a host, the garbage collection and a wear leveling operation as well as the write operation may be executed in the flash memory device. In this case, a response time that the flash memory device responds to the write request from the host may be delayed. That is, the flash memory device may not respond to the request of the host in real time.

The garbage collection and the wear leveling operation may be executed as a background operation when the flash memory device is in an idle state. When an access request is transferred from the host while the garbage collection and the wear leveling operation are executed as a background operation, a response time that the flash memory device responds to the access request from the host may be delayed. That is, the flash memory device may not respond in real time to the request of the host.

FIG. 1 is a flowchart illustrating operation of a general flash memory system. Referring to FIG. 1, in operation S1100, a flash memory system receives a write request. The write request is transferred to the flash memory system from a host.

In operation S1110, the flash memory system detects a log block to write data. That is, a free block of log blocks of the flash memory system is detected.

In operation S1120, if the free block exists among the log blocks of the flash memory system, data are written to the free block in operation S1170. If, however, the free block does not exist among the log blocks of the flash memory system, operation S1130 is executed. For convenience in description, it is illustrated that operation S1130 or operation S1170 is executed according to whether a free block exists among log blocks of the flash memory system. However, it can be understood that operation S1130 or operation S1170 may also be selectively executed when the number of free blocks of the flash memory system is smaller than a preset number.

In operation S1130, the flash memory system executes operation of acquiring a free block. Exemplarily, the flash memory system may execute a garbage collection to acquire a free block. Also, the flash memory system may execute a wear leveling operation to control the number of erasing times of log blocks. For convenience in description, it is illustrated that the flash memory system executes a compaction operation of garbage collection operations. However, the garbage collection executed by the flash memory system is not limited to the compaction operation. It can be understood that the flash memory system can acquire a free block through one of merge, compaction and garbage block get operations, or another garbage collection.

In operation S1140, the flash memory system determines which one is efficient between a copy compaction and a compaction. When it is determined that the copy compaction is more efficient than the compaction, the copy compaction is executed in operation S1150. On the contrary, when it is determined that the compaction is more efficient than the copy compaction, the compaction is executed in operation S1160. It is illustrated that the flash memory system executes either of the copy compaction and the compaction. However, it can be understood that the flash memory system may execute another garbage collection besides the copy compaction or the compaction.

In operation S1150, the copy compaction is executed. It is assumed that a first log block is configured with pages storing invalid and valid data, and a second log block is configured with pages storing valid data and free pages where data are not stored. The flash memory system copies the valid data of the first log block to the free pages of the second log block. The flash memory system erases the first log block to acquire the free block.

In operation S1160, the compaction is executed. It is assumed that the first and second log blocks store invalid data and valid data, respectively, and a third log block is a free block. The flash memory system copies the valid data of the first and second log blocks to the third log block. The flash memory system erases the first and second log blocks to acquire a free block.

In operation S1170, the flash memory system writes data to the free block.

As described above, if the garbage collection is executed when a write request is transferred from the host, a response time that the flash memory system responds to the request of the host is delayed. If the garbage collection and the wear leveling operation are simultaneously executed, the time that the flash memory system responds to the request of the host may be further delayed. Also, even when the garbage collection and the wear leveling operation are executed as a background operation, the time that the flash memory system responds to the request of the host may be delayed.

Figure 2:
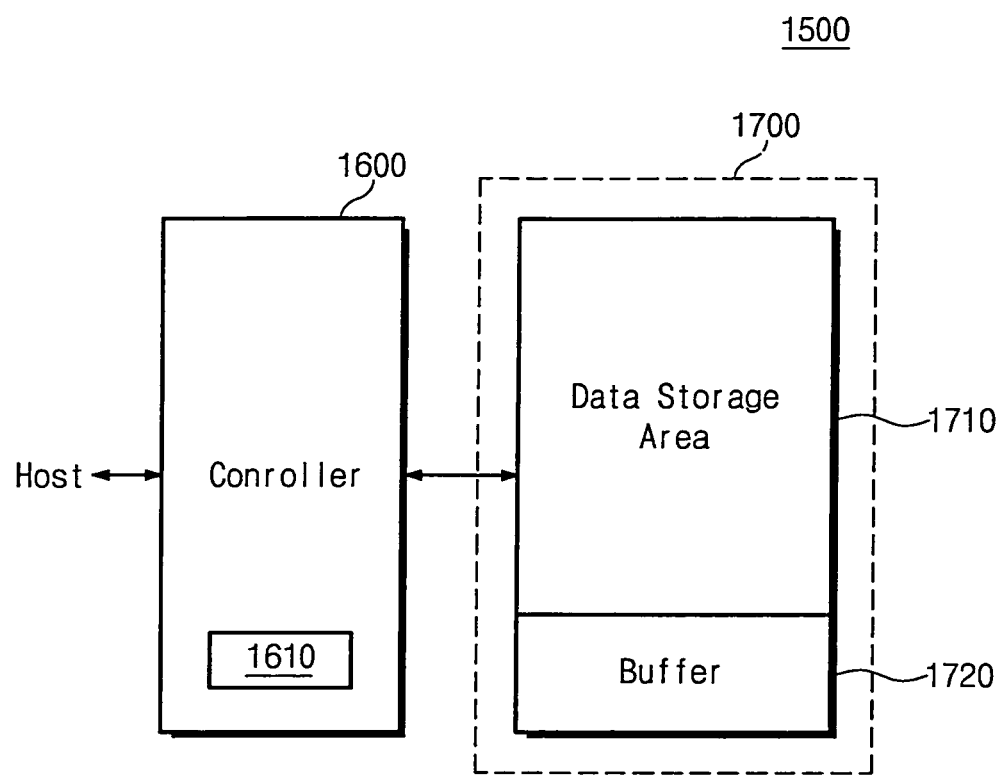
FIG. 2 is a block diagram illustrating a memory system according to an embodiment of the present invention.

FIG. 2 is a block diagram illustrating a memory system 1500 according to an embodiment of the present invention. Referring to FIG. 2, the memory system 1500 according to the embodiment of the present invention includes a controller 1600 and a nonvolatile memory device 1700.

The controller 1600 is connected to a host and the nonvolatile memory device 1700. The controller 1600 transfers data read from the nonvolatile memory device 1700 to the host, or stores data transferred from the host to the nonvolatile memory device 1700.

The controller 1600 may include a RAM, a processing unit, a host interface, and a memory interface. The RAM may be used as an operational memory of the processing unit. The processing unit may control an overall operation of the controller 1600. The host interface may include a protocol exchanging data between the host and the controller 1600. For instance, the controller 1600 may be configured such that it communicates with the exterior (host) through one of various interface protocols such as USB, MMC, PCI-E, advanced technology attachment (ATA), serial-ATA, SCSI, ESDI, and integrated drive electronics (IDE). The memory interface may interface with the nonvolatile memory device 1700. The controller 1600 may further include an error correction block. The error correction block may detect an error of data read from the nonvolatile memory 1700, and then correct the error.

The controller 1600 and the nonvolatile memory device 1700 may be integrated into one semiconductor device. Exemplarily, the controller 1600 and the nonvolatile memory device 1700 are integrated into one semiconductor device, thereby forming a memory card. Alternatively, the controller 1600 and the nonvolatile memory device 1700 are integrated one semiconductor device, thereby forming a semiconductor disk/drive (SSD, solid state disk/drive). When the memory system 1500 is used as the SSD, an operation speed of the host connected to the memory system 1500 may be significantly improved.

The nonvolatile memory device 1700 includes a data storage area 1710 and a buffer 1720. The data storage area 1710 is a storage space for storing user data. The buffer 1720 is a storage space for temporarily storing data to be written to the data storage area 1710. The buffer 1720 according to the embodiment of the present invention may have the same configuration as the data storage area 1710. Exemplarily, the memory cell array of the nonvolatile memory device 1700 is divided into two areas, of which one may be used as the data storage area 1710 and the other one may be used as the buffer 1720.

The controller 1600 may drive a control program 1610 to control the nonvolatile memory device 1700. The control program 1610 may control read, write, and erase operations of the nonvolatile memory device.

An access operation according to an access request from a host has an assigned time. Exemplarily, a write operation of 4 KB data may have an assigned time of 30 ms. If the memory system 1500 does not complete the access operation within the assigned time after the access request is transferred from the host, a time-out may occur. The memory system 1500 according to an embodiment of the present invention, however, prevents the occurrence of the time-out.

Figure 3:
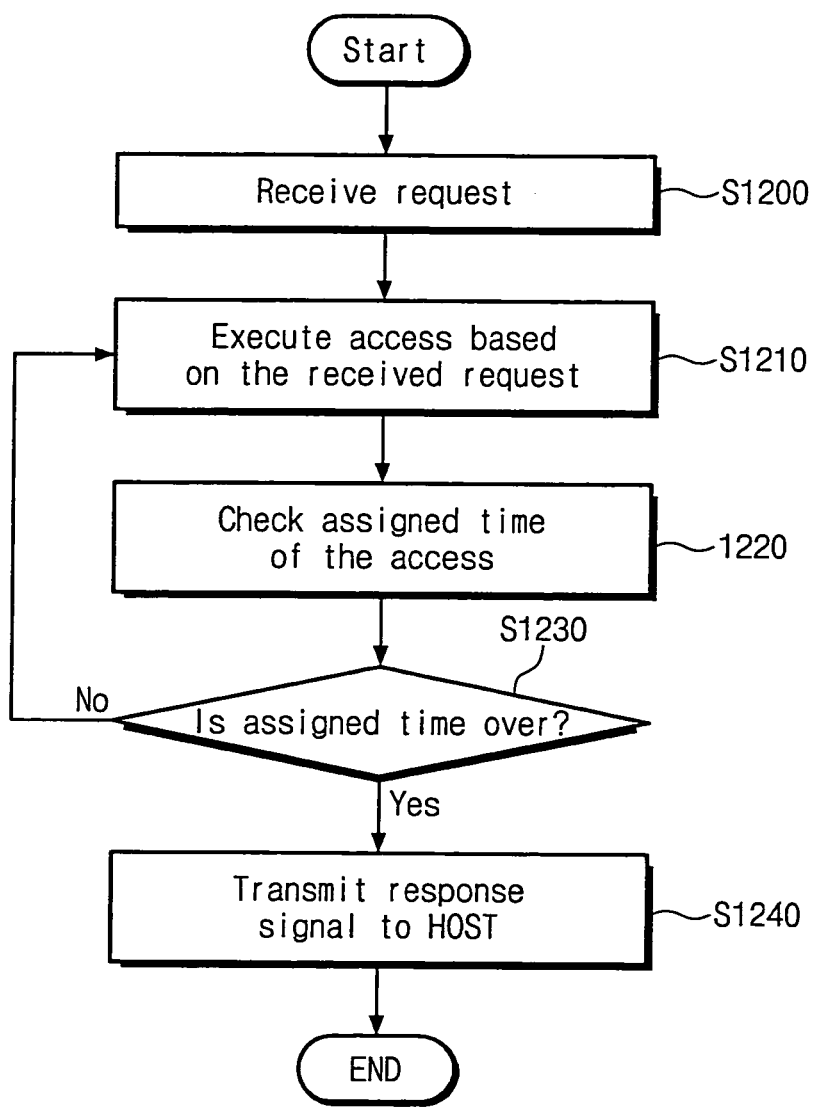
FIG. 3 is a flowchart illustrating operation of a memory system according to an embodiment of the present invention.

FIG. 3 is a flowchart illustrating operation of the memory system 1500 according to an embodiment of the present invention. Referring to FIGS. 2 and 3, in operation S1200, the memory system 1500 receives an access request from the host. In operation S1210, the memory system 1500 executes an access operation based on the access request received from the host. Exemplarily, the control program 1610 may execute write, read or erase operation based on the received access request.

In operation S1220, the control program 1610 checks whether a time assigned to the access operation is over. In operation S1230, if the time assigned to the access operation does not elapse, the access operation is continually executed in operation S1210. When the time assigned to the access operation is over, the control program 1610 transmits a response signal indicating that the access operation is completed in operation S1240.

That is, the memory system 1500 according to the embodiment of the present invention transmits the response signal indicating the completion of the access operation to the host when the time assigned to the access operation is over. The control program 1610 suspends the access operation, and receives a new access request. The suspended access operation is resumed when an idle time occurs. Exemplarily, the control program 1610 processes the access request received from the host using a multithreading technique. The control program 1610 may be stored as a firmware in a ROM or a nonvolatile memory device. Alternatively, the control program 1610 may be configured with a logic circuit.

Figure 4:
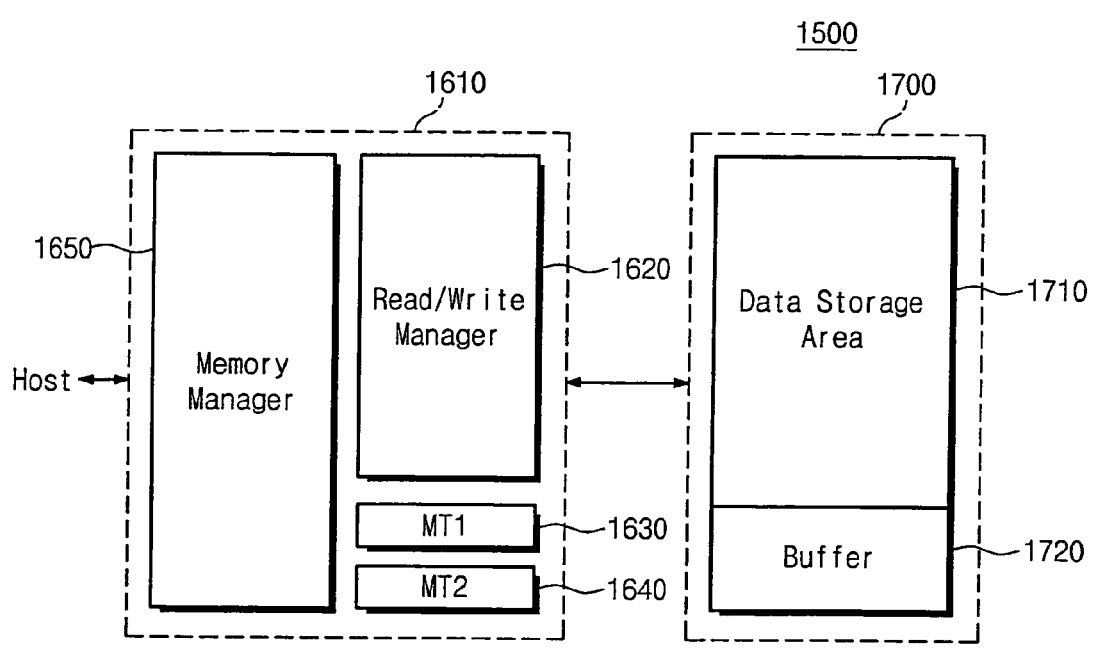
FIG. 4 is a block diagram illustrating a control program of the memory system of FIG. 2.

FIG. 4 is a block diagram illustrating the control program 1610 of the memory system 1500 of FIG. 2. The control program 1610 for controlling the nonvolatile memory device 1700 is driven in the controller (see 1600 of FIG. 2). The control program 1610 includes a read/write manager 1620, a first mapping table 1630, a second mapping table 1640, and a memory manager 1650.

The read/write manager 1620 controls a read operation and a write operation on the nonvolatile memory device 1700 using the first and second mapping tables 1630 and 1640. The first mapping table 1630 is used to access the data storage area 1710 of the nonvolatile memory device 1700. The second mapping table 1640 is used to access the buffer 1720 of the nonvolatile memory device 1700. The first and second mapping tables 1630 and 1640 are used to convert a logical address (LA) transferred from the host to a physical address (PA).

The memory manager 1650 controls an access to the nonvolatile memory device and overall communication with the host. Even though the first access operation according to the first access request from the host is not completed, the memory manager 1650 executes a second access operation according to a second access request from the host. That is, the memory manager 1650 provides a real-time responsivity to the memory system 1500.

Taking a flash memory system as an example, an embodiment of the present invention will be described in detail below. However, the embodiment of the present invention is not limited to the flash memory system. For instance, it can be understood that the technical idea of the present invention is also applicable to a memory system including a nonvolatile memory device such as a PRAM, an RRAM, an MRAM, and FRAM, an EEPROM, etc.

A cell array of the flash memory device 1700 is divided into the data storage area 1710 and the buffer 1720. The buffer 1720 has an access speed faster than the data storage area 1710. Exemplarily, the operation speed of the data storage area 1710 and the operation speed of the buffer 1720 may be controlled by differently setting the mapping tables 1630 and 1640 used for the data storage area 1710 and the buffer 1720.

Figure 5:
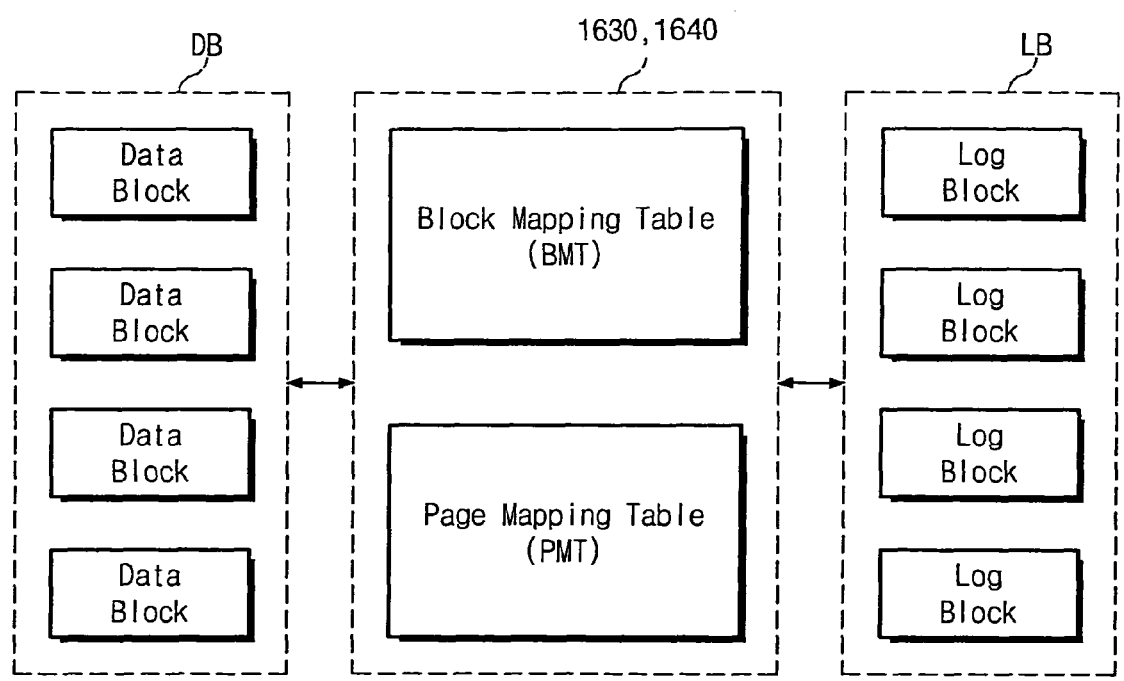
FIG. 5 is a block diagram illustrating operation of mapping tables according to an embodiment of the present invention.

FIG. 5 is a block diagram illustrating operation of the mapping tables 1630 and 1640 according to an embodiment of the present invention. Referring to FIGS. 4 and 5, the mapping tables 1630 and 1640 are used to map data blocks (DB) accessed by the host and log blocks (LB) accessed by the control program 1610. The data blocks (DB) are accessed by a logical address, and the log blocks LB are accessed by a physical address.

The data blocks (DB) form one or more data block groups. Each of the data block groups includes a desired (or, alternatively a predetermined) number of data blocks (DB). The log blocks (LB) form one or more log block groups. Each of the log block groups includes a desired (or, alternatively a predetermined) number of log blocks (LB). One or more data block groups are mapped onto one or more log block groups.

Each of the mapping tables 1630 and 1640 includes a block mapping table (BMT) and a page mapping table (PMT). The block mapping table (BMT) maps the data block groups and the log block groups. For instance, when the data block group is configured with two data blocks (DB) and the log block group is configured with four log blocks (LB), the block mapping table (BMT) maps two data block groups onto one log block group. The page mapping table (PMT) maps pages of the data blocks (DB) of the data block group onto pages of the log blocks (LB) of the corresponding log block group.

The data blocks (DB) and the log blocks (LB) of the data storage area 1710 are mapped through a block associative mapping method. That is, the data blocks (DB) are divided into a plurality of data block groups, and the log blocks (LB) are divided into a plurality of log block groups. The block mapping table (BMT) of the mapping table 1630 maps the data block groups and the log block groups. The page mapping table (PMT) of the mapping table 1630 maps pages of the data block group and pages of the log block groups. That is, the data storage region 1710 is managed in units of a block group and a page.

The data blocks (DB) and the log blocks (LB) of the buffer 1720 are mapped through a fully associative mapping method. That is, all of the data blocks (DB) form one data block group, and all of the log blocks (LB) form one log block group. The page mapping table (PMT) of the mapping table 1640 maps pages of all the data blocks (DB) and pages of all the log blocks (LB). That is, the buffer 1720 is managed in units of a page by the page mapping table (PMT).

Consequently, when data to be written to the buffer 1720 is transferred, a free page of the buffer 1720 is detected and the data is written to the detected free page. The buffer 1720 may operate in first-in first-out (FIFO) manner. Exemplarily, when data are sequentially written to pages of a first log block and pages of a second log block in the buffer 1720, data stored in the pages of the first log block and the pages of the second log block may be sequentially erased. When the pages of the first log block are set to invalid pages, the first log block may be erased. That is, a garbage collection is not required when the buffer 1720 operates. Therefore, the operation speed of the buffer 1720 may be faster than that of the data storage area 1710.

To provide a real-time responsivity to the memory system 1500, the control program 1610 makes use of a coroutine method. The control program 1610 classifies the request from the host into a primary thread and a secondary thread. When a request of the primary thread (hereinafter, referred to as primary thread request) is transferred during operation according to a request of the secondary thread (hereinafter, referred to as secondary thread request), the control program 1610 suspends the secondary thread operation, and executes operation according to the primary thread request. The suspended secondary thread operation is resumed when the control program 1610 is in an idle state.

For example, an access request transferred when there is no suspended operation or operation in progress is determined as the secondary thread. In contrast, an access request transferred when there is a suspended operation or operation in progress is determined as the primary thread. The control program 1610 provides a multithreading function using the primary and secondary threads.

Operations (for example, write, garbage collection, wear leveling) of the control program 1610, which need a time longer than a preset time, have one or more suspend points. The operations of the control program 1610 may be suspended at the suspend points. Afterwards, the suspended operation may be resumed from the suspend points. Exemplarily, the suspend points may be formed before and after a program operation for one page. Alternatively, the suspend points may be formed before and after an erase operation for one block.

For instance, when the request for the primary thread operation is transferred during the secondary thread operation, the control program 1610 suspends the secondary thread operation at the suspend point thereof, and executes the primary thread operation. Thereafter, when an idle time occurs, the control program 1610 resumes the secondary thread operation from the suspend point.

Figure 6:
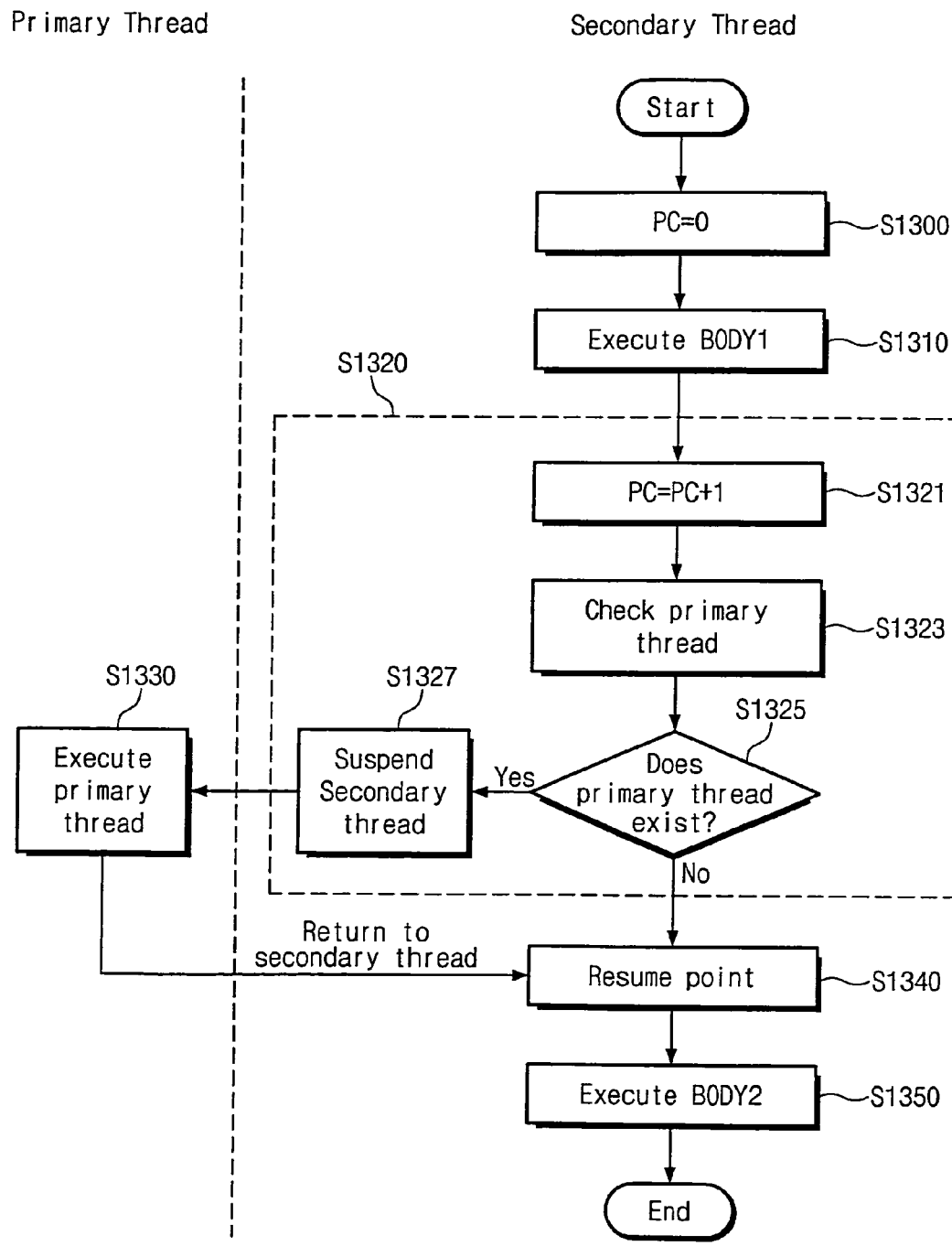
FIG. 6 is a flowchart illustrating a multithreading function provided by the control program of FIG. 4.

FIG. 6 is a flowchart illustrating a multithreading function provided by the control program 1610 of FIG. 4. In FIG. 6, it is illustrated that the secondary thread operation has one suspend point, and is divided into two bodies BODY1 and BODY2 based on the suspend point. However, the primary or secondary thread operation according to the embodiment of the present invention is not limited to one suspend point. The primary or secondary thread operation according to the embodiment of the present invention has n number of suspend points and n+1 number of bodies.

In operation S1300, a program counter (PC), local variable, is reset. The program counter PC indicates how many suspend points are passed during the secondary thread operation.

In operation S1310, the body BODY1 of the secondary thread operation is executed. Exemplarily, when the secondary thread operation is a write operation to two pages of the flash memory device (see 1700 of FIG. 2), the body BODY1 may be a write operation to one page.

Operation S1320 represents a suspend point. The secondary thread operation may be suspended at the suspend point. The operation S1320 includes a plurality of sub operations.

In operation S1321, the program counter (PC) is increased. That is, whenever the secondary thread operation executes the suspend point, the program counter (PC) is increased. The program counter (PC) indicates how many suspend points the secondary thread operation executes. When the secondary thread operation is suspended at the suspend point, the program counter (PC) may be used to detect a resume point for resuming the suspended secondary thread operation.

In operation S1323, it is checked whether a primary thread operation is requested or not. In operation S1325, the secondary thread operation is suspended if the primary thread operation is requested. Unless the primary thread operation is requested, operation S1340 is executed.

When the secondary thread operation is suspended in operation S1327, the primary thread operation is executed in operation S1330. When the thread operation is completed, the secondary thread operation is resumed in operation S1340.

In operation S1340, the control program 1610 detects a resume point of the suspended secondary thread operation using the program counter (PC). Exemplarily, if a value of the program counter (PC) is 2, the control program 1610 may execute a body after a second suspend point.

In operation S1350, the body BODY2 of the secondary thread operation is executed.

A request transferred when the control program 1610 is in an idle state may be executed as the secondary thread. A request transferred when the control program 1610 is in a busy state may be executed as the primary thread.

When the control program 1610 executes the primary thread or the secondary thread, a portion of an operational memory (e.g., SRAM) of the controller (see 1600 of FIG. 2) is assigned to execute the primary or secondary thread operation. The control program 1610 stores variables required to execute the primary or secondary thread operation in an assigned storage space.

In order that the secondary thread operation may be suspended, the primary thread operation may be executed, and the secondary thread operation may be resumed, local variables of the secondary thread operation should be maintained while executing the primary thread operation. Meanwhile, the local variables of the primary and secondary thread operations are stored in the same storage space. Accordingly, while the primary thread operation is executed, values of the local variables of the secondary thread operation may be changed or vanish due to local variables of the primary thread operation.

The control program 1610 according to an embodiment of the present invention differently sets a method of storing local variables of the secondary thread operation and a method of storing local variables of the primary thread operation. The control program 1610 maintains the local variables of the secondary thread operation even when the secondary thread operation is suspended.

Figure 7A:
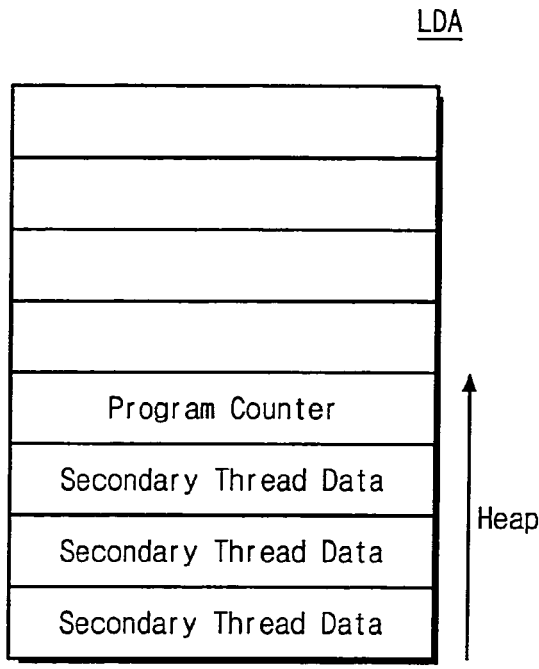
FIGS. 7A through 7C are diagrams illustrating how the control program of FIG. 4 stores local variables of primary and secondary thread operations.
Figure 7B:
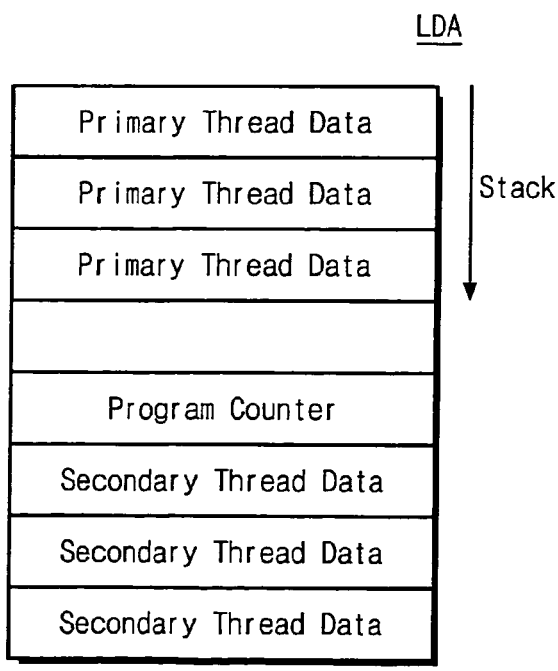
Figure 7C:
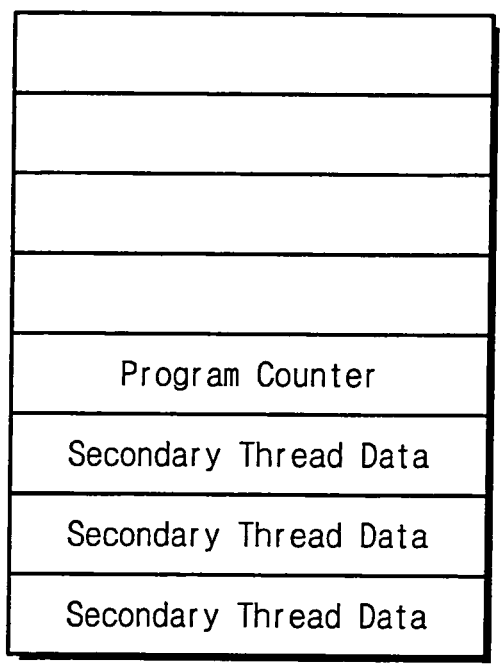

FIGS. 7A through 7C are diagrams illustrating how the control program 1610 of FIG. 4 stores local variables of the primary and secondary thread operations. Referring to FIG. 7A, the local variables of the secondary thread operation are stored in a heap way. When the secondary thread operation is suspended, the program counter (PC) is also stored in a heap way.

Referring to FIG. 7B, local values of the primary thread operation are stored in a stack way. Since the local values of the primary and secondary thread operations are differently stored in a storage space (LDA), storage spaces where the local variables of the primary and secondary thread operations are stored do not overlap each other. Therefore, the local variables of the secondary thread do not change or vanish due to the local variable of the primary thread.

Referring to FIG. 7C, when the primary thread operation is finished, the local variables of the primary thread operation are removed or vanish. The program counter and the local variables of the secondary thread operation are maintained, and thus the secondary thread operation may be normally resumed.

The control program 1610 according to the embodiment of the present invention provides a real-time responsivity to the memory system 1500 using multithreading techniques. The memory system 1500 executes a first access operation according to a first access request from the host. Due to garbage collection, wear leveling operation, or the like, the first access operation may not be completed within a time assigned to the first access operation. If a second access request is transferred when the first access operation is not completed, the control program 1610 suspends the first access operation and transmits a response signal indicating the completion of the first access operation to the host. Then, the control program 1610 executes the second access operation based on the second access request. When an idle time occurs, the control program 1610 resumes the suspended first access operation.

Figure 8:
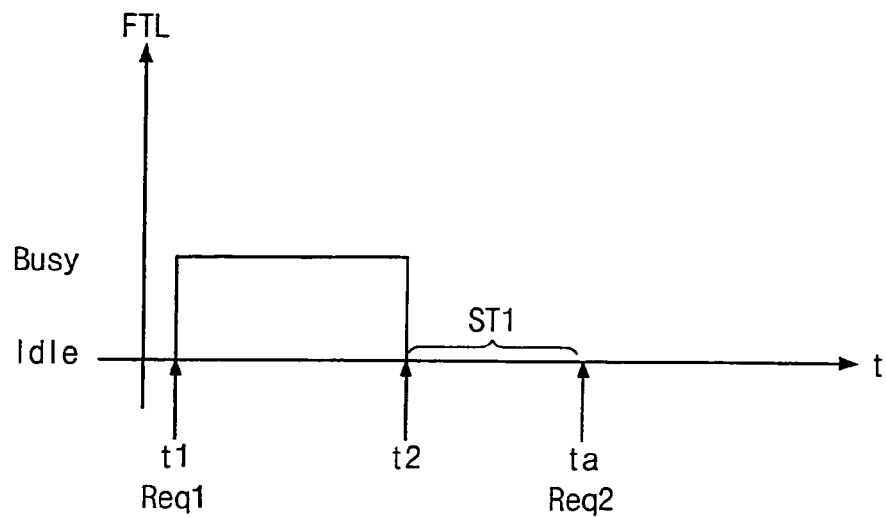
FIG. 8 is a diagram illustrating a first type idle time.

FIG. 8 is a diagram illustrating a first type idle time. In FIG. 8, an axis of abscissa represents time, and an axis of ordinate represents a state of the control program 1610.

When a first access request Req1 is transferred at a time t1, the control program 1610 executes the first access operation according to the first access request Req1. At this time, the control program 1610 is in a busy state. When a time assigned to the first access operation is ta-t1, the host transmits a second access request Req2 after the time ta. When the first access operation is finished at a time t2, the host does not transmit an access request during the time ta-t1 before the second access request Req2 is transmitted. That is, the control program 1610 has an idle time.

As illustrated in FIG. 8, an idle time occurring because the access operation is completed prior to the assigned time is called an inter-transaction slack time ST1. The control program 1610 may resume the suspended access operation during the idle time ST1.

Figure 9:
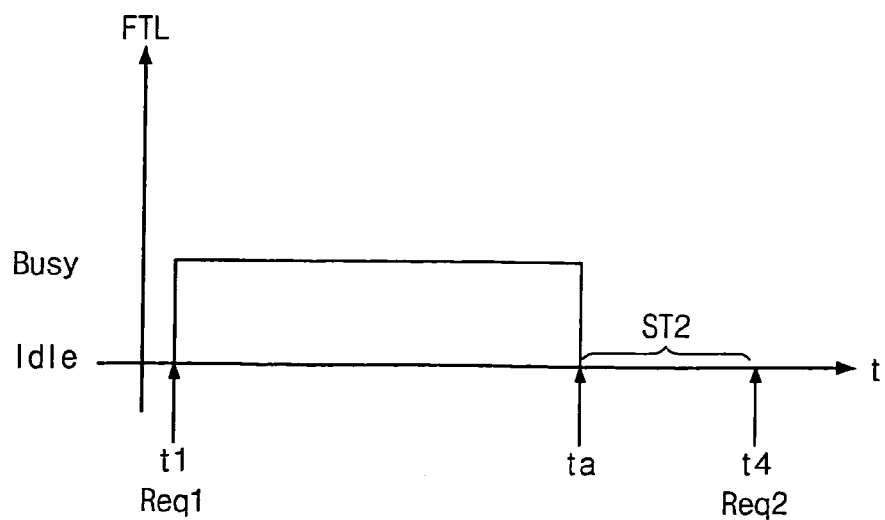
FIG. 9 is a diagram illustrating a second type idle time.

FIG. 9 is a diagram illustrating a second type idle time. In FIG. 9, an axis of abscissa represents time, and an axis of ordinate represents a state of the control program (see 1610 of FIG. 2).

The first access request Req1 is received at a time t1. The control program 1610 completes the first access operation at a time ta-t1 assigned to the first access operation according to the first access request. The host can transmit the second access request Req2 after a time ta. However, when the host does not access the memory system 1500, the host may not transmit the second access request Req2. That is, a timing that the host transmits the second access request Req2 may be a preset time elapsed after the time ta. Exemplarily, the host transmits the second access request Req2 at a time t4 after the time ta. At this time, the control program 1610 has an idle state during the time t4-ta.

An idle time between the access requests received from the host is called an inter-transaction slack time ST2. The control program 1610 may resume the suspended access operation during the idle time ST2.

Figure 10:
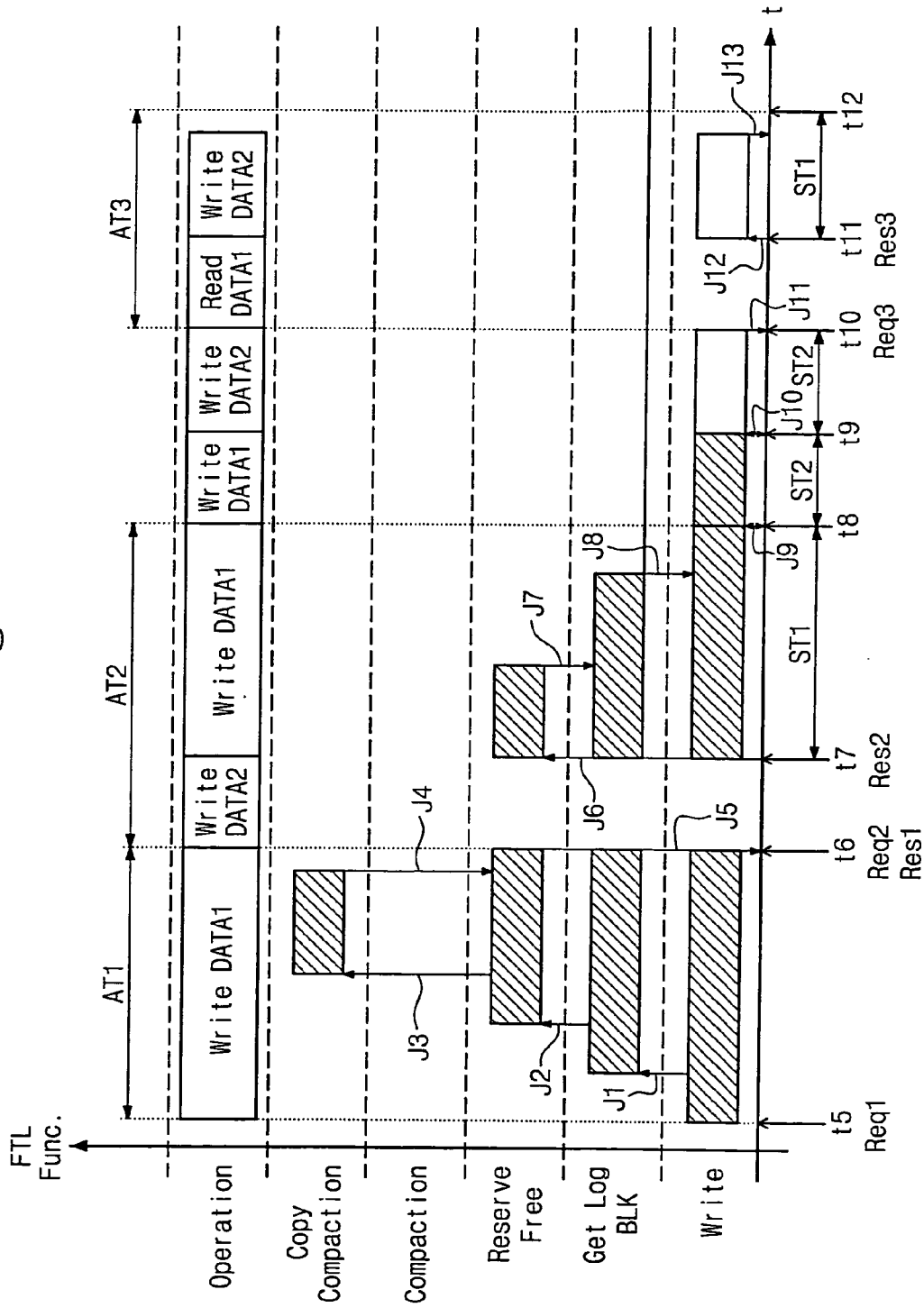
FIG. 10 is a diagram illustrating an embodiment where the control program of FIG. 4 operates according to a request of a host.

FIG. 10 is a diagram illustrating an embodiment where the control program 1610 of FIG. 4 operates according to a request of a host. In FIG. 10, an axis of abscissa represents time, and an axis of ordinate represents a function of the control program 1610.

At a time t5, the first access request Req1 is transferred from the host. Exemplarily, the first access request Req1 may be a write request. A time AT1 assigned to the first access request Req1 is up to a time t6.

The control program 1610 executes a write function. At a point J1, the write function calls a function Get Log BLK. The function Get Log BLK is a function of detecting a free block of the log blocks in the data storage area 1710 of the flash memory device 1700.

When there is no free block in the data storage area 1710, the function Get Log BLK calls a function Reserve Free at a point J2. The function Reserve Free is a function of executing a garbage collection to acquire a free block. Exemplarily, to acquire the free block, the function Reserve Free may determine which is more efficient between a copy compaction and a compaction. When it is determined that the copy compaction is more efficient than the compaction, the function Reserve Free calls a function Copy Compaction at a point J3. The copy compaction executes a copy compaction to acquire a free block. When the free block is acquired, the function Copy Compaction is finished, and the control program 1610 returns to the function Reserve Free.

The control program 1610 checks whether the time AT1 assigned to the first access operation (first write operation) is over. When the time AT1 assigned to the first access operation (first write operation) approaches although the first access operation (first write operation) is not completed, the control program 1610 suspends the first access operation (first write operation) to the data storage area 1710. Data of the data DATA1, which are not written to the data storage area 1710 yet, are written to the buffer 1720. The control program 1610 compares a size of data that are not written yet among the data DATA1, a time required to write the data to the buffer 1720, a time assigned to the first access operation (first write operation), thereby controlling a write operation to the buffer 1720 to be completed before the time AT1 assigned to the first access operation (first write operation) is over. When the write operation to the buffer 1720 is completed, the control program 1610 transmits a response signal indicating the completion of the first access operation (first write operation) to the host.

The host transmits the second access request Req2 at a time t6. Exemplarily, the second access request Req2 may be a second write request. The control program 1610 executes the second access operation (second write operation) based on the second access request Req2. The time AT2 assigned to the second access operation (second write operation) is up to a time t8. Since the first write operation is suspended, the control program 1610 executes the second write operation to the buffer 1720 instead of the data storage area 1710.

An operation speed of the buffer 1720 is faster than that of the data storage area 1710. Therefore, the second write operation of writing data to the buffer 1720 may be completed earlier than the assigned time AT2. Exemplarily, the second write operation is completed at a time t7. When the second write operation is completed, the control program 1610 transmits a response signal Res2 indicating the completion of the second write operation to the host. Though the response signal Res2 is transmitted to the host, the host requests a new access operation after the assigned time AT2 of the second access operation (second write operation). That is, from the time t7 that the second access operation is completed to the time t8 assigned to the second access operation, the control program 1610 is in an idle state. More specifically, the control program 1610 has an inter-transaction slack time ST1.

The control program 1610 resumes the suspended first access operation (first write operation) at a point J6. That is, the suspended function Reserve Free is resumed. When the function Reserve Free is finished, the control program 1610 returns to the function Get Log BLK at a point J7. When the function Get Log BLK is finished, the control program 1610 returns to the function Write at a point J8. First write data DATA1 are written to the data storage area 1710 because a free block is acquired by the function Get Log BLK.

When the time AT2 assigned to the second access operation (second write operation) is over, the control program 1610 suspends the first access operation (first write operation) at a point J9. The control program 1610 detects whether a new access request is received. If a new access request is not received, the control program 1610 has an idle time. In more detail, the control program 1610 has an inter-transaction slack time ST2. The control program 1610 resumes the first access operation (first write operation) because the idle time occurs.

The control program 1610 suspends the first access operation (first write operation) at every suspend point that is set in the first access operation (first write operation), and detects whether a new access request is received. When a new access request is not transferred, the control program 1610 resumes the first access operation (first write operation). When a new access request is transferred, the control program 1610 executes an access operation according to the new access request.

The control program 1610 cannot respond to the access request from the host while the control program 1610 resumes the suspended access operation. That is, a new access operation may be delayed by a time interval between operations of detecting whether the control program 1610 receives the new access request. Therefore, a time interval between the suspend points of the access operation may be set such that the new access operation is not executed later than a preset time.

The first access operation (first write operation) is finished at a time t9. The second access operation (second write operation) according to the second access request (second write request) is not executed on the data storage area 1710 but executed on the buffer 1720. The control program 1610 recognizes the write operation executed on the buffer 1720, not on the data storage area 1710, as a suspended access operation. Therefore, the control program 1610 copies data stored in the buffer 1720 to the data storage area 1710 during the idle time. That is, the control program 1610 executes the second access operation (second write operation).

The control program 1610 suspends the second access operation (second write operation) at every suspend point of the second access operation (second write operation), and detects whether a new access request is received. A third access request Req3 is transferred at a time t10. Exemplarily, the third access request Req3 is a read request. A time AT3 assigned to the third access operation (read operation) is up to a time t12.

The control program 1610 executes a third access operation (read operation). When the third access operation (read operation) is completed at a time t11, the control program 1610 transmits a response signal Res3 indicating the completion of the third access operation (read operation) to the host. Since the third access operation (read operation) is completed within the assigned time AT3, the control program 1610 has an idle time. More specifically, the control program 1610 has an inter-transaction slack time ST1. Therefore, the control program 1610 resumes the suspended second access operation (second write operation). At the time t12, the second access operation (second write operation) is completed.

As described above, the control program 1610 according to the embodiment of the present invention executes the first access operation (first write operation). If a time assigned to the first access operation (first write operation) is over, the control program 1610 suspends the first access operation (first write operation), and transmits the response signal indicating the completion of the first access operation (first write operation) to the host. The suspended first access operation is re-executed when an idle time occurs.

When a request for the second access operation (second write operation or read operation) is transferred after the first access operation (first write operation) is suspended, the control program 1610 executes the second access operation (second write operation or read operation). When the second access operation (second write operation or read operation) is competed before the assigned time, the control program 1610 resumes the first access operation (first write operation) until the time assigned to the second access operation (second write operation or read operation) is over. That is, the control program 1610 resumes the first access operation (first write operation) during the inter-transaction slack time ST1.

The control program 1610 resumes the first access operation (first write operation) until the request for the second access operation (second write operation or read operation) is transferred after the first access operation (first write operation) is suspended. That is, the control program 1610 resumes the first access operation (first write operation) during the inter-transaction slack time ST2. If the second access operation transferred while the first access operation (first write operation) is suspended is a second write operation, the second write operation is executed on the buffer 1720 instead of the data storage area 1710. The control program 1610 copies data stored in the buffer 1720 to the data storage area 1710 during the idle time.

In an example, the assigned times AT1 to AT3 may be different from each other. For example, when there are a plurality of hosts accessing the memory system 1500, the assigned times AT1 to AT3 respectively from the plurality of hosts are different from each other.

Figure 11:
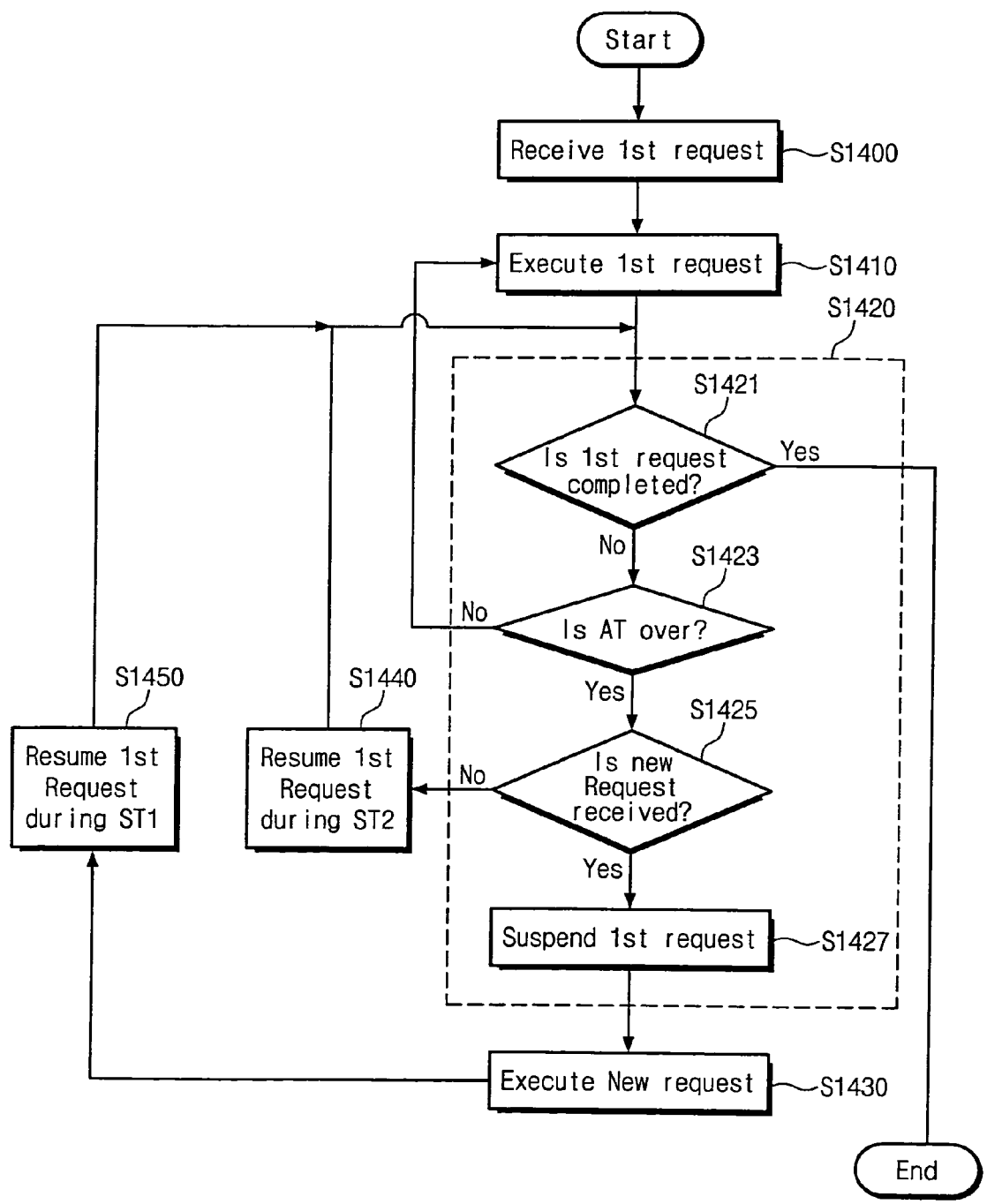
FIG. 11 is a flowchart how the control program according to the embodiment of the present invention responds in real time.

FIG. 11 is a flowchart how the control program 1610 according to the embodiment of the present invention responds in real time. Referring to FIG. 11, in operation S1400, the first access request is received from the host. In operation S1410, the control program 1610 executes the first access operation according to the first access request.

In operation S1420, the control program executes a suspend point of the first access operation. The operation S1420 includes a plurality of sub operations. In operation S1421, the control program 1610 determines whether the first access operation is completed. If the first access operation is not completed, operation S1423 is carried out.

In operation S1423, the control program 1610 determines whether the time AT assigned to the first access operation is over. If the time AT assigned to first access operation does not elapse, the first access operation continues execution in operation S1410. If, however, the time AT assigned to the first access operation is over, operation S1425 is executed.

In operation S1425, the control program 1610 determines whether a new access request is received. If a new access request is not received, the control program 1610 has an inter-transaction slack time ST2. Therefore, in operation S1440, the control program 1610 resumes the first access operation. If a new access request is received, the first access operation is suspended in operation S1427. In operation S1430, an access operation according to the new access request is executed.

The new access operation may be a read or write operation. The read operation is executed faster than the write operation. Therefore, if the new access operation is a read operation, the read operation may be completed prior to the assigned time. That is, the control program 1610 may have an inter-transaction slack time.

If the new access operation is a write operation, the new write operation is executed on the buffer 1720 because the first access operation is suspended. Since the write operation to the buffer 1720 is executed faster than the write operation to the data storage area 1710, the write operation to the buffer 1720 may be completed prior to the assigned time. That is, the control program 1610 may have an inter-transaction slack time ST1.

In operation S1450, the control program 1610 may resume the suspended first access operation because it has the inter-transaction slack time ST1.

In the aforesaid embodiment, the control program 1610 may be realized by a flash translation layer (FTL).

In the previous embodiment, it is illustrated that a cell array of the flash memory device 1700 is divided into the data storage area 1710 and the buffer 1720. However, the flash memory device 1700 according to the embodiment of the present invention may include a buffer separately.

In the foregoing embodiment, the technical idea of the present invention has been described by taking the flash memory system including the flash memory device as an example. However, the technical idea of the present invention is not limited to application to the flash memory system. Exemplarily, the technical idea of the present invention may also be applicable to a nonvolatile memory system such as a PRAM, an RRAM, an MRAM, an FRAM and an EEPROM. In this case, the control program 1610 may be provided in firmware that is driven in the controller of the nonvolatile memory device.

Figure 12:
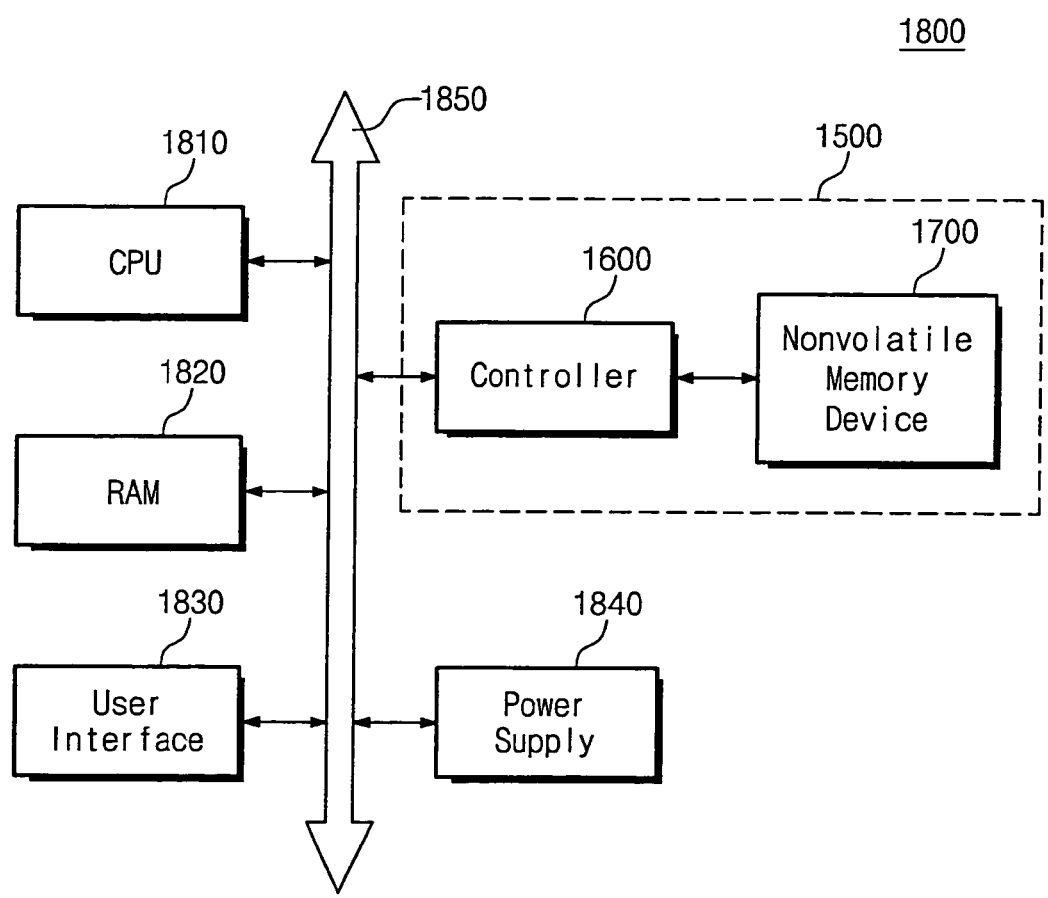
FIG. 12 is a block diagram illustrating an embodiment of a computing system including the memory system of FIGS. 2 and 4.

FIG. 12 is a block diagram illustrating an embodiment of a computing system 1800 including the memory system of FIGS. 2 and 4. Referring to FIG. 12, the computing system 1800 includes a central processing unit 1810, a random access memory (RAM) 1820, a user interface 1830, a power supply 1840, and a memory system 1500.

The memory system 1500 is electrically connected to the central processing unit 1810, the RAM 1820, the user interface 1830, and the power supply 1840 through a system bus 350. Data, which are provided through the user interface 1830 or processed by the central processing unit 1830, are stored in the memory system 1500. The memory system 1500 includes a controller 1600 and a nonvolatile memory device 1700.

In the case where the memory system 1500 is mounted as a semiconductor disk device, a booting speed of the computing system 1800 can be significantly increased. Although not shown, those skilled in the art can understand that the system according to the present invention may further include an application chipset, a camera image processor, and the like.

The memory system 1500 according to the embodiment of the present invention responds to a read or write request in real time. The memory system according to the embodiment of the present invention checks whether a time assigned to the access operation is over. If the assigned time is over, the memory system 1500 transmits a response signal indicating the completion of the access operation to the host. Then, the memory system suspends the access operation. The suspended access operation is resumed if an idle time occurs.

A flash memory system according to a first embodiment of the present invention may achieve speed-up by means of a multi-thread function. In addition, the flash memory system according to the first embodiment of the present invention may achieve high data reliability by means of a temperature sensor as well as the multi-thread function. A flash memory system including a temperature sensor will be described in detail in fourth embodiment.

The flash memory system according to the first embodiment of the present invention may achieve high performance by ensuring reliability of LSB data as well as the multi-thread function. A flash memory system ensuring reliability of LSB data will be described in detail in fifth embodiment.

The flash memory system according to the first embodiment of the present invention may achieve high data reliability by means of read count data or read history as well as the multi-thread function. A flash memory system achieving high data reliability by means of read count data or read history will be described in detail in sixth and seventh embodiments, respectively.

The flash memory system according to the first embodiment of the present invention may achieve speed-up by means of the multi-thread function and high data reliability by means of various manners which will be described below in detail. Performance of the flash memory system according to the first embodiment of the present invention may be improved through achievement of speed-up and high data reliability.

Embodiment 2

Flash Memory System Having Free Page

Recently, portable electric devices such as a digital camera, an MP3 player, a mobile phone, a personal digital assistant (PDA), etc. are extensively used. Flash memories are commonly used in those portable electric devices. The reason is that flash memories are non-volatile memory devices having characteristics such as lower power consumption and high integration.

Unlike hard disks capable of overwriting data, the flash memories cannot overwrite data. That is, if flash memories try to overwrite data, existing data must be erased first. This is called erase-before-write. Before writing data, flash memories must return to an initial state or an erase state.

An erase operation of flash memories usually takes relatively longer time than a write operation. Additionally, because an erase unit of flash memories is a block, which is larger than a write unit, this may cause flash memories to erase a portion that may be unnecessary for a write operation. The portion that was unintentionally erased needs to be restored through a write operation again.

Since units of erase and write operations differ in flash memories, operation performance of a write operation lags behind that of an erase operation in terms of speed. Moreover, if flash memories perform an erase operation on the same block about hundred thousand times, its physical wearing may cause abnormal operations. Thus, flash memories perform a wear leveling operation in order to prevent an erase operation from being repeatedly performed on a specific block.

A flash translation layer (FTL) is software for overcoming those limitations of flash memories and effectively managing them. The FTL receives a logic address from a file system, and converts it into a physical address. Here, the physical address is an address that is actually used in flash memories.

The FTL includes an address mapping table for managing the above address mapping operation. The address mapping table is usually driven in a random access memory (RAM). The address mapping tale records logical addresses and physical addresses corresponding thereto. The address mapping table may vary in its size according to a mapping unit and may have various mapping methods according to the mapping unit.

Typical mapping methods include a page mapping method, a block mapping method, and a hybrid mapping method, etc. The page mapping method uses a page mapping table. The page mapping table is used for performing a mapping operation by a page unit and stores a logical page and a physical page corresponding thereto. The blocking mapping method uses a block mapping table. The block mapping table is used for performing a mapping operation by a block unit and stores a logical block and a physical block corresponding thereto. The hybrid mapping method uses the page mapping method and the block mapping method simultaneously.

Generally, one memory block includes tens or hundreds of pages. Accordingly, if the page mapping method is used, the size of the mapping table is tens or hundreds times larger than that of the block mapping method. That is, the page mapping method requires a relatively large size of a memory space for the mapping table.

Since the block mapping method performs a mapping operation by a block unit, the size of its mapping table is less than that of the page mapping method. However, according to the block mapping method, since a position of a page that will be written into blocks is fixed, a large number of merge operations need to be performed.

In the hybrid mapping method, the page mapping method is used for a log block and the block mapping method is used for a data block. Log and data blocks are described in more detail below. In particular, log blocks may be the same as data blocks in that a log block includes the same number of pages as a data block. However, log blocks are used as a memory management tool (as described below), and thus are called log blocks instead of data blocks. Log blocks, however, may become data blocks or free blocks as described below. Because the hybrid mapping method uses both page and block mapping methods, the size of the mapping table is reduced and also the number of merge operations is decreased.

According to the hybrid mapping method, at least one log block is allocated to one data block. The merge operation may be performed even when only a portion of a page of a log block is used. For example, if the number of pages in one log block is four, a merge operation is performed when three or two pages are used. In this case, a page utilization rate of a log block is decreased. A low page utilization rate of a log block is a factor deteriorating the performance of a memory system.

Figure 13:
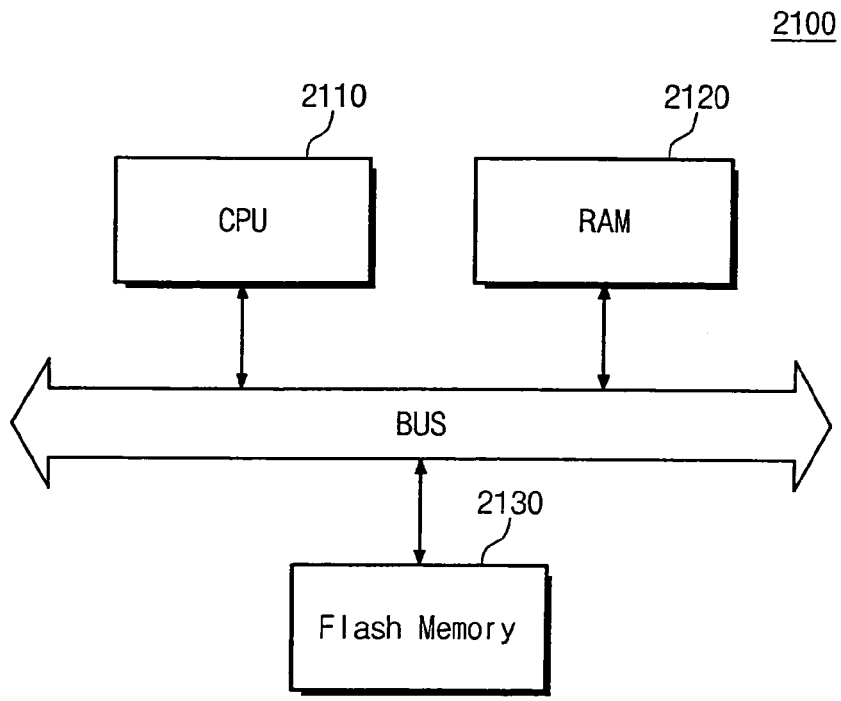
FIG. 13 is a block diagram illustrating a hardware structure of a memory system using a flash memory.

FIG. 13 is a block diagram illustrating a hardware structure of a memory system using a flash memory. Referring to FIG. 13, the memory system 2100 includes a central processing unit (CPU) 2110, a random access memory (RAM) 2120, and a flash memory 2130.

As well known to those skilled in the art, the flash memory 2130 includes a plurality of string structures, each of which has a plurality of memory cells. A set of memory cells is commonly called a cell array. A cell array of the flash memory 2130 includes a plurality of memory blocks. Each of the memory blocks includes a plurality of pages. Each of the pages includes a plurality of memory cells sharing one word line.

In the flash memory 2130, units of read and write operations are different from a unit of an erase operation. That is, the flash memory 2130 performs an erase operation by a memory block unit and performs a read or write operation by a page unit. Additionally, the flash memory 2130 does not support on overwrite operation unlike other semiconductor memories. Accordingly, the flash memory 2130 performs an erase operation before a write operation.

Due to this characteristic of the flash memory 2130, additional management for a read/write/erase operation is required to effectively utilize the flash memory 2130 as a hard disk. A flash translation layer (FTL) is system software which is developed for the above purpose. The FTL is driven on the RAM 2120.

Figure 14:
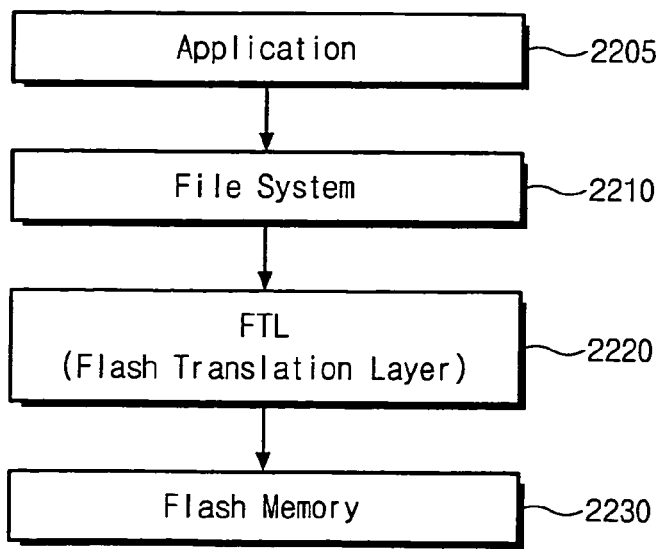
FIG. 14 is a block diagram illustrating a system software structure of the memory system of FIG. 13.

FIG. 14 is a block diagram illustrating a system software structure of the memory system 2100 of FIG. 13. The memory system 2100 has a software layer structure where an application 2205, a file system 2210, a FTL 2220, a flash memory 2230 are sequentially placed. The application 2205, the file system 2210 and the FTL 2220 may be distributed among the CPU 2110, the RAM 2120 and the flash memory 2130 as a matter of design choice. For example, the application 2205 and file system may be at the CPU 2110, the FTL 2220 may be at the CPU 2110 and/or the RAM 2120 and the flash memory 2230 may be at the flash memory 2130.

The FTL 2220 receives a logical address LA from the application 2205 or the file system 2210. The FTL 2220 receives the logical address LA and converts it into a physical address PA. The physical address PA is provided to the flash memory 2230. The FTL 2220 has an address mapping table for address conversion. The address mapping table is driven on the RAM 2120 of FIG. 13.

An address mapping method of the FTL 2220 varies according to a mapping unit. A representative mapping method includes a page mapping method, a block mapping method, and a hybrid mapping method.

The page mapping method performs an address mapping operation by a page unit. According to the page mapping method, since an address conversion operation is performed by a page unit, a merge operation for page arrangement is not required later. On the contrary, the page mapping method requires a large size of an address mapping table. That is, in order to use the page mapping method, a large capacity of RAM 2120 is required. The page mapping method does not require a merge operation but requires a large capacity of memory space for the page mapping table.

The block mapping method performs an address mapping operation by a memory block unit. The block mapping method can reduce a size of memory space compared to the page mapping method. On the contrary, the block mapping method needs to perform a large number of merge operations for page arrangement. The hybrid mapping method uses the page mapping method and the block mapping method simultaneously and thus can reduce the size of the mapping table and the number of merge operations. The hybrid mapping method will be described in more detail as follows.

Figure 15:
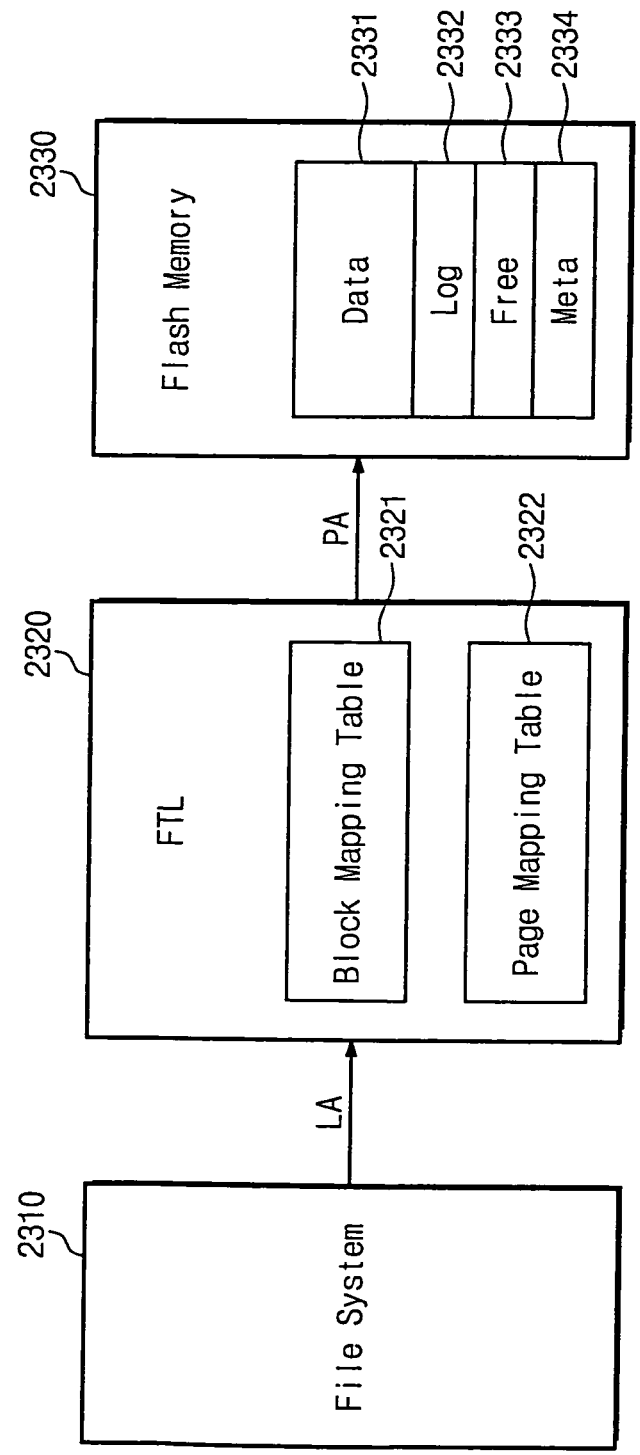
FIG. 15 is a block diagram illustrating a hybrid mapping method of the memory system of FIG. 14.

FIG. 15 is a block diagram illustrating a hybrid mapping method of the memory system of FIG. 14. Referring to FIG. 15, the memory system includes a file system 2310, a FTL 2320, and a flash memory 2330, which may correspond to the file system 2210, the FTL 2220 and the flash memory 2230 of FIG. 14. The FTL 2320 receives a logical address LA from the file system 2310 and converts it to a physical address PA by using a mapping table.

Referring to FIG. 15, the FTL 2320 includes a blocking mapping table 2321 and a page mapping table 2322. The block mapping table 2321 converts a logical block number (LBN) into a physical block number (PBN). The page mapping table 2322 is used for page mapping of a data block and a log block.

Referring to FIG. 15, the flash memory 2330 includes a data area 2331, a log area 2332, a free area 2333, and a meta area 2334. The data area 2331 includes a plurality of blocks and stores user data. The log area 2332 includes at least one log block. The log block 2332 is allocated to a specific data block.

In a case of writing data, the data are first written into a data block and then written into an allocated log block. Next, for a merge operation, effective pages of the log block and the data block are copied into a new data block.

The free area 2333 includes a plurality of free blocks. The free block is converted into a log block when the log block is insufficient. On the other hand, a data block or a log block, which is to be erased after a merge operation, is converted into a free block. That is, any one memory block can be converted into a data block, a log block, and a free block by a merge operation. Modified mapping information according to a merge operation is stored in the meta area 2334.

Figure 16:
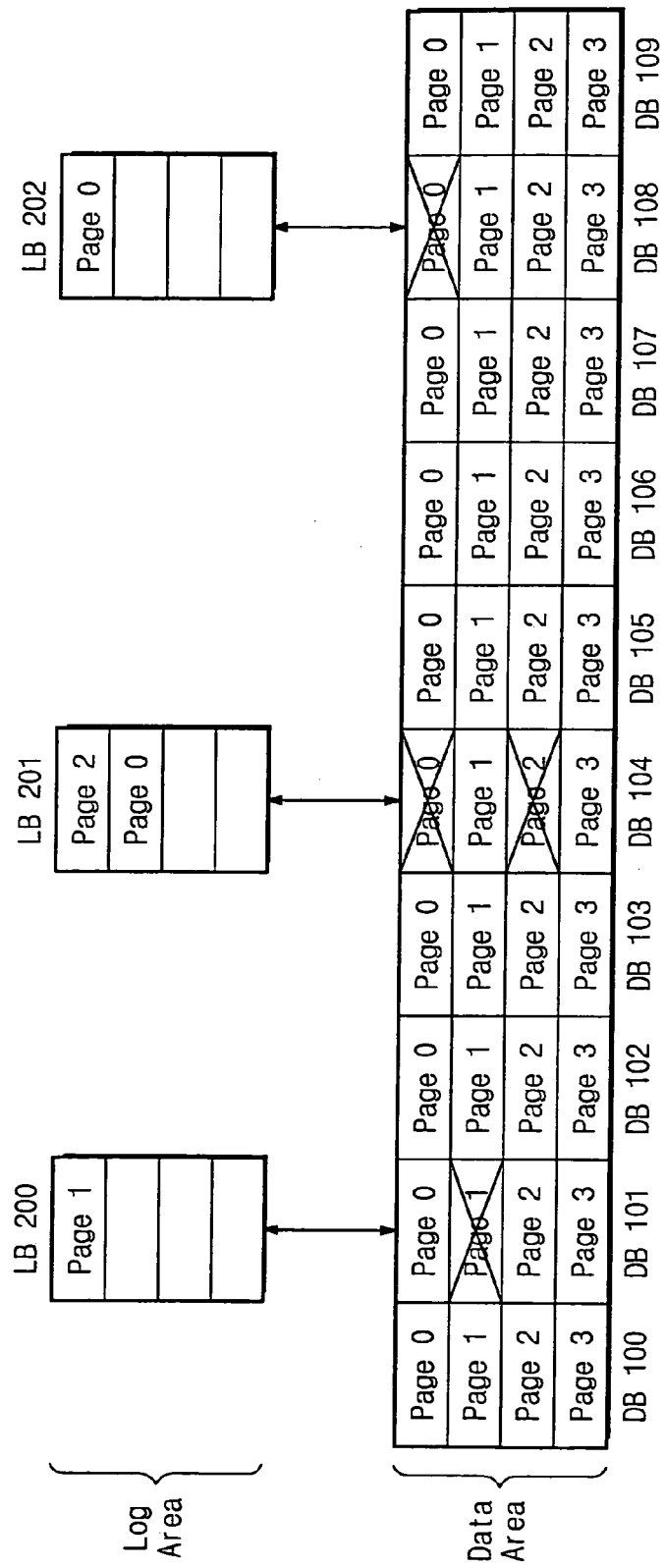
FIG. 16 is a conceptual diagram illustrating a general mapping method of a memory system.

FIG. 16 is a conceptual diagram illustrating a general mapping method of a memory system. Referring to FIG. 16, the flash memory 2330 of FIG. 15 includes a data area having data blocks, a log area having log blocks, and a free area having free blocks.

The Data area includes data blocks having physical block numbers such as DB100, ..., DB109. The log area includes log blocks having physical block number such as LB 200, LB 201, and LB 202. The free area may include three physical blocks up to the maximum. As illustrated in the FIG. 16, since all the physical blocks are allocated to the log blocks, the free area is empty. The log block LB 201 is allocated to the data block DB 104, and the log block LB 202 is allocated to the data block DB 108.

If the file system 2310 of FIG. 15 makes a data write request, the FTL 2320 of FIG. 15 examines whether there is a log block allocated to a corresponding data block or not that corresponds to the write if the physical page of the data block request store data. If there is a log block allocated to a corresponding data block, the allocated log block is used. However, if there is no log block allocated to a corresponding data block, the corresponding data block is assigned with a new log block from the free block.

Referring to FIG. 16, a physical page PPN 0 of a log block LB 200 is used for storing a logical page page 1 of a data block DB 101. A physical page PPN 1 of a data block DB 101 is nullified because the updated version of this data is now stored in the log block. Additionally, physical pages PPN 0 and PPN 1 of a log block LB 201 are respectively used for storing logical pages page 0 and page 2 of a data block DB 104. Physical pages PPN 0 and PPN 2 of the data block 104 are nullified. Lastly, a physical page PPN 0 of a log block LB 202 is used for storing a logical page page 0 of a data block DB 108. The physical page PPN 0 of the data block DB 108 is nullified.

FIG. 17(*a*) and FIG. 17(*b*) illustrating a page mapping relationship between the data block and the log block of FIG. 16. Referring to FIG. 17(*a*), a log block LB 201 is allocated to a data block DB 104. Each of the data block DB 104 and the log block LB 201 includes four physical pages page 0 to page 3. The physical page number PPN of FIG. 17 means a page order of each memory block.

The FTL 2320 of FIG. 15 performs a write operation on logical pages stored in the data block DB 104 in response to a write request. Referring to FIG. 17(*a*), the file system 2310 of FIG. 15 requests a write operation in the order of the logical page page 2 and the logical page page 0. Here, the logical page page 2 is stored in the physical page PPN2 of the data block DB 104, and the logical page page 0 is stored in the physical page PPN 0 of the data block DB 104.

Once another write request for the logical page page 2 is inputted (e.g., update of this data in the data block), a write operation for the physical page PPN 0 of the log block LB 201 is performed. The physical page PPN 2 of the data block DB 104 is nullified (e.g., invalidated because the updated version is not in the physical page PPN 0 of the log blck 20). Next, once another write request for the logical page page 0 is inputted, a write operation for the physical page PPN 1 of the log block LB 201 is performed. The physical page PPN 0 of the data block DB 104 is nullified.

FIG. 17(*b*) is a mapping table illustrating a page corresponding relationship between a data block and a log block. Referring to FIG. 17(*b*), the logical page page 2 of the data block DB 104 is stored in the physical page PPN 0 of the log block LB 201, and the logical page page 0 of the data block DB 104 is stored in the physical page PPN 1 of the log block LB 201.

However, if a log block is insufficient, the log block needs to be converted into a free block. For example, a new log block needs to be allocated into a data block DB 102 in order to store a logical page page 0 of the data block DB 102. However, if there is no free block to be allocated to the log block, a log block needs to be converted into a free block.

Figure 18:
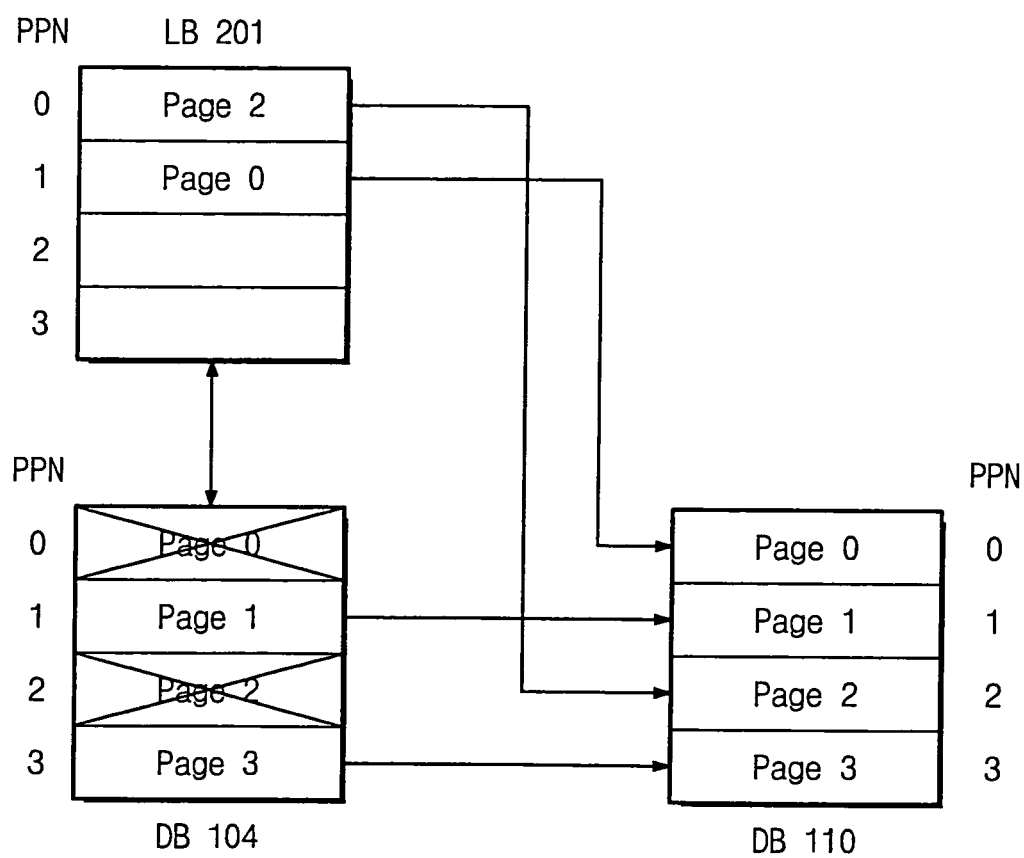
FIG. 18 is a view illustrating a method of generating a new data block by merging a data block with a log block.

FIG. 18 is a view illustrating a method of generating a new data block by merging a data block with a log block. Referring to FIG. 18, logical pages page 2 and page 0 (respectively stored in the physical pages PPN 0 and PPN 1 of the log block LB 201) and logical pages page 1 and page 3 (respectively stored in the physical pages PPN 1 and PPN 3 of the data block DB 104) are copied to a new data block DB 100.

First, the logic page page 0 of the log block LB 201 is copied to a physical page PPN 0 of a new data block DB 110. Next, the logic page page 1 of the data block DB 104 is coped to the physical page PPN 1 of the new data block DB 110. Next, the logical page page 2 of the log block LB 201 is copied to the physical page PPN 2 of the new data block DB 110. Next, the logical page page 3 of the data block DB 104 is copied to the physical page PPN 3 of the new data block DB 110. Next, the log block LB 201 and the data block DB 104 are erased and converted into a free block.

According to the mapping method of FIG. 18, valid pages of the log block LB 201 and the data block DB 104 are copied to the new data block DB 110 by a merge operation. The logical pages page 0 to page 3 are sequentially written in the new data block DB 110. The sequentially writing of the logical pages page 0 to page 3 into one block is called an in-place order. On the contrary, the arbitrarily writing of the logical pages page 0 to page 3 into one block is called an out-of-place order or a random-place order.

If a write request is in the order of the logical page page 0 to the logical page page 3, these logic pages page 0 to page 3 are sequentially written into the physical pages PPN 0 to PPN 3 of the log block LB 201. The pages written into the log block LB 201 can be directly registered as a data block without an additional page copy. This is because the log block LB 201 arranges pages to be fit to the in-place order.

However, if a write request is random, a page copy process for meeting the order of logic pages must be required. In FIG. 18, four page copy processes are required. Additionally, two erase processes each for the log block LB 201 and the data block DB 104 are required after a page copy operation. Likewise, the mapping method of FIG. 16 requires a many number of page copy processes to meet the page order. Moreover, two block erase operations are required to erase the log block LB and the data block DB after the page copy operation. The page copy operation and the block erase operation deteriorate a memory system speed.

On the other hand, in FIG. 18, the log block LB 201 uses only two of the four pages, and is converted into a free block according to a merge operation. In some cases, only one of pages of the log block LB 201 is used and then the log block LB 201 can be converted into a free block. According to a 1:2 mapping method of FIG. 17, the log block LB 201 needs to be converted into the free block frequently. The merge operation is a factor deteriorating memory system performance.

Figure 19:
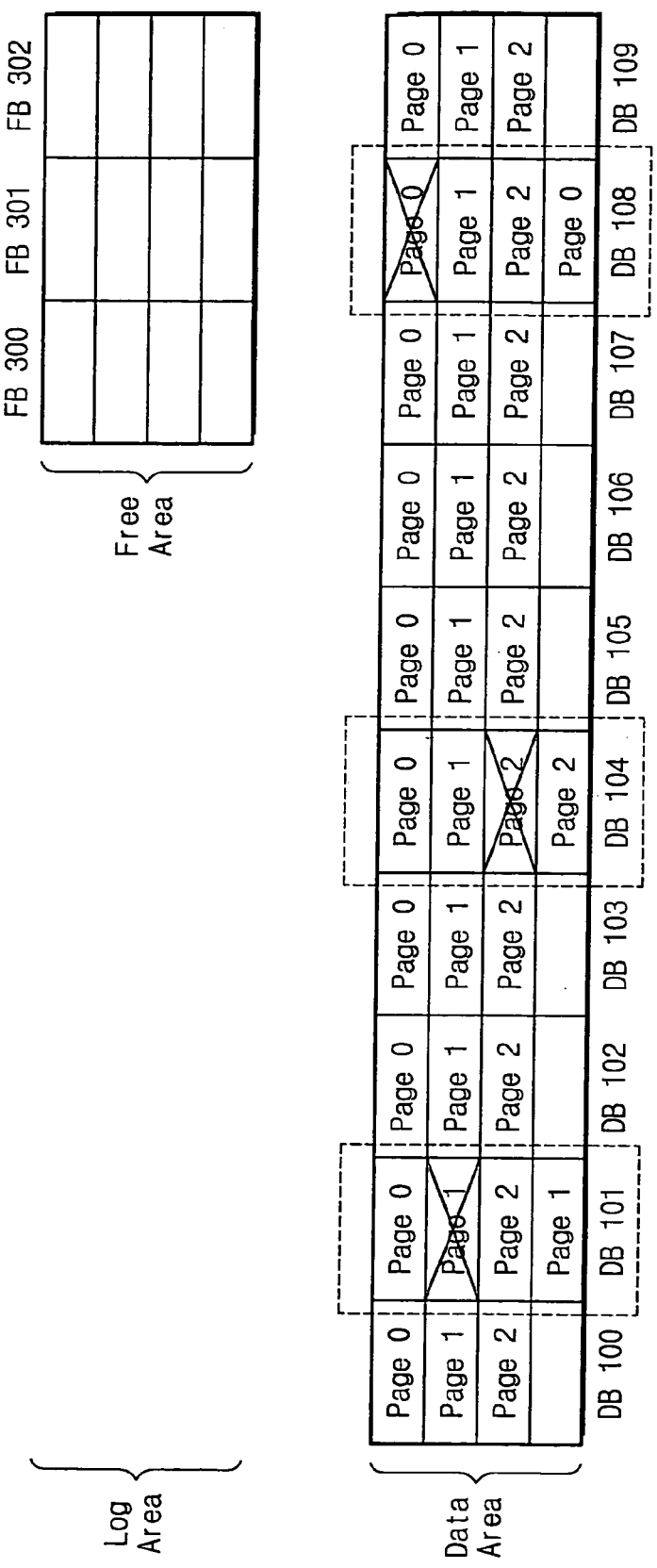
FIG. 19 is a conceptual diagram illustrating an asymmetric mapping method of a memory system according to the present invention.

FIG. 19 is a conceptual diagram illustrating an asymmetric mapping method of a memory system according to the present invention. Referring to FIG. 19, the flash memory of FIG. 15 includes a data area having data blocks, a log area having log blocks, and a free area having free blocks.

The data area includes data blocks having physical block numbers such as DB 100, . . . , DB 109. The log area is empty because there is no log block allocated to a data block. The free area can include three physical blocks to the maximum.

As illustrated in FIG. 19, because there is no log block allocated to a data block, the free area includes three free blocks FB 300, FB 301, and FB 302.

According to an embodiment of the present invention, a certain physical page of the data block is maintained as an empty physical page. For example, after data are sequentially stored in physical pages PPN 0 to PPN 2 of the data block DB 100, data are stored in a physical page PPN 0 of the next data block DB 101. As will be described later, an empty physical page is used for storing another physical page in the data block.

If the file system 2310 of FIG. 15 requests a data write operation to a page the already stores data; for example, Attempts to update stored data, the FTL 2320 of FIG. 15 determines whether there is an empty physical page in a corresponding data block or not. If there is an empty physical page in the corresponding data block, the data are stored in the empty physical page. However, if there is no empty physical page, the corresponding data block is assigned with a new log block from a free block. If there is no available free block, a merge operation will be performed.

If the file system 2310 requests a write operation about a logical page page 1 of the data block DB 101, since this page is already written in the data block the FTL 2320 detects whether there is an empty physical page in the data block DB 101 or not in response to the write request. Referring to FIG. 19, since there is an empty physical page in the data block DB 101, the logical page page 1 is stored in a physical page PPN 3. Additionally, assuming the previous write to logical page page 1 is stored in the PPN 1 of data block DB 101 the physical page PPN 1 is nullified (i.e., indicated as invalid in the FTL map).

Furthermore, if the file system 2310 requests a write operation about a logical page page 2 of a data block DB 104, since this page is already written to in the data block the FTL 2320 detects whether there is an empty physical page in the data block DB 104 or not in response to the write request. Referring to FIG. 19, since there is an empty physical page in the data block DB 104, the logical page page 2 is stored in the physical page PPN 3. Additionally, the physical page PPN 2 is nullified because PPN 2 stores the previous write to logical page 2 of data block DB 104.

Lastly, if the file system 2310 request a write operation about a logical page page 0 of the data block DB 108 (e.g., to update this data), the FTL 2320 detects whether there is an empty physical page in the data block DB 108 or not in response to the write request. Referring to FIG. 19, since there is an empty physical page in the data block DB 108, the logical page page 0 is stored in the physical page PPN 3. Additionally, the physical page PPN 0 is nullified because PPN 0 now stores outdated data of the logical page page 0 of DB 108.

As mentioned above, the number of performed merge operations can be reduced through extra physical pages in the data block. Referring to FIG. 19, because each of the data blocks DB 101, DB 104, and DB 108 includes an empty physical page, a logical page can be stored therein without a merge operation. This improves memory system performance.

A time required for a merge operation is several ten times longer than a time required for a page copy operation. The number of merge operations when a data block includes one empty physical page is half of the number of merge operations when there is no empty physical page. That is, the data block including one empty physical page performs only one merge operation while a general data block performs two merge operations. Accordingly, because the number of merge operations is reduced, memory system speed can be improved.

With the same reason, the number of merge operations when the data block includes N number of empty physical pages is 1/N+1 of when there is no empty physical page. That is, the data block having N number of empty physical pages performs only one merge operation while a typical data block performs the N+1 number of merge operations. Accordingly, because the N+1 number of merge operations is reduced, a memory system speed can be improved. In the embodiment of FIG. 19, the data block exemplarily includes one empty physical page but the present invention is not limited thereto. The data block according to the present invention may include the arbitrary number of empty physical pages.

Figure 20:
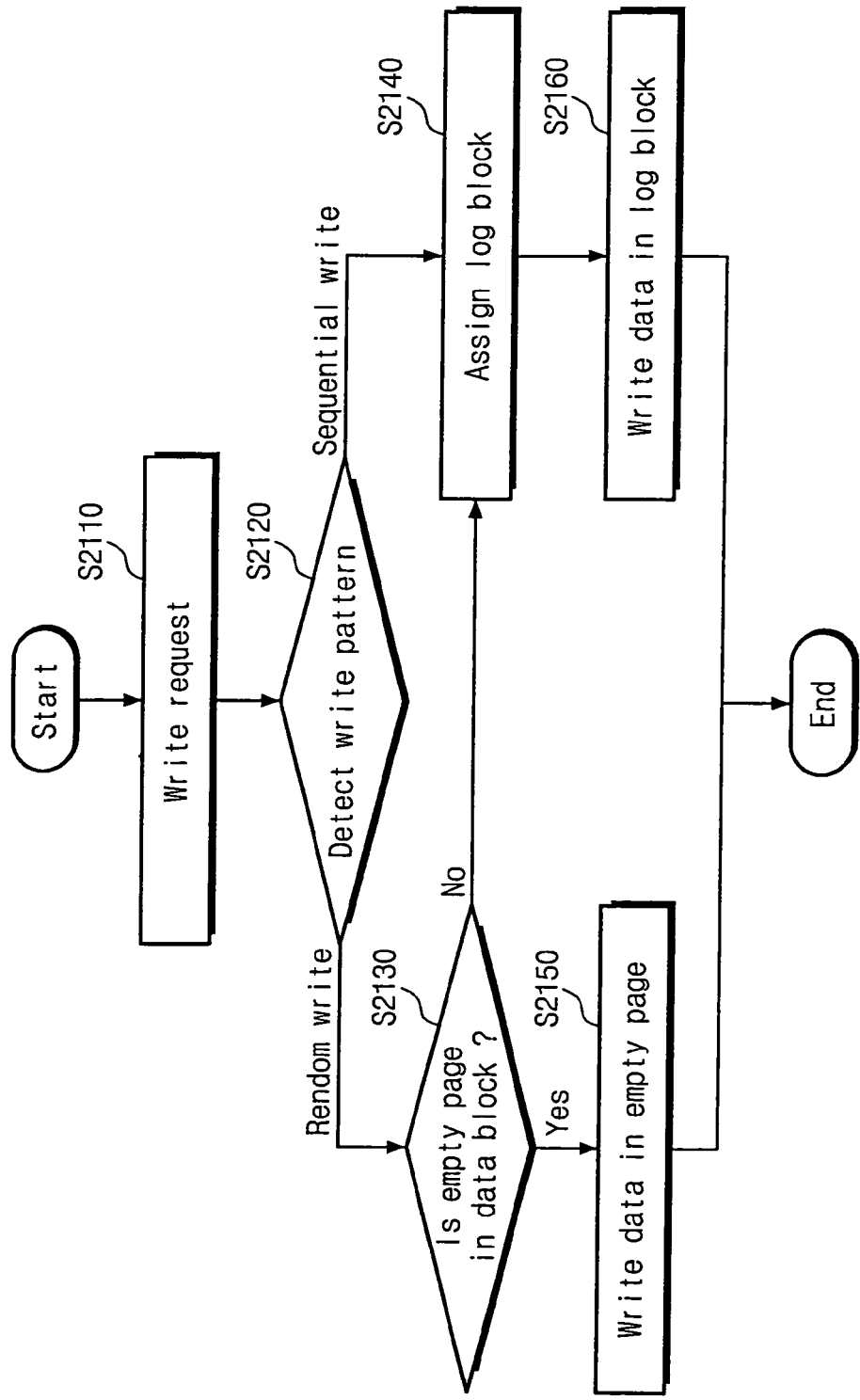
FIG. 20 is a flowchart illustrating an asymmetric mapping method according to another embodiment of the present invention.

FIG. 20 is a flowchart illustrating an asymmetric mapping method according to another embodiment of the present invention. In this embodiment, it is determined whether data are stored in an empty physical page or in an allocated log block according to a data storage pattern. Referring to FIG. 20, a write request is inputted from a file system in operation S2110. It is assumed the write request is to update data already stored. In operation S2120, a FTL detects a data write pattern in response to the write request. In more detail, the FTL determines whether data are randomly stored in respectively different data blocks (hereinafter, referred to as random write) or in sequential physical pages of one data block (hereinafter, referred to as sequential write).

It proceeds to operation S2130 when the data are randomly stored in respectively different data blocks. It proceeds to operation S2140 when the data are stored in sequential physical pages of one data block. In operation S2130, it is determined whether there is an empty physical page in the data block. If there is no empty physical page in the data block, it proceeds to operation S2140, and it proceeds to operation S2150 when there is an empty physical page. In operation S2150, the data are stored in an empty physical page. In operation S2140, a log block is allocated to the data block. In operation S2160, data are stored in the allocated log block.

As mentioned above, because it is determined whether a log block is allocated or not according to the data write pattern, performance deterioration can be prevented in a case of sequential write. Random write and sequential write will be described in more detail with reference to the following drawings.

Figure 21:
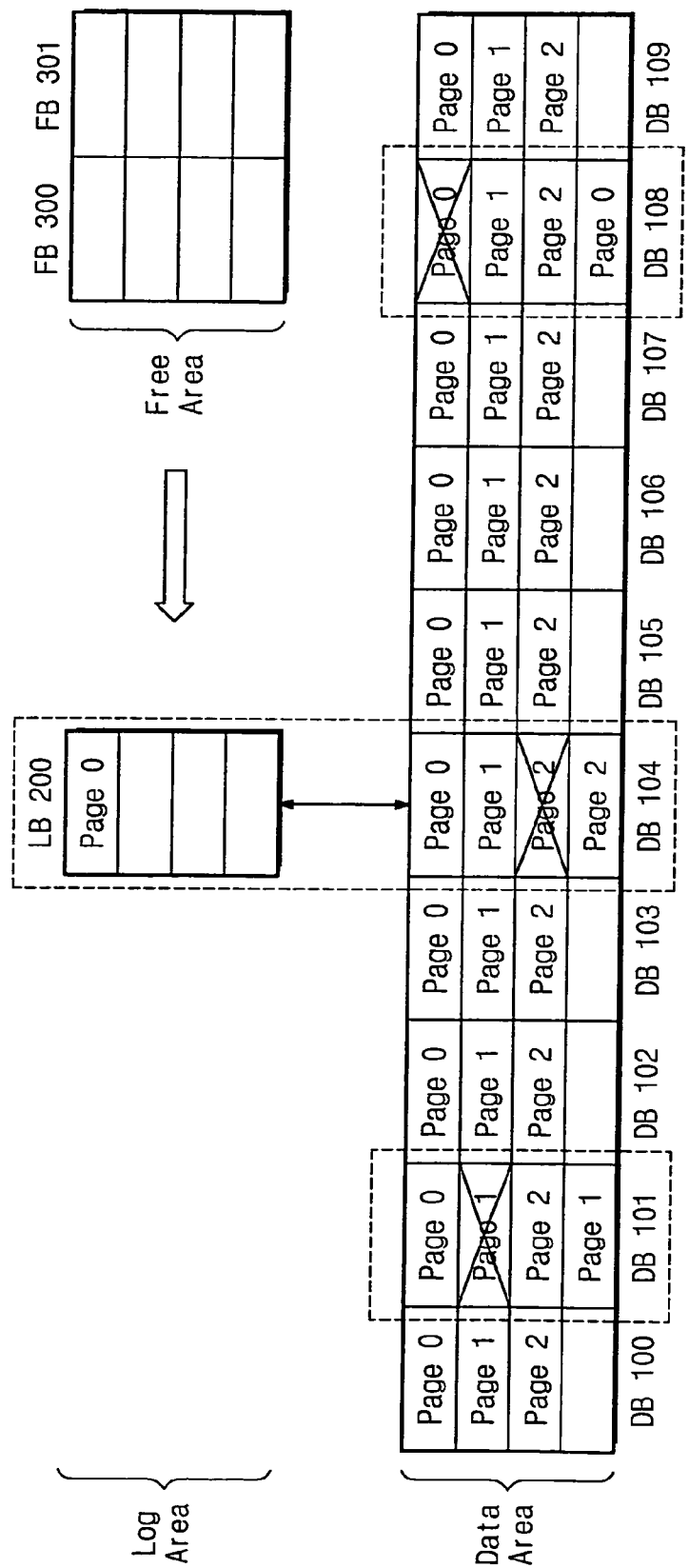
FIG. 21 is a view illustrating random write of FIG. 20.

FIG. 21 is a view illustrating the random write of FIG. 20. Referring to FIG. 21, a file system requires a write operation first about a logical page page 1 of a data block DB 101. In this case, because the data block DB 101 includes an empty physical page PPN 3, the logical page page 1 is stored in the physical page PPN 3. Then, the physical page PPN 1 is nullified because this physical page stored the previous write to that logical page.

Next, the file system requires a write operation first about a logical page page 2 of a data block DB 104. In this case, because the data block DB 104 includes an empty physical page PPN 3, the logical page page 2 is stored in the physical page PPN 3. The physical page PPN 2 is nullified because this physical page stored the previous write to that logical page.

Then, the file system requires a write operation first about a logical page page 0 of a data block DB 108. In this case, because the data block DB 108 includes an empty physical page PPN 3, the logical page page 0 is stored in the physical page PPN 3. The physical page PPN 0 is nullified because this physical page stored the previous write to that logical page.

Lastly, the file system requires a write operation first about the logical page page 0 of a data block DB 104. In this case, because the data block DB 104 does not include any empty physical page, the log block LB 200 is allocated to the data block DB 104. Moreover, the logical page page 0 is stored in a physical page PPN 0 of the log block. The physical page PPN 0 of the data block DB 104 is nullified because this physical page stored the previous write to that logical page.

In a case of random write according to this embodiment, an empty physical page in the data block is used first, and if there is no empty physical page, a log block is allocated to the data block. Through the same method, the number of merge operations can be reduced.

As mentioned above, a time required for a merge operation is usually several ten times longer than a time required for a page copy operation. The number of merge operations when the data block includes one empty physical page is an half of the number of merge operations when there is no empty physical page. That is, the data block including one empty physical page performs only one merge operation while a general data block performs two merge operations. Accordingly, because the number of merge operations is reduced, memory system speed can be improved.

With the same reason, the number of merge operations when the data block includes the N number of empty physical pages is 1/N+1 of when there is no empty physical page. That is, the data block having the N number of empty physical pages performs only one merge operation while a typical data block performs the N+1 number of merge operations. Accordingly, because the N+1 number of merge operations is reduced, memory system speed is improved. In the embodiment of FIG. 20, the data block includes only one empty physical page but the present invention is not limited thereto. The data block according to the present invention may include the arbitrary number of empty physical pages.

Referring to FIG. 21, one log block is allocated to one data block. That is, with respect to one external logical block, two internal physical blocks (e.g., a data block DB 104 and a log block LB 200) are used. In this meaning, the hybrid mapping method of FIG. 21 may be called a 1:2 mapping method. According to the 1:2 mapping method, the log block LB 200 can record only page data included in the data block DB 104. However, scopes of the present invention are not limited thereto. According to the present invention, a plurality of log blocks can be allocated to one data block. That is, a 1:k mapping method can be applied. For example, all log blocks can be allocated to one data block. Additionally, it is assumed that the free blocks are three in this embodiment but it is apparent to those skilled in the art that scopes of the present invention are not limited thereto.

Figure 22:
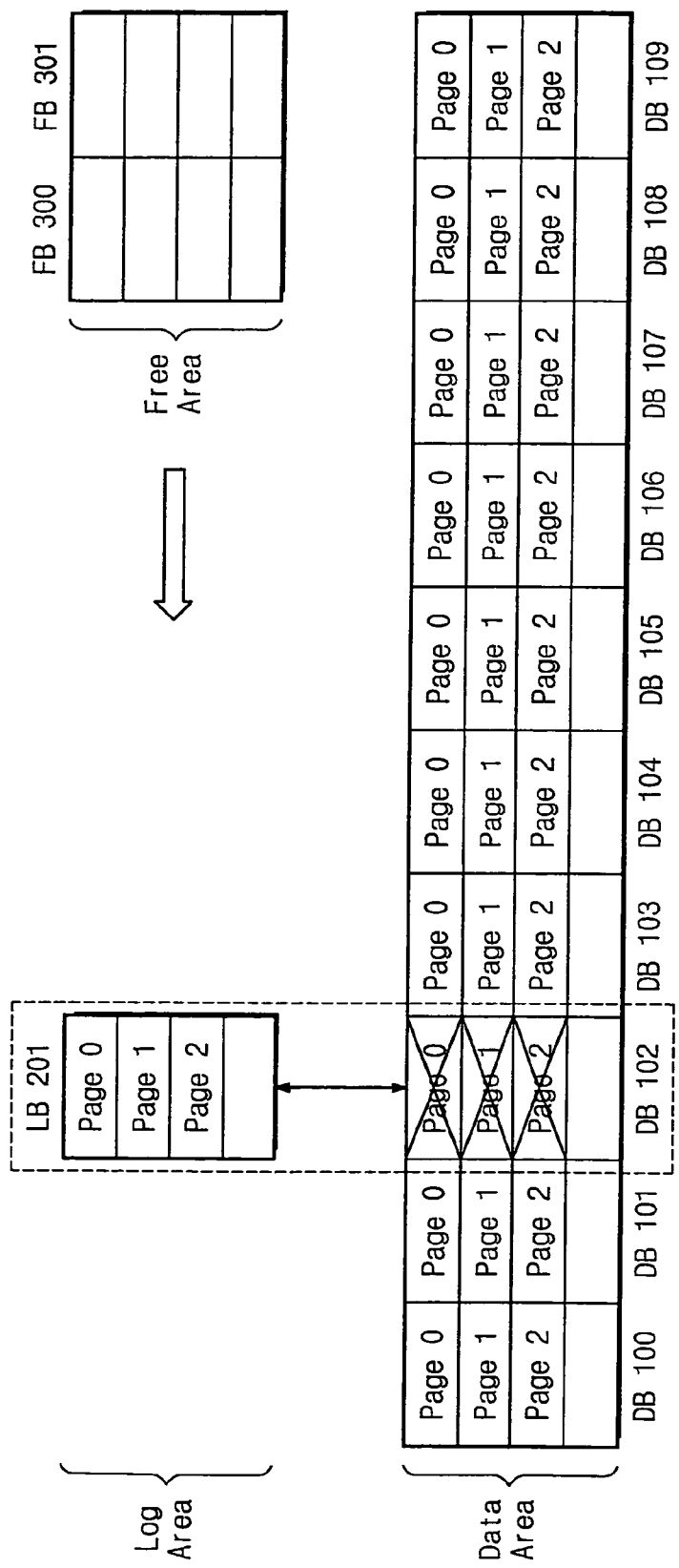
FIG. 22 is a view illustrating sequential write of FIG. 20.

FIG. 22 is a view illustrating the sequential write of FIG. 20. Referring to FIG. 22, a file system requests a write operation about logical pages page 0, page 1, and page 2 of a data block DB 102. In this case, a FTL recognizes that a data write pattern is sequential write. Accordingly, the FTL allocates the log block LB 201 to the data block DB 102 in response to a write request from the file system. The logical pages page 0, page 1, and page 2 of the data block DB 102 are respectively stored on physical pages PPN 0, PPN 1, and PPN 2 of the log block LB 201. Moreover, the physical pages PPN 0, PPN 1, and PPN 2 of the data block DB 102 are nullified because this physical page stored the previous write to that logical page.

As described above, if a data write operation is performed on one data block, a log block is allocated to a data block. Due to this method, sequential write performance can be improved.

As mentioned above, since the memory system according to the present invention uses an asymmetric mapping method, a page utilization rate of a log block can be increased. Additionally, since the present invention determines whether a log block is allocated or not according to a write data pattern, sequential write performance can be improved. Moreover, since the present invention has a high page utilization rate of a log block, the number of merge and block erase operations can be reduced compared to a typical method. Therefore, product durability can be enhanced.

However, if all the free blocks are allocated to the data block, they need to be obtained by a merge operation. As mentioned above, the free blocks can be obtained by merging data blocks with log blocks allocated thereto. However, which data block and log block are merged becomes an important issue. According to the embodiments of the present invention, data blocks and log blocks that allow merge operations to be performed without difficulties are preferentially selected for a merge operation.

Figure 23:
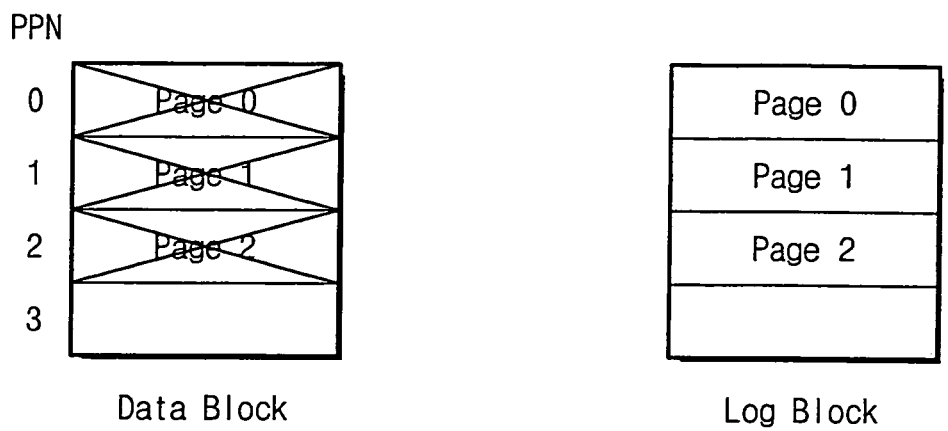
FIG. 23 is a view illustrating a case where all logical pages page 0, page 1, and page 2 in a data block are updated only once by a log block.

FIG. 23 is a view illustrating a case where all logical pages page 0, page 1, and page 2 in a data block are updated only once by a log block. Referring to FIG. 23, data stored in the log block are identical to data stored in the data block. Accordingly, a merge operation can be performed by converting a log block into a data block without a page copy operation. This merge operation is called swap merge.

Figure 24:
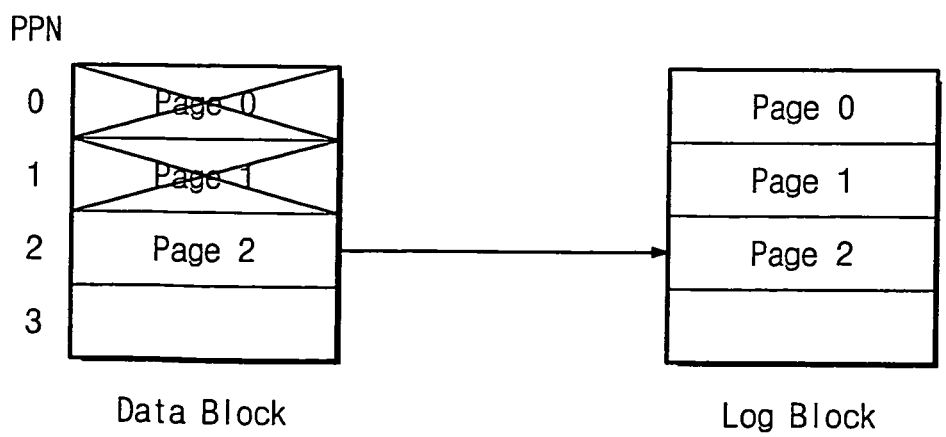
FIG. 24 is a view illustrating a case where partial logical pages in a data block are updated by a log block.

FIG. 24 is a view illustrating a case where partial logical pages in a data block are updated by a log block. Referring to FIG. 24, logical pages page 0 and page 1 of the data block are already updated. Accordingly, the logical page page 2 of the data block is stored in a physical page PPN 2 of the log block, and the log block is converted into a data block such that a merge operation can be performed. In this case, one page copy operation is performed during a merge operation. This merge operation is called a copy merge.

Figure 25:
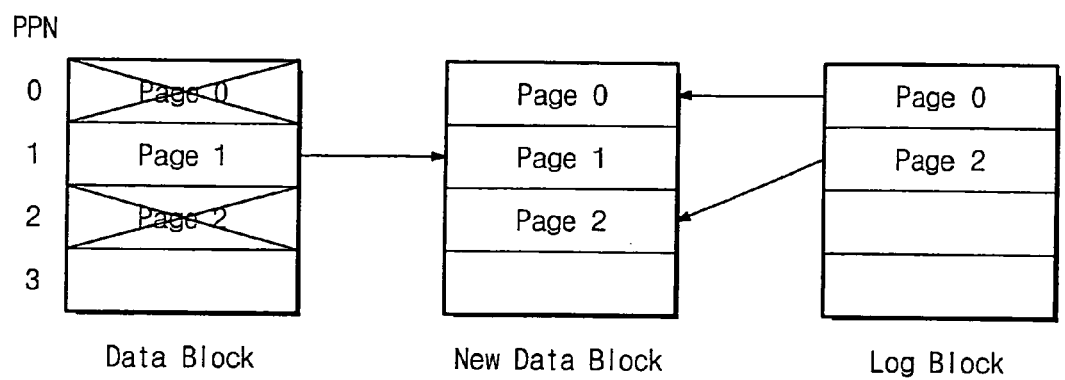
FIG. 25 is a view illustrating a case where partial logical pages in a data block are updated by a log block.

FIG. 25 is a view illustrating a case where partial logical pages in a data block are updated by a log block. Referring to FIG. 25, logical pages page 0 and page 2 are stored in a log block and a logical page page 1 is stored in an existing data block. Therefore, logical pages page 0, page 1, and page 2 are stored in a new data block, and the existing data block and the log block are erased and converted into a free block. In this case, three page copy operations are performed during merging. This merging is called simple merge.

According to the merge operations of FIGS. 23 through 25, the number of page copy operations differs. In the embodiments of the present invention, a merge operation requiring the minimum number of page copies is performed first.

Figure 26:
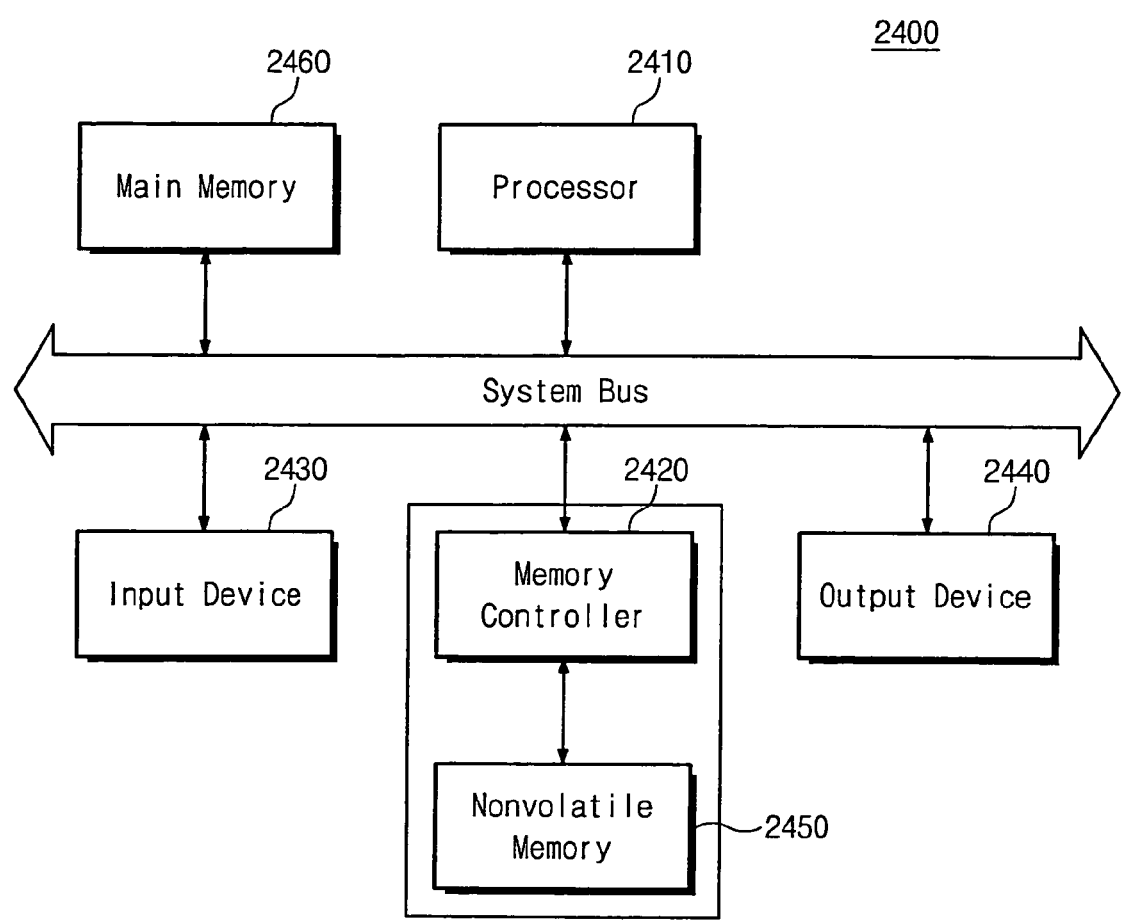
FIG. 26 is a block diagram illustrating a computing system with a flash memory device according to the present invention.

FIG. 26 is a block diagram illustrating a computing system 2400 with a flash memory device according to the present invention. Referring to FIG. 26, the computing system 2400 includes a processor 2410, a memory controller 2420, an input device 2430, an output device 2440, a nonvolatile memory 2450, and a main memory 2460. The solid line represents a system bus through which data or commands are transferred.

The memory controller 2420 and the nonvolatile memory 2450 may constitute a memory card. The processor 2410, the input device 2430, the output device 2440, and the main memory 2460 may constitute a host using a memory card as a memory device.

The computing system 2400 according to the present invention receives data from the outside through the input device 2430 (e.g., a keyboard, a camera, etc.). The inputted data may be a command by a user or multimedia data such as image data by a camera. The inputted data are stored in the nonvolatile memory 2450 or the main memory 2460.

A result processed by the processor 2410 is stored in the nonvolatile memory 2450 or the main memory 2460. The output device 2440 outputs the data stored in the nonvolatile memory 2450 or the main memory 2460. The output device 2440 outputs digital data in a human detectable form. For example, the output device 2440 includes a display or a speaker. An asymmetric mapping method according to the present invention will be applied to the nonvolatile memory 2450. As speed and durability of the nonvolatile memory 2450 are improved, speed and durability of the computing system 2400 will be improved proportional thereto.

The nonvolatile memory 2450 and/or the memory controller 2420 may be packaged using various forms of packages. For example, the nonvolatile memory 2450 and/or the controller memory 2420 may be loaded using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

Although not illustrated in the drawings, it is apparent to those skilled in the art that power supply is required to supply a power source necessary for operations of the computing system 2400. Moreover, if the computing system 2400 is a mobile device, a battery is additionally required to supply a power source to the computing system 2400.

Figure 27:
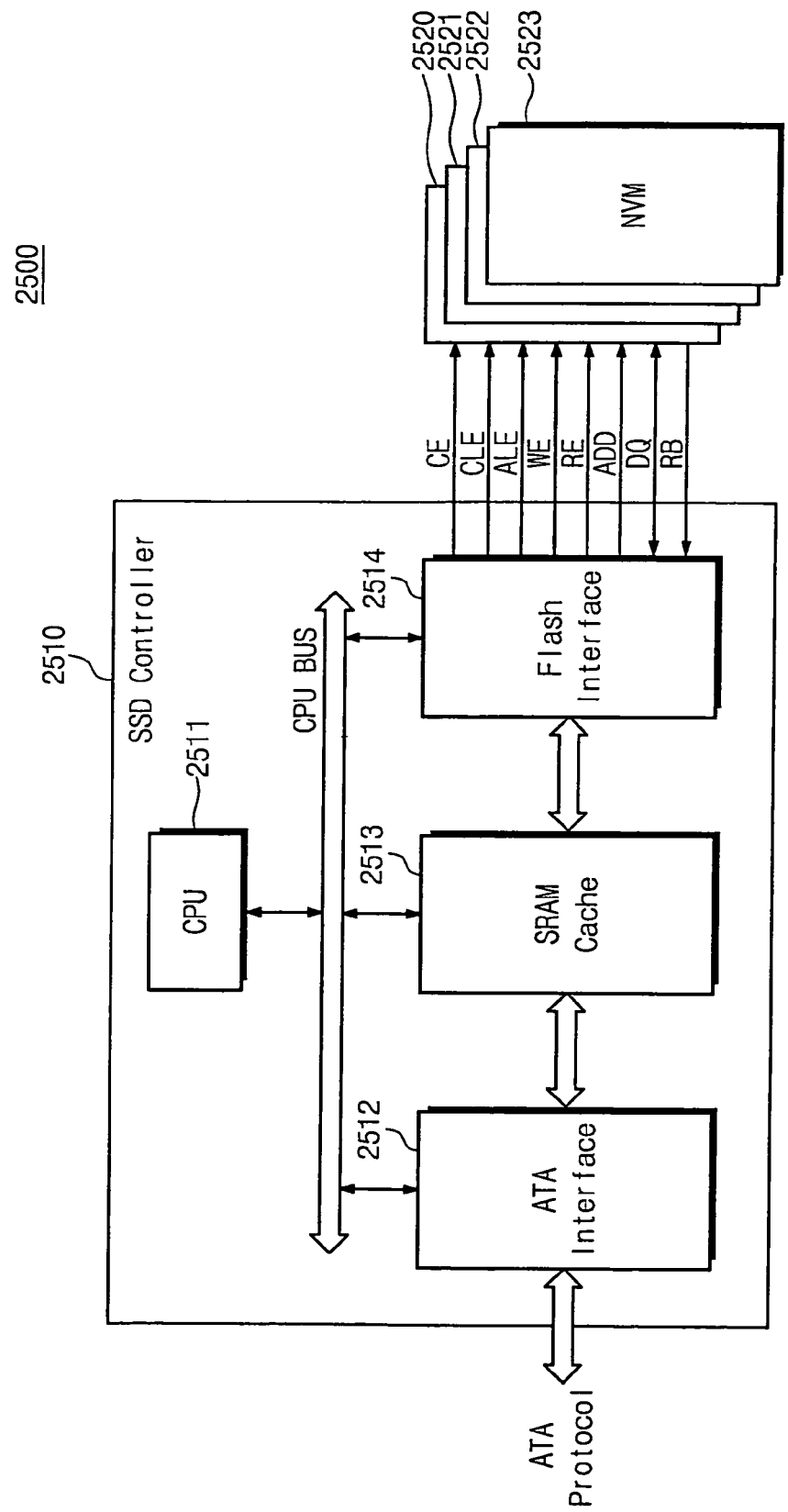
FIG. 27 is a block diagram illustrating a structure of a solid state disk (SSD) system according to the present invention.

FIG. 27 is a block diagram illustrating a structure of a solid state disk (SSD) system according to the present invention. Referring to FIG. 27, the SSD system 2500 includes a SSD controller 2510 and flash memories 2520 to 2523.

A semiconductor memory system according to the present invention may be applied to SSD. Recently, SSD used for replacing a hard disk drive (HDD) becomes popular and extensively used in the next generation memory market. SSD is a data storage device using memory chips such as a flash memory to store data instead of rotating platters in a typical HDD. SSD is more fast and physically strong to external impact and has lower power consumption compared to a mechanically operating HDD.

Referring to FIG. 27, a central processing unit (CPU) 2511 determines whether it stores data from the host in a flash memory or it reads the stored data from the flash memory to transmit it to the host after receiving a command from a host. The CPU 2511 transmits the data to the host. An ATA interface 2512 is used for exchanging data with the host according to a control of the CPU 2511. The ATA interface 2512 fetches a command and an address from the host and transmits it to the CPU 2511 through a CPU bus. Data inputted into the host through the ATA interface 2512 or data to be transmitted to the host are delivered through a SRAM cache 2513 not the CPU bus according to a control of the CPU 2511.

The SRAM cache 2513 temporarily stores transfer data between the host and the flash memories 2520 to 2523. Additionally, the SRAM cache 2513 is used for storing a program that will be operated by the CPU 2511. The SRAM cache 2513 may be regarded as a kind of a buffer memory, but does not need to necessarily include SRAM. A flash interface 2514 exchanges data with a non-volatile memory used as a storage device. The flash interface 2514 may be configured to support a NAND flash memory, a One-NAND flash memory, or a multi-level flash memory.

The semiconductor memory system according to the present invention may be used as a portable storage device. Accordingly, the semiconductor memory system may be used as a storage device of an MP3, a digital camera, a personal digital assistant (PDA), an e-book, etc. Additionally, the semiconductor memory system may be used as a storage device of a digital TV or a computer.

Figure 28:
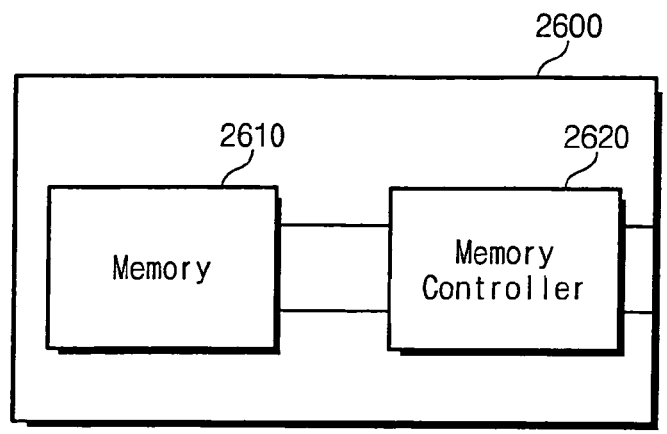
FIG. 28 is a block diagram of a memory system according to an embodiment of the present invention.

FIG. 28 is a block diagram of a memory system according to an embodiment of the present invention. In the memory system of FIG. 28, a memory 2610 and a memory controller 2620 constitute a card 2600. For example, the card 2600 may be identical to a flash memory card. That is, the card 2600 may satisfy a certain industry standard for electronic devices such as a digital camera, a personal computer, etc. It is understood that the memory controller 2620 controls the memory 2610 based on control signals received from other external devices.

Figure 29:
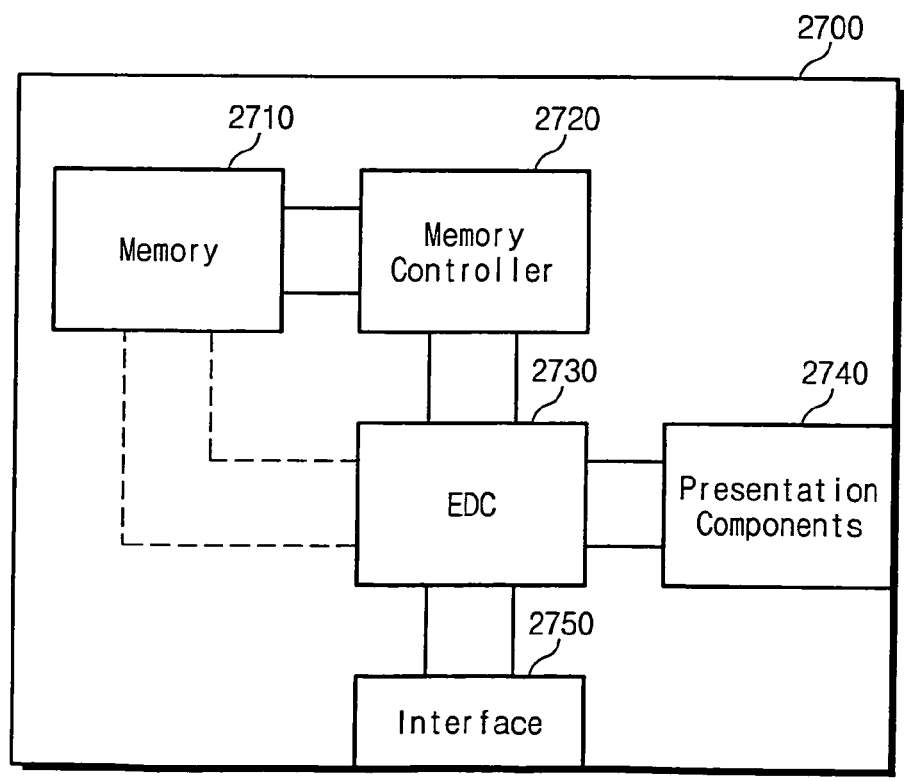
FIG. 29 is a block diagram of a memory system according to another embodiment of the present invention.

FIG. 29 is a block diagram of a memory system according to another embodiment of the present invention. The SSD system of FIG. 27 is a portable device 2700. The portable device 2700 may be an MP3 player, a video player, and a combination of video and audio players. As illustrated in FIG. 29, the portable device 2700 includes a memory 2710 and a memory controller 2720. The portable device 2700 may include an encoder and decoder (EDC) 2730, presentation components 2740, and an interface 2750.

Data (video, audio, etc.) processed by the EDC 2730 are inputted in to the memory 2710 through the memory controller 2720 and are outputted from the memory 2710. As illustrated through the dotted lines of FIG. 27, the data are directly inputted from the EDC 2730 into the memory 2710, and/or are directly outputted from the memory 2710 to the EDC 2730.

The EDC 2730 may encode data to store them in the memory 2710. For example, the EDC 2730 may perform MP3 encoding about audio data to store them in the memory 2710. In another method, the EDC 2730 may perform MPEG encoding (e.g., MPEG2, MPEG4, etc.) about video data to store them in the memory 2710. Additionally, the EDC 2730 may include a plurality of encoders for encoding other types of data based on other data formats. For example, the EDC 2730 may include an MP3 encoder for audio data and an MPEG encoder for video data.

The EDC 2730 decodes an output from the memory 2710. For example, the EDC 2730 may perform MP3 decoding about audio data outputted from the memory 2710. In another method, the EDC 2730 may perform MPEG decoding (e.g., MPEG2, MPEG4, etc.) about video data outputted from the memory 2710. Moreover, the EDC 2730 may include a plurality of decoders for decoding other types of data according to other data formats. For example, the EDC 2730 may include an MP3 decoder for audio data and an MPEG decoder for video data.

It is understood that the EDC 2730 includes only decoders. For example, the already encoded data may be received by the EDC 2730 and may be transferred to the memory controller 2720 and/or memory 2710. Moreover, the EDC 2730 may be realized with software through a general purpose processor (not shown) and then used.

The EDC 2730 receives data for encoding through the interface 2750 or already encoded data. The interface 2750 may comply with a well-known standard (e.g., firmware, USB, etc.). The interface 2750 may include at least one interface. For example, the interface 2750 may includes a firmware interface, a USB interface, etc. The data from the memory 2710 may be outputted through the interface 750.

The presentation components 2740 may display data to a user, which are outputted from the memory and/or decoded by the EDC 2730. For example, the presentation components 2740 may include a speaker jack for outputting audio data and a display screen for outputting video data.

A flash memory system according to a second embodiment of the present invention may achieve speed-up by means of at least one free page in a data block. In addition, the flash memory system according to the second embodiment of the present invention may achieve high data reliability by means of a temperature sensor as well as the free page. A flash memory system including a temperature sensor will be described in detail in fourth embodiment.

The flash memory system according to the second embodiment of the present invention may achieve high performance by ensuring reliability of LSB data as well as the free page. A flash memory system ensuring reliability of LSB data will be described in detail in fifth embodiment.

The flash memory system according to the second embodiment of the present invention may achieve high data reliability by means of read count data or read history as well as the free page. A flash memory system achieving high data reliability by means of read count data or read history will be described in detail in sixth and seventh embodiments, respectively.

The flash memory system according to the second embodiment of the present invention may achieve speed-up by means of the free page and high data reliability by means of various manners which will be described below in detail. Performance of the flash memory system according to the second embodiment of the present invention may be improved through achievement of speed-up and high data reliability.

Embodiment 3

Flash Memory System Using Microcode

A memory controller is designed using Hard-wired Logic to control all of the instruction sequences of a flash memory, in a way to enhance its performance. The memory controller designed with the Hard-wired Logic is complicated, has low extension ability, and is difficult to manage a plurality of flash memory effectively.

On the other hand, one way to increase extension ability of the memory controller is to control all of the instruction sequences of the flash memory via firmware. The designing of the memory controller according to this method may be easily done but this provides low capability. Therefore, ways to solve disadvantages of the above described two methods are required. In other words, a flash memory controller capable of extending easily with a high capability is in demand. Also, single-product memory, for example, the NAND flash memory is controlled by a CPU of a host. Products, for example, an SD card and MMC card include memory controllers inside.

Figure 30:
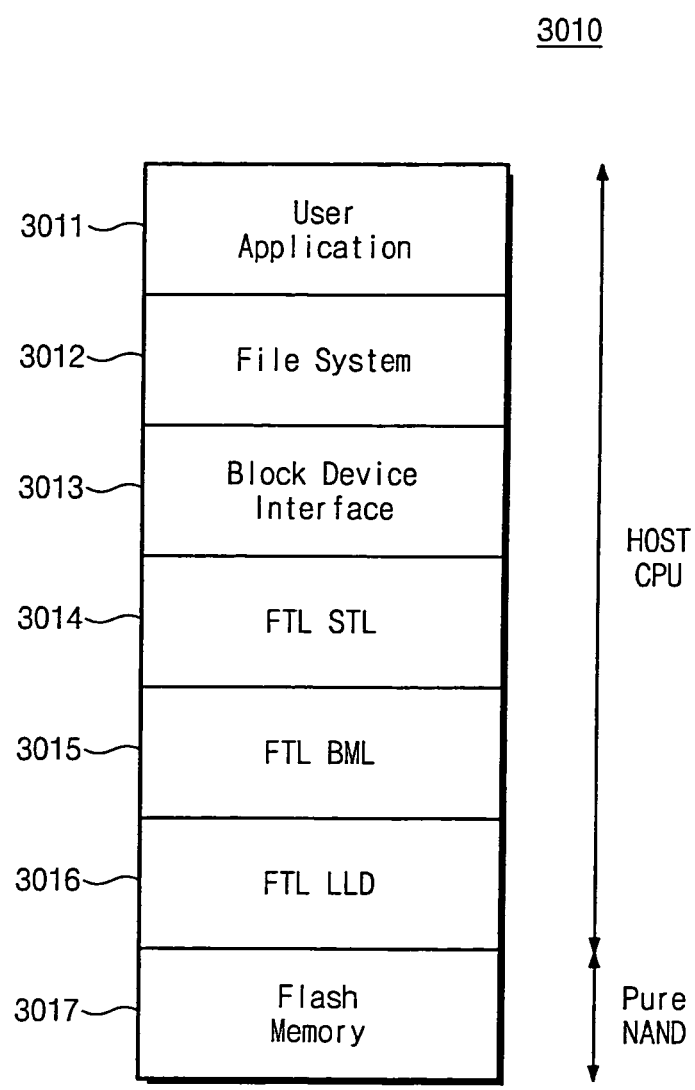
FIG. 30 depicts a system layer structure of a Pure-NAND memory.
Figure 31:
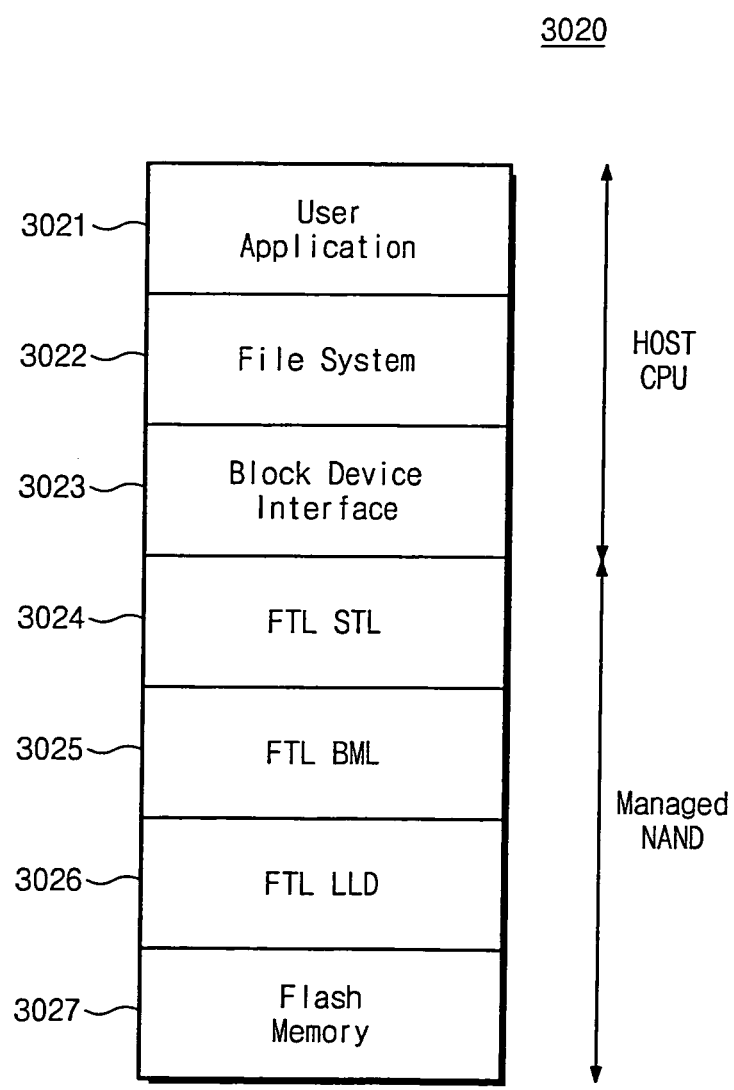
FIG. 31 is a system layer structure of a system layer structure of a Managed-NAND memory.

FIG. 30 and FIG. 31 illustrate a system layer structure for controlling a typical flash memory device.

FIG. 30 is an exemplary embodiment illustrating a system layer structure of a Pure-NAND memory, and FIG. 31 is an exemplary embodiment illustrating a system layer structure of a managed NAND memory. A Pure-NAND memory is a single-product memory, for example, NAND or OneNAND. The Pure-NAND is controlled by an external processor (i.e. CPU of a host). A relatively complicated processor, for example, ARM926 or ARM1136 is used for the external processor. A Managed-NAND is a flash memory, for example, SD, MMC, LBA NAND flash. The Managed-NAND is controlled by an internal memory controller in the flash memory. For the NAND memory controller inside the flash memory, a relatively simple processor, for example, ARM7TDMI is used.

Referring to FIG. 30, a system layer structure 3010 of the Pure-NAND includes a user application 3011, a file system 3012, a block device interface 3013, flash translation layers FTLs 3014 to 3016, and a flash memory 3017. The user application 3011 is a utility driven in the file system 3012. The user application 3011 may receive a download of contents by using a high speed downlink packet access (HSDPA), which is a third-generation mobile communication technology. The user application 3011 is driven by a host processor, for example, ARM11 or ARM9. The file system 3012 is a rule designed for reading and writing data in the flash memory 3017. Some examples of the file system 3012 are FAT16, FAT32 and NTFS which are operated in DOS or Windows, and ext2, raiserFS, and ext3 operated in Linux. A block device interface 3013 connects the file system 3012 and FTLs 3014 to 3016. The flash translation layers 3014 to 3016 include a sector translation layer, a block management layer and a low level device driver. The FTLs 3014 to 3016 control the physical flash memory 3017 so as to be used in the file system 3012. For the Pure-NAND, the CPU of the host controls the flash memory 3017 directly.

Referring to FIG. 31, a Managed-NAND system layer structure 3020 includes a user application 3021, a file system 3022, a block device interface 3023, flash translation layers 3024 to 3026, and a flash memory 3027. For the Managed-NAND, the CPU of the host controls the user application 3021, file system 3022 and the block device interface 3023, and the Managed-NAND directly controls the FTLs 3024 to 3026 and flash memory 3027. The FTL of the Pure-NAND is operated complicatedly and effectively, based on high computation performance and abundant memory (RAM) resource of the CPU of the host. However, the CPU of the host consumes a large amount of resource (i.e. the load and memory of the CPU) to operate the FTL. In other words, a write performance in the file system is highly reliable on the resource of the CPU, which may be allotted so as to perform FTL. Accordingly, in a multi-tasking condition, in case the CPU resource is given to a task having a higher priority than the task requiring a FTL performance, the write performance deteriorates rapidly.

On the other hand, for the Managed-NAND, a write performance higher than a predetermined value is ensured because it uses an internal processor exclusive for the FTL. However, the cost increases as each of the flash memories includes a controller. Also, as the Managed-NAND performs a simpler FTL with a simpler internal processor and less RAM resources, it includes a merge operation less effective than a Pure-NAND. Therefore, it is difficult to optimize the write performance in the file system for the Managed-NAND.

Figure 32:
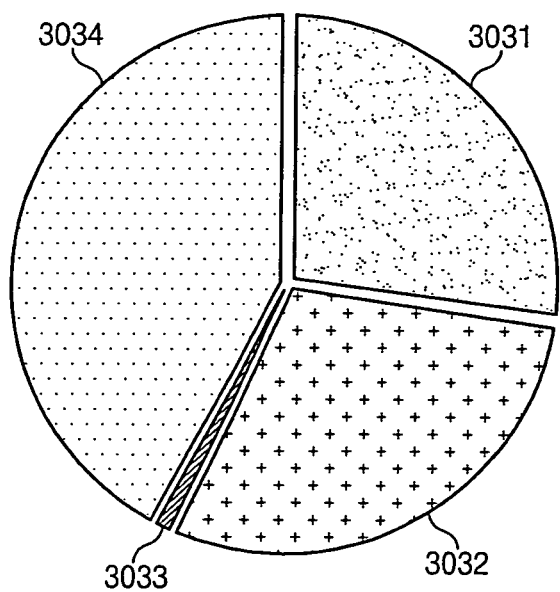
FIG. 32 depicts a chart illustrating proportions of execution time of the basic operations for each of the NAND flash memories.

FIG. 32 is a chart illustrating proportions of execution time of the basic operations for each of the NAND flash memories. Referring to FIG. 32, the most frequently used operations are "other operations" ETC 3034 among the basic operation of the NAND flash memory. The "other operations" are operations other than a write operation, a read operation and a copy operation. Examples of the "other operations" are an erase operation and an erase-verify operation. Other than the "other operations", the next mostly used operation among the basic operation of the NAND flash memory is a write operation 3031. The next mostly used operation is a copy operation 3032, then the next most used operation is the read operation 3033. For the Managed-NAND, the basic operation of the flash memory does not affect the load of the host CPU. On the other hand, for the Pure-NAND, the basic operation of the flash memory operation affects greatly the load of the host CPU.

Therefore, the memory system according to an exemplary embodiment of the present invention includes an accelerator that controls only the most frequently used operations among the basic operations of the NAND flash memory to decrease overload of the host CPU. The accelerator according to an exemplary embodiment of the present invention is described in detail with regard to FIG. 35. The memory system according to the exemplary embodiment of the present invention includes an accelerator that controls write operation and copy operation of the basic operation of the NAND flash memory. An overwrite operation cannot be performed in a flash memory device. Accordingly, the flash memory device performs a merge operation instead of an overwrite operation.

Figure 33:
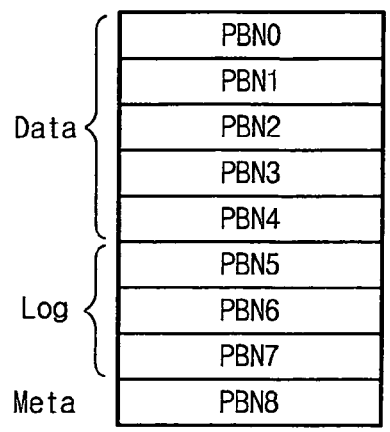
FIG. 33 and FIG. 34 depict merge operation according to log mapping.

Merge operations of a flash memory device, complying with the log mapping is described in detail with reference to FIG. 33 and FIG. 34. Referring to FIG. 33, the flash memory of a data storage device is divided into a data area, log area and a meta area.

According to the log mapping, memory blocks in the log area are designated to a portion of memory blocks of the memory blocks in the data area, respectively. For example, it is assumed that the flash memory includes 9 memory blocks PBN0 to PBN8. Among the 9 memory blocks, the memory blocks PBN0 to PBN4 are designated as data area, the memory blocks PBN5 to PBN7 as log area, and the memory block PBN8 as meta area, respectively. The memory block PBN7 of the log area is designated as a blank block. For the purpose of explanation assume the following occurs: In case data is to be written into the memory block PBN0 of the data area, the data is not written directly into the memory block PBN0, but is written into the memory block PBN5 of the log area corresponding to the memory block PBN0. In case data is to be written into the memory block PBN1, merge operation is performed as below since the memory block of the log area corresponding to the memory block PBN1 is not designated. In case there is a memory block PBN7 in the log area, a valid data stored in the memory block PBN5 of the log area is copied into the blank memory block PBN7. In addition, the valid data stored in the memory block PBN0 of the data area corresponding to the memory block PBN5 is copied into the memory block PBN7.

On the other hand, the mapping information of the memory block according to merge operation may be varied, the varied mapping information is managed by the FTL and is stored in the meta area PBN8 of the flash memory.

Figure 34:
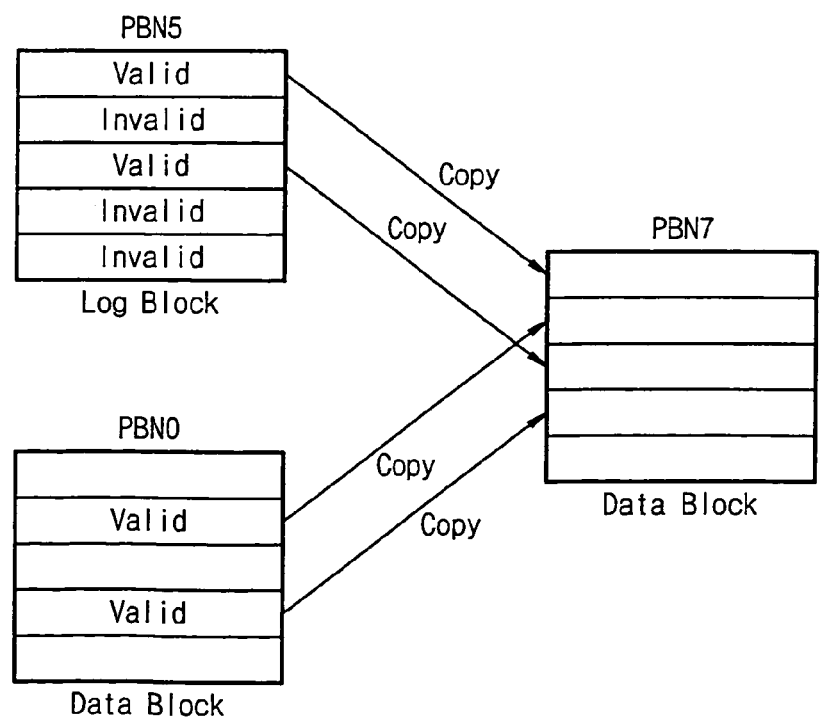

FIG. 34 illustrates merge operations according to log mapping. Referring to FIG. 34, valid pages of the log block PBN5 and data block PBN0 are copied into a new data block PBN7. Here, as the log block PBN5 is the most recently written data it is possible that it is the data the user wishes to be written, but the data written in the data block PBN0 is already erased, i.e., it may be an invalid data. In this case, the FTL cannot determine whether the data written in the data block PBN0 is valid or invalid. In other words, the valid pages of the data block PBN0 may be a valid page for the FTL, but it may be an invalid page for the file system. For example, if the file written in the second valid page of the data block PBN0 is an already erased data in the point of view of the file system, a merge operation of the corresponding page may be an unnecessary operation in the point of view of the file system. As the merge operation is an operation performed by need of the FTL, the host is unable to detect whether the merge operation is performed. Therefore, as the Managed-NAND is controlled by the included processor without being controlled by the host CPU, it performs an inefficient merge operation.

Figure 35:
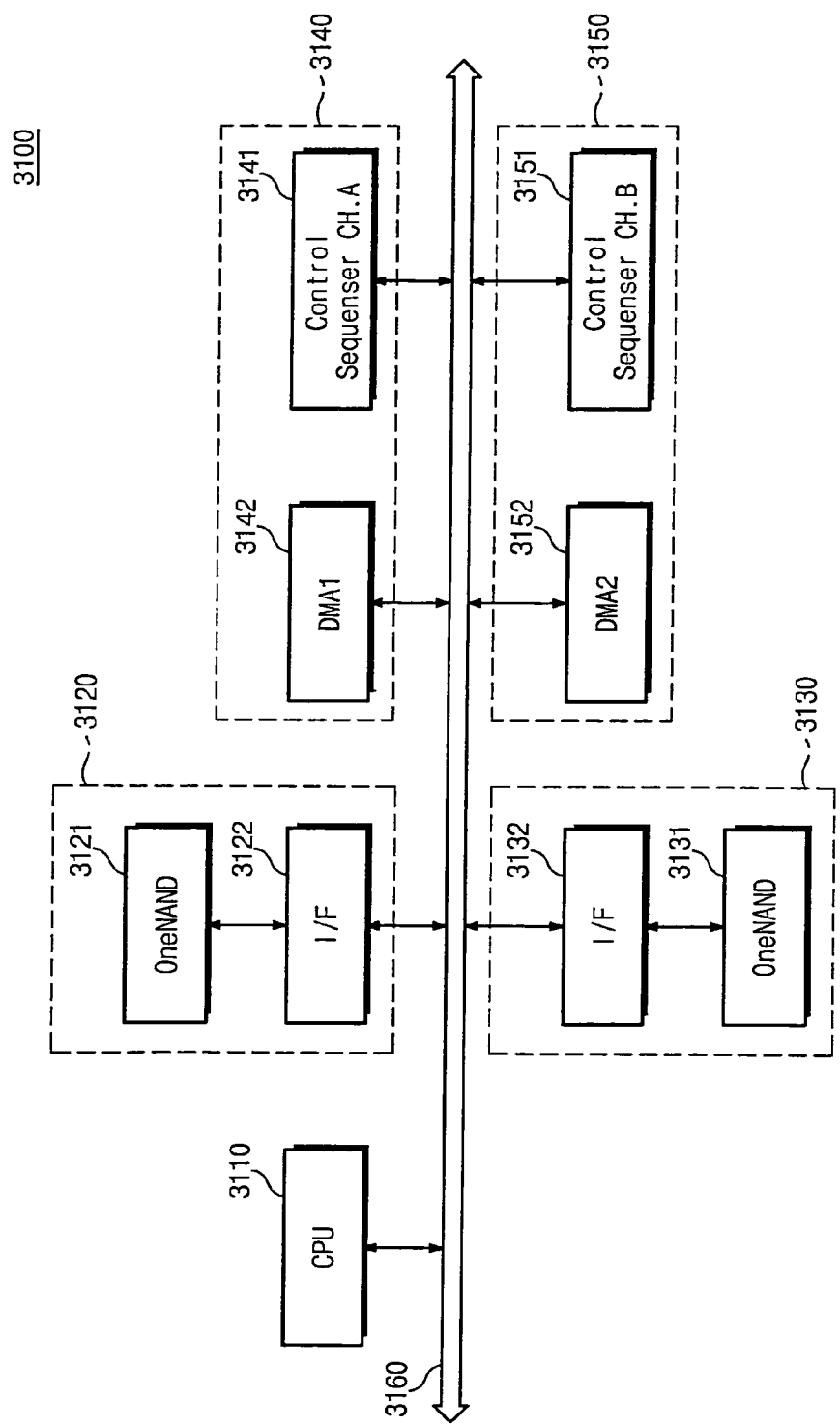
FIG. 35 depicts a block diagram of the memory system according to an exemplary embodiment of the present invention.

FIG. 35 is a block diagram of the memory system according to an exemplary embodiment of the present invention.

Referring to FIG. 35, the memory system 3100 according to the present invention includes a host processor 3110, a first memory device 3120 and a second memory device 3130, a first accelerator 3140 and second accelerator 3150, and a system bus 3160. The first memory device 3120 includes a first One-NAND flash memory 3121 and a first interface 3122. The second memory device 3130 includes a second One-NAND flash memory 3131 and a second interface 3132. The first accelerator 3140 includes a control sequencer Ch. A 3141 and a first DMA 3142. The second accelerator 3150 includes a control sequencer Ch. B 3151 and a second DMA 3152. Micro-codes are a plurality of instructions for controlling the memories, included in the first and second memory devices 3120 and 3130. The micro-codes comprise a plurality of instructions to control basic operations (for example, write, read, copy and erase operations) of the first and second memory devices 3120 and 3130. The micro-code according to the present invention further includes "Read&Load", "Read&Verify", "Write", "Wait For Event", and "END", as basic instructions, and "Read&Load&Index Increment", "Mov", "Add", "Sub", "Or", "And", "Shift Left", "Shift Right", "Swap", "Jump Backward", "Jump Backward If Equal", "Jump Backward If Not Equal", "Jump Forward", "Jump Forward If Equal", "Jump Forward If Not Equal", "Jump Backward & Link", "Jump Forward & Link", "Return" and "Block Memory Transfer". In addition, the accelerator according to the present invention performs functions of LLD_Copy, LLD_Write of the Low Level Device Driver (LLD) of the FTL by the micro-codes.

The host processor 3110 transfers the micro-codes to the control sequencer Ch. A 3141 and to the control sequencer Ch. B 3151 in the first and second accelerators 3140 and 3150 respectively via the system bus 3160. The micro-codes transferred by the host processor 3110 are retained in the code storage (not shown) in the control sequencers Ch. A and Ch. B 3141 and 3151. The micro-codes retained in the sequencer code storage are fetched and performed by the control sequencers Ch. A and Ch. B 3141 and 3151. The control sequencer Ch. A 3141 of the first accelerator 3140 performs the micro-codes. The first DMA 3142 reads data of the first One-NAND flash memory 3121, and transfers the read data to the host processor 3110 via the first interface 3122, in response to the performed micro-codes of the control sequencer Ch. A 3141. Operations of the second accelerator 3150 are the same as operations of the first accelerator 3140. In other words, the second accelerator 3150 controls basic operations of the second memory device 3130 by the micro-codes. An operation of the control sequencer Ch. B 3151 of the second accelerator 3150 is the same as the operation of the control sequencer 3141 of the first accelerator 3140. Accordingly, redundant description will be omitted here for brevity.

The memory system according to the present invention controls a plurality of memory devices mounted in the memory system using micro-codes. For that reason, it may decrease the load of the host processor 3110 in the memory system 3100.

Figure 36:
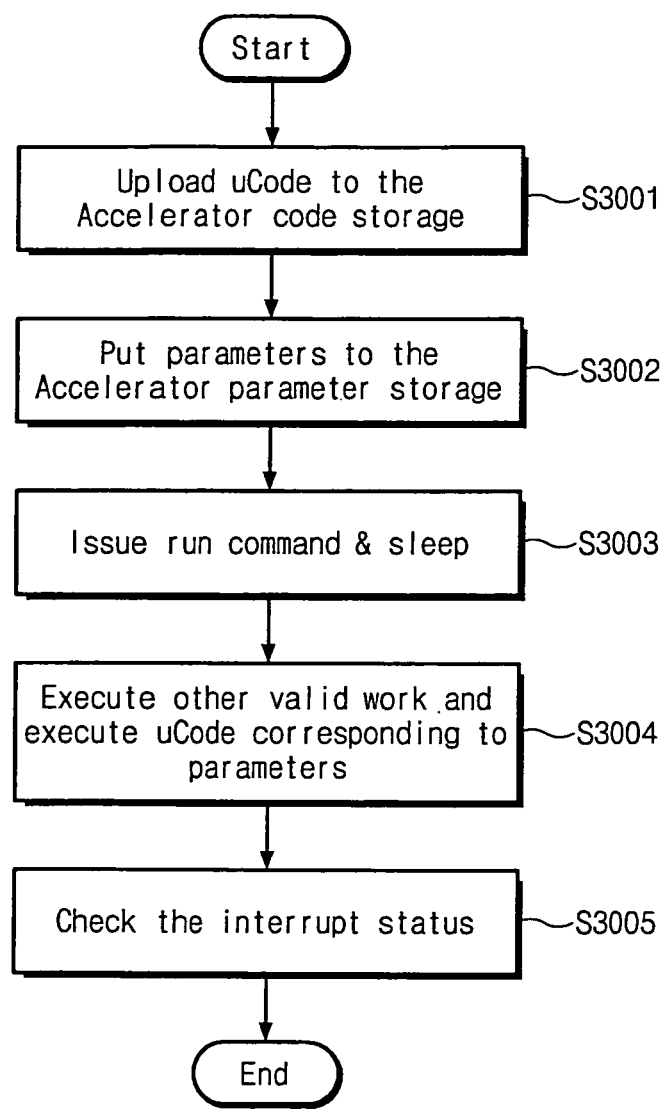
FIG. 36 depicts a flow chart illustrating a driving method of the memory system of FIG. 35.

FIG. 36 is a flow chart illustrating a driving method of the memory system of FIG. 35.

Referring to FIG. 35 and FIG. 36, the host CPU 3110 loads micro-codes in the code storage of the first and second accelerators 3140 and 3150 via the system bus 3160 (S3001). The host CPU 3110 loads parameter storages (not shown) of the first and second accelerators 3140 and 3150 via the system bus 3160 (S3002). The parameter includes a source address and a target address of the first and second memories 3121 and 3131. The host CPU 3110 issues drive instruction of the first and second accelerators 3140 and 3150, and maintains a sleep mode until interruptions occur from the first and second accelerators 3140 and 3150 (S3003). The first and second accelerators 3140 and 3150 perform the micro-codes corresponding to the parameter to generate an interruption (S3004). The first accelerator 3140 and the second accelerator 3150 check the interrupt status (S3005).

The present invention includes a flash memory accelerator in the Pure-NAND, to enhance write performance in a file system. In the memory system according to the present invention, tasks with a more complex computation and with more use of memory are performed by the host CPU, and tasks using less memory are performed by the accelerator. Accordingly, in the present invention, use of the host CPU required for merge and program operations during write operation of the FTL may be decreased. Also, the memory system according to the present invention decreases reliability of the write performance of the flash memory on the amount of resource of the presently available host CPU.

Figure 37:
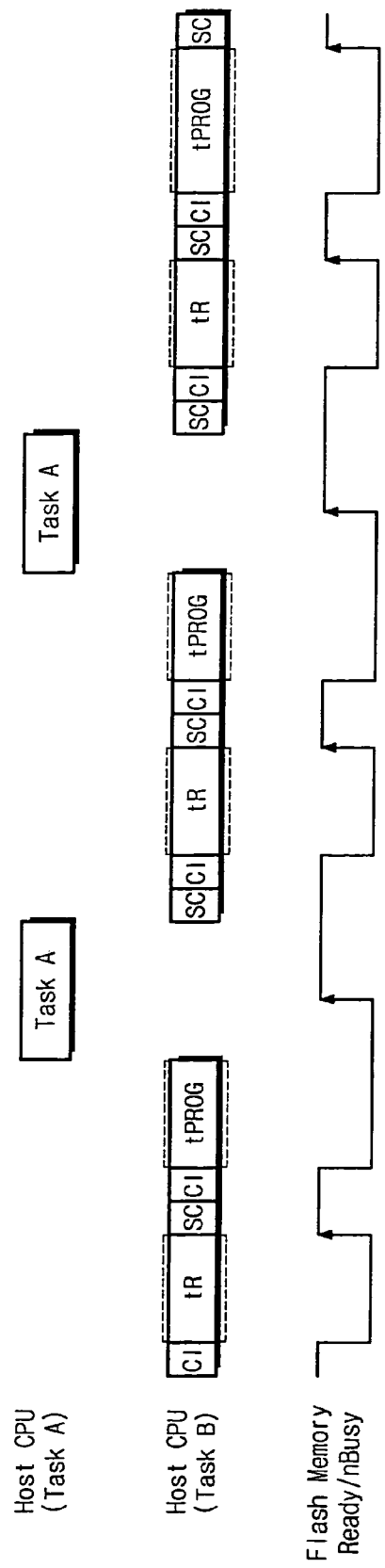
FIG. 37 depicts a timing diagram of operations of a host CPU in a Pure-NAND.

FIG. 37 is a timing diagram of operations of a host CPU in a Pure-NAND.

Referring to FIG. 37, CI denotes an issuing task of a flash memory instruction by a host CPU. SC denotes status checking of the flash memory by the host CPU. tR or tPROG are performing flash memory instruction by the host CPU. In other words, tR is a time period in which data is read from a memory cell and until data is transferred to a latch register, and tPROG is a programming time period in which data is written from a latch register to a memory cell.

A host CPU performs Task A and Task B in parallel. Task A is irrelevant to the basic operations of the flash memory, and Task B is for controlling the basic operations of the flash memory. The host CPU performs the Task A and Task B in time sharing system. In other words, the host CPU performs the Task B while performing the Task A.

Figure 38:
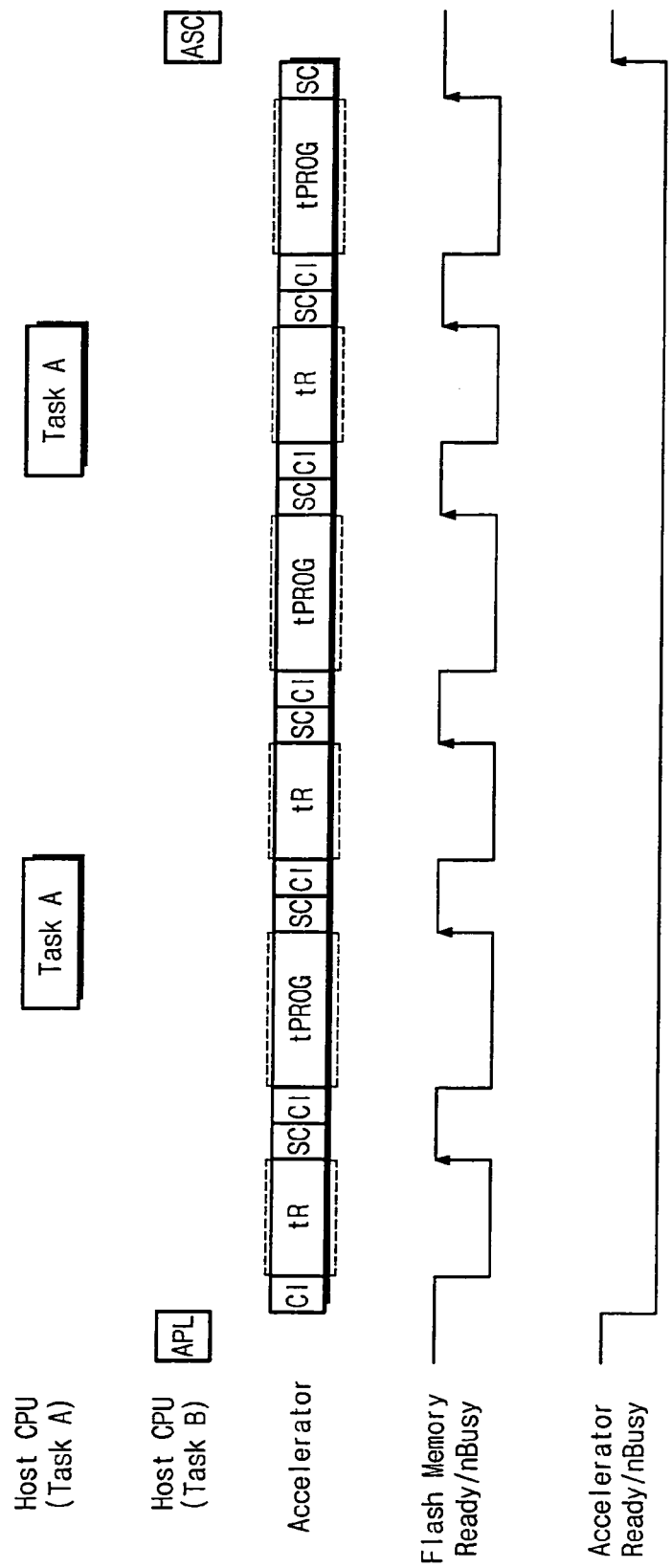
FIG. 38 depicts a timing diagram of the CPU and accelerator of FIG. 35.

FIG. 38 is a timing diagram of the CPU and accelerator of FIG. 35. Referring to FIG. 38, CI is an issue operation of the flash memory instruction by the accelerator, SC is a status checking of the flash memory by the accelerator, APL is a parameter loading operation of the accelerator, ASC is a status checking of the accelerator by the host CPU, and tR or tPROG are flash memory instruction busy-waiting operation by the accelerator. In other words, tR is a time period in which data is read from a memory cell and data is transferred to a latch register. tPROG is a programming time period in which data is written from the latch register to the memory cell.

The host CPU performs Task A and Task B in parallel. The Task A is an operation irrelevant to basic operation of the flash memory, and Task B is an operation for controlling the basic operation of the flash memory. The host CPU performs the Task A and Task B independently from each other. Thus, the present invention is able to decrease the load of the host CPU.

Figure 39:
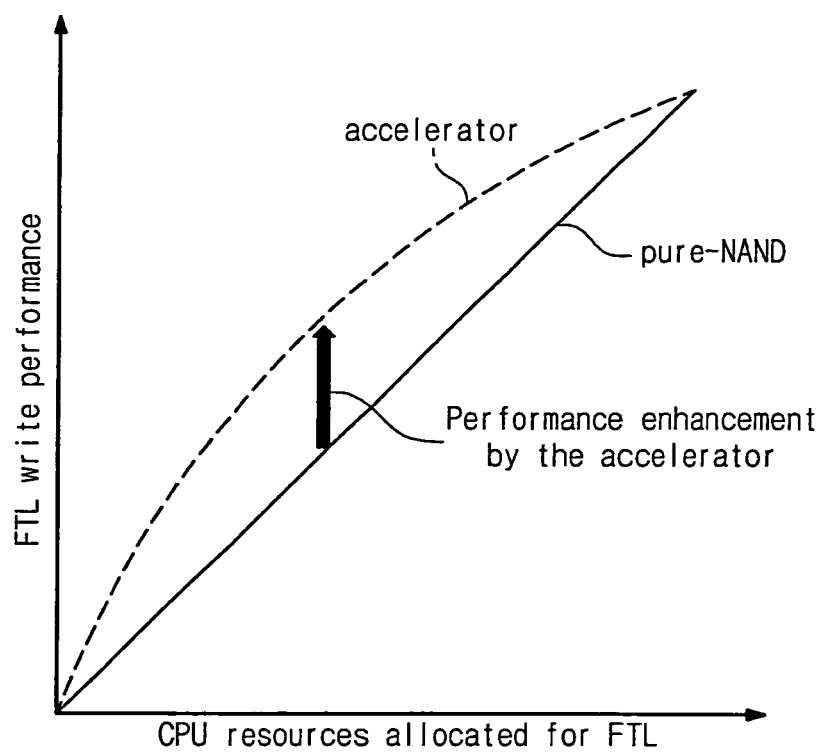
FIG. 39 depicts a graph comparing the operation performance between the FIG. 37 and FIG. 38.

FIG. 39 is a graph comparing the operation performance between the FIG. 37 and FIG. 38.

Referring to FIG. 37 to FIG. 39, the X-axis of the graph is an amount of resource allotted to the CPU for driving the FTL, and the Y-axis is a write performance of the FTL. In other words, the X-axis corresponds to a load of the host CPU, and the Y-axis corresponds to the operation performance. The solid line depicts the operation performance illustrated in FIG. 37. The dotted line depicts the operation performance illustrated in FIG. 38. In other words, when the amount of resource allotted to the CPU increases the solid line which is the operation performance of FIG. 37 increases arithmetically, and the dotted line which is the operation performance of FIG. 38 increases geometrically.

Figure 40:
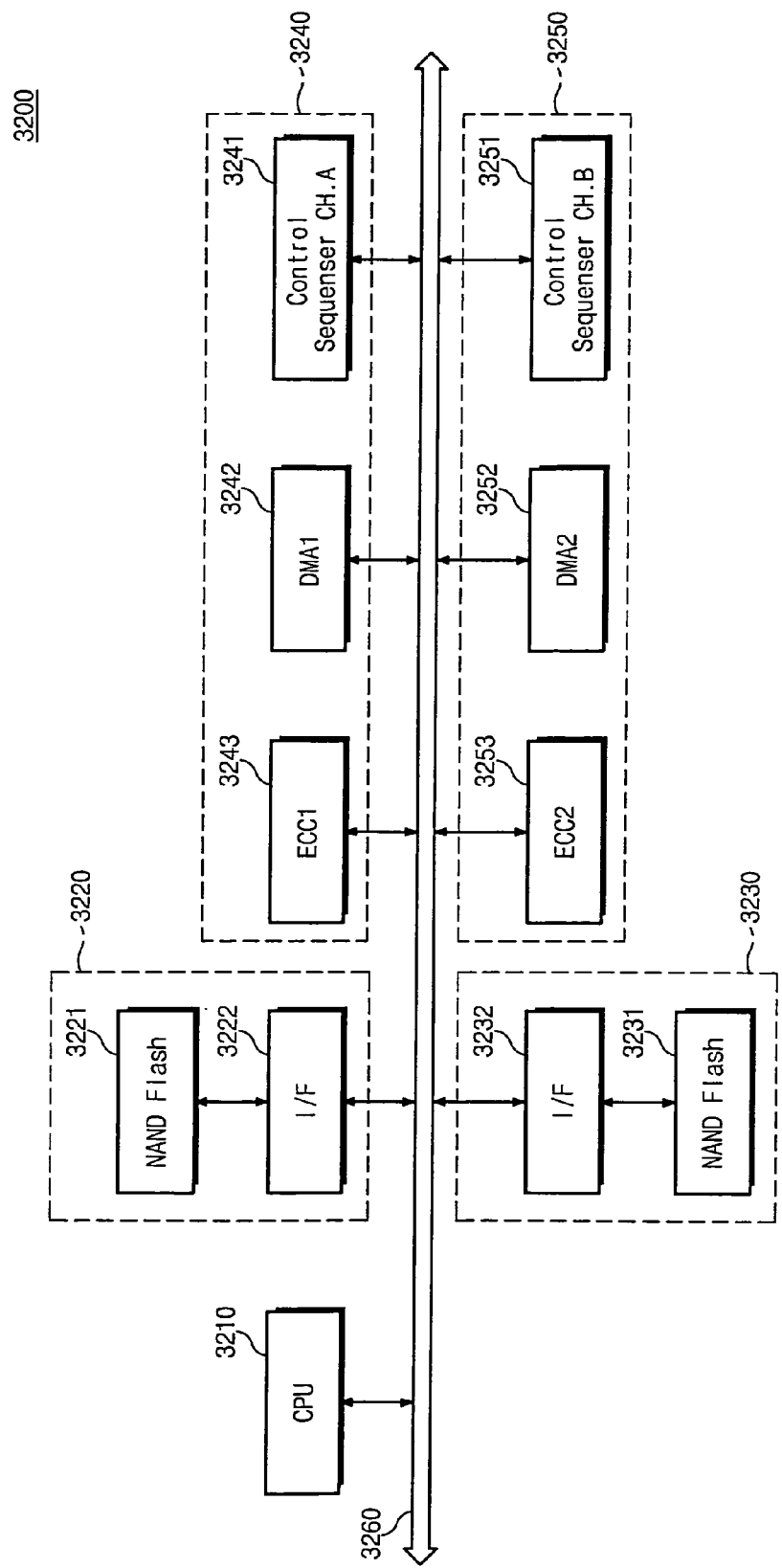
FIG. 40 depicts a block diagram illustrating a memory system according to another exemplary embodiment of the present invention.

FIG. 40 is a block diagram illustrating a memory system according to another exemplary embodiment of the present invention.

Referring to FIG. 40, a memory system 3200 according to the present invention includes a host processor 3210, a first memory device 3220 and a second memory device 3230, a first accelerator 3240 and a second accelerator 3250, and a system bus 3260. The first memory device 3220 includes a first NAND flash memory 3221, and a first interface 3222. The second memory device 3230 includes a second NAND flash memory 3231 and a second interface 3232. The first accelerator 3240 includes a control sequencer Ch. A 3241, a first DMA 3242, and a first error correction code block 3243. The second accelerator 3250 includes a control sequencer Ch. B 3251, a second DMA 3252, and a second error correction code block 3253.

Micro-codes are a plurality of instructions for controlling the memories, included in a first memory device 3220 and a second memory device 3230. The micro-codes comprises a plurality of instructions to control basic operations (for example, write, read, copy and erase operations) of the first and second memory devices 3220 and 3230. The host processor 3210 transfers the micro-codes to the control sequencers Ch. A and Ch. B 3241 and 3251 in the first and second accelerators 3240 and 3250 via the system bus 3260. The transferred micro-codes via the host processor 3210 are stored in a code storage (not shown) of the control sequencers Ch. A and Ch. B 3241 and 3251. The micro-codes stored in the sequencer code storage is fetched and performed accordingly by the control sequencers Ch. A and Ch. B 3241 and 3251.

A first error correction code block 3243 corrects error of the data in the first NAND flash memory 3221. The first device DMA 3242 reads the data in the first NAND flash memory 3221 via the first interface 3222 in response to the micro-codes performed by the control sequencer Ch. A 3241, and transfers the data corrected by the first error correction code block 3243 to the host processor 3210. The operation of the second accelerator 3250 is identical with the operation of the first accelerator 3240. In other words, the second accelerator 3250 controls the basic operation of the second memory device 3230 using the micro-codes.

Figure 41:
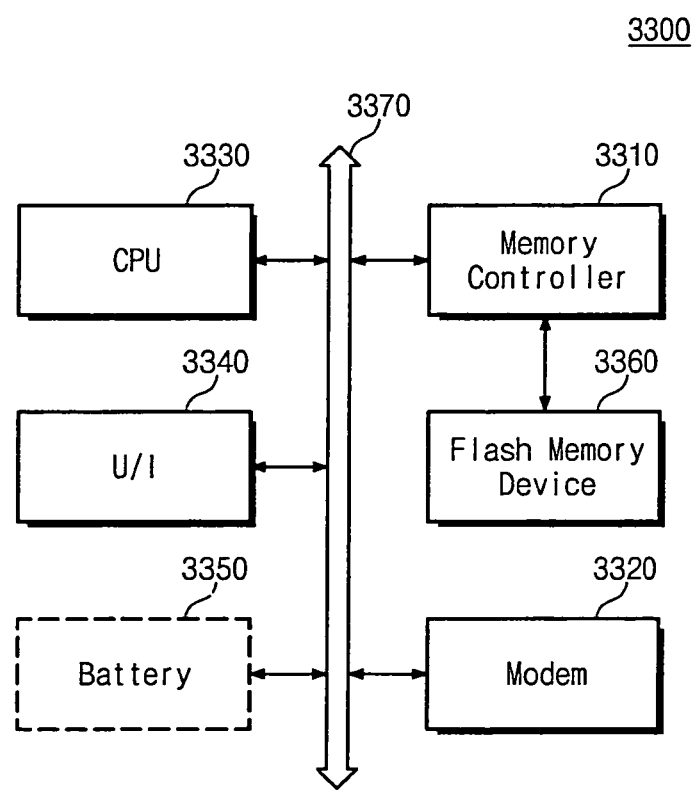
FIG. 41 depicts a computer system including the memory system of the present invention.

The flash memory device is a nonvolatile memory device that is capable of retaining stored data even when power is cut off. As mobile devices, for example, cellular phones, PDA, digital cameras, portable game consoles, and MP3P are being used more, the flash memory device is used more widely as a code storage as well as a data storage. The flash memory device may also be applied to home applications, for example, HDTV, DVD, router and GPS. A computer system including the memory system of the present invention is depicted briefly in FIG. 41. The computing system 3300 of the present invention includes a CPU 3330 connected electrically to a system bus 3700, a user interface 3340, a modem 3320 for example a baseband chipset, a memory controller 3310 and a flash memory device 3360. The memory controller 3310 controls the flash memory device 3360. In the flash memory device 3360, an N-bit data (N is a positive number higher than or equal to 1) processed or to be processed by the CPU 3330, is to be stored by the memory controller 3310. In case the computing system according to the present invention is a mobile device, a battery 3350 for supplying operation voltage of the computing system is further provided. Although not shown in drawing, it will be obvious to a person in the art that the computing system of the present invention may further include an application chipset, a camera image processor (CIS), or a mobile DRAM. The memory controller 3310 and the flash memory device 3360, for example, may further include a solid state drive/disk (SSD) using a nonvolatile memory, to store data. An example of SSD is described in the U.S. Patent No. 2006-0152981 which is hereby incorporated by reference in its entirety. Also, the memory controller 3310 and the flash memory device 3360 may include the nonvolatile memory in the memory card, to store data.

Figure 42:
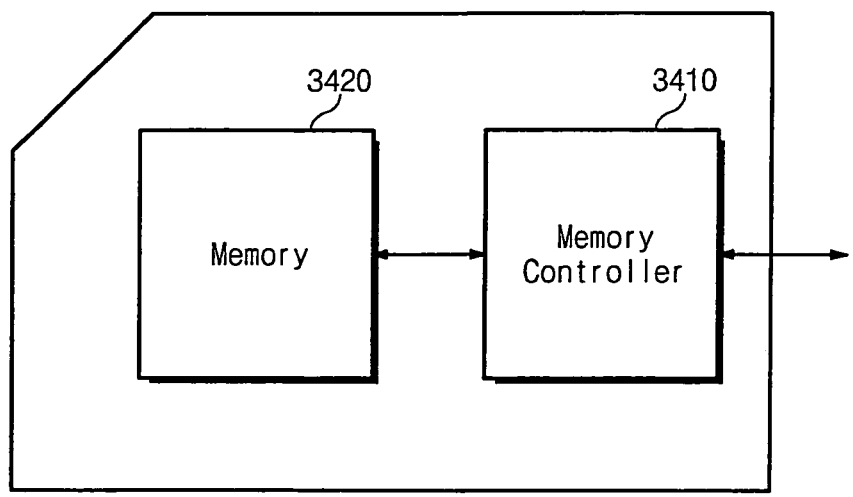
FIG. 42 is a block diagram depicting memory-based storage device according to other exemplary embodiment of the present invention.

FIG. 42 is a block diagram illustrating memory-based storage device according to other exemplary embodiment of the present invention.

The memory-based storage device 3400 depicted in FIG. 42 is configured so that the memory 3420 and the memory controller 3410 constitute a memory card. The memory-based storage device 3400 may be a memory card, for example, a flash memory card. In other words, the memory-based storage device 3400 may be a memory card that conforms to an industrial standard so as to use an electronic device, for example, a personal computer. The memory controller 3410 may control the memory 3420 based on control signals received from another device (e.g. an external device) by the memory-based storage device 3400.

A flash memory system according to a third embodiment of the present invention may achieve speed-up by means of a microcode. In addition, the flash memory system according to the third embodiment of the present invention may achieve high data reliability by means of a temperature sensor as well as the microcode. A flash memory system including a temperature sensor will be described in detail in fourth embodiment.

The flash memory system according to the third embodiment of the present invention may achieve high performance by ensuring reliability of LSB data as well as the microcode. A flash memory system ensuring reliability of LSB data will be described in detail in fifth embodiment.

The flash memory system according to the third embodiment of the present invention may achieve high data reliability by means of read count data or read history as well as the microcode. A flash memory system achieving high data reliability by means of read count data or read history will be described in detail in sixth and seventh embodiments, respectively.

The flash memory system according to the third embodiment of the present invention may achieve speed-up by means of the microcode and high data reliability by means of various manners which will be described below in detail. Performance of the flash memory system according to the third embodiment of the present invention may be improved through achievement of speed-up and high data reliability.

II. Data Reliability of Flash Memory System

Embodiment 4

Flash Memory System Including Temperature Sensor

Generally, a memory system includes a semiconductor memory for storing data and a memory controller for controlling an operation of the semiconductor memory. The semiconductor memory devices are classified into volatile memories such as DRAM, SRAM, and so on, and nonvolatile memories such as EEPROM, FRAM, PRAM, MRAM, flash memory, and so on. The volatile memory loses its data when power is interrupted, but the nonvolatile memory reserves its data even if power is interrupted. Among the nonvolatile memories, the flash memory is widely used as a data storage media on the merits of high programming speed, low power consumption, large-capacity data storage, and so forth.

The flash memory has pluralities of memory cells for storing data. Each memory cell stores single bit data or multi-bit data. A memory cell storing single bit data has two levels (or states) by threshold voltage distributions. A memory cell storing multi-bit data has four or more levels (or states) by threshold voltage distributions.

The flash memory programs data therein with predetermined margins between levels (or states). This is for the purpose of preventing data from read fails when a threshold voltage distribution of memory cells is changes by external environment. Generally, a threshold voltage of memory cell would be changed by external environment such as temperature, humidity, pressure, electromagnetic power. For example, the threshold voltage may be changed when programming the flash memory cell under high and low temperature or when reading the flash memory cell under high and low temperature.

As such, a memory cell of the flash memory may have threshold voltages varying based on external temperature. This temperature property of the flash memory cell would be more problematic when storing multi-bit data in a memory cell. As more bits are stored in a single memory cell, a read margin becomes smaller. With a smaller read margin, if a threshold voltage of memory cell is changed, it further raises a probability of generating a read fail.

Figure 43:
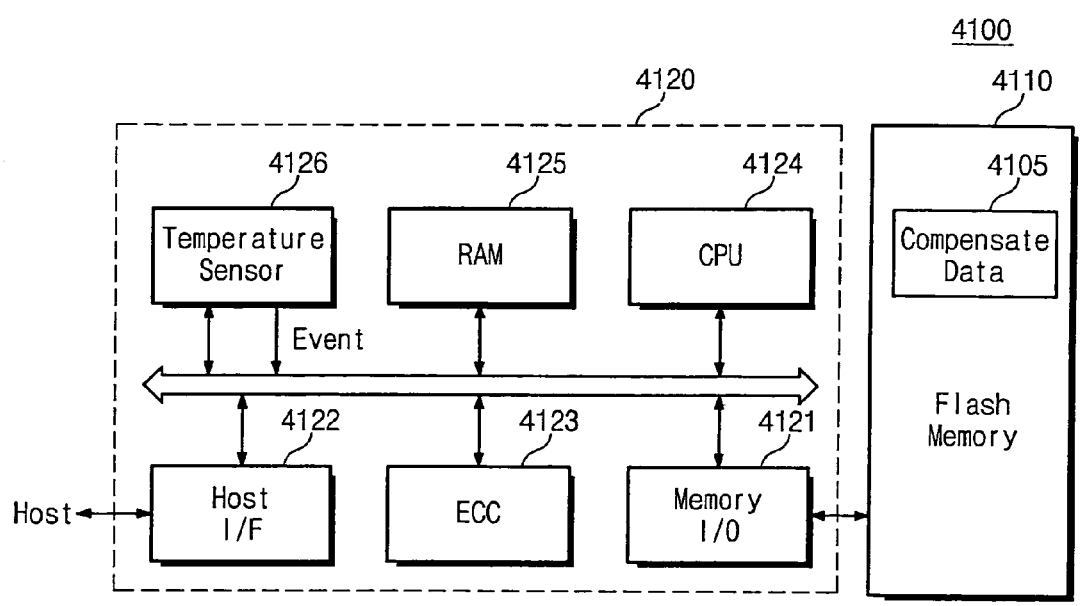
FIG. 43 is a block diagram exemplarily showing an embodiment of a memory system according to the present invention.

FIG. 43 is a block diagram exemplarily showing an embodiment of a memory system according to the present invention. Referring to FIG. 43, the memory system 4100 includes a flash memory 4110 and a memory controller 4120. The memory system 4100 according to the present invention is able to trim a level of a bias voltage (e.g., read or verifying voltage) of the flash memory 4110 by temperature variation.

The flash memory 4110 conducts an erasing, writing, or reading operation in accordance with control of the memory controller 4120. The flash memory 4110 includes pluralities of memory cells able to store data. The memory cells of the flash memory 4110 are variable in threshold voltage by temperature. In other words, threshold voltages of the memory cells are variable while programming the same data under low and high temperature. If the threshold voltages of the memory cells change by temperature, a bit error could be inadvertently generated during the reading operation.

The flash memory 4110 is able to store data (hereinafter, referred to as 'compensation data') for compensating a threshold voltage change of the memory cells. The compensation data 4105 can be stored in a specific area of the memory cells in a stage of fabricating the flash memory 4110. The memory cells are capable of storing single bit data or multi-bit data.

A memory cell storing single bit data has two levels of threshold voltage distribution. This memory cell is called single level cell (SLC). A memory cell storing multi-bit data has four or more levels of threshold voltage distribution. This memory cell is called multi-level cell (MLC). The flash memory 4110 shown in FIG. 43 may include a single level cells or a multi-level cells, or a combination.

Table 1 exemplarily shows the compensation data of a SLC flash memory.

TABLE 1

| Temperature (° C.) | Vrd0 (V) | Vvf (V) |
|---|---|---|
| 80~90 | R0 | F0 |
| 60~80 | R0 + 0.05 | F0 + 0.05 |
| 40~60 | R0 + 0.10 | F0 + 0.10 |
| 20~40 | R0 + 0.15 | F0 + 0.15 |
| 0~20 | R0 + 0.20 | F0 + 0.20 |
| −20~0 | R0 + 0.25 | F0 + 0.25 |

In Table 1, Vrd0 is a read voltage applied to a selected word line during the reading operation and Vvf0 is a verifying voltage applied to a selected word line during a program-verifying operation. In 80~90° C., the read voltage is R0 and the verifying voltage is F0. As will be appreciated, R0 and F0 will vary by design. A threshold voltage of memory cell varies by temperature. To compensate a threshold voltage change by temperature variation, the read or verifying voltage is differently set in accordance with temperature as shown in Table 1.

For example, as shown in Table 1, in the temperature range of 60~80° C., the read voltage is set to R0+0.05 and the verifying voltage is set to F0+0.05. In the temperature boundary of 40~60° C., the read voltage is set to R0+0.10 and the verifying voltage is set to F0+0.10. In Table 1, intervals of the temperature range are set to 20° C., and an increment of the read and verifying voltages is set to 0.05V by the temperature boundary. But, it will be appreciated that the intervals, increments and ranges of the temperature boundary, the read voltage, and the verifying voltage may be variously set different from Table 1.

Table 2 exemplarily shows compensation data of an MLC flash memory.

TABLE 2

| Temp. (° C.) | Vrd1 (V) | Vrd2 (V) | Vrd3 (V) | Vvf1 (V) | Vvf2 (V) | Vvf3 (V) |
|---|---|---|---|---|---|---|
| 80~90 | R1 | R2 | R3 | F1 | F2 | F3 |
| 60~80 | R0 + 0.05 | R0 + 0.05 | R0 + 0.05 | F0 + 0.05 | F0 + 0.05 | F0 + 0.05 |
| 40~60 | R0 + 0.10 | R0 + 0.10 | R0 + 0.10 | F0 + 0.10 | F0 + 0.10 | F0 + 0.10 |
| 20~40 | R0 + 0.15 | R0 + 0.15 | R0 + 0.15 | F0 + 0.15 | F0 + 0.15 | F0 + 0.15 |
| 0~20 | R0 + 0.20 | R0 + 0.20 | R0 + 0.20 | F0 + 0.20 | F0 + 0.20 | F0 + 0.20 |
| −20~0 | R0 + 0.25 | R0 + 0.25 | R0 + 0.25 | F0 + 0.25 | F0 + 0.25 | F0 + 0.25 |

In Table 2, Vrd1, Vrd2, and Vrd3 are read voltages applied to a selected word line during the reading operation, and Vvf1, Vvf2, and Vvf3 are verifying voltages applied to a selected word line during the program-verifying operation. In 80~90° C., the read voltage is set to R1, R2, and R3 and the verifying voltage is set to F1, F2, and F3. Again, these values will vary by design. To compensate a threshold voltage change by temperature variation, the read or verifying voltage is differently set in accordance with temperature as shown in Table 2. It will be appreciated that the intervals, increments and ranges of the temperature boundary, the read voltage, and the verifying voltage may be variously set different from Table 2.

The memory system 4100 according to the present invention stores the compensation data as like Tables 1 and 2, and trims threshold voltage compensation values of the flash memory in accordance with the compensation data. For instance, if current temperature is 25° C., the memory system 4100 sets the read voltage of the flash memory to R0+0.15, R1+0.15, R2+0.15, and R3+0.15 and sets the verifying voltage to F0+0.15, F1+0.15, F2+0.15, and F3+0.15 in accordance with the compensation data. These compensation data may be stored in the flash memory 4110 as shown in FIG. 43, a ROM of the memory controller 4120, or another storage medium.

Continuously referring to FIG. 43, the memory controller 4120 includes a memory interface 4121, a memory interface 4121, an ECC circuit 4123, a central processing unit (CPU) 4124, a random access memory (RAM) 4125, and a temperature sensor 4126. The memory controller 4120 senses temperature variation of the flash memory 4110 and trims threshold voltages of the flash memory 4110 in accordance with the compensation data stored in the flash memory 4110.

The memory interface 4121 is connected directly to the flash memory 4110 and used for directly exchanging a command, an address, and a control signal with the flash memory 4110. That is, the memory interface 4121 provides a read command and address in the reading operation, and provides a writing command, an address, and data in the writing operation. The host interface 4122 is used for exchanging data with a host (not shown).

The ECC circuit 4123 is used for analyzing or correcting a bit error of data stored in the flash memory 4100. The central processing unit 4124 conducts an overall control operation for data exchange of the memory controller 4120. The RAM 4125 is used as a working memory. Although not shown, the memory system 4100 may further include a ROM (not shown) storing code data for interfacing with a host.

The temperature sensor 4126 compensates a threshold voltage change of the memory cells by sensing temperature variation of the flash memory 4110. For this, the temperature sensor 4126 measures current temperature and sets a temperature boundary with reference to measured temperature. For instance, it is assumed that current temperature is 25° C. and an interval of the temperature boundary is 20° C. The temperature sensor 4126 sets the temperature boundary in which the lower limit is 15° C. and the upper limit is 35° C., referring to the current temperature 25° C.

The temperature sensor 4126 generates an event signal if measured temperature is out of the temperature boundary of 15° C.~35° C. in the programming or reading operation of the flash memory 4110. And, the temperature sensor sets a new temperature boundary according to measured temperature. For example, if measured temperature is 10° C. during the programming operation of the flash memory 4110, the temperature sensor 4126 generates the event signal and sets the new temperature boundary with the lower limit 0° C. and the upper limit 20° C.

The memory controller 4120 compensates a threshold voltage change of the flash memory 4110 in response to the event signal generated from the temperature sensor 4126. The temperature sensor 4126 consumes tens milliseconds in measuring current temperature. Because of that, measuring temperature of the flash memory 4110 every programming or reading operation of the flash memory 4110 would result in functional degradation. The temperature sensor 4126 of the present invention preliminarily sets the temperature boundary in order to solve such a problem.

If measured temperature is 15° C., the temperature sensor 4126 sets a temperature boundary with the lower limit 5° C. and the upper limit 25° C. And, the temperature sensor 4126 generates the event signal only of measured temperature is out of the temperature boundary of 5° C.~25° C. And, the temperature sensor 4126 sets a new temperature boundary of 30° C.~50° C. on basis of current temperature (e.g., 40° C.). In this time, the read and verifying voltages of the flash memory 4110 are set to R0+0.15, R1+0.15, R2+0.15, R3+0.15, F0+0.15, F1+0.15, F2+0.15, and F3+0.15 in accordance with the compensation data shown in Table 1 or 2.

The memory system 4100 according to the present invention is able to reduce bit errors caused by change of threshold voltages of the memory cells by temperature variation. That is, the memory system 4100 according to present invention preliminarily compensates a threshold voltage change by temperature variation before the operation (reading or programming) of the flash memory 4110. Hereinafter will be detailed internal organization of the flash memory 4110 and method for compensating threshold voltages.

Figure 44:
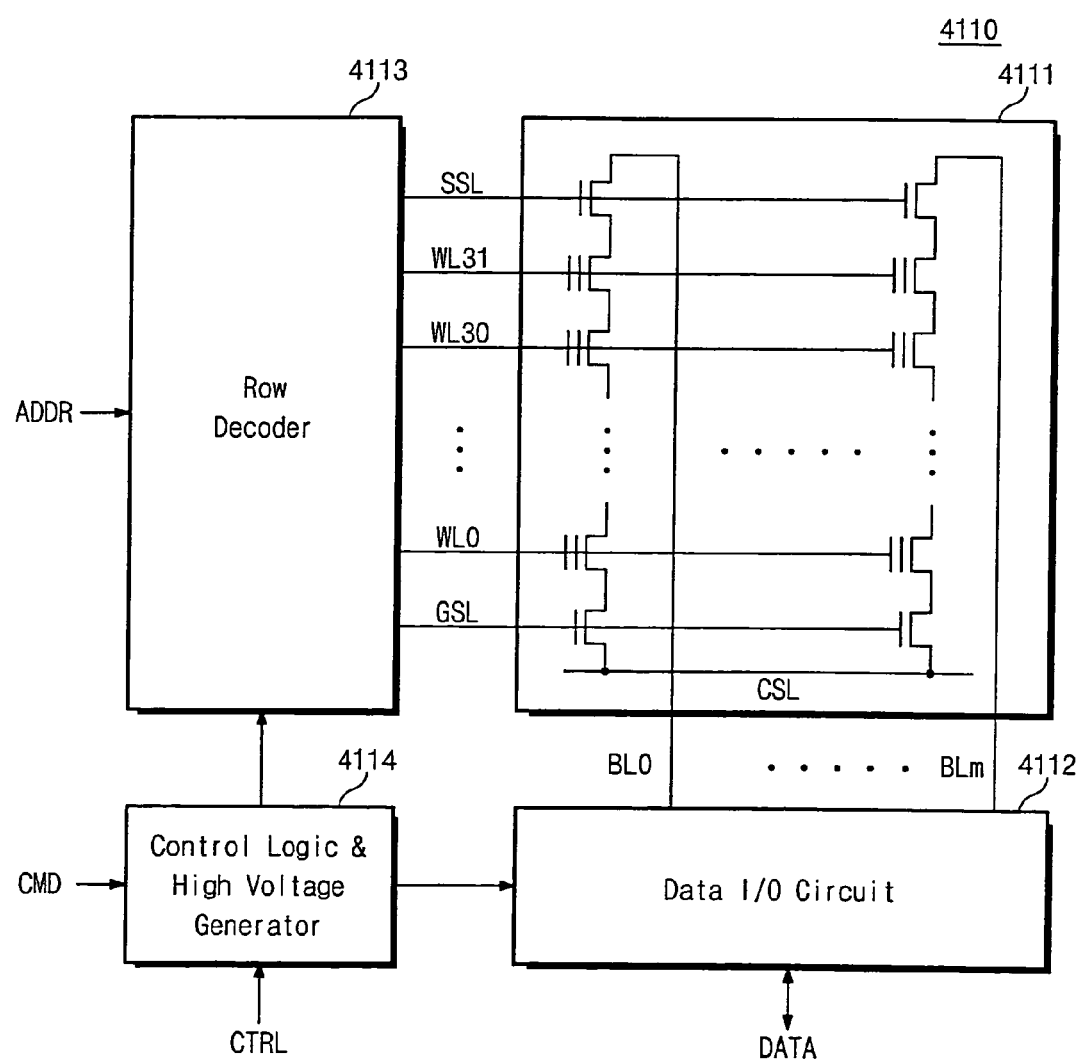
FIG. 44 is a block diagram showing the flash memory shown in FIG. 43.

FIG. 44 is a block diagram exemplarily showing the flash memory shown in FIG. 43. The flash memory 4110 includes a memory cell array 4111, a data input/output circuit 4112, a row decoder 4113, and a control logic and high voltage generator 4114.

The memory cell array 4111 includes pluralities of memory blocks. Each memory block is formed of plural pages. Each page is formed of plural memory cells. Each memory cell is capable of storing single bit data or multi-bit data. The flash memory 4110 conducts the erasing operation in the unit of memory block, and conducts the writing or reading operation in the unit of page.

FIG. 44 shows a memory block. Referring to FIG. 44, the memory block includes a string selection transistor connected to a string selection line SSL, memory cells coupled to pluralities of word lines WL0~WL31, and a ground selection transistor connected to a ground selection line GSL. The string selection transistors are connected to bit lines BL0~BLm and the ground selection transistors are connected to a common source line CSL.

The data input/output circuit 4112 is connected to the memory cell array 4111 by way of the plural bit lines BL0~BLm. The data input/output circuit 4112 inputs data DATA through a data input/output line (not shown). Input data is stored in a corresponding memory cell. In the meantime, the data input/output circuit 4112 reads data from the memory cell through the bit line BL. Read data is output to external through the data input/output line.

The row decoder 4113 is connected to the memory cell array by way of the plural word lines WL0~WL31. The row decoder 4113 inputs an address ADDR and selects a memory block or page. Here, an address for selecting a memory block is called a block address and an address for selecting a page is called page address.

The control logic and high voltage generator 4114 controls the data input/output circuit 4112 and the row decoder 4113 in response to a command CMD and a control signal CTRL. Here, the control signal CTRL is provided from the memory interface 4121 (refer to FIG. 43). Meanwhile, the control logic and high voltage generator 4114 generates bias voltages such as program voltage, read voltage, erasure voltage, and so on which are to be provided to the word lines.

In the meantime, the control logic and high voltage generator 4114 includes a trim circuit for trimming a bias voltage such as the read voltage or the program-verifying voltage in response to an external sense signal (e.g., signal indicating sensed temperature). The trim circuit (not shown) is to trim a threshold voltage change when threshold voltages of the memory cells are changed due to temperature variation.

Figure 45:
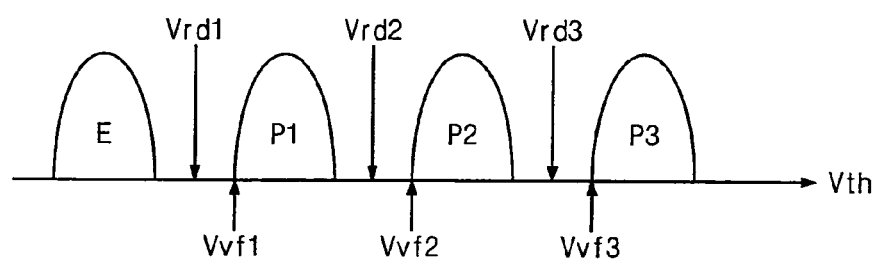
FIG. 45 is a diagram showing a bias voltage of a multi-level cell.

FIG. 45 is a diagram exemplarily showing threshold voltage distributions of the memory cells shown in FIG. 44. FIG.

45 shows the threshold voltage distributions of the multi-level cells having four levels. The memory cell has one of the four states E, P1, P2, and P3.

During the reading operation, the selective read voltage Vrd1, Vrd2, or Vrd3 is provided to a selected word line WL0 (refer to FIG. 44) and a deselective read voltage Vread is provided to unselected word lines WL0~WL31 (refer to FIG. 44). The first selective read voltage Vrd1 has a voltage level between the erased state E and the first programmed state P1. The second selective read voltage Vrd2 has a voltage level between the first programmed state P1 and the second programmed state P2. The third selective read voltage Vrd3 has a voltage level between the second and third programmed states P2 and P3.

In the meantime, during the program-verifying operation, the program-verifying voltage Vvf1, Vvf2, or Vvf3 is provided to a selected word line. The first program-verifying voltage Vvf1 is a voltage for programming a memory cell into the first programmed state P1. The second program-verifying voltage Vvf2 is a voltage for programming a memory cell into the second programmed state P2. The third program-verifying voltage Vvf3 is a voltage for programming a memory cell into the third programmed state P3.

Figure 46:
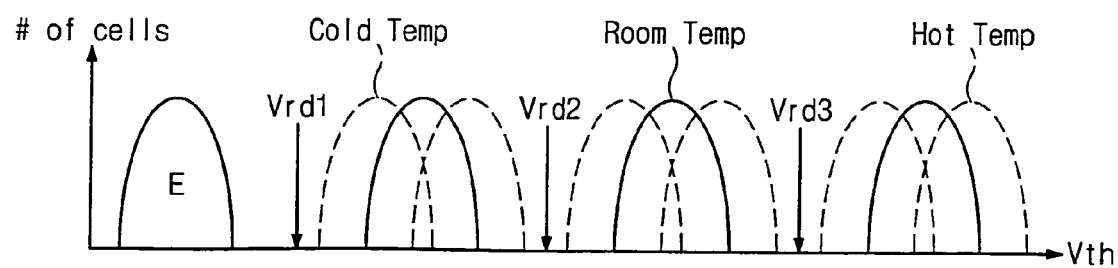
FIG. 46 is a diagram showing a threshold voltage change by temperature variation of the memory cell shown in FIG. 44.

FIG. 46 is a diagram showing a threshold voltage change of memory cells by temperature variation. Referring to FIG. 46, the memory cells are distributed as like the solid lines of FIG. 46 at room temperature.

But if the memory cells are programmed at cold temperature lower than the room temperature, their threshold voltages are seen as shifting to left. In other words, when programming memory cells in the cold temperature, it lowers potential barriers to generate the FN tunneling effect of the memory cells. And, channel electrons much more move to a floating gate of the memory cell. In this case, a channel can be easily formed therein even if a gate voltage of the memory cell is lower in the reading operation. For that reason, the threshold voltages of the memory cells are seen as shifting to left. Also, if the memory cells are programmed at hot temperature higher than the room temperature, their threshold voltages are seen as shifting to right.

Programming the memory cells at the cold temperature and then conducting the reading operation at the room temperature, reduces a read margin of the flash memory. In FIG. 46, assuming the selective read voltages Vrd1, Vrd2, and Vrd3 are constant, if the threshold voltages of the memory cells shift to left, a read margin is reduced so much. Also, programming the memory cells at the hot temperature and then conducting the reading operation at the room temperature, reduces a read margin of the flash memory.

Further, if the memory cells are programmed at the hot temperature and read at the cold temperature, or if the memory cells are programmed at the cold temperature and read at the hot temperature, it more reduces a read margin. When the flash memory is insufficiently secured of a read margin, it increases a probability of generating an ECC bit error. The present invention compensates a threshold voltage change by sensing temperature variation of the flash memory 4110 and trimming the program-verifying voltage or the read voltage in accordance with the compensation data. That is, the present invention shifts threshold voltage levels of the memory cells by varying the program-verifying voltage or the read voltage in accordance with temperature variation.

Figure 47:
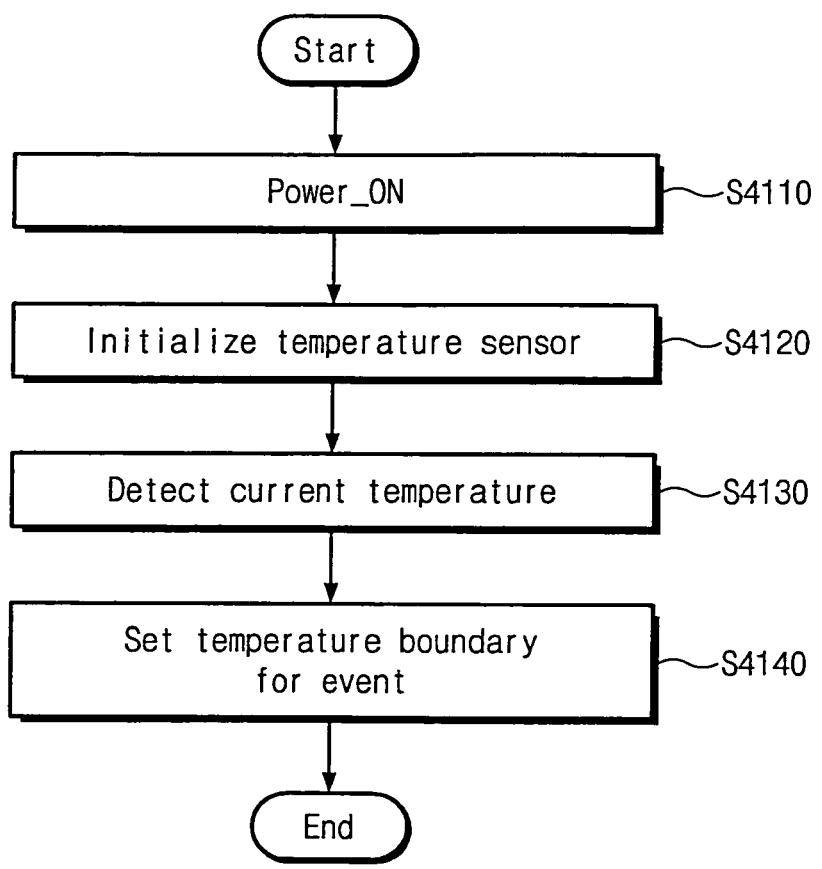
FIG. 47 is a flow chart showing a procedure for initializing the temperature sensor shown in FIG. 43.

FIG. 47 is a flow chart showing a procedure for initializing the temperature sensor shown in FIG. 43. FIG. 47 shows the procedure for initializing the temperature when the memory system 4100 (refer to FIG. 43) is powered on. In a step S4110, the memory system 4100 is powered on. In a step S4120, the temperature sensor 4126 (refer to FIG. 43) is initialized when the memory system 4100 is powered on. And in a step S4140, it measures current temperature of the initializing procedure. In a step S4140, it sets the temperature boundary with reference to the measured temperature. Here, setting the temperature boundary is for the purpose of generating the event signal in accordance with temperature variation.

Figure 48:
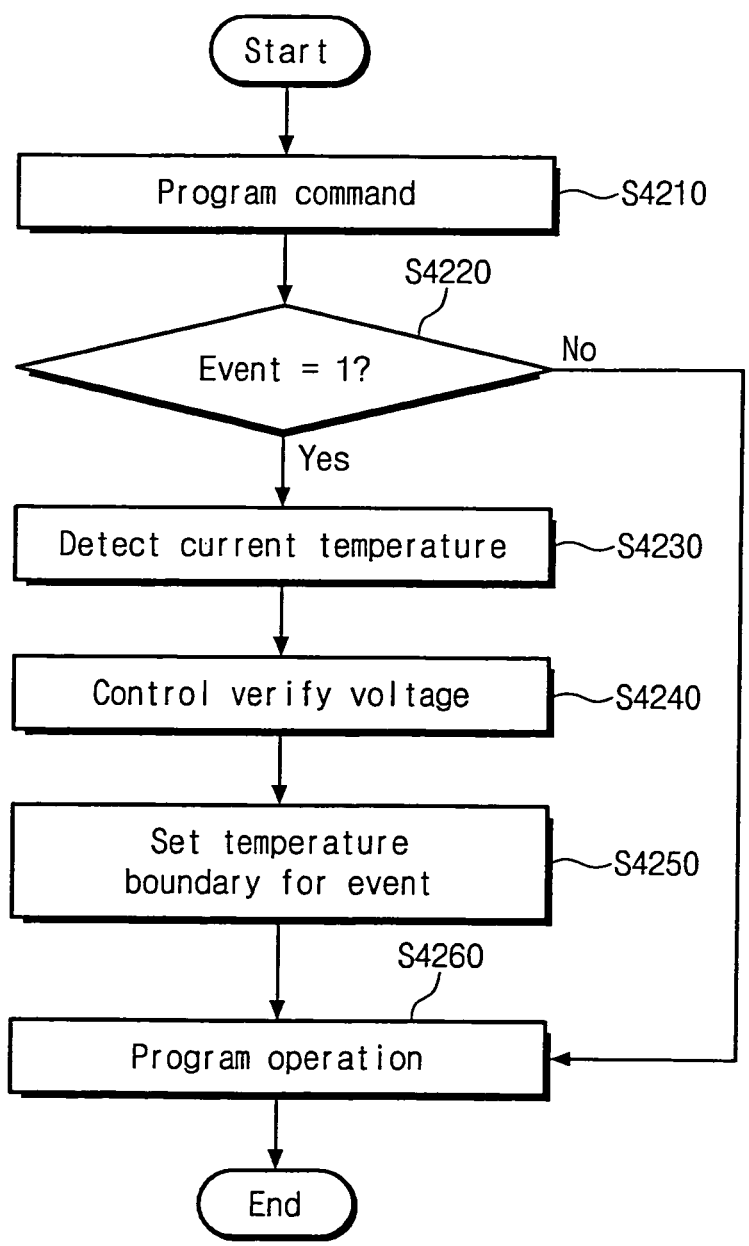
FIG. 48 is a flow chart showing a verifying-voltage trimming method by temperature variation of a memory system according to the present invention.

FIG. 48 is a flow chart showing a verifying-voltage trimming method of the memory system shown in FIG. 43. FIG. 48 shows a procedure for trimming the verifying voltage in correspondence with temperature variation during the programming operation.

In a step S4210, a program command is provided to the flash memory 4110. The flash memory 4110 begins the programming operation in response to the program command. Before internally executing the programming operation, the flash memory 4110 determines whether the temperature sensor 4126 (refer to FIG. 43) generates the event signal.

In a step S4220, it determines whether the event signal is generated. A condition that there is no generation of the event signal means that temperature variation of the flash memory 4110 is ranged within the temperature boundary. Unless the temperature sensor generates the event signal, the flash memory 4110 conducts the programming operation normally without trimming the verifying voltage. To the contrary, if the event signal is generated, it means that temperature variation is out of the current temperature boundary. Accordingly, it is desirable to trim or compensate the program-verifying voltage in order to reduce ECC bit errors by temperature variation.

In a step S4230, the temperature sensor 4126 measures current temperature. Here, the temperature sensor 4126 measures current temperature not during all of the programming operations but only when the event signal is generated. This is for the purpose of preventing the memory system from experiencing functional degradation caused by frequent temperature sensing.

In a step S4240, the flash memory 4110 trims the program-verifying voltage. The memory system 4100 reads the compensation data with reference to the current temperature measured by the step S4230. Here, the compensation data are stored in the ransom access memory 4125 (refer to FIG. 43). The compensation data are loaded into the random access memory 4125 from the flash memory 4110. The flash memory 4110 trims the program-verifying voltage in accordance with the compensation data.

In a step S4250, the temperature sensor 4126 sets a new temperature boundary with reference to the temperature measured by the step S4230. And in a step S4260, the flash memory 4110 conducts the programming operation by using the trimmed verifying voltage. The verifying-voltage trimming method of the memory system according to the present invention compensates a threshold voltage change of the memory cells, which is caused by temperature variation, in response to the event signal generated from the temperature sensor. The flash memory 4110 will continue to use the trimmed or compensated voltages as the current voltages until another event signal is received.

Figure 49:
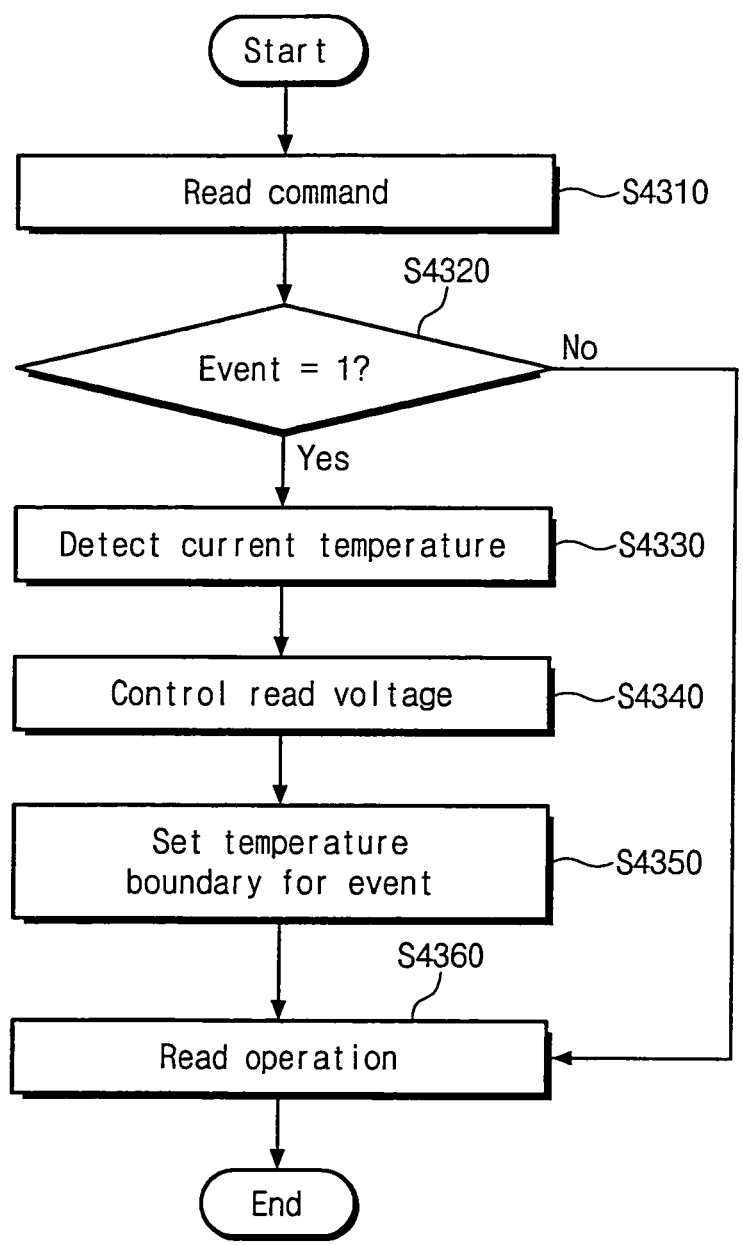
FIG. 49 is a flow chart showing a read-voltage trimming method by temperature variation of a memory system according to the present invention.

FIG. 49 is a flow chart showing a read-voltage trimming method of the memory system shown in FIG. 43. FIG. 49 shows a procedure for trimming the read voltage in correspondence with temperature variation during the reading operation.

In a step S4310, a read command is provided to the flash memory 4110. The flash memory 4110 begins the reading operation in response to the read command. Before internally executing the reading operation, the flash memory 4110 determines whether the temperature sensor 4126 (refer to FIG. 43) generates the event signal.

In a step S4220, it determines whether the event signal is generated. Unless the temperature sensor generates the event signal, the flash memory 4110 conducts the reading operation normally without trimming the read voltage. To the contrary, if the event signal is generated, it is desirable to trim the read voltage in order to reduce ECC bit errors by temperature variation.

In a step S4230, the temperature sensor 4126 measures current temperature. Here, the temperature sensor 4126 measures current temperature not during all of the reading operations but only when the event signal is generated. This is for the purpose of preventing the memory system from functional degradation caused by frequent temperature sensing.

In a step S4240, the flash memory 4110 trims the read voltage. The memory system 4100 reads the compensation data with reference to the current temperature measured by the step S4230. The flash memory 4110 trims the read voltage in accordance with the compensation data.

In a step S4250, the temperature sensor 4126 sets a new temperature boundary with reference to the temperature measured by the step S4230. And in a step S4260, the flash memory 4110 conducts the reading operation by using the trimmed verifying voltage. The verifying-voltage trimming method of the memory system according to the present invention compensates a threshold voltage change of the memory cells, which is caused by temperature variation, in response to the event signal generated from the temperature sensor. The flash memory 4110 will continue to use the trimmed or compensated voltages as the current voltages until another event signal is received.

Figure 50:
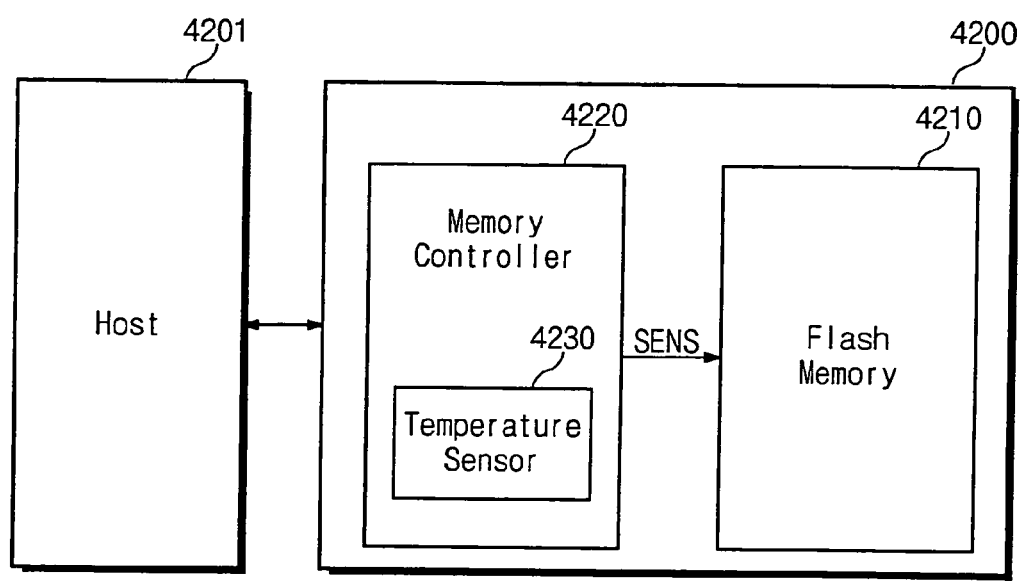
FIGS. 50 through 53 are block diagrams showing various embodiments of the memory system according to the present invention.

FIGS. 50 through 54 are block diagrams showing various embodiments of the memory system according to the present invention. Referring to FIG. 50, the memory system 4200 communicates with a host 4201. The memory system 4200 includes a flash memory 4210 and a memory controller 4220. The memory controller 4220 includes a temperature sensor 4230. The temperature sensor 4230 senses temperature variation of the flash memory 4210.

The memory controller 4220 analyzes temperature variation sensed by the temperature 4230 and provides a sensing signal SENS to the flash memory 4210. Here, the sensing signal SENS may be a command, data, or a control signal provided to the flash memory 4210 from the memory controller 4220. The flash memory 4210 trims the program-verifying voltage or the read voltage in response to the sensing signal SENS.

Figure 51:
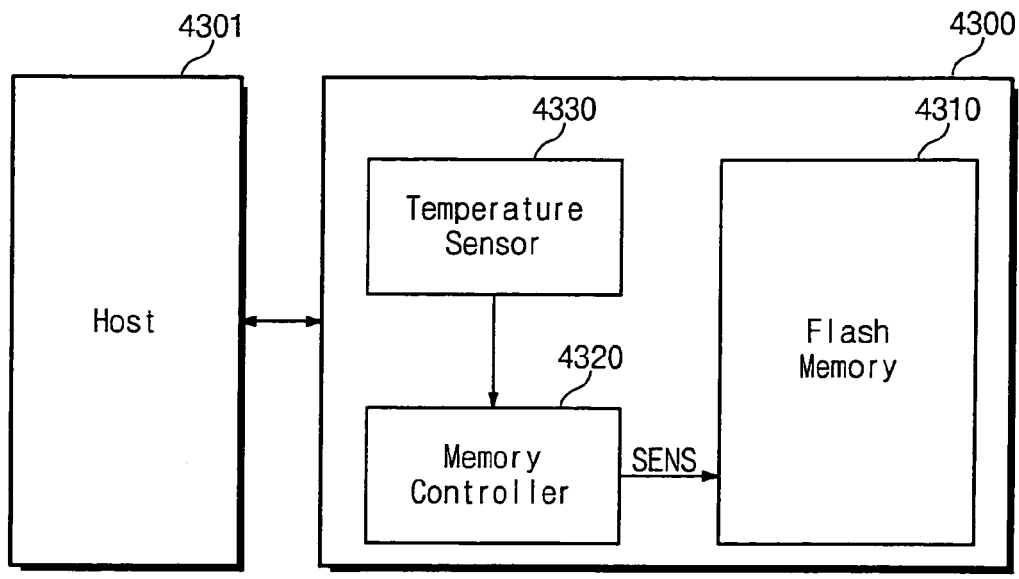

Referring to FIG. 51, the memory system 4300 communicates with a host 4301. The memory system 300 includes a flash memory 4310, a memory controller 4320, and a temperature sensor 4330. The temperature sensor 4330 is located out of the memory controller 4320. The temperature sensor 4330 senses temperature variation of the flash memory 4310. The memory controller 4320 analyzes temperature variation sensed by the temperature sensor 4330 and provides the sensing signal SENS to the flash memory 4310. The flash memory 4310 trims the program voltage or read voltage in response to the sensing signal SENS.

Figure 52:
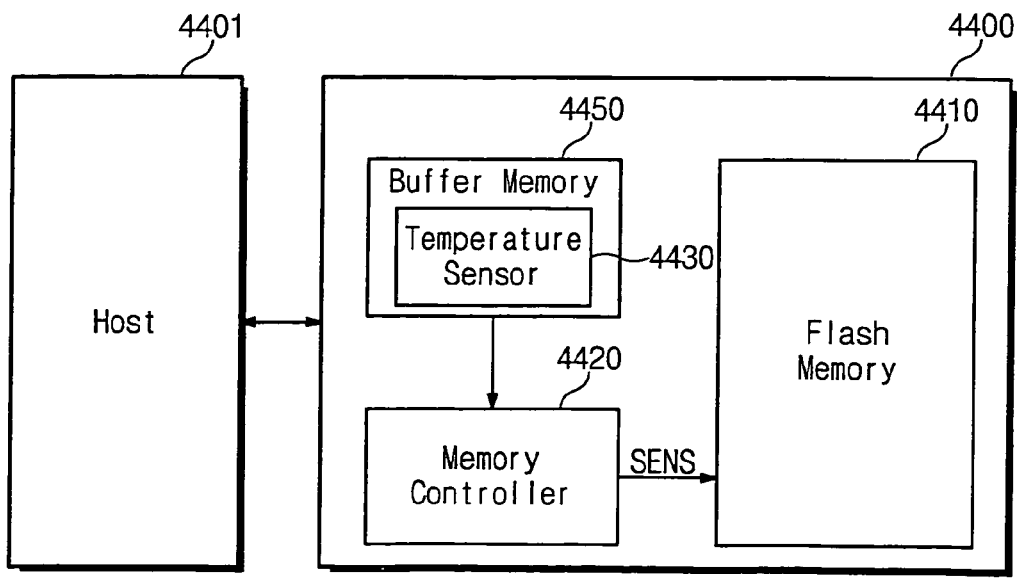

Referring to FIG. 52, a memory system 4400 communicates with a host 4401. The memory system 4400 includes a flash memory 4410, a memory controller 4420, and a buffer memory 4450. The buffer memory 4450 includes a temperature sensor 4430. Here, the buffer memory 4450 includes a volatile memory such as DRAM, mobile DRAM, or SRAM, or a nonvolatile memory such as flash memory, PRAM, MRAM, or EEPROM.

The temperature sensor 4430 senses temperature variation of the flash memory 4410. The memory controller 4420 analyzes temperature variation sensed by the temperature sensor 4430 and provides the sensing signal SENS to the flash memory 4410. The flash memory 4410 trims the program voltage or read voltage in response to the sensing signal SENS.

Figure 53:
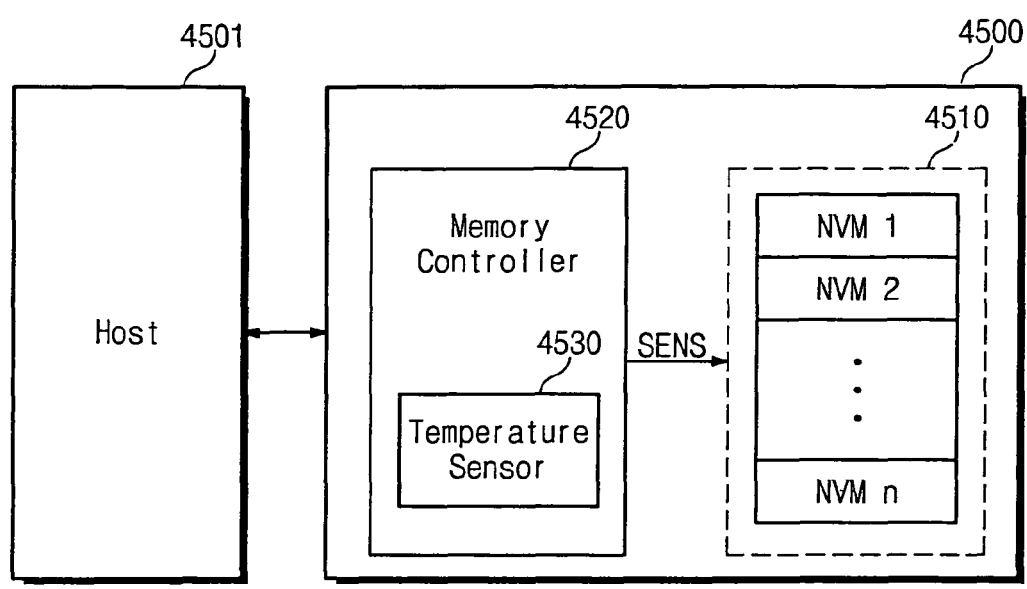

Referring to FIG. 53, a memory system 4500 communicates with a host 4501. The memory system 4500 includes a flash memory 4510 and a memory controller 4520. A nonvolatile memory NVM includes a flash memory, PRAM, MRAM, or EEPROM. The memory controller 4520 includes a temperature sensor 4530. The temperature sensor 4530 senses temperature variation of the nonvolatile memory 4510. The memory controller 4520 analyzes temperature variation sensed by the temperature sensor 4530 and provides the sensing signal SENS to the nonvolatile memory 4510. The nonvolatile memory 4510 trims the program voltage or read voltage in response to the sensing signal SENS.

Figure 54:
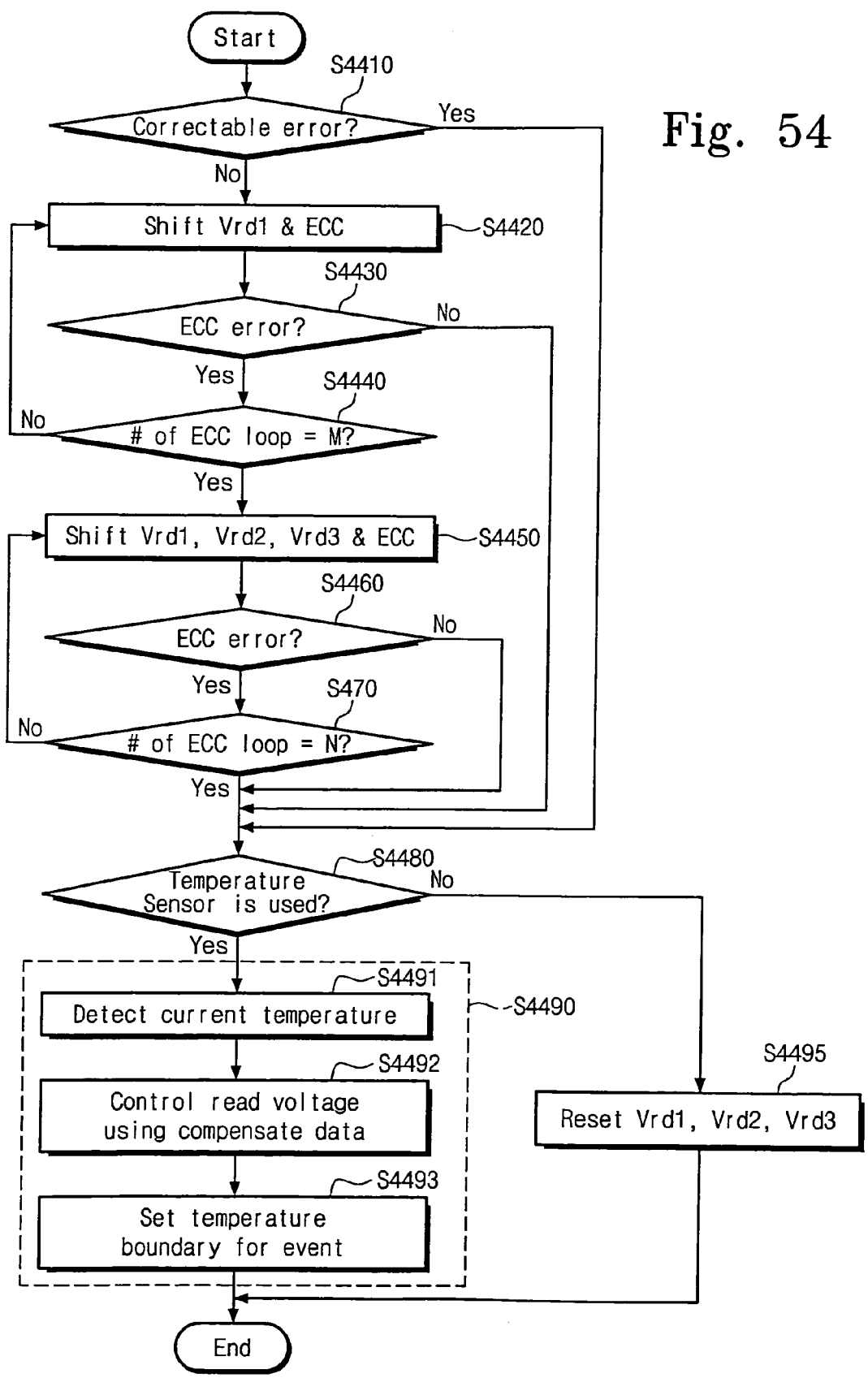
FIG. 54 is a flow chart showing another method for curing a bit error by a threshold voltage change of memory cells.

FIG. 54 is a flow chart showing a method for securing data reliability of the flash memory. FIG. 54 shows another method of curing a bit error by threshold voltage change of memory cells. The flash memory may be experiencing a bit error due to program or read disturbance, besides the bit errors caused by temperature variation.

The flash memory uses an ECC circuit for curing such bit errors. But a range capable of curing the bit error is no more than a desired (or, alternatively predetermined) bit number. For instance, in the case that the ECC circuit is able to cure a 4-bit error, it is not further practicable to cure more bits than 4 bits. FIG. 54 shows the method for repairing such error bits in the above case.

In a step S4410, the ECC circuit determines whether it is possible to correct bit errors. From the above case, if the number of error bits is more than four bits, they are incorrectable errors. If the number of error bits is less than four bits, they are correctable errors. If it is able to correct bit errors, the ECC circuit is used for correcting the bit errors. Being unable to correct bit errors, the ECC circuit changes a level of the read voltage Vrd and conducts the operation of error detection and correction.

In a step S4420, the flash memory changes the first read voltage Vrd1 and then conducts the error detection and correction operation. In the flash memory cell, it would be generated that erased memory cells are over-programmed due to program or read disturbance on the cell string architecture. In this time, as shown in FIG. 45, if the reading operation is carried out with the first read voltage Vrd1, the over-programmed memory cells can be partly read as off-cells. If the over-programmed memory cells are conditioned out of the ECC correction capability, there is no way of recovery by a conventional method. The present invention conducts the error detection and correction operation by increasing the first read voltage Vrd1 by an incremental voltage level so as to make the over-programmed memory cells read as on-cells.

In a step S4430, after changing the first read voltage Vrd1, the ECC circuit determines whether there is a bit error. If there is a correctable bit error, the procedure for curing bit errors is terminated. But if there is an uncorrectable bit error, the first read voltage Vrd1 is changed again. In a step S4440, the ECC circuit determines whether the number of ECC loops is M (M is a natural number).

In a step 4450, if the ECC loops are repeated times, the ECC circuit changes the first through third read voltages Vrd1, Vrd2, and Vrd3, and conducts the error detection and correction operation. Here, levels of the first through third read voltages Vrd1, Vrd2, and Vrd3 can be alternately changed as like +a, −a, +b, and −b (a, b are natural numbers). This is because it is not possible to know whether the threshold voltages of the memory cells have been shifted to left or right.

In a step S4460, after changing the first through third read voltages Vrd1, Vrd2, and Vrd3, it determines whether there is a bit error. If there is a correctable bit error, the procedure for curing bit errors is terminated. But if there is uncorrectable bit error, the first through third read voltages Vrd1, Vrd2, and Vrd3 are changed again. In a step S4470, it determines whether the number of ECC loops is M (M is a natural number). The memory system according to the present invention is able to cure bit errors caused by other reasons besides temperature variation.

After the procedure for repairing data, the present invention makes the read voltage level to the original state. In a step S4480, it determines whether the aforementioned temperature sensor is being used or not. If the temperature sensor is being used, a step S4490 is carried out. If the temperature sensor is not being used, a step S4495 is carried out.

The step S4490 includes a step of measuring current temperature by means of the temperature sensor (S4491), a step of trimming the read voltage in accordance with the compensation data with reference to the measured temperature (S4492), and a step of setting a new temperature boundary for the next event on the measured temperature (S4493). The first through third read voltages Vrd1, Vrd2, and Vrd3 which are changed in the previous step are reset.

The memory system according to the present invention may be implemented in a unit product of flash memory, one-NAND flash memory, a semiconductor disk drive (SSD), a memory card, or so forth. If the present invention is applied to a memory card, the flash memory and the memory controller are integrated on a single card. This memory card includes a multimedia card (MMC), an SD card, an XD card, a CF card, a SIM card, or so on. The memory system according to the present invention can be used in a computer, a notebook, a mobile phone, an MP3 player, a PMP, an application chipset, a camera image processor, or so forth.

A flash memory system according to a fourth embodiment of the present invention may achieve high data reliability by means of a temperature sensor as well as the multi-thread function. In addition, the flash memory system according to the fourth embodiment of the present invention may achieve speed-up by means of the multi-thread function described in the first embodiment, the free page described in the second embodiment, and the microcode described in the third embodiment as well as the temperature sensor. Performance of the flash memory system according to the fourth embodiment of the present invention may be improved through achievement of high data reliability and speed-up.

Embodiment 5

Flash Memory System Repairing LSB Data

As discussed previously, in recent years apparatuses employing nonvolatile memories are increasingly used. For example, MP3 players, digital cameras, portable telephones, camcorders, flash memory cards, and solid state drives (SSDs) employ nonvolatile memories as storage devices.

There are flash memory devices as kinds of nonvolatile memory devices. Generally, flash memory device are known as electrically programmable and erasable nonvolatile memory devices. Recently requiring large capacity or high frequency characteristics in applications such as large scale storage units or code memories for mobile apparatuses, they are much interesting in flash memories. Flash memory devices can be classified into NAND and NOR types.

A NAND flash memory includes an array of memory cells composed of floating gate transistors. The memory cell array includes pluralities of memory blocks. Each memory block includes strings (or called "NAND string") of floating gate transistors. Each string is formed of a string selection transistor, a ground selection transistor, and pluralities of memory cells connected between the string and ground selection transistors. Pluralities of word lines are arranged on the cell array, intersecting the strings. Each word line is connected to a control gate of a corresponding cell transistor of each string.

A cell array of a NOR flash memory device has a structure where pluralities of memory cells are arranged in parallel to a bit line. Compared to the NAND flash memories, the NOR flash memory devices are widely used in the fields requiring high speed because they are operating with high frequency in programming and reading operations. But the NOR flash memory devices are more disadvantageous to a degree of integration than the NAND flash memories.

As a proposal to overcome the limit of storage capacity, normally is adopted a multi-level cell (hereinafter referred to as 'MLC'). An MLC structure conquers the physical limit of integration by storing plural bits in a unit memory cell.

Figure 55:
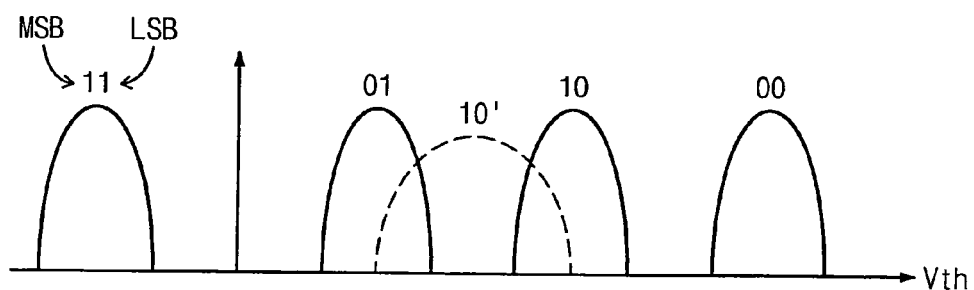
FIG. 55 is a diagram showing threshold voltage distributions of multi-level cells each storing 2 bits (MSB and LSB) and data values corresponding to the distributions in a memory such a NAND flash memory.

FIG. 55 is a diagram showing threshold voltage distributions of multi-level cells each storing 2 bits (a most significant bit MSB and a least significant bit LSB), and data values corresponding to the distributions in a memory such a NAND flash memory. Referring to FIG. 55, data values of multi-level cells are correspondent with '11', '01', '10', and '00' in order from the lowest state of threshold voltages. Generally, the state '11' is an erased state. A programming operation begins from the erased state '11'.

A memory cell is programmed to have one of four states '11', '01', '10', and '00' in accordance with threshold voltage distributions. First, it describes a procedure of programming the least significant bit (LSB) will be described. According to the LSB data, a threshold voltage of the memory cell maintains the erased state or changes to the state 10'. For instance, if the LSB is '1', a threshold voltage of the memory cell maintains the erased state. If the LSB is '0', a threshold voltage of the memory cell increases to the state 10' shown in dashed lines in FIG. 55.

Next, the most significant bit (MSB) is programmed. A memory cells having the state 10' is programmed to be in the state '00', or programmed to be in the state '10', according to the MSB. For instance, the memory cell having the state 10' is programmed into the state '00' if the MSB is '0', or programmed into the state '10' if the MSB is '1'. On the other hand, a memory cell having the state '11' maintains the state '11', or is programmed into the state '01', according to the MSB. For instance, the memory cell having the state '11' is programmed to be in the state '01' if the MSB is '0', or maintains the state '11' if the MSB is '1'. Through such a manner, multi-bit data are programmed in a memory cell. In other words, the LSB is first programmed in a memory cell and then the MSB is programmed into the memory cell in which the LSB has been programmed.

However, while programming the MSB into a memory cell in which the LSB has been programmed, there would be generated a program fail. For example, a program fail occurs if there is power failure while programming the MSB. Or, a program fail may occur by a defect of a memory cell. If there is a program fail while programming the MSB, the LSB already programmed is affected therefrom. This problem is called 'bit coupling'.

Figure 56:
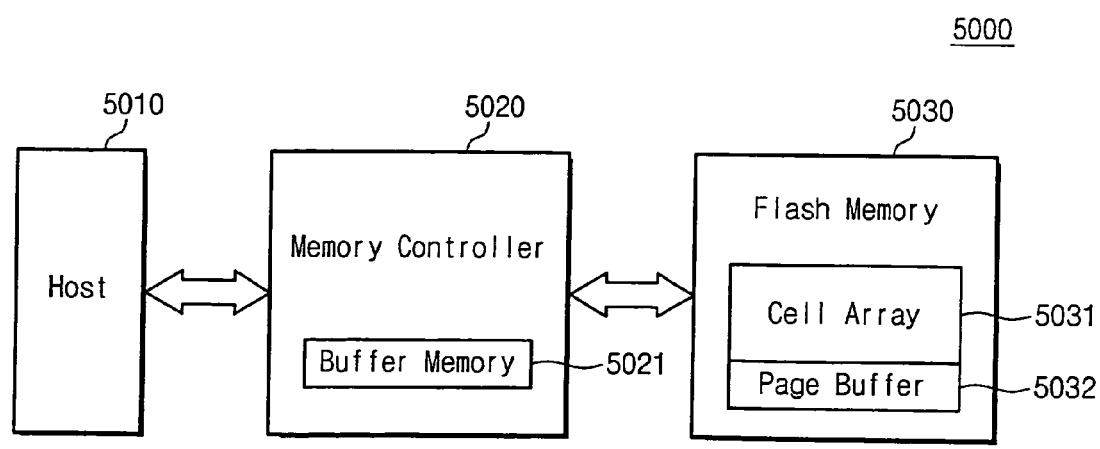
FIG. 56 is a diagram showing a memory system according to an embodiment of the present invention.

FIG. 56 is a diagram showing a memory system according to an embodiment of the present invention. Referring to FIG. 56, the memory system 5000 according to the present invention is comprised of a host 5010, a memory controller 5020, and a flash memory 5030.

The memory controller 5020 includes a buffer memory 5021. The flash memory 5030 includes a cell array 5031 and a page buffer 5032. Although not shown in FIG. 56, the flash memory 5030 also includes a decoder, a data buffer, and a control unit.

The memory controller 5020 receives data and a writing command which are input from the host 5010, and controls the flash memory 5030 to write data into the cell array 5031. Further, the memory controller 5020 controls the flash memory 5030 to read data from the cell array 5031 in compliance with a read command input from the host 5010.

The buffer memory 5021 temporarily stores data to be written into the flash memory 5030 or data read from the flash memory 5030. The buffer memory 5021 transfers temporary data therefrom to the host 5010 or the flash memory 5030 by control of the memory controller 5020.

The cell array 5030 of the flash memory 5030 is formed of plural memory cells. The memory cells are nonvolatile, from which data are not lost even if power is turned out after storing them therein. The page buffer 5032 is a buffer that stores data to be written into a selected page of the cell array 5031 or data read from a selected page of the cell array 5031.

The flash memory 5030 conducts the programming operation in the unit of page. The memory controller 5020, during the programming operation, transfers data to the flash memory 5030 in the unit of page by means of the internal buffer memory 5021. The page buffer 5032 temporarily stores data loaded from the buffer memory 5021 and programs the loaded data into a selected page at the same time. After programming, a program-verifying operation is carried out to check up whether data have been correctly programmed.

From a result of program-verifying, if there is a program fail, the programming and program-verifying operations resume with incrementing a program voltage. After completing a programming with data of one page volume in this way, the programming operation is conducted by receiving the next data.

Figure 57:
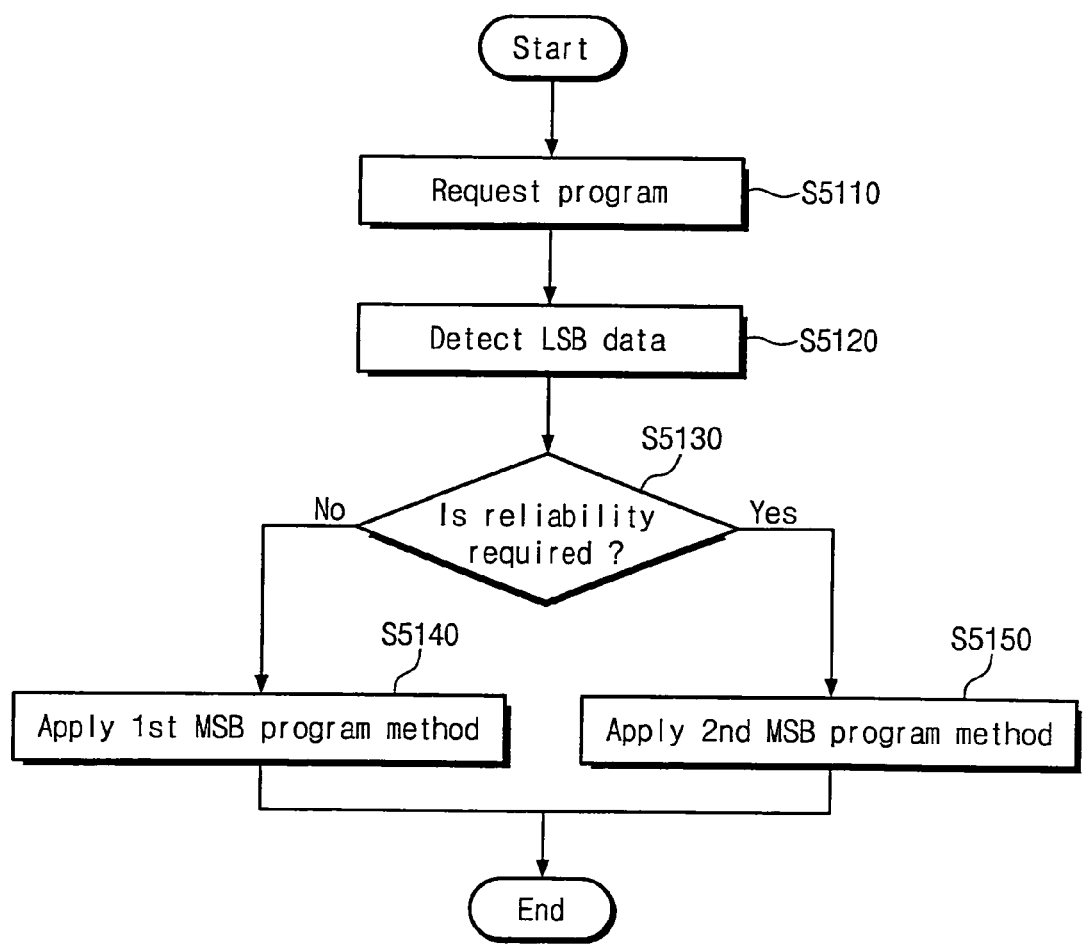
FIG. 57 is a flow chart for illustrating a programming method according to an embodiment of the present invention.

FIG. 57 is a flow chart for illustrating a programming method according to an embodiment of the present invention. In this embodiment, an MSB programming method is differently executed in accordance with reliability required therefor. There is a problem on reliability if previously programmed data is lost when it is programmed later. For that reason, the term 'reliability' can be used as a meaning of protecting the previous data.

Referring to FIG. 57, a request for programming is input from an external (e.g., a host) in a step S5110. If there is an input of request for programming, the memory controller 5020 finds LSB data of a memory cell to be programmed in a step S5120. In a step S5130, the memory controller 5020 or the flash memory 5030 (e.g., the control unit 5136 in FIG. 60) detects whether the LSB data is required to have high reliability. For instance, data such as personal information or password is required to have high reliability. If the LSB data is not required to have high reliability, it is programmed by a first programming method in a step S5140. To the contrary, if the LSB data is required to have high reliability, it is programmed by a second programming method in a step S5150.

As aforementioned, in the embodiment according to the present invention, the first and second programming methods are alternatively adopted thereto in accordance with a degree of the reliability required therefrom. Adopting which one of the first and second programming methods may be determined by the memory controller 5020. For example, the memory controller 5020 is able to control the flash memory 5030 to adopt the second programming method if LSB data stored in a memory cell to be programmed is required to have high reliability.

Furthermore, adopting which one of the first and second programming methods may be determined by the flash memory 5030. For instance, the flash memory 5030 is able to determine a programming method to be applied thereto with reference to an address of data to be stored therein. If an address to be stored is correspondent with a specific region of the memory cell array, the first programming method may be adopted thereto. If an address to be stored is correspondent with another region of the memory cell array, the second programming method may be adopted thereto. In this case, the conventional memory controller 5020 can be used without modification. Hereinafter, the first and second programming methods will be described with reference to the figures illustrated later.

Figure 58:
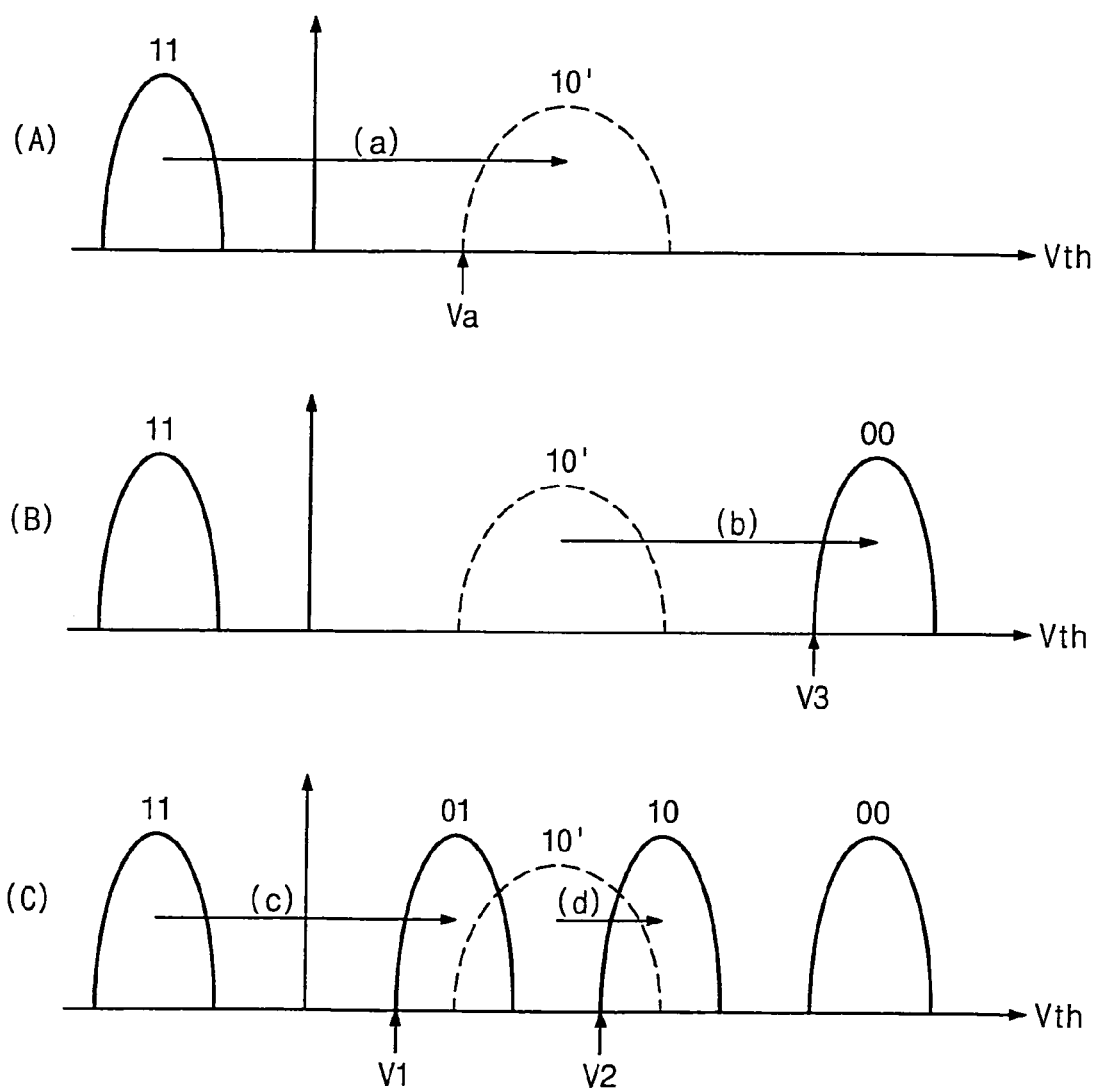
FIGS. 58A through 58C are diagrams showing a first programming method according to the present invention.

FIGS. 58A through 58C are diagrams showing the first programming method according to the present invention. FIG. 58A shows threshold voltage variation while programming LSB data. FIG. 58B shows threshold voltage variation while programming data to have the state '00'. FIG. 58C shows threshold voltage variation while programming data to have the states '01' and '10'.

First, it will be described about a procedure of programming the LSB with reference to FIG. 58A. A memory cell having the state '11' (the erased state) is programmed to have the state 10' in accordance with the LSB data. For example, the memory cell maintains the state '11' if the LSB data is '1'. The memory cell transitions to the state 10' if the LSB data is '0'. During this, a verify-reading operation is carried out by using a verifying voltage Va. If threshold voltages of all memory cells having the LSB of '0' are higher than the verifying voltage, the programming operation is completed.

Next, the memory controller transfers data of a page volume from the buffer memory to the flash memory in order to program the MSB. Referring to FIG. 58B, if the MSB data is '0', a memory cell having the state 10' is programmed to have the state '00'. During this, the verify-reading operation is conducted by using a verifying voltage V3. If threshold voltages of all memory cells having the MSB of '0' are higher than the verifying voltage V3, the programming operation is completed.

Referring to FIG. 58C, the MSB data is '1', a memory cell having the state '11' is programmed to have the state '01' and a memory cell having the state 10' is programmed to have the state '10'. During this, it detects whether a program pass succeeds or not by means of verifying voltages V1 and V2. But, as aforementioned, there could be a program fail while programming the MSB into the memory cell in which the LSB has been programmed. If there is an error while programming the MSB, it may affect the LSB that has been already programmed in the memory cell.

Therefore, in the embodiment of the present invention, the first programming method aforementioned is adopted thereto when not requiring high reliability, while the second programming method described later is adopted thereto when requiring high reliability. Adopting the second programming method described later, the LSB data is not lost even when there is a program fail while programming the MSB. As a result, the nonvolatile memory device is improved in reliability.

FIGS. 59A through 59D are diagrams for illustrating the second programming method according to the present invention. FIGS. 59A through 59D show a procedure of programming the LSB and MSB, i.e., 2-bit data, into a memory cell. Different from the first programming method, the second programming method is carried out in the sequence from the state '10'' to the state '10' and from the state '11' to the state '01'.

Figure 59:
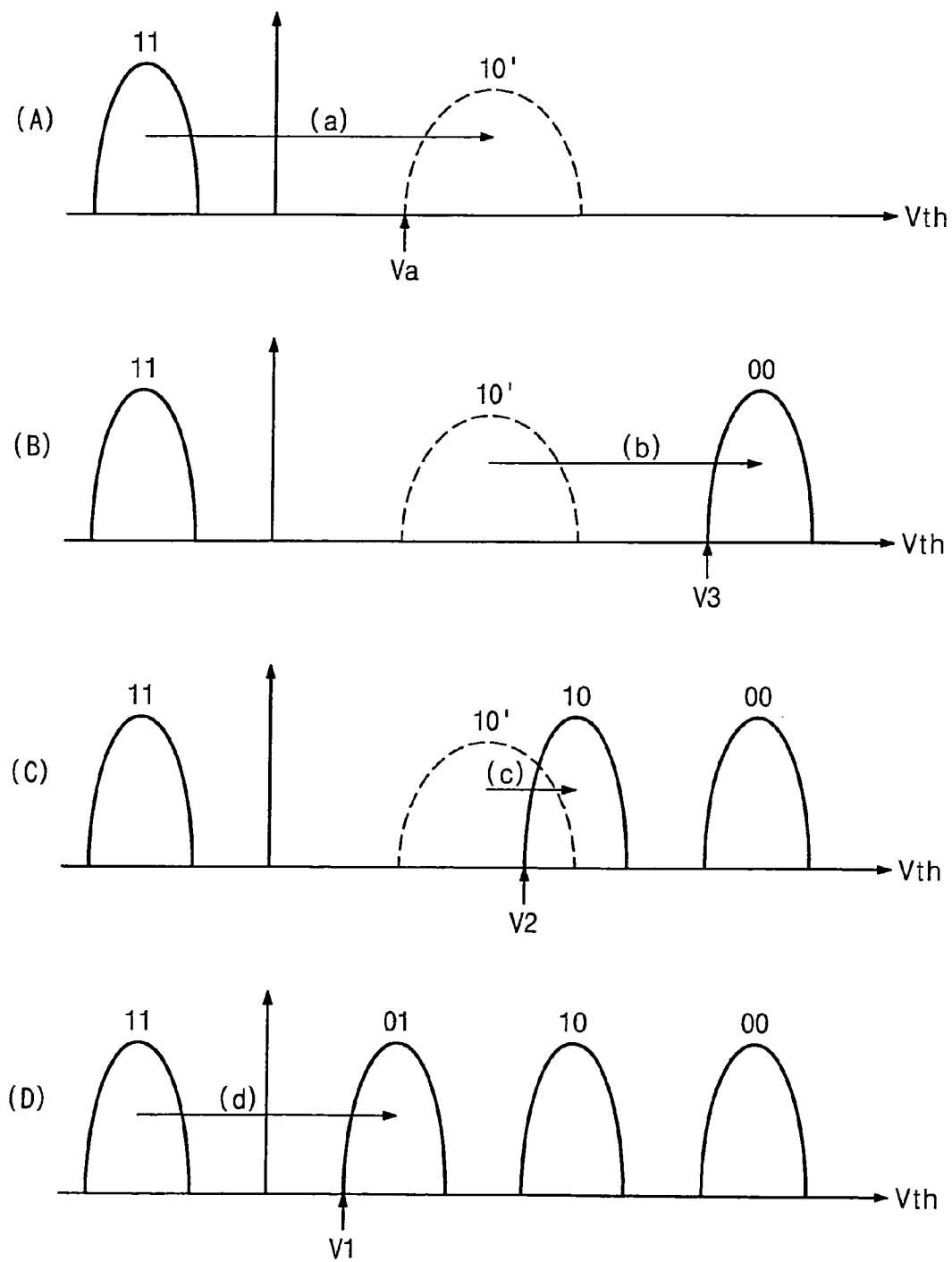
FIGS. 59A through 59D are diagrams for illustrating another programming method according to the present invention.

Referring to FIG. 59A, first it will be described about a method for programming the LSB. A memory cell having the state '11' is programmed to have the state '11' or 10' in accordance with the LSB data. For instance, if the LSB data is '1', the memory cell maintains the state '11'. If the LSB data is '0', the memory cell goes to the state 10'. During this, the verify-reading operation is conducted by using the verifying voltage Va. If threshold voltages of all memory cells having the MSB of '0' are higher than the verifying voltage Va, the programming operation is completed.

Next, the memory controller transfers data of a page volume from the buffer memory to the flash memory in order to program the MSB. Referring to FIG. 59B, if the MSB data is '0', a memory cell having the state 10' is programmed to have the state '00'. During this, it detects a program pass by means of the verifying voltage V3. If threshold voltages of all memory cells having the MSB of '0' are higher than the verifying voltage V3, the programming operation is completed.

Referring to FIG. 59C, if the MSB data is '1', a memory cell having the state 10' is programmed to have the state '10'. During this, it detects a program pass by means of the verifying voltage V2. If threshold voltages of all memory cells having the MSB of '1' are higher than the verifying voltage V2, the programming operation is completed.

Referring to FIG. 59D, if the MSB data is '0', a memory cell having the state '11' is programmed to have the state '01'. During this, it detects a program pass by means of the verifying voltage V1. If threshold voltages of all memory cells having the MSB of '0' are higher than the verifying voltage V1, the programming operation is completed.

Referring to FIGS. 59A through 59D, the programming stages respective to the states are carried out in sequence. Thus, it is able to detect where a program fail is generated. Further, as described later, it is possible to restore the LSB data if it finds a stage where program fail is generated.

Which programming stage a program fail is generated in can be detected by various ways. The embodiments of the present invention will be described with relevance to a method using an error correction circuit and a method using a flag memory cell or a flag register. But, the present invention is not restricted thereto. It is also available to use other various ways in detecting a program fail stage.

Figure 60:
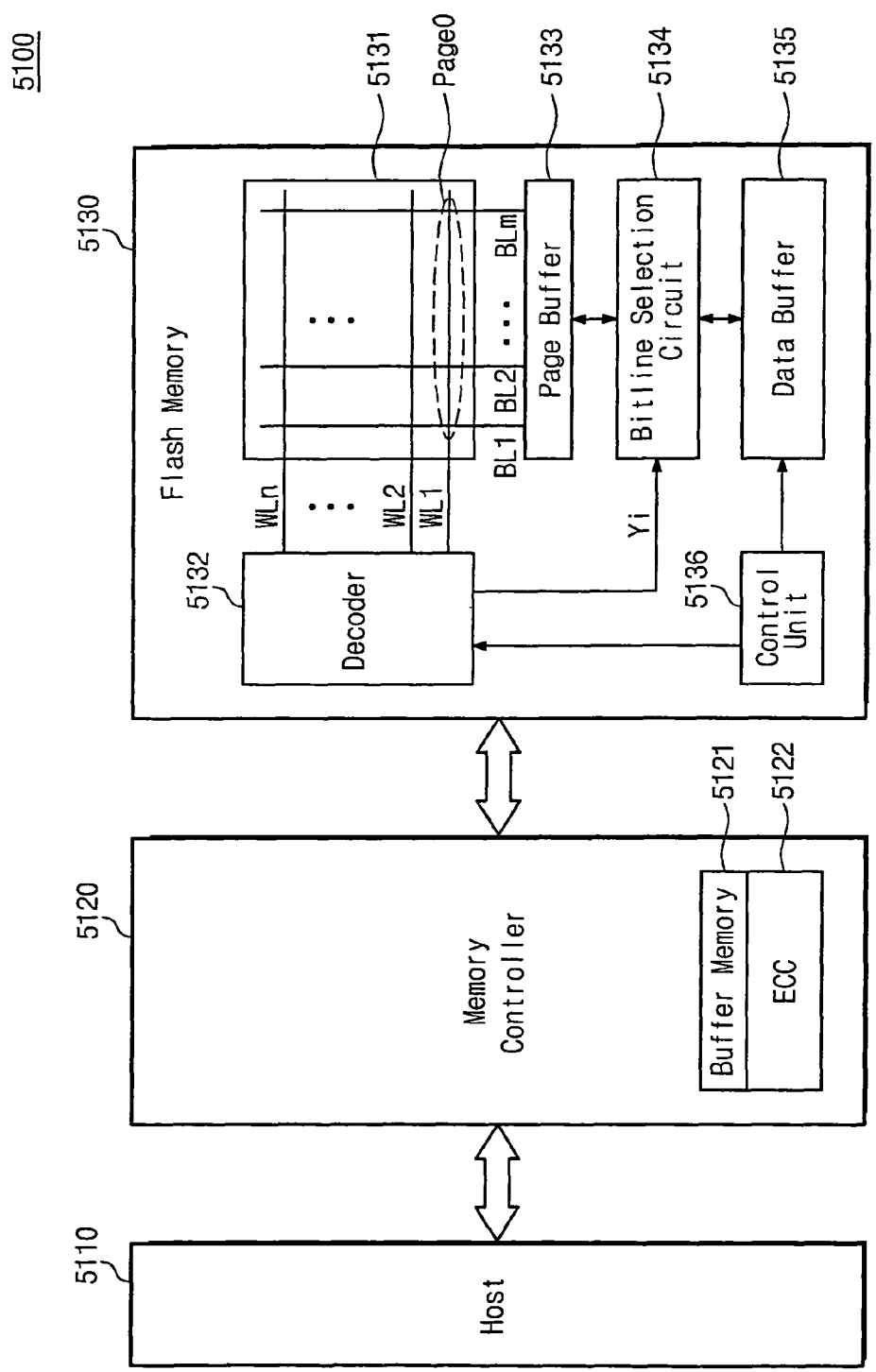
FIG. 60 is a block diagram for illustrating a method of detecting a program fail stage in accordance with the present invention.

FIG. 60 is a block diagram for illustrating a method of detecting a program fail stage in accordance with the present invention. Referring to FIG. 60, a memory system 5100 according to the present invention includes a host 5110, a memory controller 5120, and a flash memory 5130. Here, the flash memory 5130 is able to store multi-bit data in a memory cell.

In FIG. 60, the memory controller 5120 and the flash memory 5130 may be included in a memory card. This memory card includes a MMC (Multi Media Card), an SD card, an XD card, or a SIM card. Further, this memory card is used in connection with the host 5110 such as a digital camera, a mobile phone, an MP3 player, or a PMP.

The memory controller 5120 inputs a command from the host 5110 and controls an overall operation (e.g., writing and reading operations) of the flash memory 5130 in compliance with the input command. Referring to FIG. 60, the memory controller 5120 includes a buffer memory 5121 and an error correction circuit 5122.

The buffer memory 5121 is used for temporarily storing data to be written into the flash memory 5130 or data read from the flash memory 5130. Data stored in the buffer memory 5130 is transferred to the flash memory 5130 or the host 5110 by control of the memory controller 5120. The buffer memory 5121 may be implemented in a random access memory (RAM), e.g., a SRAM or DRAM.

The memory system 5100 according to the present invention includes the error correction circuit 5122 in the memory controller 5120. Error correction is to detect and correct an error, even if the error is partly generated from data, by adding a check code to data, which is to be stored, according to a set rule.

A conceptual operational of the error correction is to generate a check code from input data in an input operation and to store all the input data and check code. And, in an output operation, an error is detected and corrected by comparing the stored check code with the check code generated from the data.

Continuously referring to FIG. 60, the flash memory 5130 is comprised of a cell array 5131, a decoder 5132, a page buffer 5133, a bitline selection circuit 5134, a data buffer 5135, and a control unit 5136. In FIG. 60, a NAND flash memory is illustrated as an example.

The cell array 5131 is formed of plural memory blocks (not shown). Each memory block is formed of plural pages (e.g., 128 pages). Each page is formed of plural memory cells sharing a word line WL. In the case of NAND flash memory, an erasing operation is conducted in the unit of block and reading and writing operations are conducted in the unit of page.

In the meantime, as aforementioned, each memory cell is able to store multi-bit data (e.g., 2-bit data). A 2-bit memory cell has four states or levels in accordance with threshold voltage distributions.

The decoder 5132 is connected to the cell array 5131 through word lines WL1~WLn, and controlled by the control unit 5136. The decoder 5132 inputs an address ADDR from the memory controller 5120, and selects a word line (e.g., WL1) or generates a selection signal Yi to select a bit line BL. The page buffer 5133 is connected to the cell array 5131 through bit lines BL1~BLm.

The page buffer 5133 stores data that are loaded from the buffer memory 5121. In the page buffer 5133, data is loaded in the volume of a page. The loaded data are simultaneously programmed in a selected page (e.g., page0) in the programming operation. On the other hand, the page buffer 5133 reads data from the page (e.g., page0) in the reading operation and temporarily stores read data. Data stored in the page buffer 5133 is transferred to the buffer memory 5121 in response to a read-enable signal (nRE; not shown).

The bitline selection circuit 5134 is a circuit for selecting a bit line in response to the selection signal Yi. The data buffer 5155 is an input/output buffer used for data transmission between the memory controller 5155 and the flash memory 5130. The control unit 5136 inputs a control signal from the memory controller 5120, as a circuit for controlling an internal operation of the flash memory 5130.

The memory system 5100 is comprised of the error correction circuit 5122 in the memory controller 5120. The error correction circuit 5122 detects which programming stage a fail is generated from. A method of detecting a program fail will be detailed with reference to the figures illustrated later.

Figure 61:
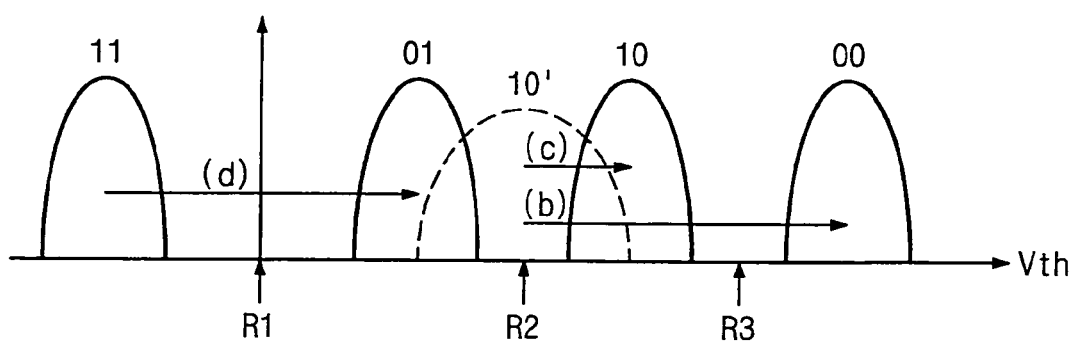
FIG. 61 is a diagram for illustrating a method of detecting a program fail by the error correction circuit shown in FIG. 60.

FIG. 61 is a diagram for illustrating a method of detecting a program fail by the error correction circuit shown in FIG. 60. In this embodiment, the error correction circuit detects a program fail by finding whether an error is generated in an uncorrectable degree.

Referring to FIG. 61, first, the reading operation is conducted by using a read voltage R2. The error correction circuit detects generation of an error with reference to read data. If an error is generated in an uncorrectable degree, this means there is a fail while programming the MSB data.

For example, it is assumed that a program fail is generated during transition from the state 10' to the state '10'. Due to the program fail, among memory cells that must be programmed into the state '10', threshold voltages of one group memory cells are lower than the read voltage R2 and threshold voltage of the other group memory cells are higher than the read voltage R2. This means that the program fail is generated during transition from the state 10' to the state '10'. Thus, an error is detected by the error correction circuit.

Thereby, the LSB data can be correctly read by conducting the reading operation with the read voltage V2. For instance, if a memory cell is turned on when a read voltage R1 is applied thereto, it means the LSB data is '1'. To the contrary, if a memory cell is turned off when the read voltage R1 is applied thereto, it means the LSB data is '0'.

As stated above, the reason a program fail stage is detectable by the error correction circuit is because transitions from the state 10' to the state '10' and from the state '11' to the state '01' sequentially proceed by the second programming method. If as like the first programming method, the transitions from the state 10' to the state '10' and from the state '11' to the state '01' proceed at the same time, the error correction circuit is unable to correctly detect a program fail stage. This is because, if an error is generated while applying the read voltage R2 thereto, it is impossible to find out whether the error is generated while programming the memory cell from the state '11' into the state '01' or from the state 10' into the state '10'.

As a result, by the second programming operation according to the present invention, it is able to correctly detect a program fail stage. Through this manner, the LSB data can be correctly read even if there is an MSB program fail. While the NAND flash memory is exemplified in the embodiment, the present invention is applicable to a NOR flash memory.

An implementation of blind testing algorithm determines the failed programming stage without help of 'flag cell memory'. So called blind testing algorithm makes a series of assumption on a specific failed programming stage, and based on the assumption, applies appropriate read threshold voltage to read out the stored LSB data, and runs ECC algorithm on the read out data, and check whether the result of ECC is successful, and if the ECC result is successful then concludes the current assumption on the specific failed programming stage is correct, and then return the read out data, otherwise if the ECC result is not successful then concludes the current assumption is false and makes another assumption on the failed programming stage.

Figure 62:
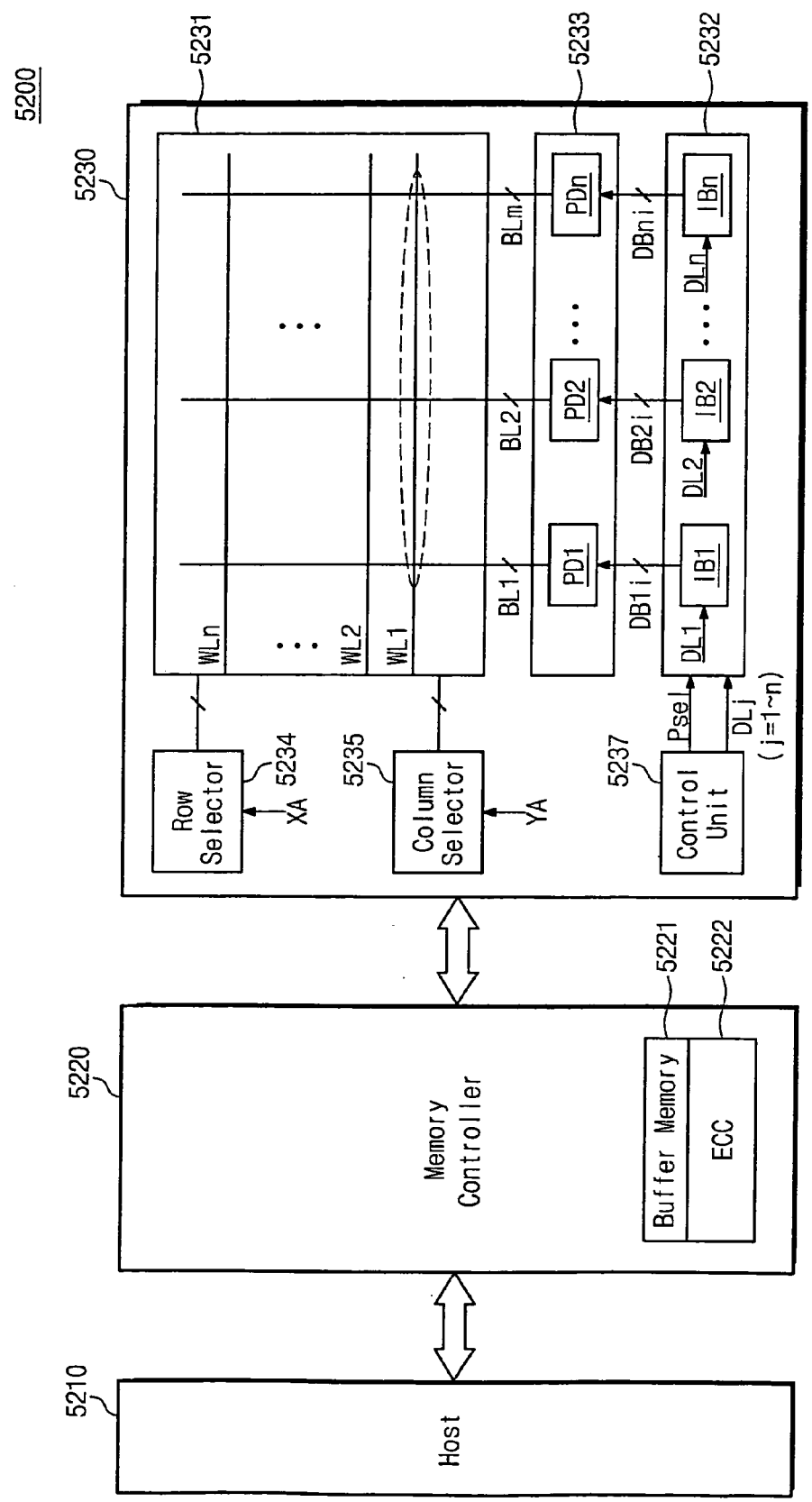
FIG. 62 is a block diagram showing an embodiment of a NOR flash memory device according to the present invention.

FIG. 62 is a block diagram showing an embodiment of a NOR flash memory device according to the present invention. Referring to FIG. 62, a memory system 5200 according to the present invention includes a host 5210, a memory controller 5220, and a NOR flash memory 5230. Here, the NOR flash memory 5230 is able to store multi-bit data in a memory cell.

The NOR flash memory 5230 according to the present invention includes a cell array 5231, a row selector 5234, and a column selector 5235. The cell array 5231 includes memory cells (not shown) placed at intersections of plural word and bit lines. The row selector 5234 selects a word line in response to a row address XA. The column selector 5235 selects bit lines in response to a column address YA.

The NOR flash memory 5230 according to the present invention includes a data input buffer 5232, a program driver 5233, and a control circuit 5237. The data input buffer 5232 inputs program data in parallel through data lines. The input program data are stored in input buffers IB1, IB2, and IB3. Further, the data input buffer 5232 outputs data to the program driver 5233 from the input buffers IB1, IB2, and IB3 when a program selection signal Psel is high.

The control circuit 5237 provides the program selection signal Psel and a data latch signal DLj (j=1~n). The program driver 5233 simultaneously applies program voltages BL1$i$, BL2$i$, BL$ni$ (i=1~16) in response to program data DB1$i$, DB2$i$, DB$ni$ (i=1~16). The program driver 5233 includes drivers PD1, PD2, and PD3 corresponding to the input buffers IB1, IB2, and IB3.

Figure 63:
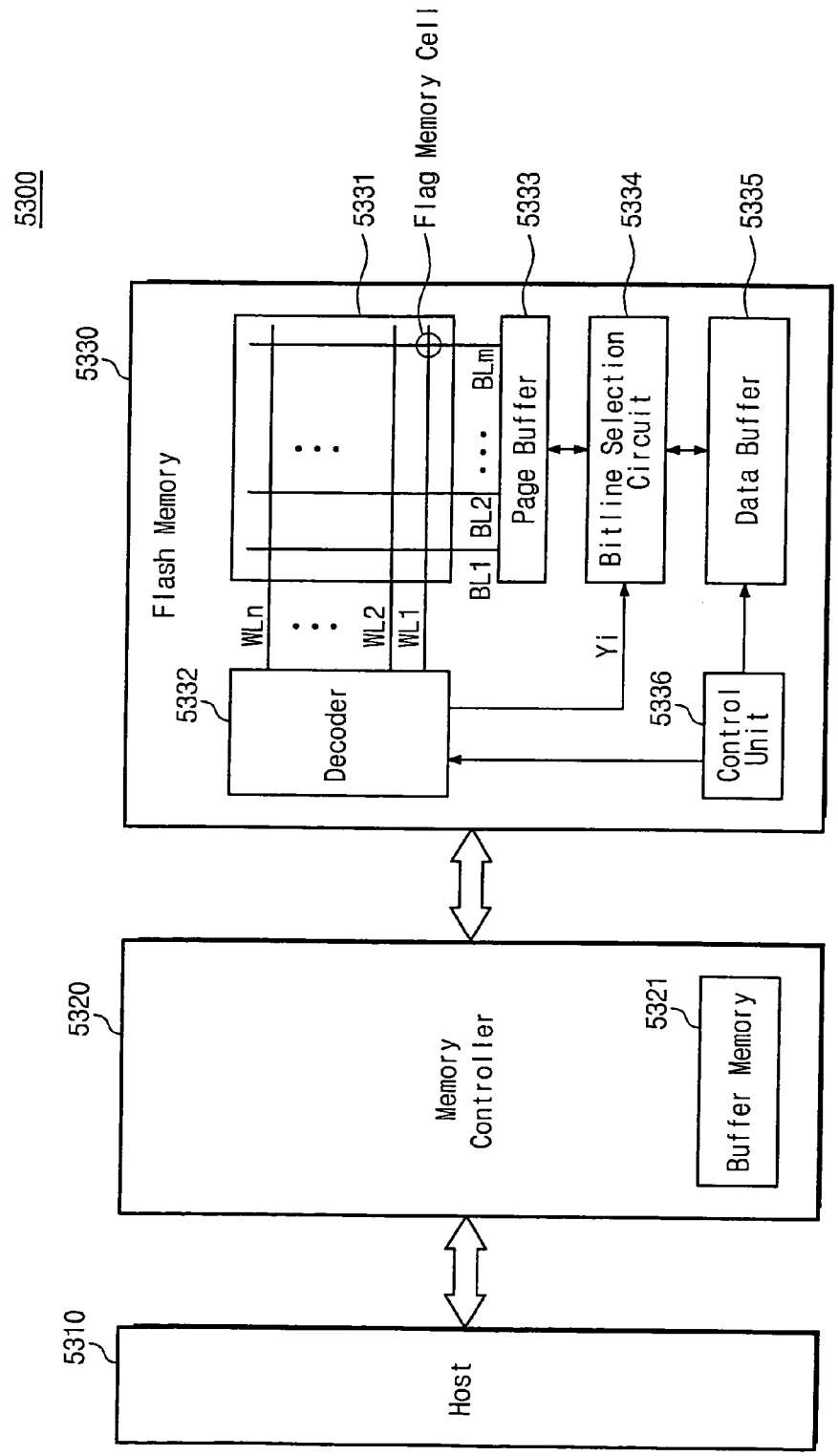
FIG. 63 is a block diagram for illustrating another method of detecting a program fail stage in accordance with the present invention.

FIG. 63 is a block diagram for illustrating another method of detecting a program fail stage in accordance with the present invention. Referring to FIG. 63, a memory system 5300 according to the present invention includes a host 5310, a memory controller 5320, and a flash memory 5330. The flash memory 5330 is able to store multi-bit data in a memory cell. The memory controller 5320 includes a buffer memory 5231. The flash memory 5330 includes a memory array 5331, a decoder 5332, a page buffer 5333, a bit line selection circuit 5334, a data buffer 5335 and a control unit 5336. The elements of the memory controller 5320 and the flash memory 5330 are the same as the like named elements described with respect to FIG. 60.

Here, to detect a program fail stage, memory cells of a memory cell array 5330 are partly used as flag memory cells. Threshold voltages of the flag memory cells vary whenever completing a programming stage. A method of changing threshold voltages of the flag memory cells by completing the programming stages will be described.

Figure 64:
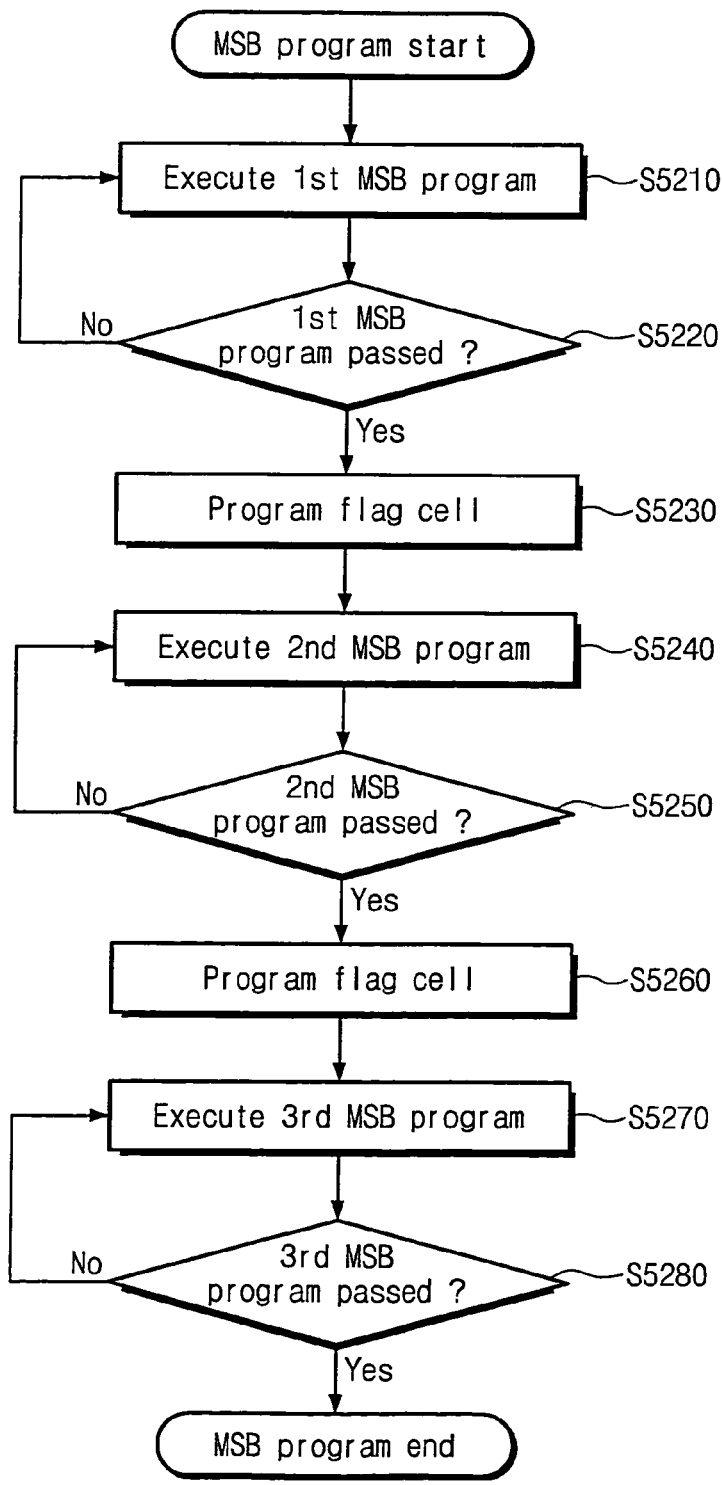
FIG. 64 is a flow chart for illustrating a method of changing threshold voltages of flag memory cells by programming.

FIG. 64 is a flow chart for illustrating a method of changing threshold voltages of the flag memory cells by programming. Referring to FIG. 64, first through third MSB programming operations are carried out in sequence. The first MSB programming operation means that a threshold voltage of the memory cell transitions to the state '00' from the state 10'. The second MSB programming operation means that a threshold voltage of the memory cell transitions to the state '10' from the state 10'. And the third MSB programming operation means that a threshold voltage of the memory cell transitions to the state '01' from the state '11'.

First in a step S5210, the first MSB programming operations is carried out. By the first MSB programming operation, threshold voltages of the memory cells partly transition into the state '00' from the state 10'. The rest of the memory cells do not vary in threshold voltage because they are prohibited in programming. In a step S5220, the flash memory (e.g., the control unit) determines whether the first MSB programming operation has been passed or not. Determining a program pass or not can be carried out by means of a well-known method such as Y-scan checking or wired-OR checking. Thus, a pass/fail checking method will be detailed.

Unless the first MSB programming operation has been passed, the first MSB programming operation resumes. If the first MSB programming operation has been passed, a step S5230 is conducted. In the step S5230, the flag memory cells are programmed. By programming, the flag memory cells are changed in threshold voltage. For instance, if the first MSB programming operation has been passed, a threshold voltage of the flag memory cell can rise up to the state '01'. Thus, if a threshold voltage of the flag memory cell is in the state '01', it can be seen that the first MSB programming operation is completed.

After programming the flag memory cells, the second MSB programming operation is carried out in a step S5240. By the second MSB programming operation, threshold voltages of the memory cells partly transition into the state '10' from the state 10'. The rest of the memory cells do not vary in threshold voltage because they are prohibited in programming. In a step S5250, the flash memory (e.g., the control unit) determines whether the second MSB programming operation has been passed or not. Unless the second MSB programming operation has been passed, the second MSB programming operation resumes. If the second MSB programming operation has been passed, a step S5260 is conducted.

In the step S5260, the flag memory cells are programmed. By programming, the flag memory cells are changed in threshold voltage. For instance, if the second MSB programming operation has been passed, a threshold voltage of the flag memory cell can rise up to the state '10'. Thus, if a threshold voltage of the flag memory cell is in the state '10', it can be seen that the second MSB programming operation is completed.

After programming the flag memory cells, the third MSB programming operation is carried out in a step S5270. By the third MSB programming operation, threshold voltages of the memory cells partly transition into the state '01' from the state '11'. The rest of the memory cells do not vary in threshold voltage because they are prohibited in programming. In a step S5280, the flash memory (e.g., the control unit) determines whether the third MSB programming operation has been passed or not. Unless the third MSB programming operation has been passed, the third MSB programming operation resumes. If the third MSB programming operation has been passed, the MSB programming operation is terminated.

As aforementioned, threshold voltage of the memory cells are changed whenever each programming stage is completed. Therefore, by referring to the threshold voltage of the flag memory cell, the flash memory (e.g., the control unit) is able to detect which stage the programming operation is completed up to. For instance, if a program fail is generated due to power failure during the second MSB programming operation, the flag memory cell has the state '01' in threshold voltage.

It is here assumed that the flag memory cell is a multi-bit cell, however, it will be appreciated by those skilled in the art that the flag memory cell may be a plurality of single level cells. The aforementioned method is even applicable to a NOR flash memory device. In this case, the flag memory cells may be comprised in a memory cell array in the NOR flash memory device.

Figure 65:
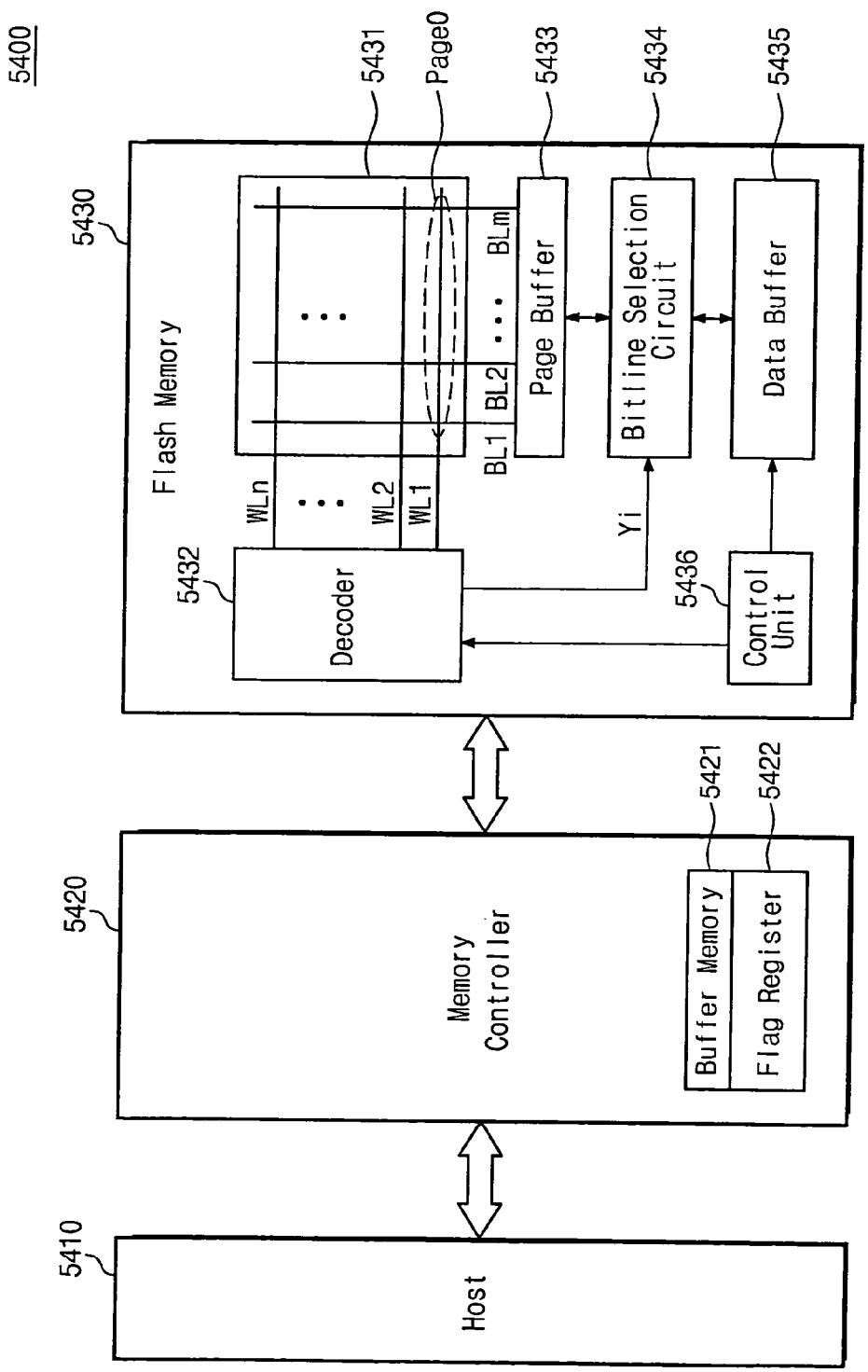
FIG. 65 is a block diagram for illustrating still another method of detecting program fails in a memory system according to the present invention.

FIG. 65 is a block diagram for illustrating still another method of detecting program fails in a memory system according to the present invention. Referring to FIG. 65, the memory system 5400 according to the present invention includes a host 5410, a memory controller 5420, and a flash memory 5430. The memory controller 5420 includes a buffer memory 5421. The flash memory 5430 includes a memory cell array 5431, a decoder 5432, a page buffer 5433, a bit line selection circuit 5434, a data buffer 5435 and a circuit unit 5436. The elements of the memory controller 5420 and the flash memory 5430 discussed above are the same as the like named elements described with respect to FIG. 60.

In this embodiment, the memory controller 5420 also includes a flag register 5422 for detecting a program fail. Data stored in the flag register 5422 is updated whenever completing the programming stage. The flag register 5422 may be formed of a nonvolatile memory device that is free from data loss due to power failure or so on. Thus, referring to data stored in the flag register 5422, the memory controller 5420 or flash memory 5430 (e.g., the control unit) is able to find which stage the programming operation is completed up to. A method of updating the flag register 5422 by completing the programming stage will be described with reference to the figures illustrated later.

Figure 66:
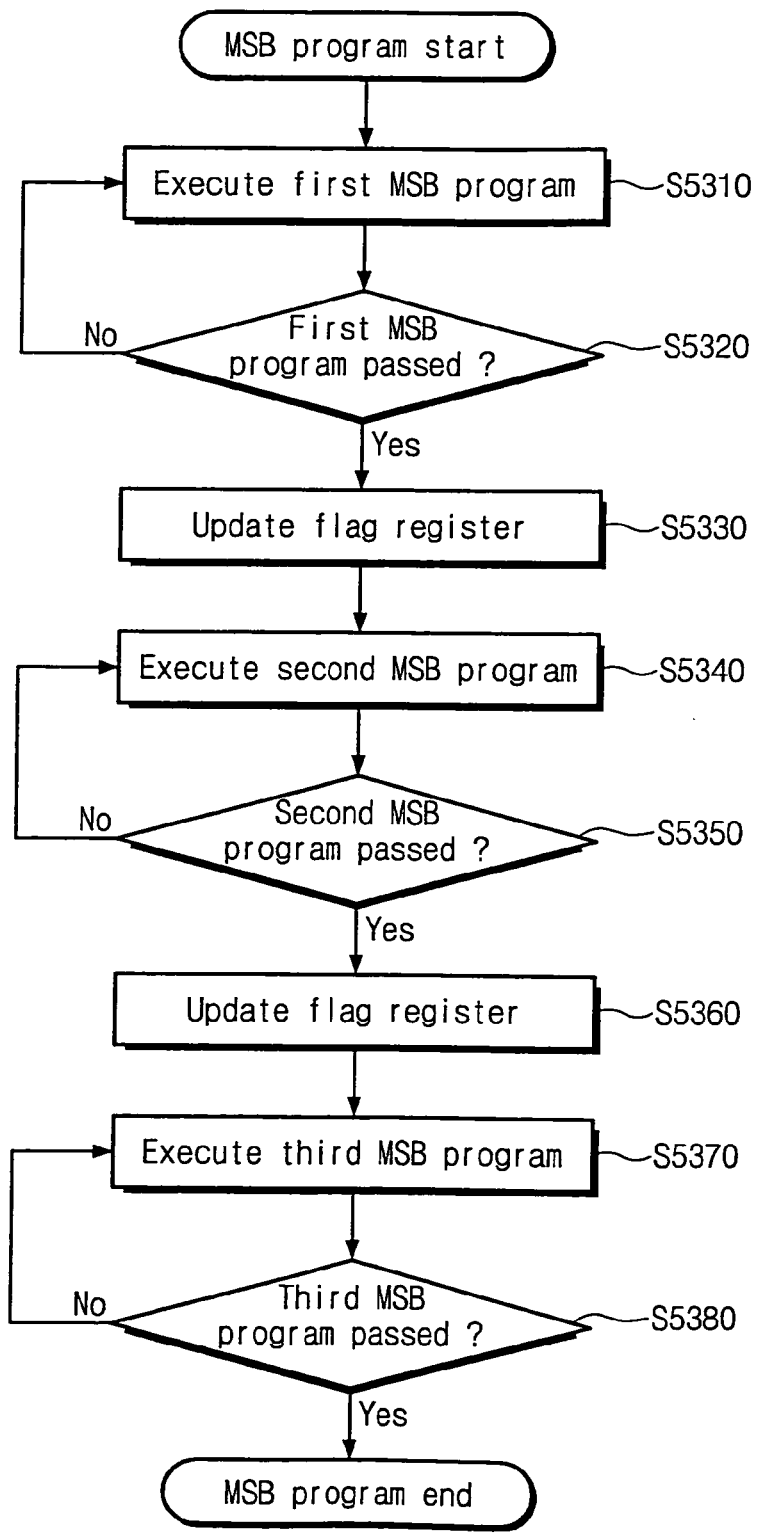
FIG. 66 is a flow chart for illustrating a method changing data stored in a flag register by completing a programming stage.

FIG. 66 is a flow chart for illustrating a method changing data stored in the flag register by completing the programming stage. Referring to FIG. 66, the first through third MSB programming operations are conducted in sequence. The first MSB programming operation means that a threshold voltage of the memory cell transitions to the state '00' from the state 10'. The second MSB programming operation means that a threshold voltage of the memory cell transitions to the state '10' from the state 10'. And the third MSB programming operation means that a threshold voltage of the memory cell transitions to the state '01' from the state '11'.

First in a step S5310, the first MSB programming operations is carried out. By the first MSB programming operation, threshold voltages of the memory cells partly transition into the state '00' from the state 10'. The rest of the memory cells do not vary in threshold voltage because they are prohibited in programming. In a step S5320, it determines whether the first MSB programming operation has been passed or not. Determining a program pass or not can be carried out by means of a well-known method such as Y-scan checking or wired-OR checking. Thus, a pass/fail checking method will be detailed. Unless the first MSB programming operation has been passed, the first MSB programming operation resumes. If the first MSB programming operation has been passed, a step S5330 is conducted.

In the step S5330, data stored in the flag register are updated. By updating, the flag register has data indicating that the first MSB programming operation has been passed. Therefore, referring to data stored in the flag register, the memory controller 5420 or flash memory 5430 (e.g., the control unit) are able to find which stage the programming operation is completed up to.

After updating the flag register, the second MSB programming operation is carried out in a step S5340. By the second MSB programming operation, threshold voltages of the memory cells partly transition into the state '10' from the state 10'. The rest of the memory cells do not vary in threshold voltage because they are prohibited in programming. In a step S5350, it determines whether the second MSB programming operation has been passed or not. Unless the second MSB programming operation has been passed, the second MSB programming operation resumes. If the second MSB programming operation has been passed, a step S5360 is conducted.

In the step S5360, data stored in the flag register are updated. By updating, the flag register has data indicating that the second MSB programming operation has been passed. Therefore, referring to data stored in the flag register, it is able to find which stage the programming operation is completed up to.

After updating the flag register, the third MSB programming operation is carried out in a step S5370. By the third MSB programming operation, threshold voltages of the memory cells partly transition into the state '01' from the state '11'. The rest of the memory cells do not vary in threshold voltage because they are prohibited in programming. In a step S5380, it determines whether the third MSB programming operation has been passed or not. Unless the third MSB programming operation has been passed, the third MSB programming operation resumes. If the third MSB programming operation has been passed, the MSB programming operation is terminated.

As aforementioned, data stored in the flag register are changed whenever each programming stage is completed. Therefore, by referring to data stored in the flag register, it is able to detect which stage the programming operation is completed up to. For instance, if a program fail is generated due to power failure during the second MSB programming operation, the flag register stores data informing that the first MSB programming operation has been passed.

The flag register may be formed of a nonvolatile memory free from an effect caused by power failure or so on. The aforementioned method is applicable even to a NOR flash memory device. In this case, the flag register may be comprised in a memory controller in the NOR flash memory device.

Figure 67:
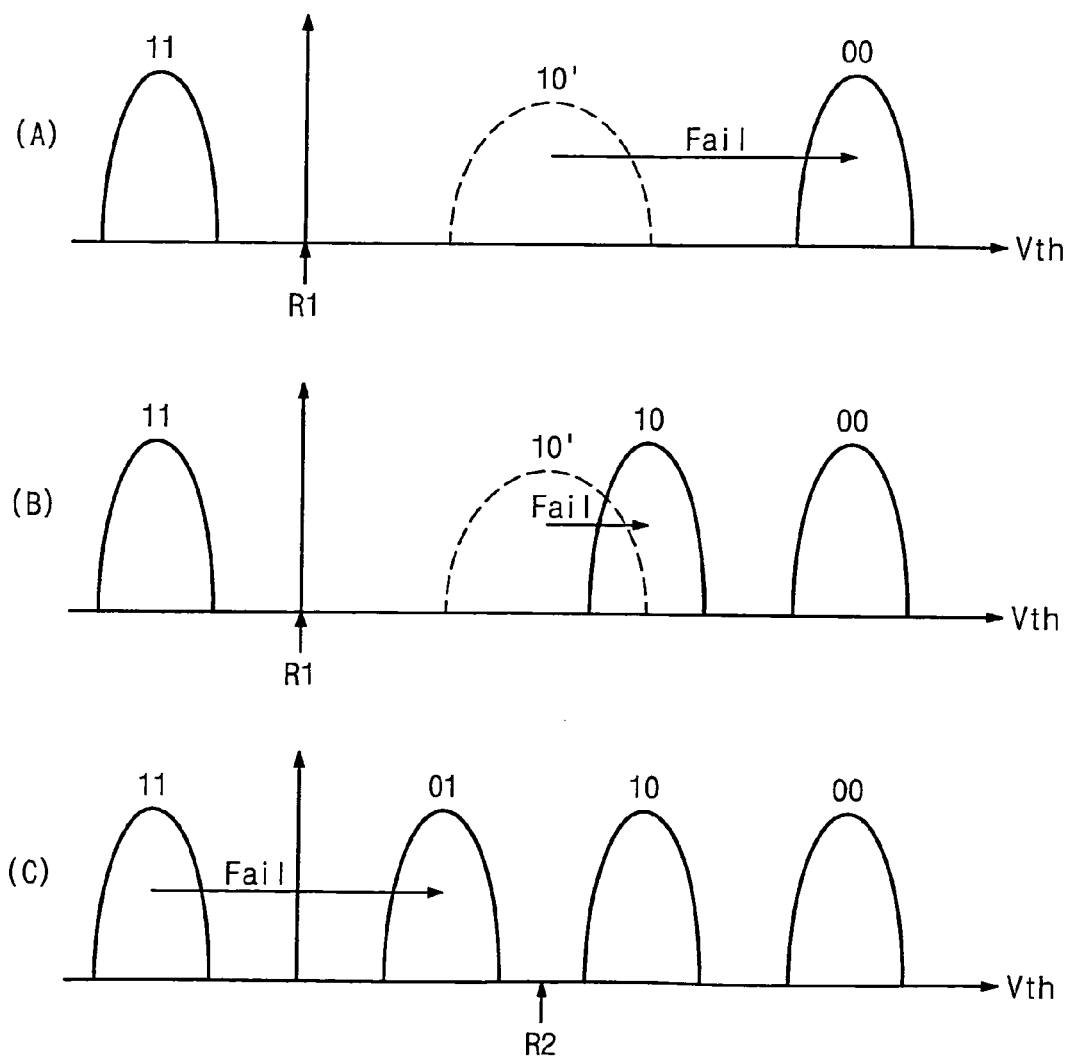
FIGS. 67A through 67C are diagrams showing LSB reading methods according to the present invention.

FIGS. 67A through 67C are diagrams showing LSB reading methods according to the present invention. As aforementioned, after detecting which stage a program fail is generated from, the LSB reading methods are differently applied thereto in accordance with a result of the detection.

FIG. 67A is a diagram showing the LSB reading method in the case that a program fail is generated due to power failure or so on during the first MSB programming operation. Referring to FIG. 67A, if a program fail is generated during transition from the state 10' into the state '00', the LSB data can be read by applying the read voltage R1 to a gate of a selected memory cell. For example, at the time of applying the read voltage R1, if the memory cell is turned on, it means the LSB data is '1'. To the contrary, if the memory cell is turned off, it means the LSB data is '0'.

FIG. 67B is a diagram showing the LSB reading method in the case that a program fail is generated due to power failure or so on during the second MSB programming operation. Referring to FIG. 67B, if a program fail is generated during transition from the state 10' into the state '10', the LSB data can be read by applying the read voltage R1. For example, at the time of applying the read voltage R1, if the memory cell is turned on, it means the LSB data is '1'. To the contrary, if the memory cell is turned off, it means the LSB data is '0'.

FIG. 67C is a diagram showing the LSB reading method in the case that a program fail is generated due to power failure or so on during the third MSB programming operation. Referring to FIG. 67C, if a program fail is generated during transition from the state '11' into the state '01', the LSB data can be read by applying the read voltage R2. For example, at the time of applying the read voltage R2, if the memory cell is turned on, it means the LSB data is '1'. To the contrary, if the memory cell is turned off, it means the LSB data is '0'.

By the aforementioned methods, the LSB may be stably restored data even if a program fail is generated due to power failure or so on while programming the MSB data. Therefore, the semiconductor memory device is improved in reliability.

Figure 68:
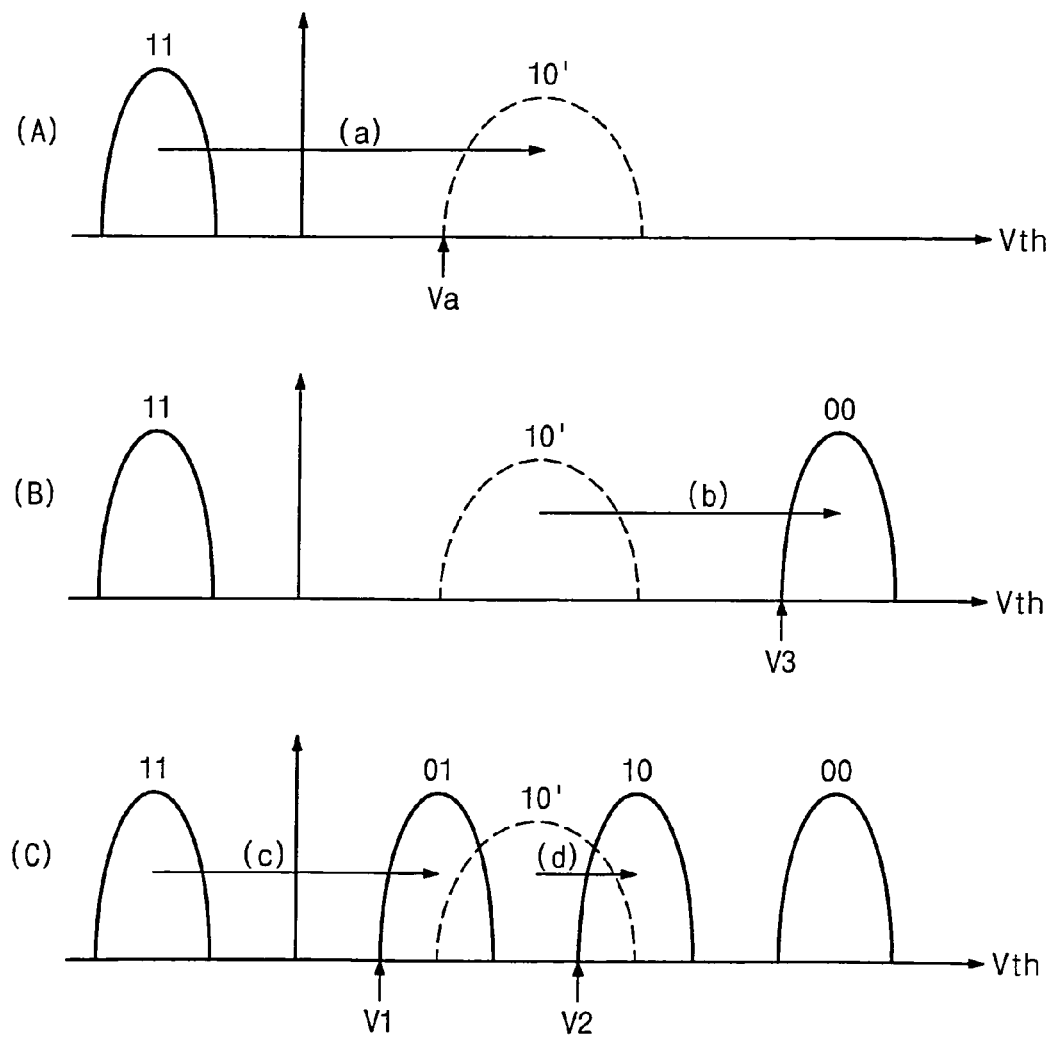
FIGS. 68A through 68C show one of the programming methods according to the present invention.
Figure 69:
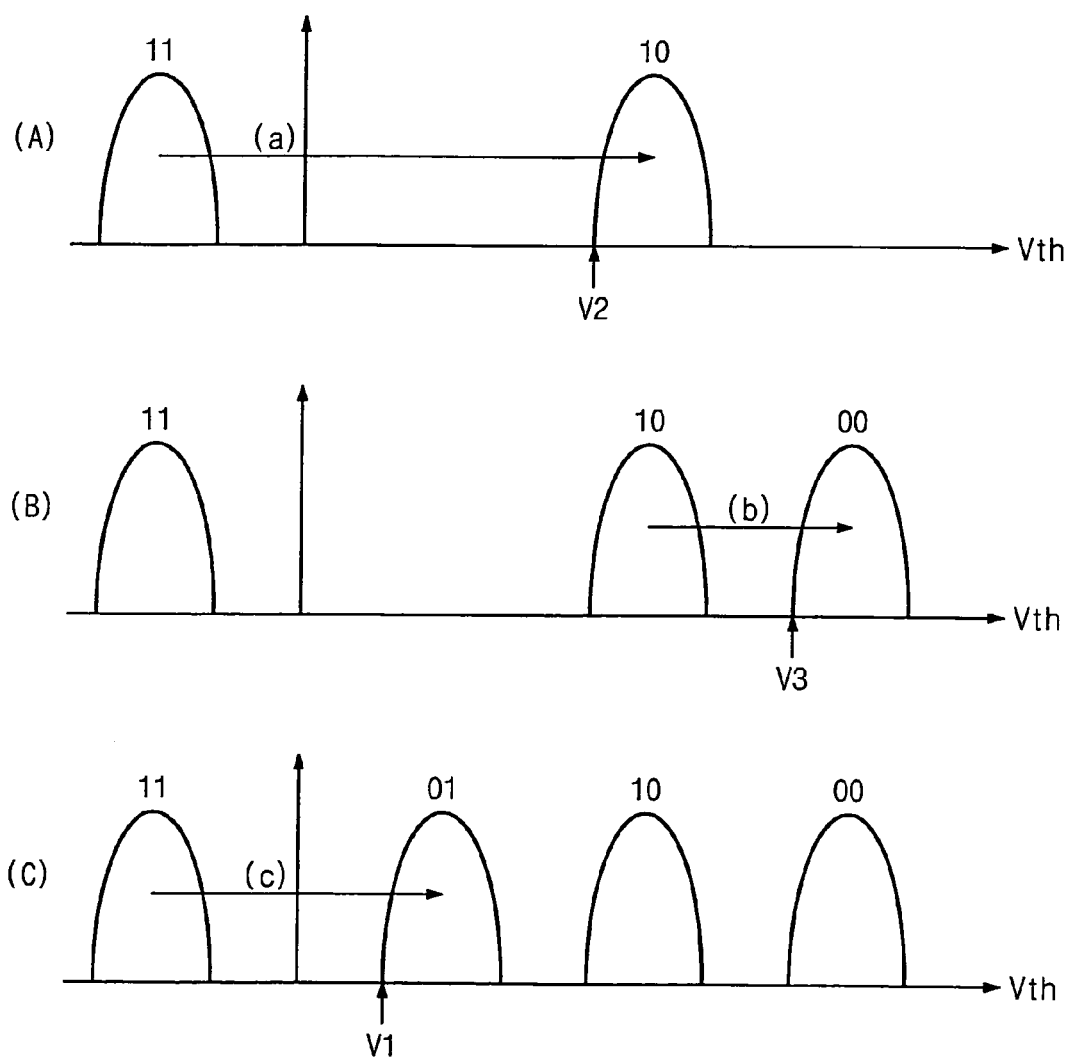
FIGS. 69A through 69C show another programming method according to the present invention.

As shown in FIG. 57, the first and second programming methods are alternatively selected in accordance with a degree of reliability required therefor. The first and second programming methods may be implemented in various embodiments. Hereinafter will be described the first and second programming methods in accordance with another embodiment of the present invention with reference to FIGS. 68 and 69.

FIGS. 68A through 68C show the first programming method according to the present invention. FIG. 68A shows a threshold voltage variation when the LSB data is programmed. FIG. 68B shows a threshold voltage variation when programmed to have the state '00'. FIG. 68C shows a threshold voltage variation when programmed to have the states '01' and '10'.

Referring to FIG. 68A, a procedure of programming the LSB is first described. A memory cell having the state '11' is programmed to have the state 10' in accordance with the LSB data. For instance, the memory cell maintains the state '11' if the LSB data is '1'. The memory cell transitions to the state 10' if the LSB data is '0'. During this, whether the programming has been passed is detected by means of the verifying voltage Va.

Next, the memory controller 5020 transfers data of a page volume to the flash memory 5030 from the buffer memory 5021 in order to program the MSB. Referring to FIG. 68B, if the MSB data is '0', a memory cell having the state 10' is programmed to have the state '00' in accordance with the MSB. During this, whether the programming has been passed is detected by means of the verifying voltage V3.

Referring to FIG. 68C, if the MSB data is '1', a memory cell having the state '11' is programmed to have the state '01' and a memory cell having the state 10' is programmed to have the state '10'. During this, whether the programming has been passed is detected by means of the verifying voltages V1 and V2.

In the meantime, as aforementioned, there is a possibility of generating a program fail while programming the MSB into the memory cell in which the LSB is programmed. If an error is generated while programming the MSB, it may affect the LSB that has been already programmed therein.

Therefore, in the embodiment of the present invention, the first programming method aforementioned is adopted thereto when not requiring high reliability, while the second programming method described later is adopted thereto when requiring high reliability. Adopting the second programming method, the LSB data is not lost even when there is a program fail while programming the MSB. As a result, the nonvolatile memory device is improved in reliability.

FIGS. 69A through 69C illustrate the second programming method according to the present invention. FIGS. 69A through 69C show a procedure of programming the LSB and MSB, i.e., 2-bit data, into a memory cell.

Referring to FIG. 69A, first it will be described about a procedure for programming the LSB. A memory cell having the state '11' is programmed to have the state '10' in accordance with the LSB data. For instance, if the LSB data is '1', the memory cell maintains the state '11'. If the LSB data is '0', the memory cell goes to the state '10'. During this, whether the programming has been passed is detected by means of the verifying voltage Va.

Next, the memory controller transfers data of a page volume from the buffer memory to the flash memory in order to program the MSB. Referring to FIG. 69B, if the MSB data is '0', a memory cell having the state '10' is programmed to have the state '00'. During this, it detects a program pass by means of the verifying voltage V3. To the contrary, if the MSB data is '1', the memory cell maintains the state '10' in threshold voltage.

Referring to FIG. 69C, if the MSB data is '0', a memory cell having the state '11' is programmed to have the state '01'. During this, it detects a program pass by means of the verifying voltage V1. To the contrary, if the MSB data is '1', the memory cell maintains the state '11' in threshold voltage.

As aforementioned, while programming the LSB data, a threshold voltage of a memory cell rises up to the state '10'. Thus, the states '11' and '01' are clearly distinguished from the states '10' and '00'. Thus, it is possible to restore the LSB data. In this embodiment, the LSB data can be restored regardless of which stage a program fail is generated in. As described later, this is because the LSB reading operation is conducted by means of the same read voltage R2 regardless of which stage a program fail is generated in.

Figure 70:
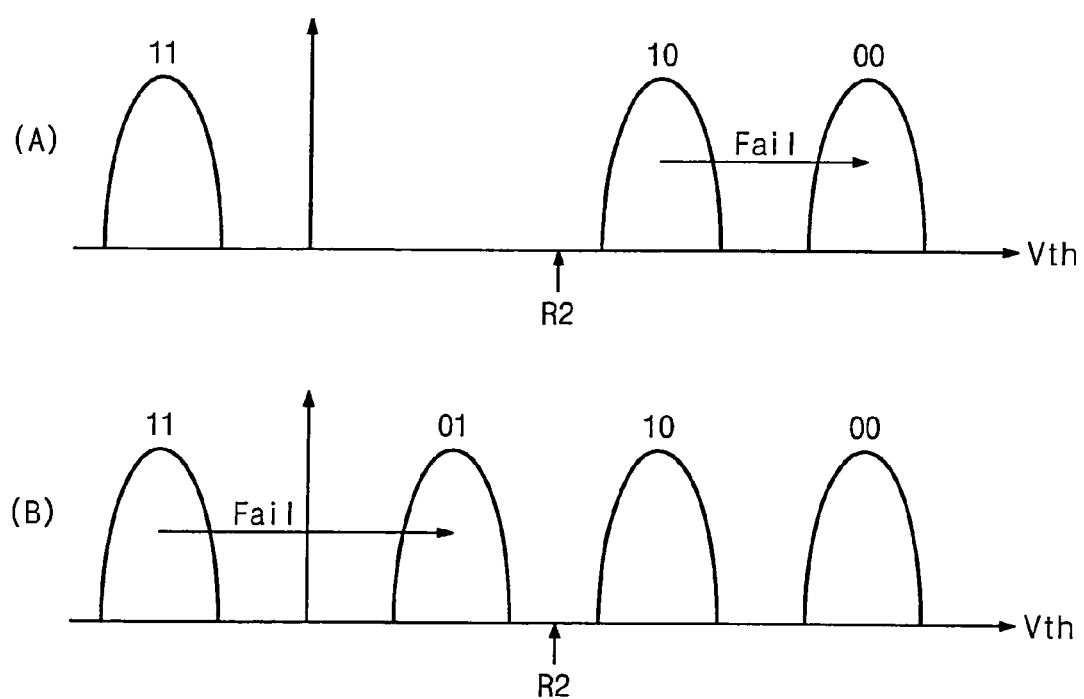
FIGS. 70A and 70B are diagrams showing an LSB reading method according to the present invention.

FIGS. 70A and 70B are diagrams showing an LSB reading method according to the present invention. In this method, the reading operation is conducted by means of the same read voltage R2 regardless of which stage a program fail is generated in.

FIG. 70A is a diagram showing the LSB reading method in the case that a program fail is generated due to power failure or so on during transition from the state '10' into the state '00'. Referring to FIG. 70A, if a program fail is generated during transition from the state '10' into the state '00', the LSB data can be read by applying the read voltage R2. For example, at the time of applying the read voltage R2, if the memory cell is turned on, it means the LSB data is '1'. To the contrary, if the memory cell is turned off, it means the LSB data is '0'.

FIG. 70B is a diagram showing the LSB reading method in the case that a program fail is generated due to power failure or so on during transition from the state '11' into the state '01'. Referring to FIG. 16C, if a program fail is generated during transition from the state '11' into the state '01', the LSB data can be read by applying the read voltage R2. For example, at the time of applying the read voltage R2, if the memory cell is turned on, it means the LSB data is '1'. To the contrary, if the memory cell is turned off, it means the LSB data is '0'.

By the aforementioned methods, it is able to stably restore the LSB data even if a program fail is generated due to power failure or so on while programming the MSB data. Therefore, the semiconductor memory device is improved in reliability.

Figure 71:
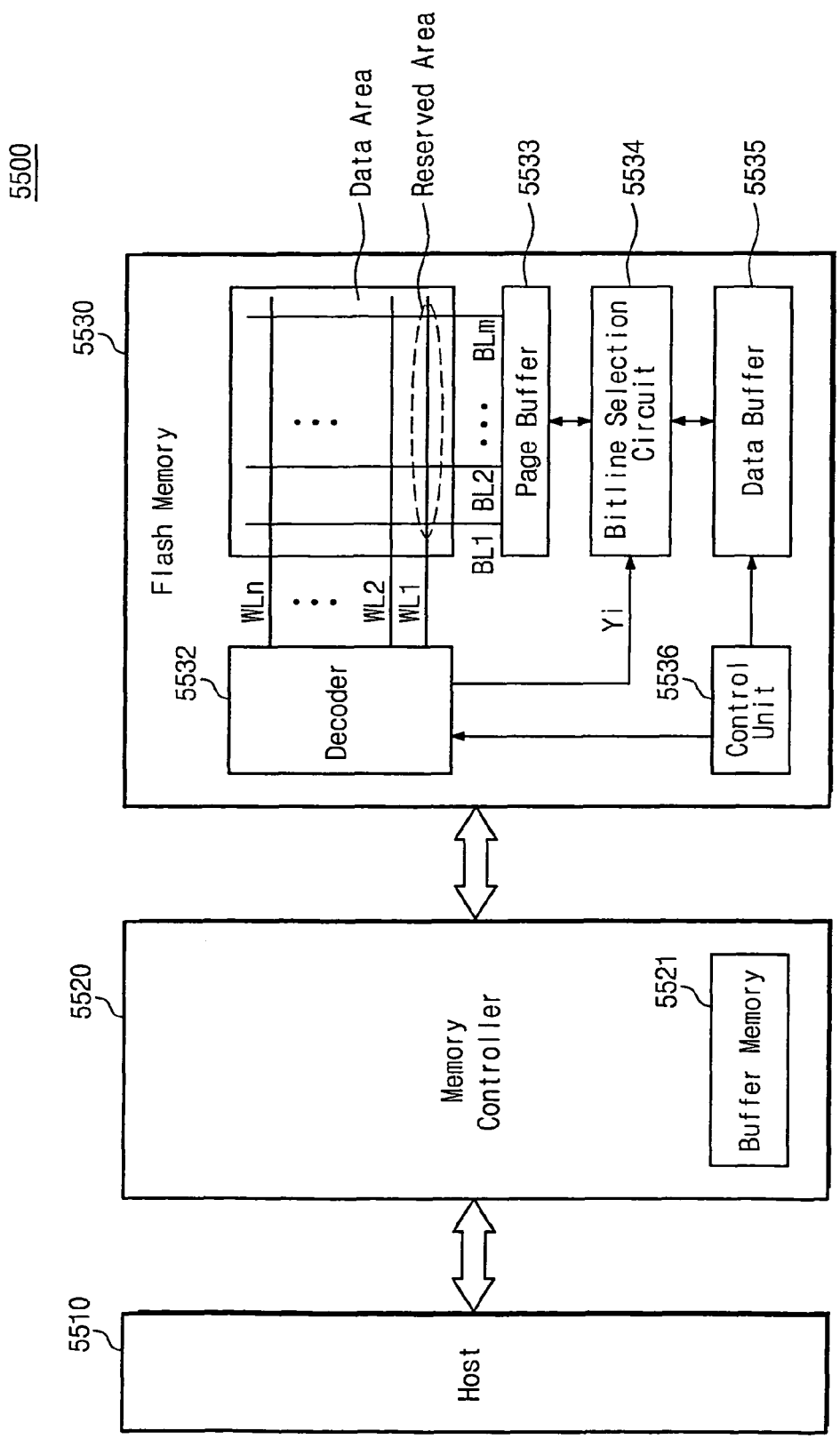
FIG. 71 is a block diagram for illustrating another application of the present invention.

FIG. 71 is a block diagram for illustrating another application of the present invention. Referring to FIG. 71, pages of the memory cell array are divided into a data area and a reserved area. The structure of the embodiment of FIG. 71 is the same as FIG. 63 except that the reference numerals start with 55 instead of 53 and flag cells do not necessarily exist in the embodiment of FIG. 71.

The pages of memory block can be used divisionally for random access. As a flash memory device does not support an overwriting function, it is necessary to prepare a new page in order to correct data stored in a used page. During this, if there is no usable page in the memory block, it results in an overhead such as must be allocated with a new memory block. Thus, the memory block is preliminarily provided with usable pages, which are used for correcting the used pages. Thereby, such an overhead can be reduced. In this embodiment, these pages form a reserved area.

In the meantime, after programming the MSB data to a word line of the memory cell array, if the LSB data is programmed to the next word line, data stored in memory cells coupled to the previous word line would be changed by interference. To prevent this problem is used an address scrambling technique.

The address scrambling technique is a technique of programming the LSB data into memory cells coupled to the next word line before programming the MSB data into memory cells coupled to a first word line. Thereby, the memory cells coupled to the previous word line are free from interference by the LSB data programming to the next word line. The address scrambling technique will be detailed below.

Figure 72A:
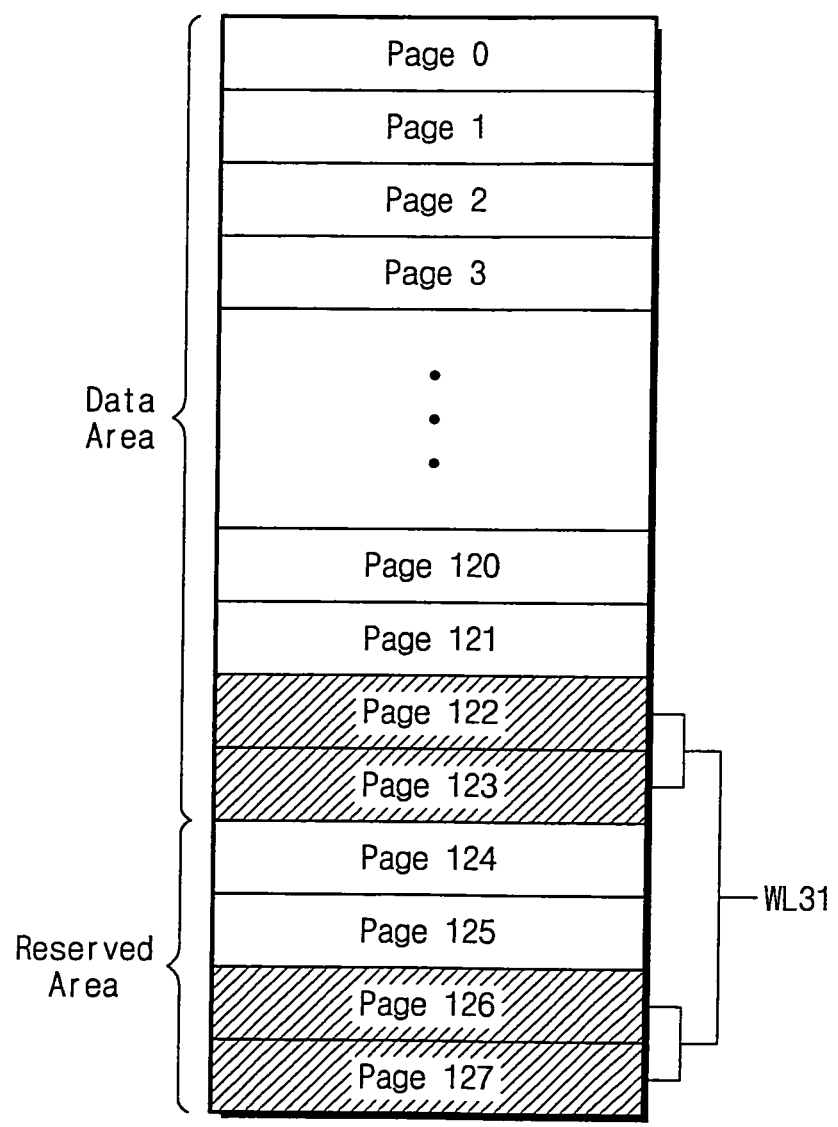
FIGS. 72A and 72B are diagrams for illustrating an address scrambling technique.
Figure 72B:
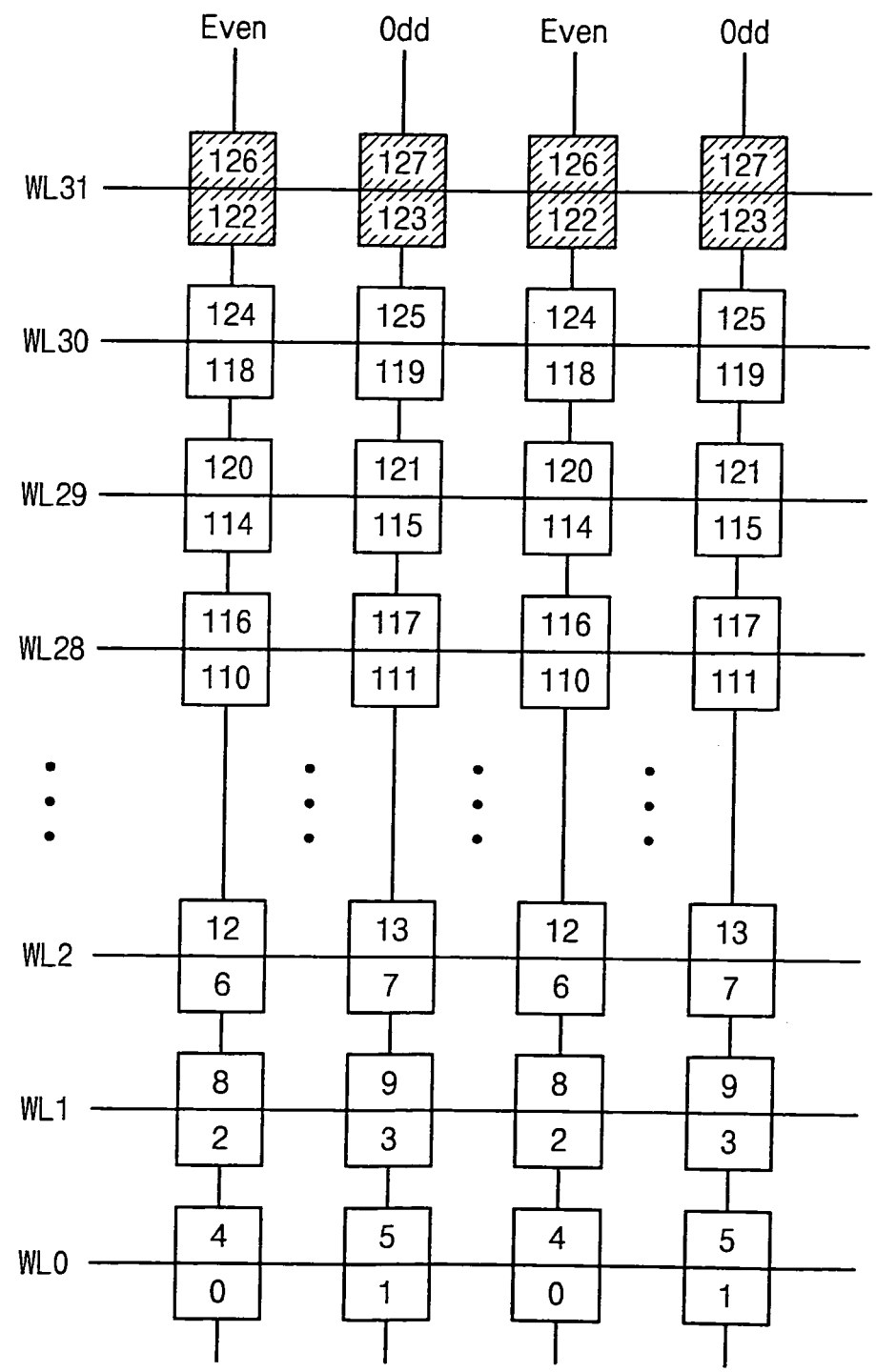

FIGS. 72A and 72B are diagrams for illustrating the address scrambling technique. FIG. 72A shows pages of a memory block. Exemplarily, a memory block includes 128 pages (page0~page127). But, it will be apparent to those skilled in the art that the present invention may not restricted thereto. A memory block may include an arbitrary number of pages.

Referring to FIG. 72A, the pages 0~123 form a data area. The rest of pages 124~127 form a reserved area. Data are sequentially written into the pages of the data area. The pages of the reserved area are comprised therein for random access. For instance, after storing data in the pages from 0 to 123, data are stored in pages of the next memory block. The pages of the reserved area are used later in order to correct the pages 0~123.

FIG. 72B is a diagram for explaining an order to store data into memory cells. A word line intersects even and odd bit lines. Memory cells connected to the even bit lines and memory cells connected to the odd bit lines form different pages. Further, a memory cell stores the LSB and MSB data. Accordingly, a word line is able to store four pages in full. For instance, the pages 0, 1, 4, and 5 are stored in the word line 0.

The pages are stored according to a rule by address scrambling. The page 0 is stored in the memory cells placed at intersections of a word line WL0 and the even bit lines in the form of the LSB data. The page 1 is stored in the memory cells placed at intersections of the word line WL0 and the odd bit lines in the form of the LSB data. The page 2 is stored in memory cells placed at intersections of a word line WL1 and the even bit lines in the form of the LSB data. The page 3 is stored in the memory cells placed at intersections of the word line WL1 and the odd bit lines in the form of the LSB data.

The page 4 is stored in the memory cells placed at intersections of the word line WL0 and the even bit lines in the form of the MSB data. The page 5 is stored in the memory cells placed at intersections of the word line WL0 and the odd bit lines in the form of the MSB data. The page 6 is stored in the memory cells placed at intersections of a word line WL2 and the even bit lines in the form of the MSB data. The page 7 is stored in the memory cells placed at intersections of the word line WL2 and the odd bit lines in the form of the LSB data. In this manner, it is able to minimize the interference by the MSB data programming.

Referring again to FIG. 72A, the reserved area is formed of pages 124 through 127. As aforementioned, the reserved area is used for correcting data stored in the data area. However, if a program fail is generated due to power failure or so on while storing data in the reserved area, data stored in the data area would be damaged. For instance, if a program fail is generated while programming the page 126 in the reserved area, data stored in the page 122 of the data area would be damaged. This is because the pages 122 and 126 are stored in the same memory cells in the form of the LSB and MSB data. Therefore, it is necessary to restore the LSB data even if a program fail is generated while programming the MSB data. Such a problem is resolvable by the programming method according to the present invention.

While the 2-bit MLC is illustrated as an example in this embodiment, the present invention is not restricted thereto in scope. The present invention is applicable to an n-bit MLC (n is an integer). A 4-bit MLC will be described with reference to the figures illustrated later.

Figure 73A:
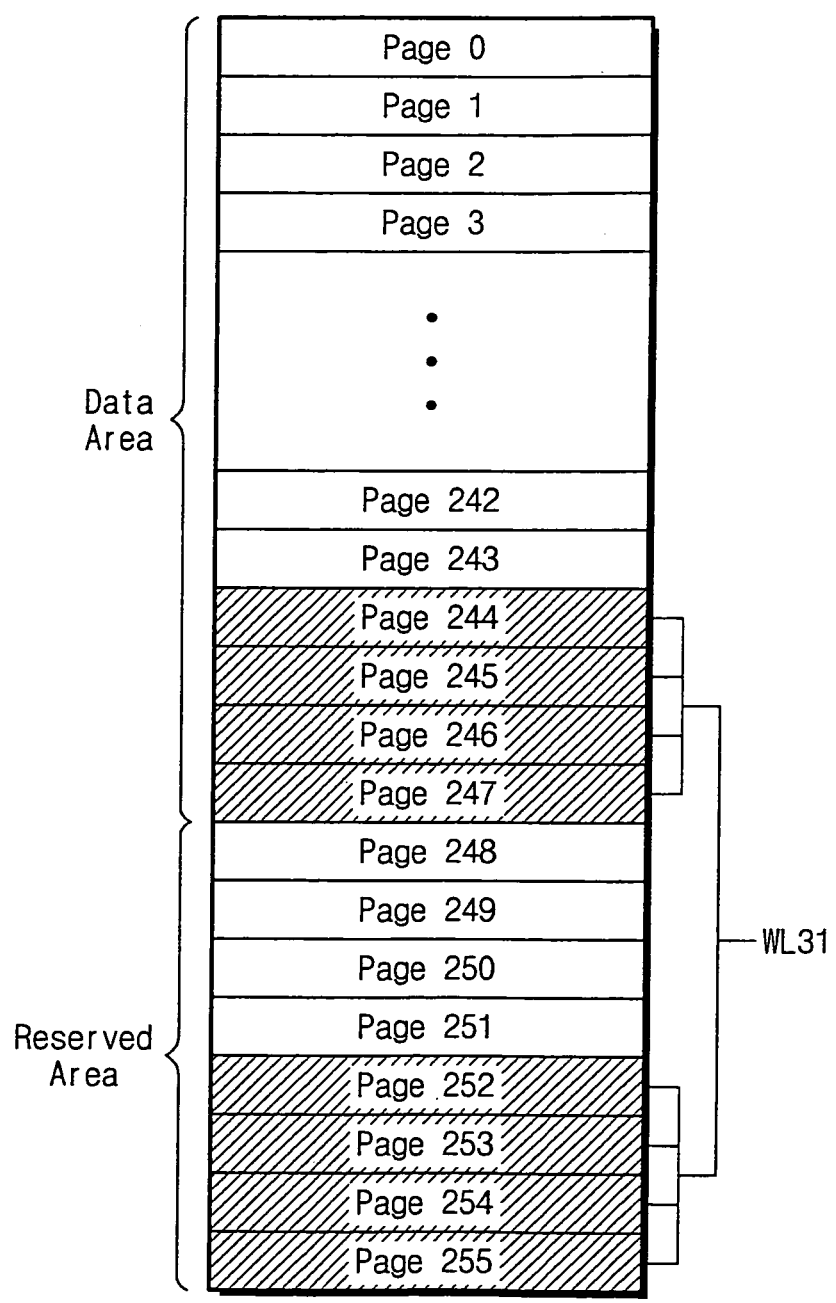

FIGS. 73A and 73B are diagrams for illustrating a programming sequence when 4 bits are stored in a memory cell. FIG. 73A shows pages in a memory block. Exemplarily, a memory block includes 256 pages. But, it will be apparent to those skilled in the art that the present invention is not restricted thereto in scope. A memory block may include an arbitrary number of pages.

Referring to FIG. 73A, the pages 0~247 form a data area. The rest of pages 248~255 form a reserved area. Data are sequentially written into the pages of the data area. The pages of the reserved area are comprised for random access later. For example, after storing data the pages from 0 to 247, data are stored in pages of the next memory block.

FIG. 73B is a diagram for explaining an order to store data into memory cells. A word line intersects even and odd bit lines. Memory cells connected to the even bit lines and memory cells connected to the odd bit lines form different pages. Further, a memory cell stores 4 bits (first through fourth bits). Accordingly, a word line is able to store eight pages in full. For instance, the pages 0~3 and 8~11 are stored in the word line 0.

The pages are stored according to a rule by address scrambling. The page 0 is stored' in the memory cells placed at intersections of the word line WL0 and the even bit lines in the form of the first bit data. The page 1 is stored in the memory cells placed at intersections of the word line WL0 and the odd bit lines in the form of the first bit data. The page 2 is stored in the memory cells placed at intersections of the word line WL0 and the even bit lines in the form of the second bit data. The page 3 is stored in the memory cells placed at intersections of the word line WL0 and the odd bit lines in the form of the second bit data.

The page 4 is stored in the memory cells placed at intersections of the word line WL1 and the even bit lines in the form of the first bit data. The page 5 is stored in the memory cells placed at intersections of the word line WL1 and the odd bit lines in the form of the first bit data. The page 6 is stored in the memory cells placed at intersections of the word line WL1 and the even bit lines in the form of the second bit data. The page 7 is stored in the memory cells placed at intersections of the word line WL1 and the odd bit lines in the form of the second bit data.

The page 8 is stored in the memory cells placed at intersections of the word line WL0 and the even bit lines in the form of the third bit data. The page 9 is stored in the memory cells placed at intersections of the word line WL0 and the odd bit lines in the form of the third bit data. The page 10 is stored in the memory cells placed at intersections of the word line WL0 and the even bit lines in the form of the fourth bit data. The page 11 is stored in the memory cells placed at intersections of the word line WL0 and the odd bit lines in the form of the fourth bit data. In this manner, it is able to minimize the interference by the LSB data programming.

Referring again to FIG. 73A, the reserved area is formed of pages 248 through 255. As aforementioned, the reserved area is used for correcting data stored in the data area. However, if a program fail is generated due to power failure or so on while storing data in the reserved area, data stored in the data area would be damaged. For instance, if a program fail is generated while programming the page 252 in the reserved area, data stored in the page 244 of the data area would be damaged. This is because the pages 252 and 244 are stored in the same memory cells in the form of the second and third bit data. Therefore, it is necessary to restore the LSB data even if a program fail is generated while programming the MSB data. Such a problem is resolvable by the programming method according to the present invention.

Figure 74:
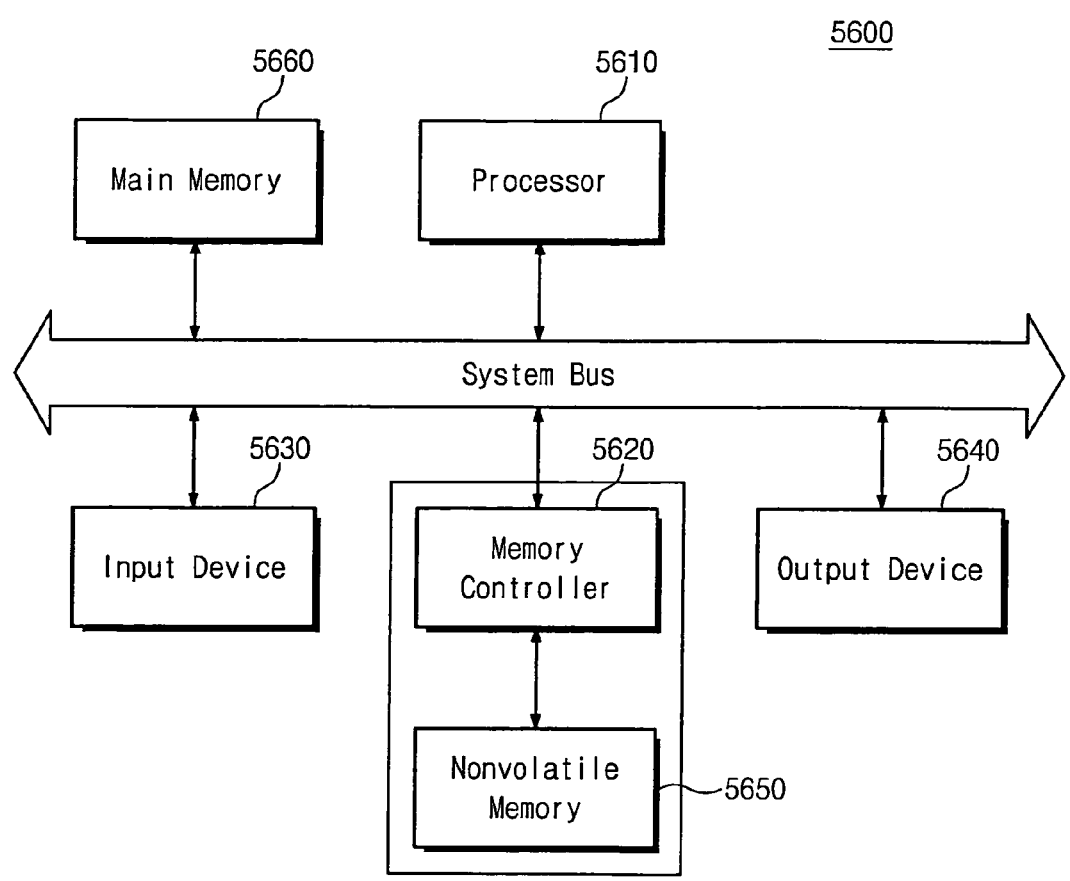
FIG. 74 is a block diagram briefly showing a computing system with a flash memory device according to the present invention.

FIG. 74 is a block diagram briefly showing a computing system 5600 with a flash memory device according to the present invention. Referring to FIG. 74, the computing system 5600 includes a processor 5610, a memory controller 5620, input units 5630, output units 5640, a flash memory 5650, and a main memory unit 5660. In the figure, the solid line denotes a system bus through which data or commands are transferred.

The memory controller 5620 and the flash memory device 5650 may form a memory card. And, the processor 5610, the input units 5630, the output units 5640, and the main memory unit 5660 may form a host using the memory card as a storage unit.

The computing system 5600 according to the present invention inputs data from external through the input units 5630 (e.g., keyboards or cameras). The input data may be a command by a user or multimedia data such as image data taken by a camera. The input data is stored in the flash memory 5650 or the main memory unit 5660.

A result processed by the processor 5610 is stored in the flash memory 5650 or the main memory unit 5660. The output units 5640 output data from the flash memory 5650 or the main memory unit 5660. For example, the output units 5640 output data in visible forms for humans. For example, the output units 5640 include display devices or speakers.

The word-line driving method according to the present invention may be applied to the flash memory 5650. Along as the reliability of the flash memory 5650, the reliability of the computing system 5600 will be improved in proportion thereto.

The flash memory 5650 and/or the memory controller 5620 can be mounted by way of various types of packages. For instance, the flash memory 5650 and/or the memory controller 5620 may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP). The nonvolatile memory 5650 and the controller 5620 may construct a memory card.

Although not shown in the figure, it can be understood by those skilled in the art that a power supply is required for supplying power to the computing system 5600. And, if the computing system 5600 is a mobile device, it may be further required of a battery for supplying power thereto.

Figure 75:
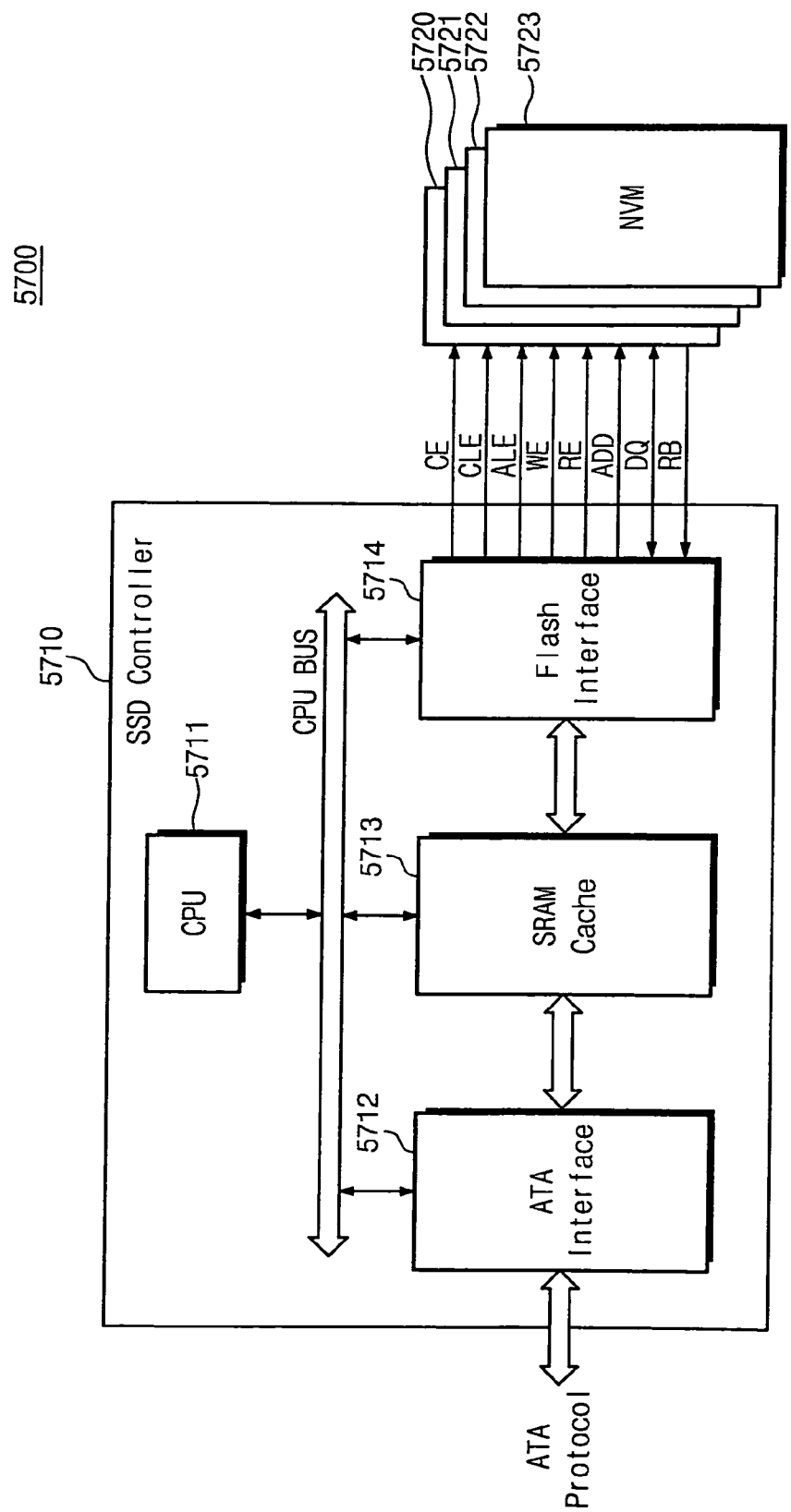
FIG. 75 is a block diagram briefly showing an SSD system according to the present invention.

FIG. 75 is a block diagram briefly showing an SSD system according to the present invention. Referring to FIG. 75, the SSD system 5700 includes an SSD controller 5710 and flash memories 5720~5723.

The semiconductor memory system according to the present invention is applicable to an SSD (solid state drive). In recent years, SSD products, which are expected to replace hard disk drives (HDDs), are being spotlighted in new generation markets. The SSD is a storage unit using memory chips such as flash memories for storing data, instead of a rotating plate used in a HDD. The SSD is more advantageous than the HDD, which operates mechanically, in operation rate, external impact, and power consumption.

Referring again to FIG. 75, a central processing unit 5711 accepts a command from a host, and controls and determines to store data into the flash memory from the host or to transfer data to the host from the flash memory. An ATA interface 5712 exchanges data with the host in accordance with control of the central processing unit 5711. The ATA interface 5712 fetches a command and address from the host and transfers the command and address to the central processing unit 5711 through a CPU bus. Data input from the host or data to be transferred to the host, through the ATA interface 5712, is transferred to an SRAM cache 5713 in accordance with the central processing unit 5711 without passing through the CPU bus.

The SRAM cache 5713 temporarily stores data moving between the host and the flash memories 5720~5723. Further, the SRAM cache 5713 is used even for storing a program to be used by the central processing unit 5711. The SRAM cache 5713 may be regarded as a buffer memory, which is not always organized in an SRAM. A flash interface 5714 exchanges data with the nonvolatile memories used as storage units. The flash interface 5714 may be configured to support a NAND flash memory, a one-NAND flash memory, or a multi-level flash memory.

The semiconductor memory system according to the present invention may be used as a portable storage device. Thus, it can be used as a storage device for an MP3 player, a digital camera, a PDA, or an e-book. Further, it can be used as a storage unit for a digital TV or computer.

Figure 76:
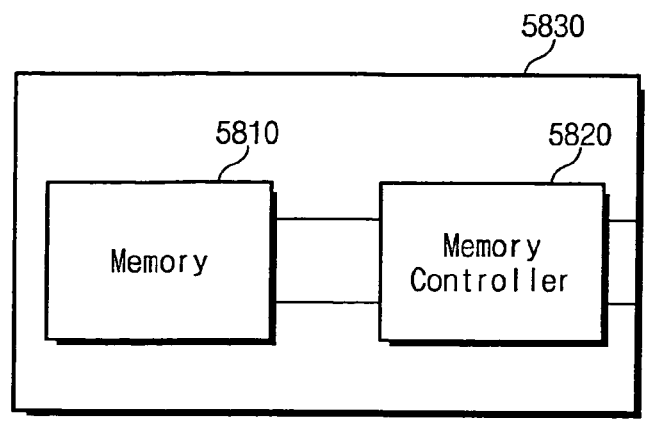
FIG. 76 is a block diagram showing a memory system according to another exemplary embodiment of the present invention.

FIG. 76 is a block diagram showing a memory system according to another exemplary embodiment of the present invention. In the memory system shown in FIG. 76, a memory 5810 and a memory controller 5820 form a card 5830. For example, the card 5830 may be a memory card such a flash memory card. That is, the card 5830 may be a card satisfying a certain industrial standard for an electronic apparatus such a digital camera or personal computer. It will be appreciated that the memory controller 5820 is able to control the memory 5810 on basis of control signals received from another (e.g., external) system by the card 5830.

Figure 77:
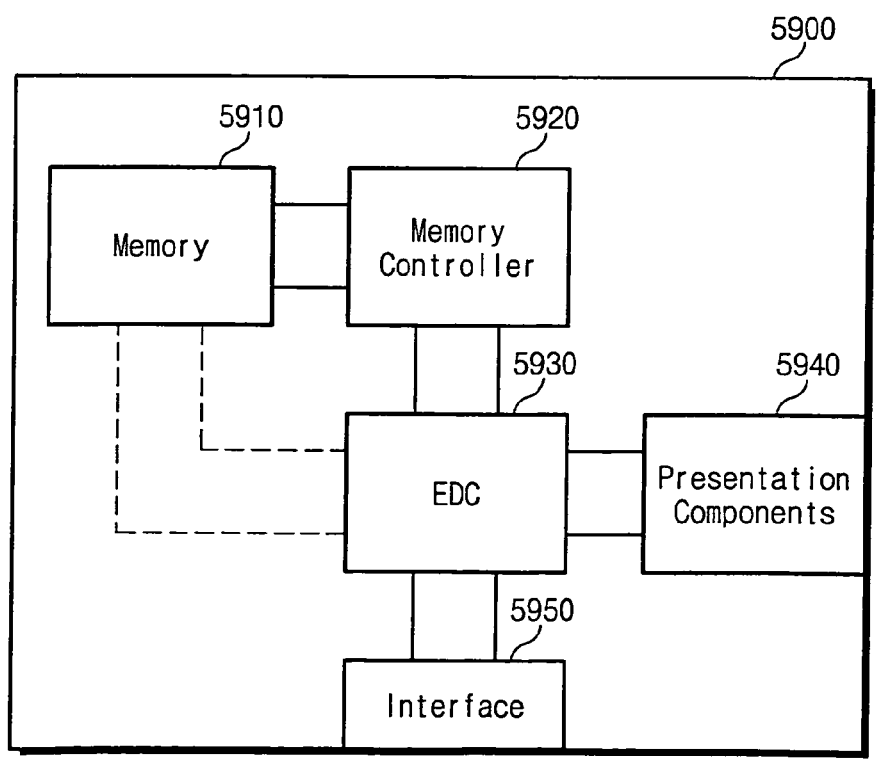
FIG. 77 is a block diagram showing a memory system according to another exemplary embodiment of the present invention.

FIG. 77 is a block diagram showing a memory system according to another exemplary embodiment of the present invention. The system shown in FIG. 77 denotes a portable system 5900. The portable system 5900 may be an MP3 player, a video player, a combination video and audio player, or so forth. As shown, the portable system 5900 includes a memory 5910 and a memory controller 5920. The portable system 5900 may further include an encoder and decoder 5930, presentation components 5940, and an interface 5950.

Data (video, audio, etc.) processed by the encoder and decoder (EDC) 1610 can be input to the memory 5910, through the memory controller 5910, and output from the memory 5910. As illustrated by dotted lines in FIG. 77, data can be input directly into the memory 5910 from the EDC 5930 and/or output directly into the EDC 5930 from the memory 5910.

The EDC 5930 is able to encode data in order to store the data into the memory 5910. For instance, the EDC 5930 is able to an MP3 encoding operation to audio data in order to store the data in the memory 5910. In another way, the EDC 5930 is able to conduct an MPEG encoding operation (e.g., MPEG2, MPEG4, etc.) to video data in order to the data in the memory 5910. Further, the EDC 5930 may include pluralities of encoders for encoding data of other types in accordance with other data formats. For instance, the EDC 5930 may include an MP3 encoder for audio data and an MPEG encoder for video data.

The EDC 5930 is able to decode an output of the memory 5910. For instance, the EDC 5930 is able to conduct an MP3 decoding operation to audio data output from the memory 5910. In another way, the EDC 5930 is able to conduct an MPEG decoding operation (e.g., MPEG2, MPEG4, etc.) to video data output from the memory 5910. Further, the EDC 5930 may include pluralities of decoders for decoding data of other types in accordance with other data formats. For instance, the EDC 5930 may include an MP3 decoder for audio data and an MPEG decoder for video data.

It can be also understood that the EDC 5930 include decoders only. For example, previously encoded data can be received by the EDC 5930 and passed through the memory controller 5920 and/or the memory 5910.

The EDC 5930 is able to receive data for encoding by way of the interface 5950 or to receive preciously encoded data. The interface 5950 may accord to a known standard (e.g., firmware, USB, etc.). The interface 5950 may further include more one interface units. For instance, the interface 5950 may include a firmware interface, a USB interface, and so on. Data from the memory 5910 may be even output by way of the interface 5950.

The presentation components 5940 are able to display data output from the memory and/or decoded by the EDC 5930. For instance, the presentation components 5940 may include a speaker jack for outputting audio data, a display screen for outputting video data, and so on.

Figure 78:
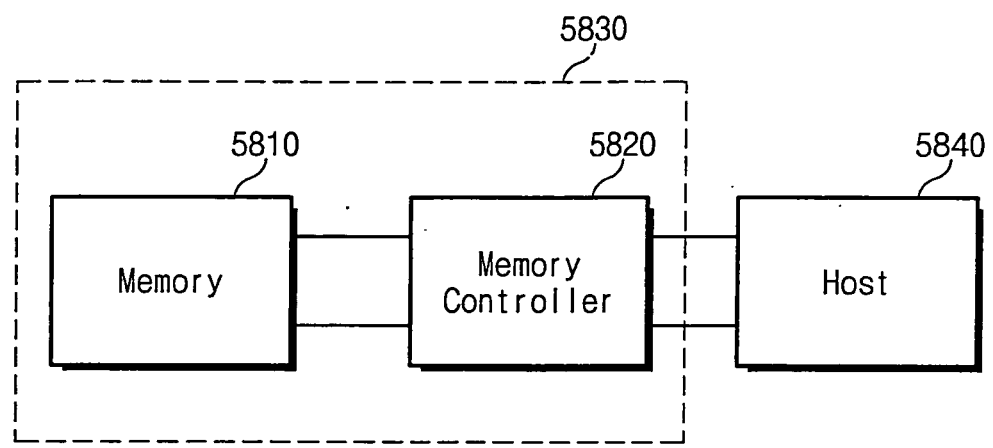
FIG. 78 shows an embodiment where a host system 5840 is coupled to the card of FIG. 70.

FIG. 78 shows an embodiment where a host system 5840 is coupled to the card 5830 of FIG. 76. In the embodiment, the host system 5840 is able to apply control signals to the card 5830 so as to make the memory controller 5820 control an operation of the memory 5810.

A flash memory system according to a fifth embodiment of the present invention may achieve high data reliability by repairing LSB data. In addition, the flash memory system according to the fifth embodiment of the present invention may achieve speed-up by means of the multi-thread function described in the first embodiment, the free page described in the second embodiment, and the microcode described in the third embodiment as well as by repairing LSB data. Performance of the flash memory system according to the fifth embodiment of the present invention may be improved through achievement of high data reliability and speed-up.

Embodiment 6

Flash Memory Device Saving Read Count Data

As discussed, semiconductor memory devices are classified into volatile memories such as DRAM, SRAM, and so on, and nonvolatile memories such as EEPROM, FRAM, PRAM, flash memory, and so on. The volatile memories lose data stored therein when power is interrupted, while the nonvolatile memories retain data stored therein even if power is interrupted. Especially, since the flash memories have advantages of high programming rate, low power consumption, large-capacity data storage, and so forth, they are being widely used in computer systems for example as storage media.

The flash memory includes a memory cell array storing data. The memory cell array is composed of plural memory blocks. Each memory block is formed of plural pages. Each page is formed of plural memory cells. The flash memory conducts an erasing operation in the unit of memory block, and conducts a writing or reading operation in the unit of page.

Each memory cell of the flash memory is discriminated into an on-cell or off-cell. The on-cell stores data '1', which is even referred to as 'erased cell'. The off-cell stores data '0', which is even referred to as 'programmed cell'. The on-cell may have a threshold voltage between −3V and −1V, and the off-cell may have a threshold voltage of +1V and +3V.

Figure 80:
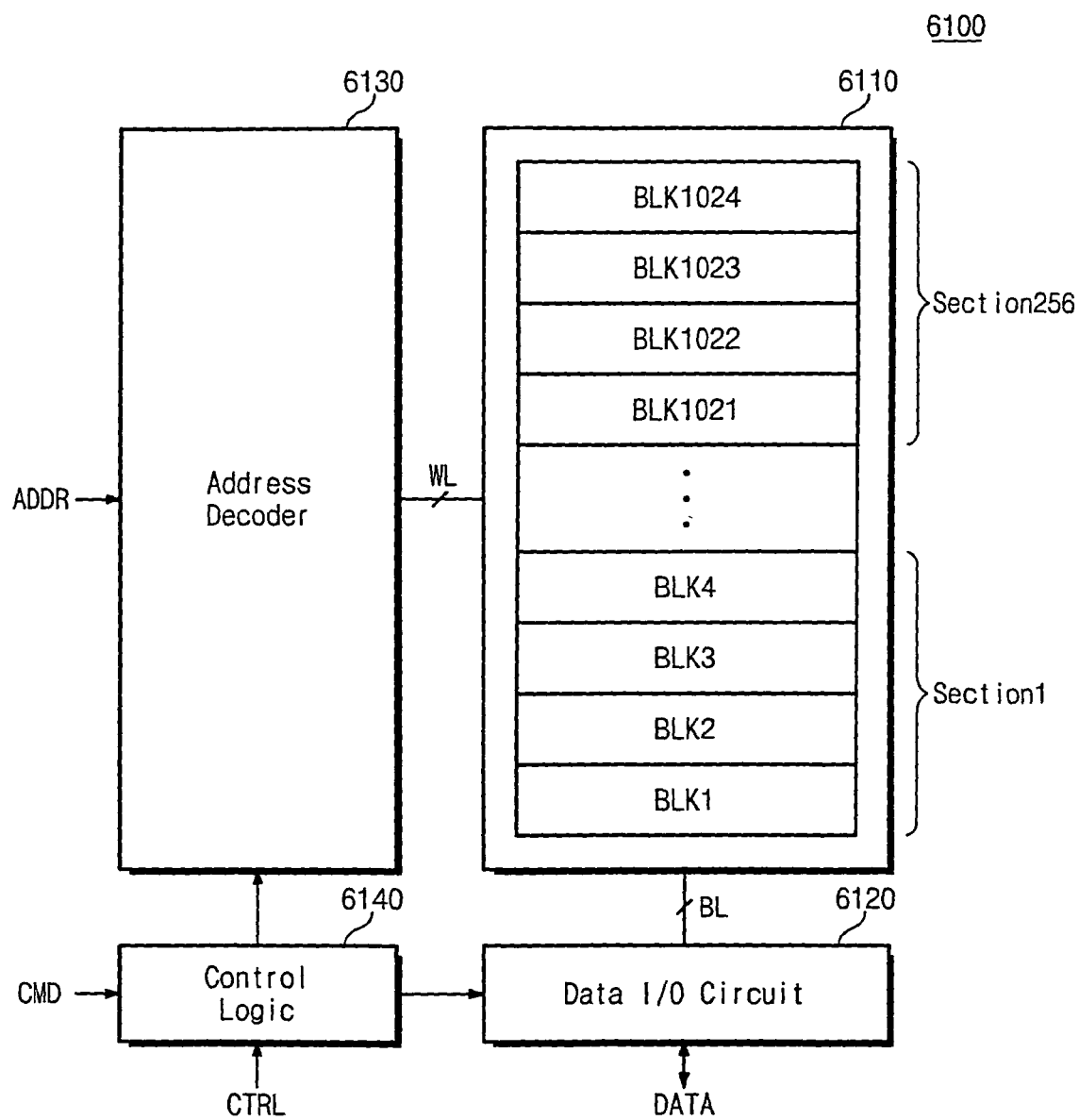
FIG. 80 is a block diagram showing the flash memory shown in FIG. 79.

The flash memory has a cell string (refer to FIG. 80). The cell string includes a string selection transistor connected to a string selection line (SSL), memory cells connected to pluralities of word lines (WL0~WL31), and a ground selection transistor connected to a ground selection line (GSL). The string selection transistor is connected to a bit line (BL), and the ground selection transistor is connected to a common source line (CSL).

During a reading operation, a selective read voltage (Vrd) about 0V is applied to a selected word line of the flash memory and a deselective read voltage (Vread) about 4.5V is applied to unselected word lines. Here, the deselective read voltage (Vread) is a voltage enough to turn on a memory cell connected to the unselected word line.

Meantime, a read fail could be caused due to various reasons in the reading operation of the flash memory. Here, the read fail means that a memory cell that has been programmed as on-cell (or data '1') is read as an off-cell (or data '0'), or that a memory cell that has been programmed as off-cell is read as an on-cell. There are several reasons of read fail.

A typical read fail occurs by soft programming. The read fail by soft programming is mostly generated when a threshold voltage of an on-cell increases. If there is a read fail, a conventional flash memory repairs the read fail by means of reprogramming. However, the conventional method for repairing a read fail after the read fail occurs is inconvenient because it is required to find out the reason.

Figure 79:
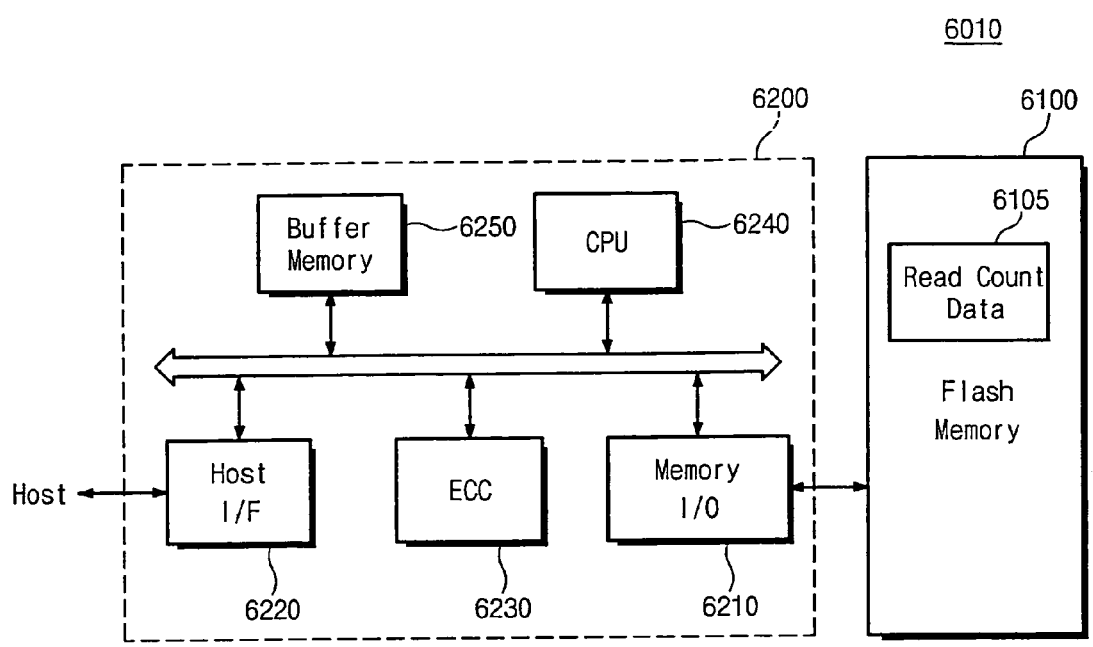
FIG. 79 is a block diagram exemplarily showing a memory system according to an embodiment of the present invention.

FIG. 79 is a block diagram exemplarily showing a memory system according to an embodiment of the present invention. Referring to FIG. 79, the memory system 6010 includes a flash memory 6100 and a memory controller 6200.

The flash memory 6100 is a nonvolatile memory, conducting writing, reading, and erasing operations in compliance with control of the memory controller 6200. The flash memory 6100 stores read count data 6105. The read count data 6105 can be stored even in meta-block of the flash memory 6100 or in a user data field of the flash memory 6100. The read count data 6105 means the number of reading operation times of the flash memory 6100. The read count data 6105 will be described in detail hereinafter.

The memory controller 6200 provides a read command RD_CMD, an address ADDR, and a control signal CTRL to the flash memory 6100 in a reading operation. The flash memory 6100 inputs the read command and address from the memory controller 6200 and provides a read voltage to a corresponding word line.

The memory controller 6200 includes a memory interface 6210, a host interface 6220, an ECC circuit 6230, a central processing unit (CPU) 6240, and a buffer memory 6250. The buffer memory 6250 is used as a working memory of the CPU 6240. The buffer memory 6250 can be implemented by a random access memory (RAM). The host interface 6220 is comprised of protocol necessary for exchanging data with a host.

The ECC circuit 6230 is used for analyzing and correcting a bit error of data stored in the flash memory 6100. The memory interface 6210 is directly connected to the flash memory 6100 and used for exchanging a command, an address, and a control signal. The CPU 6240 conducts overall control operations for data exchange of the memory controller 6200. Although not shown, it will be appreciated by those skilled in the art that the semiconductor memory device 100 is further comprised of a ROM (not shown) storing code data for interfacing with a host.

The memory system 6010 according to the present invention stores the read count data 6105 into the flash memory 6100 in order to prevent a read fail of the flash memory 6100. The memory controller 6200 increases and periodically updates the read count data 6105 every reading operation by means of the buffer memory 6250. The memory system 6010 according to the present invention refreshes a corresponding memory block of the flash memory 6100 if the read count data 6105 reaches a read fail permission range. According to the present invention, it is able to preliminarily prevent a read fail.

Additionally, the memory system 6010 according to the present invention is able to raise the reliability of the read count data that acts as a reference of flash programming and refreshing cycles. The flash programming and refreshing cycles will be detailed hereinafter. Especially, the memory system 6010 periodically updates the read count data to the flash memory 6100 in a normal operation and compensates the read count data in a sudden power-off mode, enhancing the reliability of the read count data 6105.

FIG. 80 is a block diagram showing the flash memory shown in FIG. 79. Referring to FIG. 80, the flash memory 6100 includes a memory cell array 6110, a data input/output circuit 6120, an address decoder 6130, and a control logic circuit 6140.

The memory cell array 6110 includes pluralities of memory blocks, e.g., BLK1~BLK1024. Each memory block is formed of plural pages. Each page is formed of plural memory cells. The memory cell stores single bit data or multi-bit data. The flash memory conducts an erasing operation in the unit of memory block and conducts a reading or writing operation in the unit of page.

Referring to FIG. 80, the memory cell array 6110 can be divided into pluralities of sections. Each section is formed of the plural memory blocks. For instance, a first section is composed of first through fourth memory blocks BLK1~BLK4 and a 256th section is composed of 1021st through 1024th memory blocks BLK1021~BLK1024. In this invention, the reason for dividing the memory cell array 6110 into the sections is to prevent degradation of the memory system 6010 in performance while compensating the read count data.

In the meantime, although not shown in FIG. 80 (see FIG. 81), each memory block includes a string selection transistor connected to a string selection line (SSL), memory cells connected to pluralities of word lines WL, and a ground selection transistor connected to a ground selection line (GSL). The string selection transistor is connected to a bit line BL, and the ground selection transistor is connected to a common source line (CSL).

During a reading operation, the flash memory 6100 applies a power source voltage (Vcc) to the string selection line (SSL) and the ground selection line (GSL). A selective read voltage (Vrd) is applied to a selected word line and a deselective read voltage (Vread) is applied to unselected word lines. Here, the deselctive read voltage (Vread) is a voltage enough to turn on a memory cell connected to the unselected word line.

The data input/output circuit 6120 is connected to the memory cell array 6110 through pluralities of bit lines BL. The data input/output circuit 6120 inputs data DATA by way of a data input/output line (not shown). The input data is stored in a corresponding memory cell. Meantime, the data input/output circuit 6120 reads data from a memory cell through the bit line BL. Read data is output to external through the data input/output line.

The address decoder 6130 is connected to the memory cell array 6110 through the plural word lines WL. The address decoder 6130 inputs an address ADDR and selects a memory block or page. Here, an address for selecting a memory block is referred to as block address and an address for selecting a page is referred to as page address.

The control logic circuit 6140 controls the data input/output circuit 6120 and the address decoder 6130 in response to a command CMD and a control signal CTRL. Here, the control signal CTRL is provided from the memory interface 6210 (refer to FIG. 79). Meanwhile, the control logic circuit 6140 generates bias voltages to be provided to the word lines in the writing, reading, and erasing operations.

During the reading operation, the control logic circuit 6140 generates the selective read voltage (Vrd) provided to a selected word line and the deselective read voltage (Vread) provided to unselected word lines. Generally, the deselective read voltage (Vread) is higher than the selective read voltage (Vrd).

Figure 81:
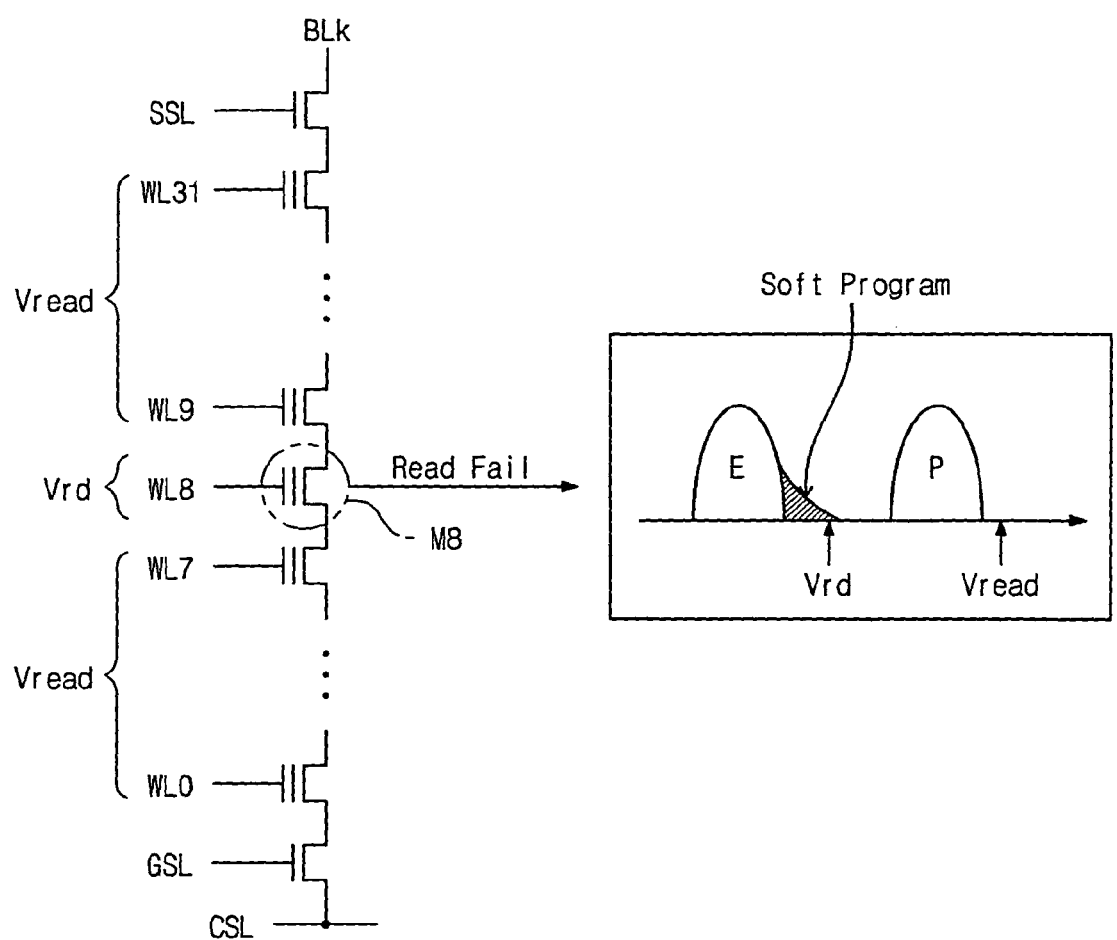
FIG. 81 is a diagram for illustrating a cell string of the flash memory shown in FIG. 80 and a read fail due to soft programming.

FIG. 81 is a diagram for illustrating a cell string of the flash memory shown in FIG. 80 and a read fail. Referring to FIG. 81, between the common source line CSL and the bit line BLk are serially connected the ground selection transistor, the plural memory cells, and the string selection transistor. The ground selection transistor is connected to the ground selection line GSL, the plural memory cells are connected to the plural word lines WL0~WL31, and the string selection transistor is connected to the string selection line SSL.

During the reading operation, the selective read voltage Vrd (about 0V) is applied to a selected word line (e.g., WL8) and the deselective read voltage Vread (about 4.5V) is applied to the unselected word lines WL0~WL7 and WL9∫WL31. Here, the deselective read voltage Vread is a voltage enough to turn on the memory cells connected to the unselected word lines WL0~WL7 and WL9~WL31.

If a selected memory cell M8 is softly programmed, a read fail occurs from the selected memory cell M8. Here, soft programming means that a threshold voltage of the memory cell M8 conditioned in an erased state E increases due to read disturbance. In FIG. 81, the hatching area denotes that memory cells of the erased state E are softly programmed. If a threshold voltage of the selected memory cell M8 becomes higher than the selective read voltage Vrd due to soft programming, a read fail occurs. That is, a memory cell of the erased state E is read as being in a programmed state P. This bit error is referred to as read fail due to soft programming.

Figure 82:
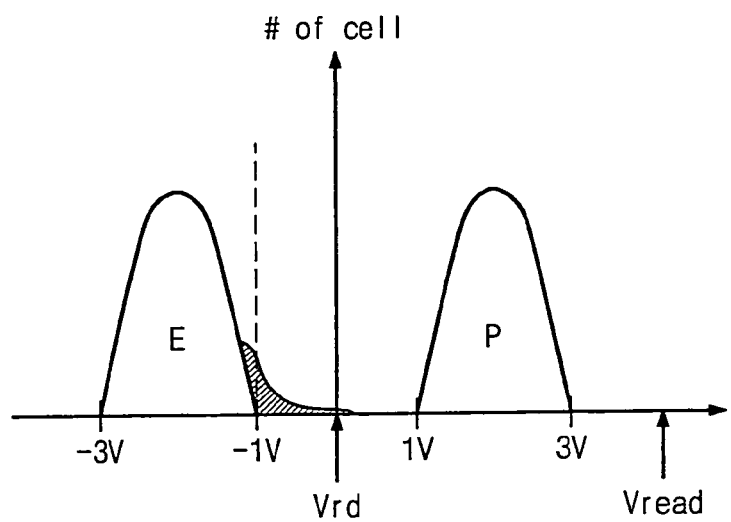
FIGS. 82 and 83 are diagrams for illustrating soft programming of the memory cell shown in FIG. 81.
Figure 83:
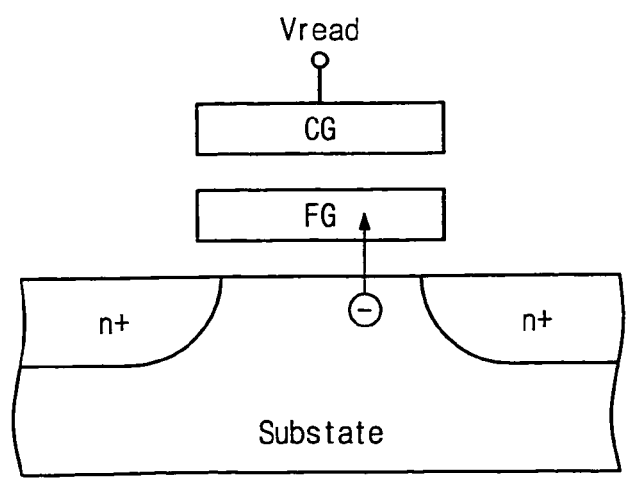

FIGS. 82 and 83 illustrate an example that a selected memory cell is softly programmed. Referring to FIG. 82, memory cells of the erased state E have threshold voltages between −3V and −1V and memory cells of the programmed state P have threshold voltages between +1V and +3V. The selective read voltage Vrd provided to the selected word line WL8 (refer to FIG. 81) is about 0V. The deselective read voltage Vread provided to the unselected word lines WL0~WL7 and WL9~WL31 (refer to FIG. 81) is about 4.5V.

In the meantime, the flash memory conducts the reading operation in the unit of page. It is assumed that the reading operation is carried out to all pages (e.g., 32 pages) of the memory block. During this, the selective read voltage Vrd of one time and the deselective read voltage Vread of 31 times are applied to each word line. If the deselective read voltage Vread higher than the power source voltage (Vcc) is repeatedly applied to a gate of a memory cell, the memory cell is stressed.

As show in FIG. 83, if the deselective read voltage Vread is repeatedly applied to a control gate CG of a memory cell, electrons may flow into a floating gate from a channel. At this time, a memory cell (on-cell) of the erased state E increases in threshold voltage. If a threshold voltage of the memory cell of the erased state E increases over −1V, the memory cell does not have a sufficient read margin. The threshold voltage of the memory cell becomes higher than the selective read voltage Vrd, it can be read as a memory cell of the programmed state P.

As such, if threshold voltages of the memory cells increase by the repetitive applying of the deselective read voltage Vread, a read fail occurs due to the soft programming. The hatching area of FIG. 82 shows a result of increasing threshold voltages of the memory cells. If threshold voltages of the memory cells increase due to read fails by soft programming, the memory cells lose their data storage capability.

On the other side, it is steadily demanding for the flash memory 6100 (refer to FIG. 79) in extending data storage capacity, raising reading and writing rates, and safely protecting important data. For this requirement, the flash memory is being designed to coincidently have a memory block storing multi-bit data (hereinafter, referred to as MLC block) and a memory block storing single bit data (hereinafter, referred to as SLC block) in the memory cell array.

Figure 84:
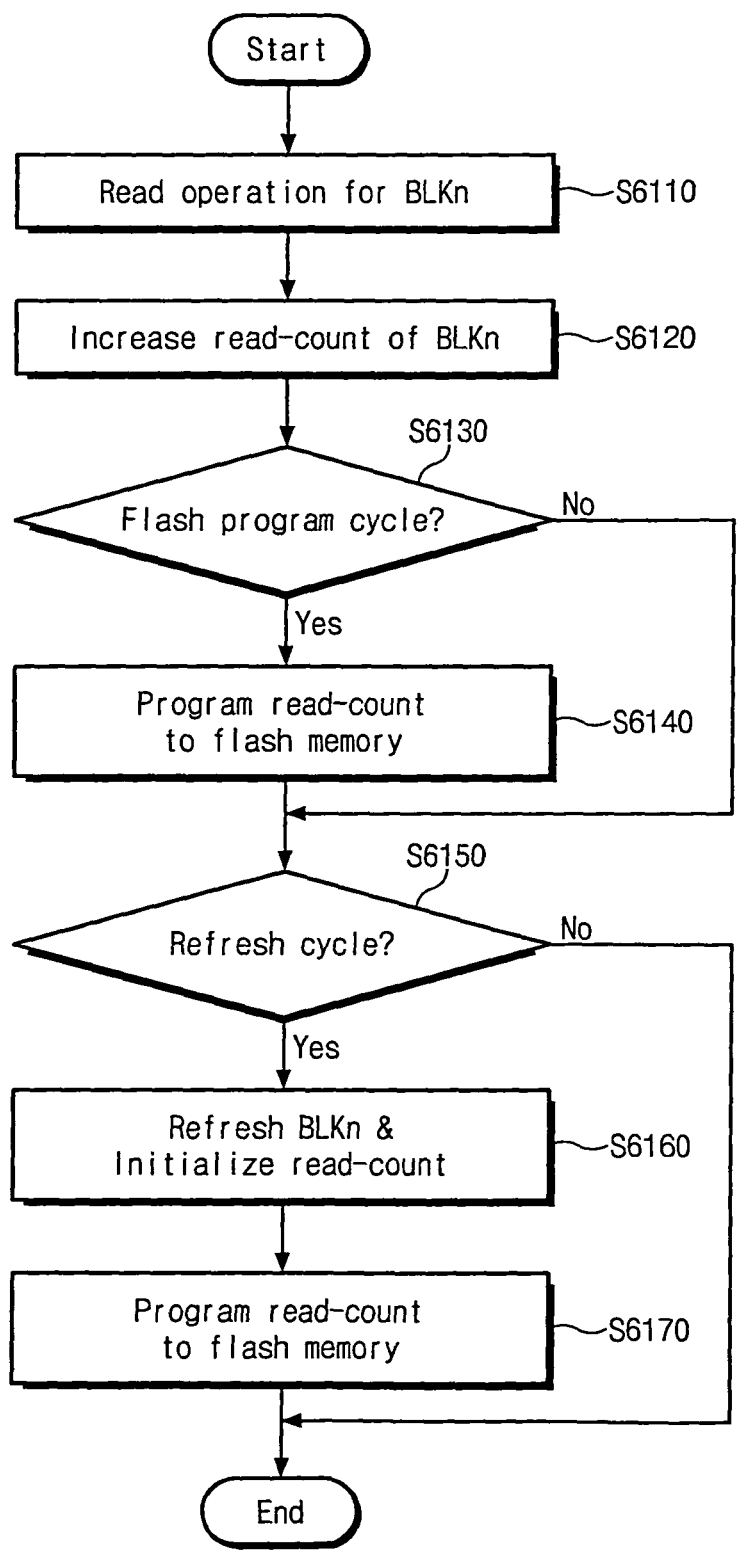
FIG. 84 is a flow chart showing a read fail preventing method of the memory system according to an embodiment of the the present invention.

FIG. 84 is a flow chart showing a read fail preventing method of the memory system according to an embodiment of the present invention. According to the read fail preventing method by the present invention, the memory system 6010 (refer to FIG. 79) preliminarily prevents a read fail, which is caused by soft programming, by means of flash programming and refreshing cycles.

In a step S6110, the reading operation is carried out to a memory block BLKn. Here, the reading operation is conducted to a selected page of the memory block BLKn. The selective read voltage Vrd is provided to a word line of the selected page and the deselective read voltage Vread is provided to word lines of the rest unselected pages.

In a step S6120, the read count data to the memory block BLKn increases. Although not shown in FIG. 84, the read count data 6105 stored in the flash memory 6100 (refer to FIG. 79) is loaded into the buffer memory 6250 (refer to FIG. 79) at a power-on time. The memory controller 6130 (refer to FIG. 79) increases the read count data whenever conducting the reading operation to the memory block BLKn.

In a step S6130, the memory controller 6200 determines whether the read count data correspond to the flash programming cycle. Here, the flash programming cycle means a cycle for periodically programming the read count data, which is restored in the buffer memory 6250, into the flash memory 6100. For example, if the flash programming cycle is 100, the memory system 6010 updates the read count data into the flash memory 6100 whenever the read count data reaches 100, 200, 300, . . . , etc. If the flash programming cycle is 1000, the memory system 6010 updates the read count data into the flash memory 6100 whenever the read count data reaches 1000, 2000, 3000, . . . , etc.

In a step S6140, the read count data is programmed into the flash memory 6100. In other words, if the read count data reaches the flash programming cycle in the step S6130, the memory system 6010 programs the read count data, which is stored in the buffer memory 6250, into the flash memory 6100 in the step S6140.

In a step S6150, the memory controller or flash memory determines whether the read count data corresponds to the refreshing cycle. Here, the refreshing cycle means a cycle for reprogramming the memory block BLKn. The refreshing cycle is variable by a programming-erasing (PE) cycle. Table 3 exemplarily shows the refreshing cycles to the PE cycle.

TABLE 3

| PE cycle | Refreshing cycle |
|---|---|
| 0.1K | 500K |
| 0.5K | 300K |
| 1.0K | 100K |
| 5.0K | 30K |
| less than 5.0K | 10K |

From Table 3, if the PE cycle is 0.1K (K=1000), the refreshing cycle is 500K. If the PE cycle is 0.5K, the refreshing cycle is 300K. If the PE cycle is 1.0K, the refreshing cycle is 100K. If the PE cycle is 5.0K, the refreshing cycle is 30K. If the PE cycle is less than 5.0K, the refreshing cycle is 10K. Meanwhile, the refreshing cycle is variable in accordance with the SLC or MLC flash memory. In general, the refreshing cycle is set to be higher because the SLC flash memory is better than the MLC flash memory in security to bit error.

In a step S6160, if the read count data reaches the refreshing cycle, the memory controller or flash memory refreshes the memory block BLKn and initiates the read count data. There are several ways to refresh the memory block BLKn. One of the ways is to program the memory block BLKn into another memory block. Another way is carried out by, after temporarily moving data from the memory block BLKn to another memory block, erasing the memory block BLKn and then reprogramming the memory block BLKn with the temporarily moved data. Any refreshing way may be helpful to preliminarily prevent a read fail that is caused by soft programming.

In a step S6170, the read count data is programmed into the flash memory 6100. That is, the initialized read count data is programmed into the flash memory 6100 during the step S6150. The step S6170 is an operation for initializing the previous read count data stored in the flash memory 6100.

The read fail preventing method according to the present invention is able to preliminarily prevent a read fail due to soft programming by periodically updating the read count data and refreshing the flash memory 6100 according to a refreshing cycle.

Figure 85:
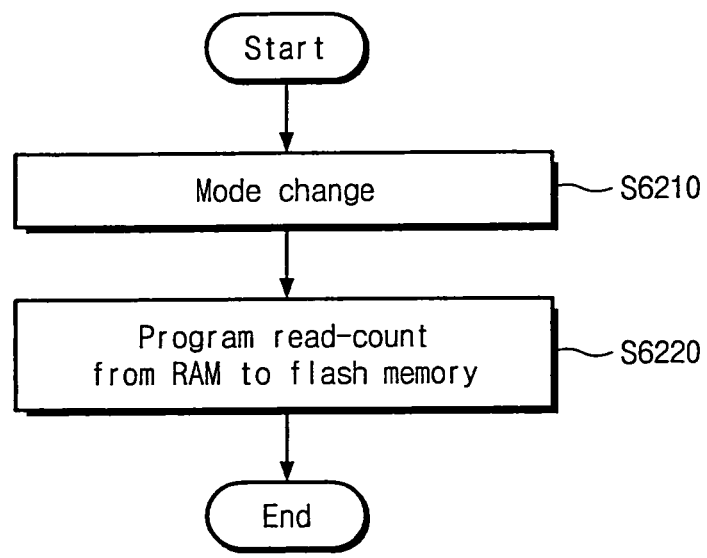
FIG. 85 is a flow chart showing another embodiment of the read fail preventing method for the memory system according to the present invention.

FIG. 85 is a flow chart showing another embodiment of the read fail preventing method for the memory system according to the present invention. The memory system 6010 (refer to FIG. 79) is operable in various modes such as sleep mode, idle mode, standby mode, active mode, and so on.

If there is a change of mode (S6210), the memory system 6010 programs the read count data into the buffer memory 6250 (refer to FIG. 79) (step S6220). Here, an operation of programming the read count data into the flash memory 6100 may be only at the time of change to a specific mode. For instance, the operation of programming the read count data into the flash memory 6100 may be carried out only when the active mode turns to the idle, sleep, or standby mode.

Figure 86:
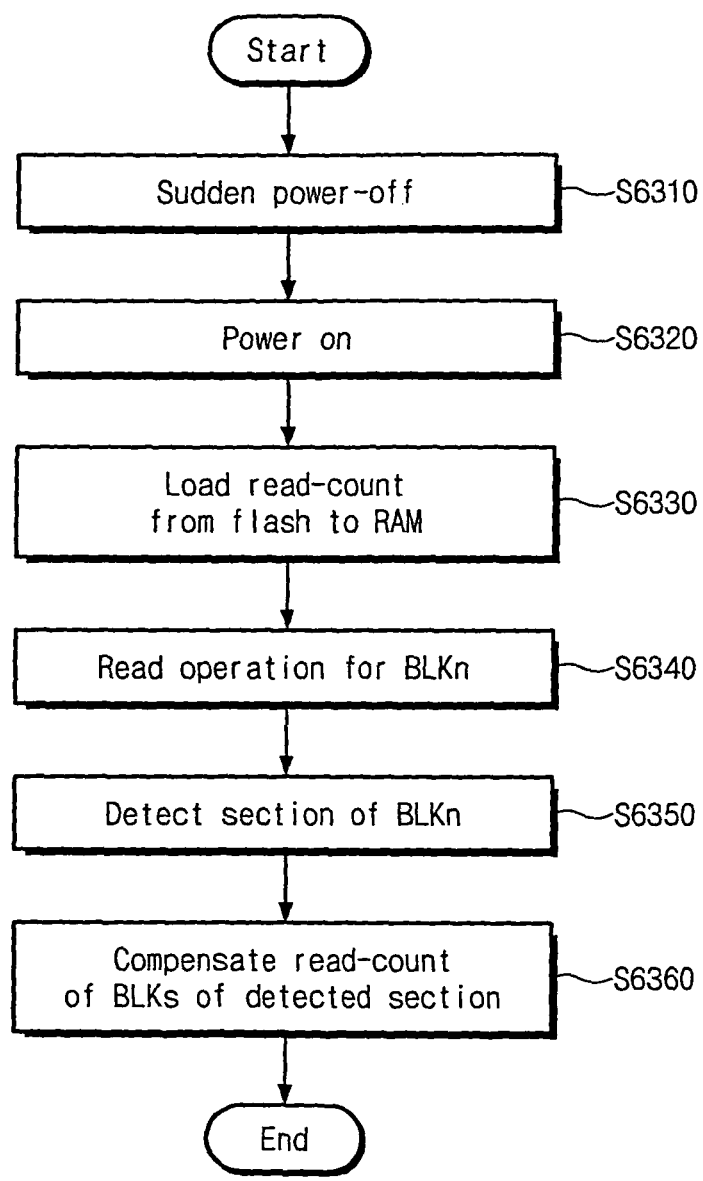
FIG. 86 is a flow chart for illustrating a method of compensating read count data if sudden power-off occurs.

FIG. 86 is a flow chart for illustrating a method of compensating the read count data if sudden power-off occurs. Here, the sudden power-off means that power is abruptly shut off inadvertently due to various reasons such as carelessness during an operation of the memory system 6010 (refer to FIG. 79). The memory system according to the present invention 6010 (refer to FIG. 79) effectively prevents a read fail due to soft programming by compensating the read count data with a proper value at the sudden power-off time.

In a step S6310, it is assumed that during an operation of the memory system 6010 (refer to FIG. 79), the sudden power-off occurs in the memory system 6010. If the sudden power-off occurs, the flash memory 6100 (refer to FIG. 79) retains data but the buffer memory 6250 (refer to FIG. 79) loses data stored therein. Thus, when the sudden power-off occurs, the read count data stored in the buffer memory 6250 is lost while the read count data stored in the flash memory 6100 is maintained.

In an initializing operation of the memory system 6010, the read count data stored in the flash memory 6100 is loaded into the buffer memory 6250. Whenever conducting the reading operation to the flash memory 6100, the read count data stored in the buffer memory 6250 increases.

Otherwise the read count data stored in the flash memory 6100 is updated only by an additional flash programming operation. Thus, since the read count data stored in the buffer memory 6250 is lost if the sudden power-off occurs, there is no way of learning the read count data corresponding to the sudden power-off time. The memory system 6010 according to the present invention is provided with a method capable of compensating the read count data when the sudden power-off occurs.

In a step S6320, the memory system 6010 is powered on again. Here, a power-on operation is an initializing operation activated after the sudden power-off. In a step S6330, the read count data is loaded into the buffer memory 6250 from the flash memory 6100.

In a step S6340, the reading operation is carried out to the memory block BLKn. In a step S6350, the memory controller detects a section including the memory block BLKn. Here, the section includes pluralities of the memory blocks BLK1~BLK4 as shown in FIG. 80.

In a step S6360, the memory system 6010 compensates the read count data of all the memory blocks included in the detected section. For instance, it is assumed that the flash programming cycle of the read count data is 100, the detected section is Section1 (refer to FIG. 80), and the read count data before compensating the memory blocks BLK1~BLK4 is as shown in Table 4.

TABLE 4

| Section | Block | Read count before compensation | Read count after compensation |
|---|---|---|---|
| 1 | BLK1 | 120 | (120 + 50) |
|  | BLK2 | 319 | (319 + 50) |
|  | BLK3 | 418 | (418 + 50) |
|  | BLK4 | 502 | (502 + 50) |

In Table 4, a compensation value of the read count data is set to 50 that is an intermediate of the flash programming cycle 100. The read count data after compensation are set to 170, 369, 468, and 552, respectively. But the compensation value of the read count data may be set to another value within the range of the flash programming cycle.

From Table 4, if the reading operation is carried out to the memory block BLK1, it compensates the read count data to the memory blocks BLK1~BLK4 included in the first section. Next, if the reading operation is carried out to the memory block BLK1021, it compensates the read count data to the memory blocks BLK1021~BLK1024 included in the 256th section.

The memory system 6010 according to the present invention does not compensate the read count data for all data blocks BLK1~BLK1024 (refer to FIG. 80) at the sudden power-off time. Instead of that, it compensates the read count data for a section including a memory block where the reading operation is carried out. According to the present invention, it is able to prevent performance degradation of the memory system which is caused from compensating the read count data for all of the memory blocks.

In the meantime, the memory system 6010 according to the present invention may include a subsidiary battery in preparation for the sudden power-off. If the sudden power-off occurs, the memory system 6010 updates the read count data to into the flash memory 6100 by means of the subsidiary battery.

Figure 87:
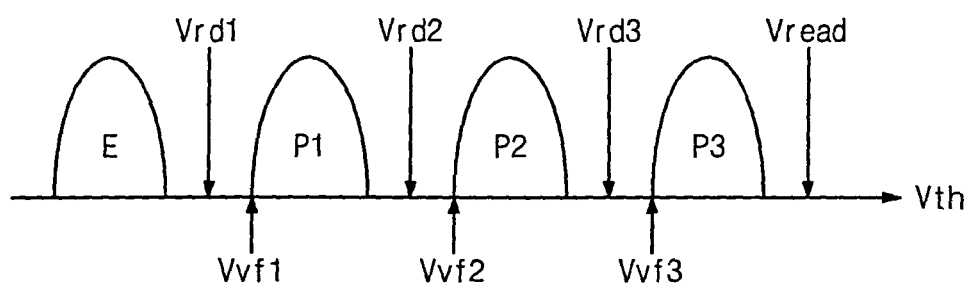
FIG. 87 is a diagram exemplarily showing cell threshold voltage distributions of an MLC flash memory.

The memory system 6010 according to the present invention is applicable with an MLC flash memory. FIG. 87 is a diagram exemplarily showing cell threshold voltage distributions of an MLC flash memory. FIG. 87 shows threshold voltage distributions of multi-level cells with four levels. The memory cell has one of the four states E, P1, P2, and P3.

During the reading operation, the selective read voltages Vrd1 Vrd2, and Vrd3 are applied to the selected word line WL8 (refer to FIG. 81) and the deselective read voltage Vread is applied to the unselected word lines WL0~WL7 and WL9~WL31 (refer to FIG. 81). The first selective read voltage Vrd1 has a voltage level between the erased state E and the first programmed state P1. The second selective read voltage Vrd2 has a voltage level between the first and second programmed states P1 and P2. The third selective read voltage Vrd3 has a voltage level between the second and third programmed states P2 and P3.

Meanwhile, program-verifying voltages Vvf1, Vvf2, and Vvf3 are provided to a selected word line during a program-verifying operation. The first program-verifying voltage Vvf1 is a voltage for programming the memory cell in the first programmed state P1. The second program-verifying voltage Vvf2 is a voltage for programming the memory cell in the second programmed state P2. The third program-verifying voltage Vvf3 is a voltage for programming the memory cell in the third programmed state P3.

Figure 88:
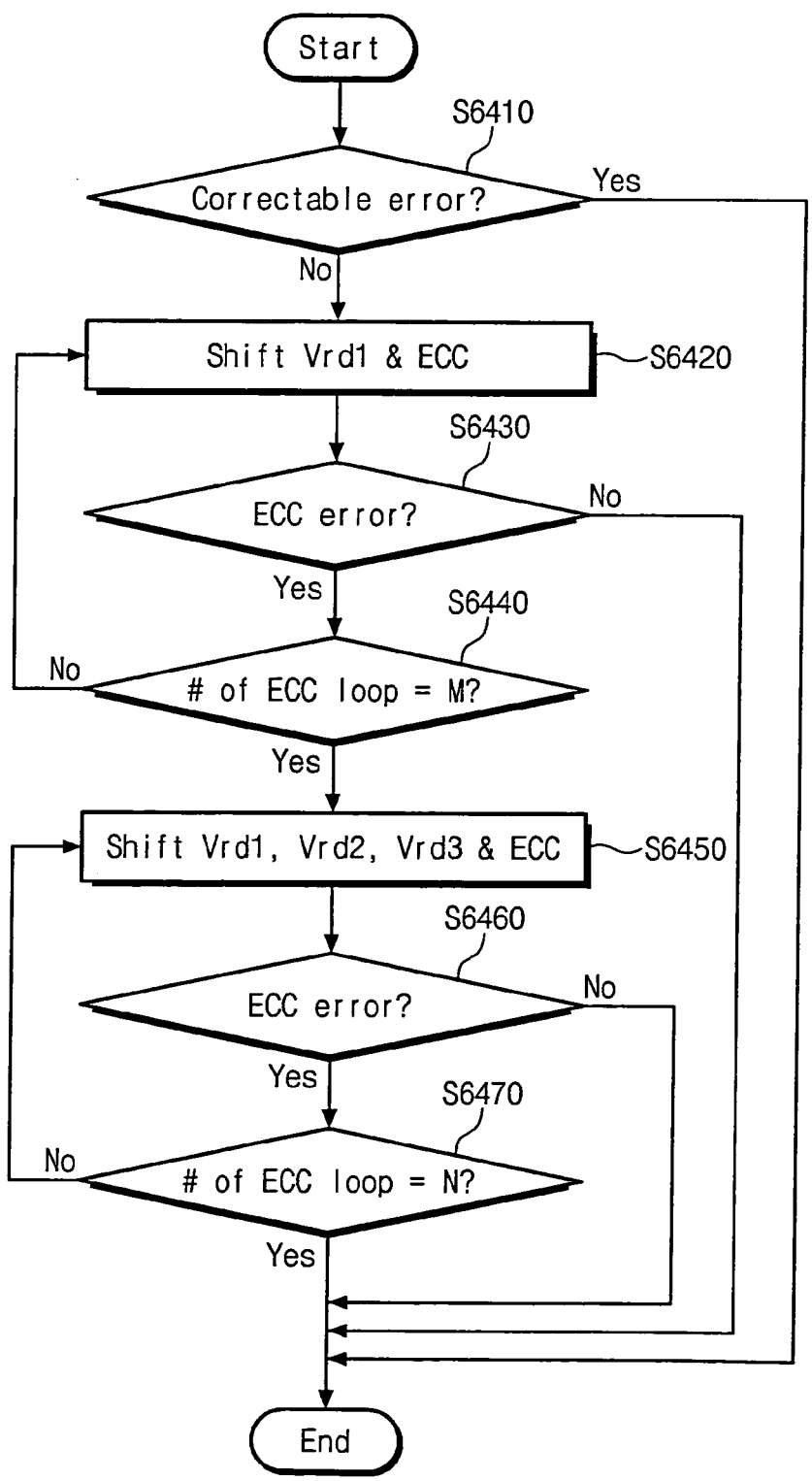
FIG. 88 is a flow chart showing a method of assuring the flash memory in data reliability.

FIG. 88 is a flow chart showing a method of assuring the flash memory in data the reliability. FIG. 88 shows a method for repairing a bit error. In the flash memory, a bit error may occur for various reasons such as program disturbance or read disturbance, or by soft programming as aforementioned.

The flash memory uses the ECC circuit for repairing such a bit error. However a sphere of repairing bit errors by the ECC circuit is limited just to a certain number of bits. For instance, if the ECC circuit is capable of curing 4 bit errors, it is unable to repair bit errors more than 4 bits. FIG. 88 shows an error bit repairing method for this case.

In a step S6410, the ECC circuit determines whether a bit error is correctable. From the aforementioned case, error bits more than 4 bits are incorrectable and error bits less than 4 bits are correctable. If it is possible to correct bit errors, the ECC circuit is used for repairing the bit errors. But if it is impossible to correct bit errors by the ECC circuit, an error detecting and correcting operation is carried out after shifting a level of the read voltage Vrd.

In a step S6420, the flash memory shifts the first read voltage Vrd1 and conducts the error detecting and correcting operation. The flash memory cell may be over-programmed, even though it has been conditioned in the erased state, because of program disturbance or read disturbance on the structural property. For this case, as shown in FIG. 88, the reading operation with reference to the first read voltage Vrd1 may cause the over-programmed memory cells to be partly read as off-cells. If the over-programmed memory cells are out of the range of ECC correction, there is no way of repairing bit errors by a conventional method. The present invention offers the error detecting and correcting operation by increasing the first read voltage Vrd1 in a predetermined voltage unit so as to make the over-programmed memory cell read as an on-cell.

In a step S6430, after shifting the first read voltage Vrd1, the ECC circuit determines whether there is a bit error. If there is no bit error or correctable bit error, the procedure of repairing bit error is completed. If there is uncorrectable bit error, the first read voltage Vrd1 is shifted again. In a step S6440, it determines whether an ECC looping count is M (M is a natural number).

In a step S6450, if the ECC looping count is repeated in M times, the ECC circuit shifts the first through third read voltages Vrd1, Vrd2, and Vrd3 and then conducts the error detecting and correcting operation. Here, levels of the first through third read voltages Vrd1, Vrd2, and Vrd3 can be shifted alternately as like +a, −a, +b, and −b (a and b are natural numbers). This is because it is hard to learn whether threshold voltages of the memory cells have been shifted left or right.

In a step S6460, after shifting the first through third read voltages Vrd1, Vrd2, and Vrd3, the ECC circuit determines whether there is a correctable bit error. If there is no bit error or correctable bit error, the procedure of repairing bit error is completed. If there is uncorrectable bit error, the first through third read voltages Vrd1, Vrd2, and Vrd3 are shifted again. In a step S6470, it determines whether the ECC looping count is M (M is a natural number). The memory system according to the present invention is able to cure bit errors caused by another reason, but bit errors due to temperature variation.

Figure 89:
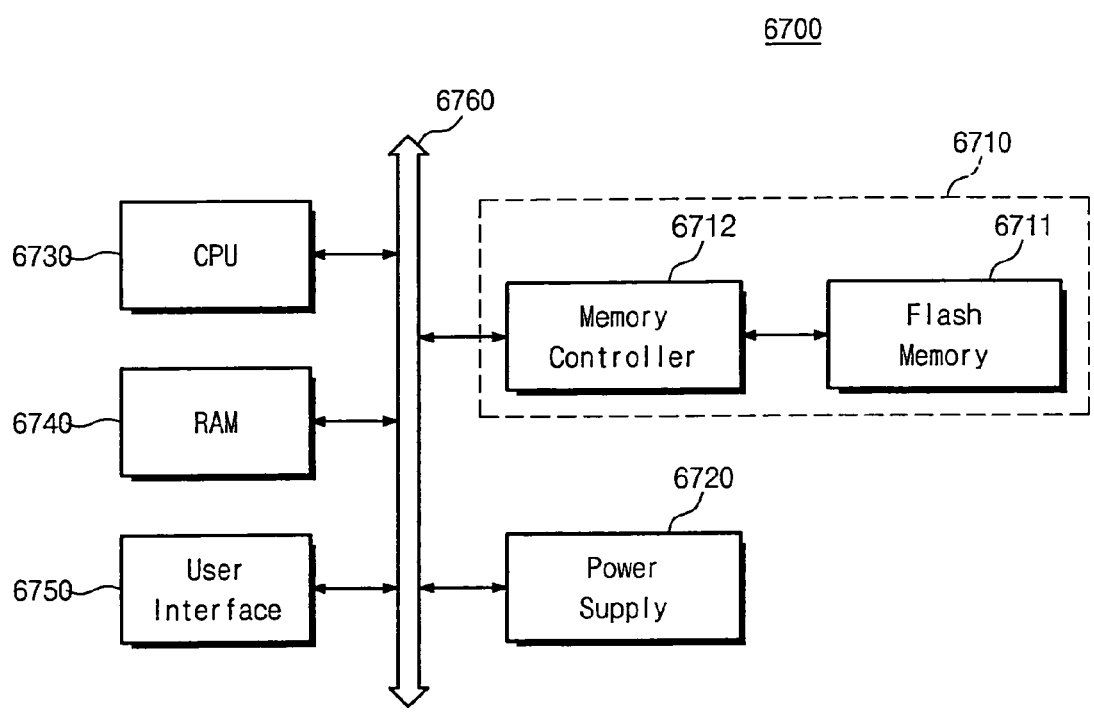
FIG. 89 is a block diagram showing a computer system including a memory system according to the present invention.

FIG. 89 is a block diagram showing a computer system including a memory system according to the present invention. Referring to FIG. 89, the computer system 6700 includes a memory system 6710, a power supply unit 6720, a CPU 6730, a buffer memory 6740, a user interface 6750, and a system bus 6760.

The memory system 6710 includes a flash memory 6711 and a memory controller 6712. The memory system 6710 may be designed by employing a unit product of the flash memory or an integrated circuit such as one NAND™ memory. The flash memory 6711 inputs a read command and an address from the memory controller 6712, analyzes an error correction code (ECC), and controls the selective read voltage Vrd and the deselective read voltage Vread.

The memory system 6710 is electrically connected to the power supply unit 6720, the CPU 6730, the buffer memory 6740, and the user interface 6750 through the system bus 6760. In the flash memory 6711 are stored data, which are provided through the user interface 6750 or processed by the CPU 6730, by way of the memory controller 6712.

If the memory system 6710 is built in a semiconductor solid state disk (SSD), a booting rate of the computer system 6700 can be greatly enhanced. Although not shown, the computer system shown in FIG. 89 may be used in an application chipset, a camera image processor, or so forth.

The memory system may be mounted by way of various types of packages. For instance, the flash memory device and/or the memory controller may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

A flash memory system according to a sixth embodiment of the present invention may achieve high data reliability by saving read count data. In addition, the flash memory system according to the sixth embodiment of the present invention may achieve speed-up by means of the multi-thread function described in the first embodiment, the free page described in the second embodiment, and the microcode described in the third embodiment as well as by saving read count data. Performance of the flash memory system according to the sixth embodiment of the present invention may be improved through achievement of high data reliability and speed-up.

Embodiment 7

Flash Memory Device Managing Read History

Error detection and correction techniques effectively recover data from damage caused by various factors. For example, data can be corrupted due to various factors while storing data in a memory and also due to perturbations of a data transmission channel during transmitting data from a source to a destination.

Suggested are various methods for detecting and correcting damaged data. As well-known error detection techniques are a reed-solomon (RS) code, a hamming code, a bose-chaudhuri-hocquenghem (BCH) code, a cyclic redundancy code (CRC), etc. It is possible to detect and correct corrupted data through the above codes.

In most application fields where non-volatile memory devices are used, data and an error correcting code (ECC) value, (hereinafter referred to as ECC data) are stored together in a flash memory device. The ECC data are used for correcting errors that occur during a read operation of a flash memory device, and the number of bit errors correctible using the ECC data is limited.

The bit errors occurring during a read operation can be corrected through the error detection and correction techniques without an additional recovery process such as well-known block replacement. On the contrary, if bit errors occurring during a read operation is not correctible, data stored in a memory block having the bit errors will be lost.

Figure 90:
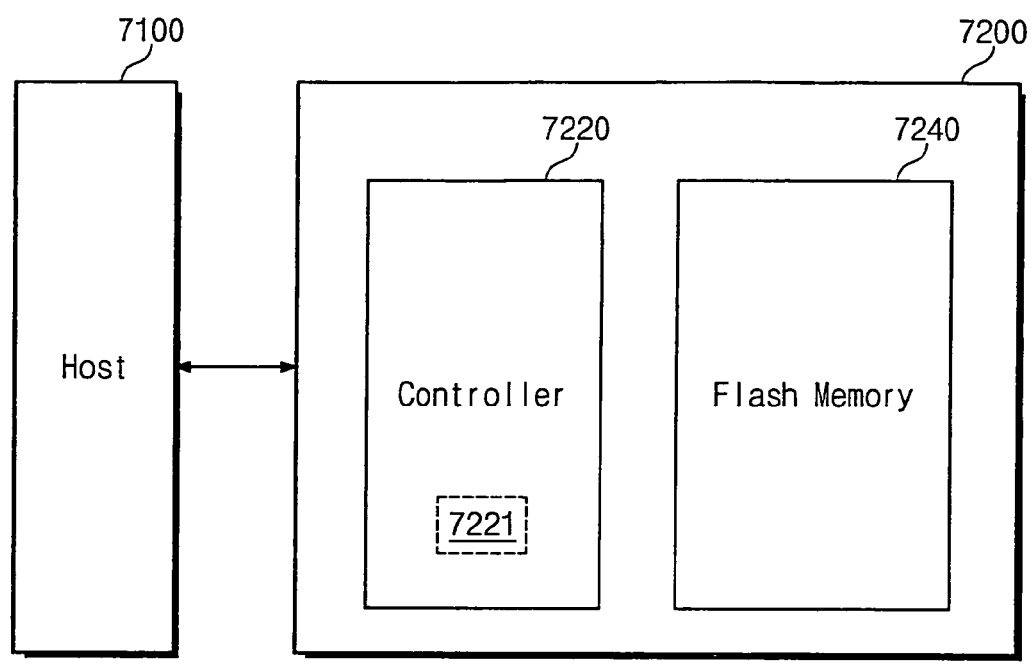
FIG. 90 is a block diagram of a computing system according to exemplary embodiments of the present invention.
Figure 91:
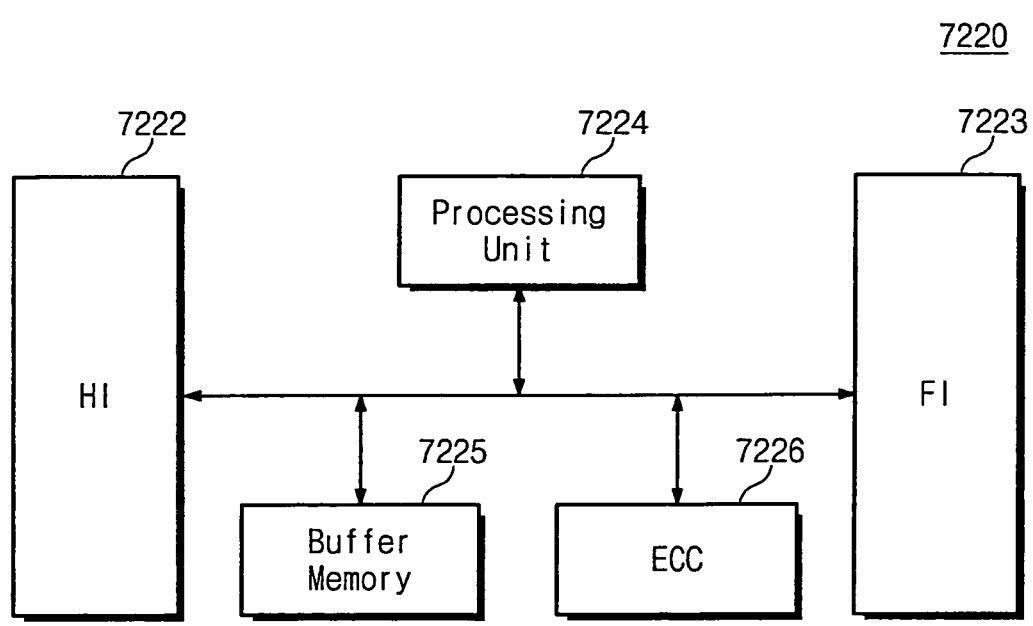
FIG. 91 is a block diagram of a memory controller of FIG. 90 according to exemplary embodiments of the present invention.

FIG. 90 is a block diagram of a computing system according to exemplary embodiments of the present invention. FIG. 91 is a block diagram of a memory controller of FIG. 90 according to exemplary embodiments of the present invention.

Referring to FIG. 90, the computing system includes a host 7100 and a memory-based storage device 7200. The memory-based storage device 7200 stores data or outputs its stored data in response to a request of the host 7100. The memory-based storage device 7200 is connected to the host 7100 through a serial AT attachment (SATA) interface, a parallel AT attachment (PATA) interface, a small computer system interface (SCSI), an enhanced small disk interface (ESDI), an integrated drive electronics (IDE) interface, a multi-media card (MMC) interface, a SD interface, or like interfaces. However, it is apparent to those skilled in the art that an interface between the host 7100 and the memory-based storage device 7200 is not limited to the above interfaces. Also, the host 7100 and the memory-based storage device 7200 can be connected to each other through at least two such interfaces.

The memory-based storage device 7200 includes a controller 7220 and a storage medium 7240. According to exemplary embodiments of the present invention, the storage medium 7240 is formed of a flash memory. However, it is apparent to those skilled in the art that the storage medium 7240 is not limited to the flash memory. For example, non-volatile memories such as a phase change memory, a magnetroresistive memory, etc. may be used as the storage medium 7240. For convenience of explanation, the storage medium 7240 is only formed of one flash memory as illustrated in FIG. 90. The controller 7220, as illustrated in FIG. 91, includes a host interface 7222, a flash interface 7223, a processing unit 7224, a buffer memory 7225, and an error checking and correcting (ECC) circuit 7226. These components are well-known to those skilled in the art.

In the memory-based storage device 7200, the controller 7220 is configured to manage the flash memory 7240. For example, the controller 7220 manages a read history of the flash memory 7240 in order to improve reliability of the memory-based storage device 7200. The read history includes the number of error bits, error bit positions, plain information, die information, refresh information, etc. The controller 7220 manages memory blocks of the flash memory 7240 based on the read history. For example, the controller 7220 manages the memory blocks of the flash memory 7240 to be processed as a bad bock or a limited-purpose memory block according to the read history.

The memory-based storage device 7200 records characteristic read history information (e.g., the number of error bits, error bit positions, plain information, die information, refresh information, etc.), which can be observed during a read operation, and also designates a memory block having a high possibility of problem occurrence as a danger block based on the read history information. Therefore, the memory-based storage device 7200 restricts the available usage of the danger block. For example, the memory-based storage device 7200 operates by managing the danger block as a different block from a general block. Through this management method, reliability of the memory-based storage device 7200 can be improved.

According to a typical memory management method, based on whether an operation, requested through a result value of a program or erase operation, is successful or not, a method for determining a block of the requested operation as a defective block has been used until now. That is, whether a memory block is processed as a bad block or not is determined based on a result value of a program or erase operation. As the minimum feature size of a memory device is microminiaturized and its capacity is increased, reliability of a memory device becomes deteriorated. Accordingly, when a read operation is performed on a memory bock where a result of a program or erase operation is successful, possibility that data errors occur is gradually increased. Moreover, as aging of a memory device due to continuous usage of a memory device is progressed, circuit defects (i.e., physical defects) will be increased. That is, a progressive defect will be increased. In this case, data read from a memory block, (e.g., a danger block) having those circuit defects also have a high possibility that error correction is impossible.

Accordingly, the memory-based storage device 7200 manages a read history of memory blocks, such that reliability deterioration due to a danger block can be prevented. This will be described in more detail below.

Figure 92:
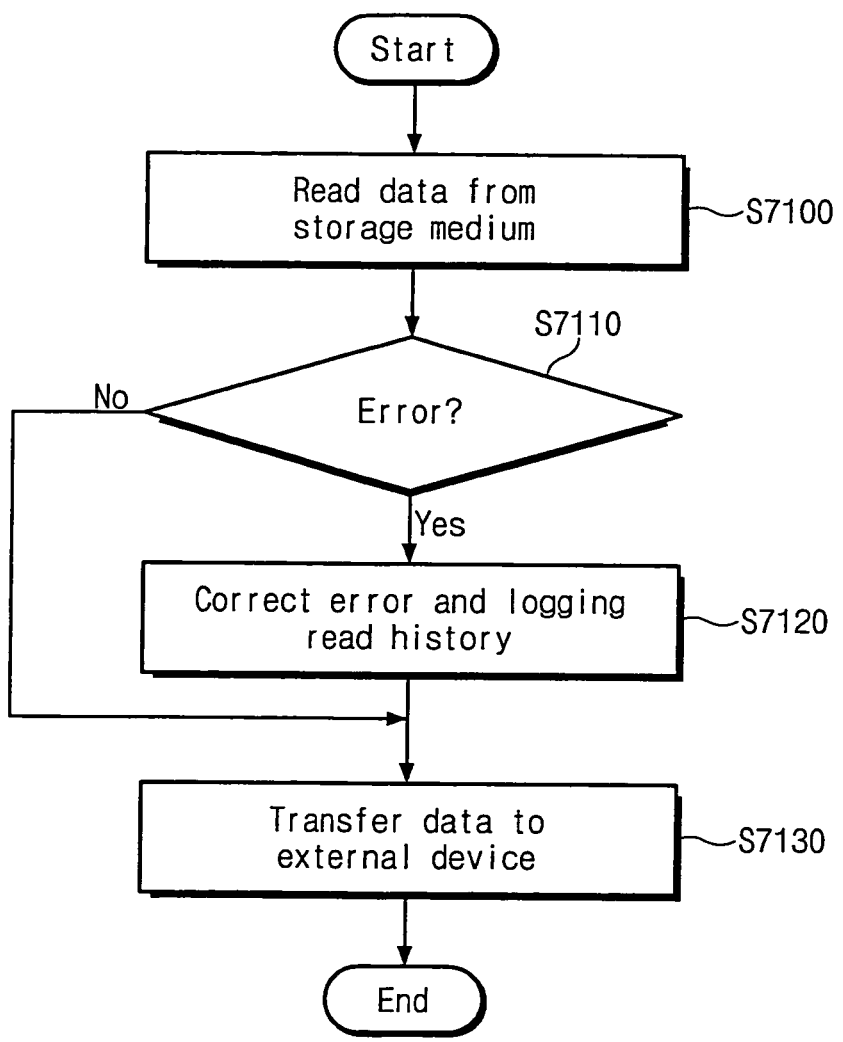
FIG. 92 is a flowchart illustrating a read process of a memory-based storage device according to exemplary embodiments of the present invention.

FIG. 92 is a flowchart illustrating a read process of a memory-based storage device according to exemplary embodiments of the present invention. Hereinafter, the read process of the memory-based storage device will be described in more detail with reference to the accompanying drawings.

Once a read operation is requested from the host 7100, data are read from the flash memory 7240 as a storage medium in operation S7100. As well-known, the read data are temporarily stored on the buffer memory 7225 of the controller 7220. Simultaneously, the controller 7220 determines whether an error occurs or not in the data read through the ECC circuit 7226 in operation S7110. If there is no error in the read data, it proceeds to operation S7130. On the contrary, if there is an error in the read data, it proceeds to operation S7120. In operation S7120, the controller 7220 corrects an error of the data read through the ECC circuit 7226. Furthermore, the controller 7220 updates a read history (i.e., an error history) with respect to a memory block from which data are read. Thereafter, it proceeds to operation S7130. In operation S7130, the read data are transferred to an external device, i.e., the host 7100.

Here, the controller 7220 of the memory-based storage device 7200, as illustrated in FIG. 90, includes a table 7221 (hereinafter, referred to as a read history table) for managing a read history. The read history table 7221 stores an error history such as the number of error bits, error bit positions, plain information, etc. This read history table 7221 is stored in the flash memory 7240. The read history table 7221 is loaded from the flash memory 7240 into the buffer memory 7225 during power-up, and, if necessary, is backup/restored to the flash memory 7240.

Figure 93:
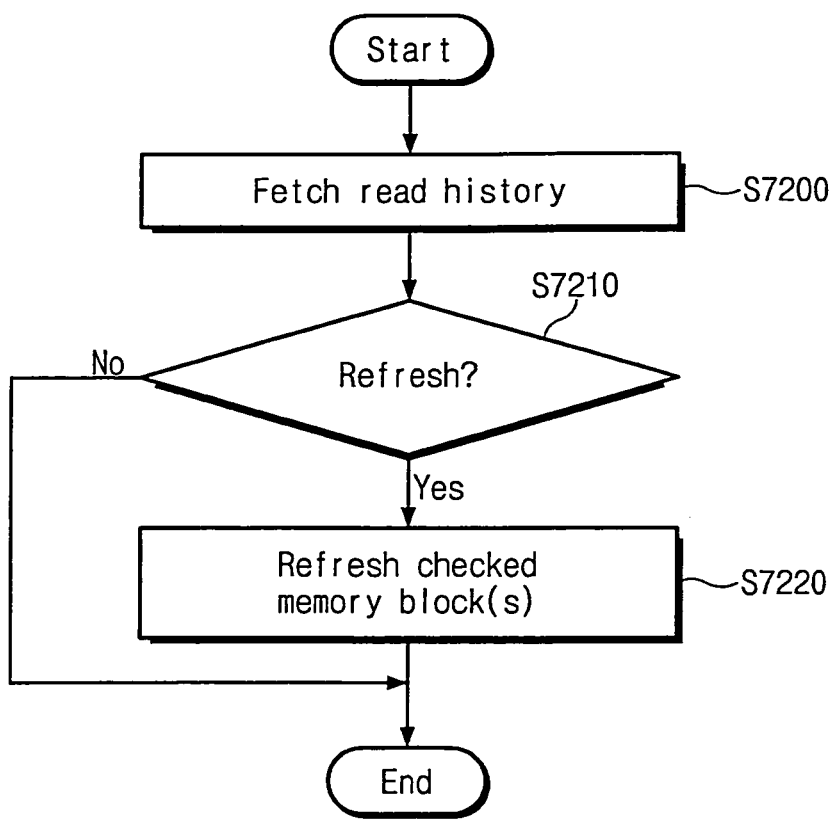
FIG. 93 is a flowchart illustrating a block management method of the memory-based storage device according to exemplary embodiments of the present invention.
Figure 94:
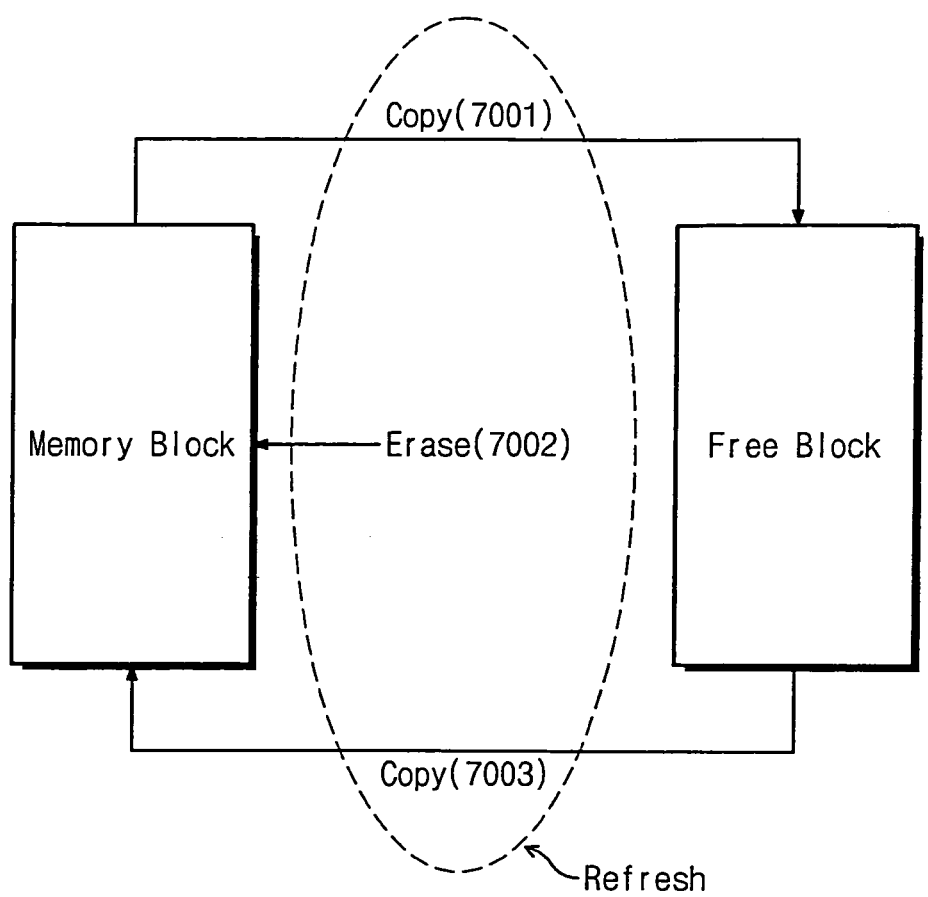
FIG. 94 is a view illustrating a refresh operation according to exemplary embodiments of the present invention.

FIG. 93 is a flowchart illustrating a block management method of the memory-based storage device 7200 according to exemplary embodiments of the present invention. FIG. 94 is a view illustrating a refresh operation according to exemplary embodiments of the present invention.

The memory-based storage device 7200 will be configured to refresh a memory block based on a read history. For example, the controller 7220 analyzes the read history information (e.g., the number of error bits) of the table 7221 to control a refresh operation of the memory block. In more detail, in operation S7200, the controller 7220 fetches the read history of the read history table 7221. Then, in operation S7210, the controller 7220 determines whether the number of error bits in an arbitrary memory block exceeds a desired (or, alternatively predetermined) number of error bits (or, the reference number of error bits) or not, based on the read history. That is, the controller 7220 determines whether there are memory blocks to be refreshed or not according to a test result. If there is no memory blocks to be refreshed, its process will be terminated. If there are memory blocks to be refreshed, it proceeds to operation S7220.

In operation S7220, the controller 7220 controls the flash memory 7240 to refresh the memory blocks exceeding the reference number of bit errors. More detailed description will be made with reference to FIG. 94. As illustrated in FIG. 94, data of a memory block to be refreshed is copied to a free block in operation 7001. Then, the memory block to be refreshed is erased in operation 7002. Finally, data stored in the free block is copied to the memory block in operation 7003. The memory block is refreshed through the above operations. Then, the free block is erased.

When the number of error bits is increased, possibility of read error occurrence becomes higher. If a read error occurs, data will be lost. Due to this, data loss can be prevented by refreshing a memory block according to whether the number or error bits of the memory block exceeds the reference number of error bits or not. Because memory cells are stressed due to a repeating read operation, the number of error bits can be increased. That is, a read error may be caused by read/program/erase operational stress. Hereinafter, a read error due to the stress will be referred to as a stress-based defect. Accordingly, the stress-based defect may be prevented by refreshing a memory block. Consequently, it is possible to improve reliability of the memory-based storage device 7200 by reducing a read error caused by the stress-based defect.

Figure 95:
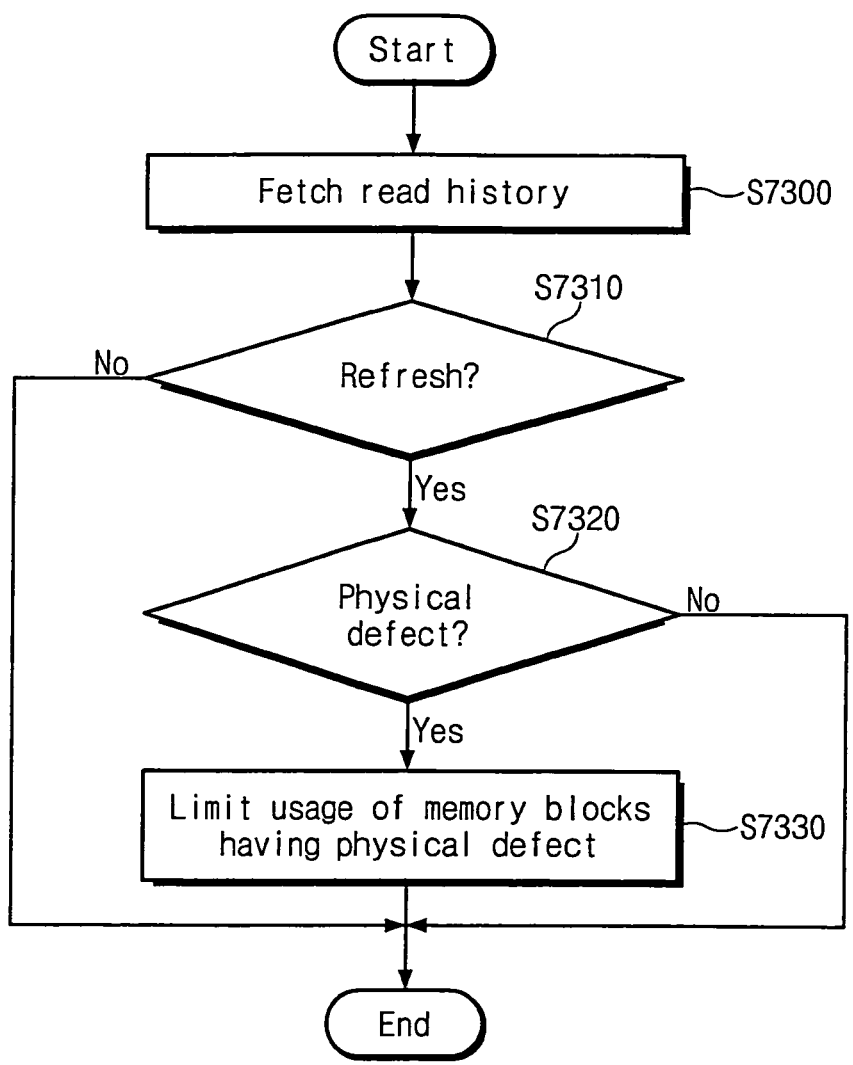
FIG. 95 is a flowchart illustrating a block management method of a memory-based storage device according to another exemplary embodiment of the present invention.

FIG. 95 is a flowchart illustrating a block management method of a memory-based storage device according to another exemplary embodiment of the present invention. Hereinafter, the block management method will be described in more detail with reference to the accompanying drawings.

The controller 7220 fetches a read history from the read history table 7221 of the buffer memory 7225 in operation S7300. The controller 7220 determines whether there is a refreshed memory block or not based on the read history in operation S7310. If there is no refreshed memory block, an operation is terminated. If there is a refreshed memory block, it proceeds to operation S7320.

In operation S7320, the controller 7220 determines whether a previously occurred error of the memory block is caused by a physical defect or a stress-based defect based on the read history. The stress-based defect may be resolved by the refresh operation as mentioned above. On the contrary, if the previously occurred error of the refreshed memory block is caused by a physical defect (e.g., a progressive defect), it proceeds to operation S7330. In operation S7330, the controller 7220 manages a history in order to limit the usage of the memory block having a physical defect.

In the exemplary embodiment, whether the refreshed memory block has a physical defect or not can be determined based on the number of refreshed times. For example, a memory block refreshed more than one time can be determined as one having a physical defect.

As mentioned above, a memory block is refreshed under the assumption that errors continuously occur due to the stress-based defect. However, if an error history among read history information is considered, errors may continuously occur due to the progressive defect not the stress-based defect. If the memory block is refreshed even when an error is caused by the progressive defect not the stress-based defect, all of data that are stored in that memory block can be lost. That is, it is impossible to recover the data stored in the memory block. Therefore, according to the block management method of the present invention, memory blocks determined to have a physical defect are classified as danger blocks in advance. This danger block may be processed as a bad block or used for different purposes than a normal block. For example, if it is assumed that the memory-based storage device 7200 stores M-bit data, that kind of a danger block may be used for storing N-bit data (M<N). Additionally, read, erase, and program operations for that kind of a danger block will be limited. According to the error history, memory blocks that are physically or circuitously related to a specific block also can be processed as danger blocks.

Figure 96:
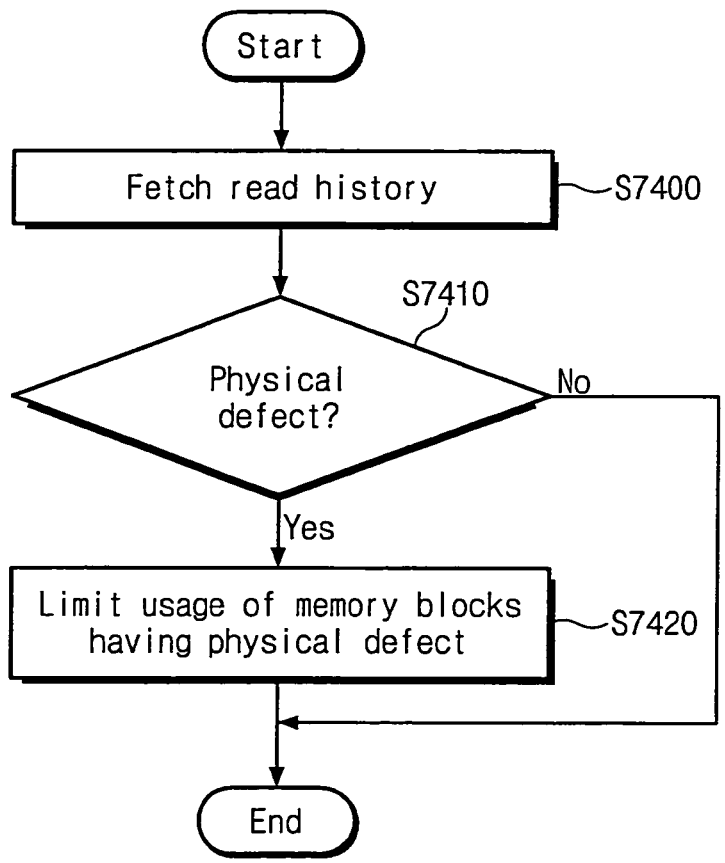
FIG. 96 is a flowchart illustrating a block management method of a memory-based storage device according to another exemplary embodiment of the present invention.

FIG. 96 is a flowchart illustrating a block management method of a memory-based storage device according to another exemplary embodiment of the present invention. The block management method of FIG. 96 is substantially identical to that of FIG. 95 except that the determination operation S7310 is omitted, and thus its overlapping description will be omitted for conciseness. The fact that the determination operation S7310 is omitted is that danger blocks are not classified based on a refreshed memory block. That is, it is possible to classify danger blocks according to whether a previously occurred error of a memory block is a progressive defect (i.e., a physical defect) or a stress-based defect with reference to a read/error history.

In exemplary embodiments of the present invention, the progressive defect (i.e., a physical defect) can be determined based on error patterns prepared according to a test result of a flash memory. Additionally, the progressive defect can be determined based on an error history including a phenomenon that errors repeatedly occur in a refreshed memory block.

In exemplary embodiments of the present invention, it is possible to determine a memory block as a danger block (i.e., a memory block having a physical defect) based on the read history. For example, referring to FIG. 96, the controller 7220 fetches a read history from the read history table 7221 of the buffer memory 7225 in operation S7400, and it is determined whether a memory block has a physical defect or not based on the read history in operation S7410. According to a determination result, the memory block having a physical defect will be processed as a danger block in operation S7420.

According to the block management method of the present invention, a refresh operation for a memory block may not precede.

Figure 97:
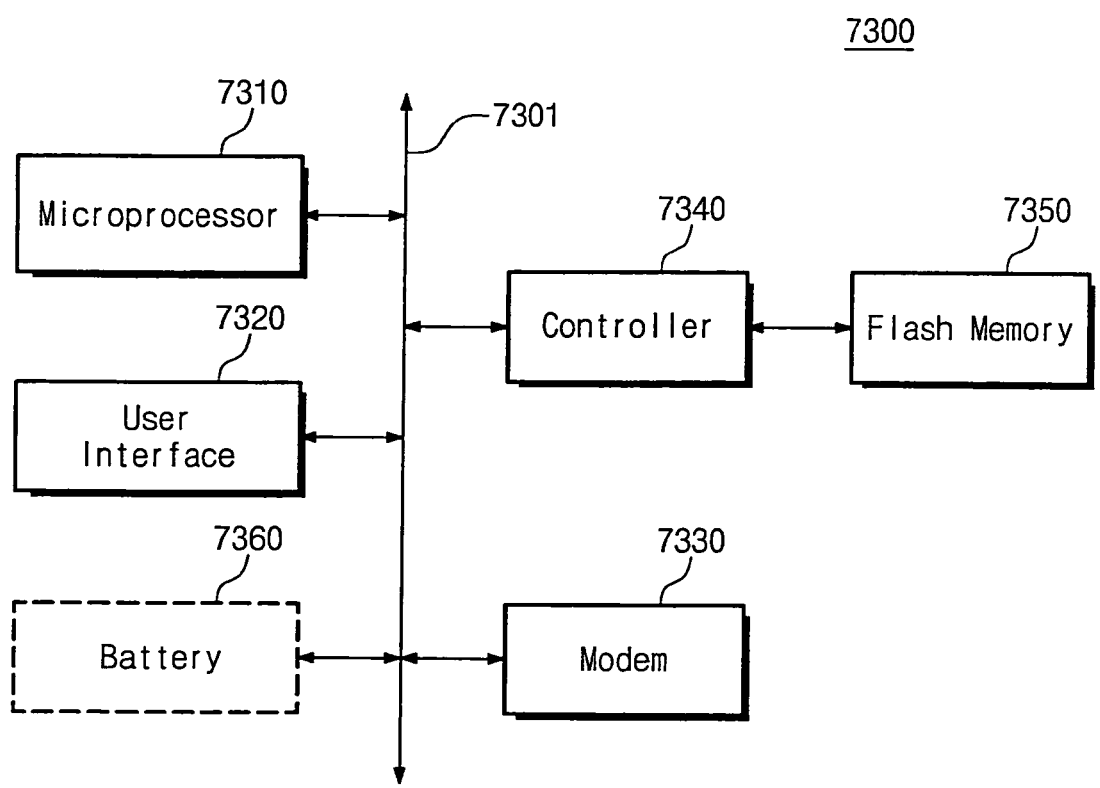
FIG. 97 is a block diagram of a computing system according to another exemplary embodiment of the present invention.

A flash memory device is a non-volatile memory device maintaining its stored data even when power supply is cut off. As mobile devices such as a cellular phone, a personal digital assistant (PDA), a digital camera, a portable game console, and an MP3 player become widely used, the flash memory device is extensively employed as a data storage and a code storage. Additionally, the flash memory device may be used for home applications such as a high-definition television (HDTV), a digital versatile disk or a digital video disk (DVD), a router, and a global positioning system (GPS). FIG. 97 is a block diagram of a computing system 7300 including a memory system according to the present invention. The computing system 7300 includes a microprocessor 7310, a user interface 7320, a modem 7330 such as a baseband chipset, a controller 7340, and a flash memory 7350, which are connected through a bus 7301. The controller 7340 corresponds to that of FIG. 90, and the flash memory 7350 is substantially identical to that of FIG. 90. N-bit data (N is an integer equal to or greater than 1) processed/to be processed by the microprocessor 7310 are stored in the flash memory 7350 through the controller 7340. If the computing system is a mobile device, a battery 7360 is additionally provided to supply an operating voltage to the computing system. Although not illustrated in the drawings, it is apparent to those skilled in the art that an application chipset, a camera image processor (CIS), a mobile DRAM, etc. can be further provided in the computing system. The controller 7340 and the flash memory 7350 may constitute a solid state drive/disk (SSD) using a non-volatile memory to store data, for example. The exemplary SSD is disclosed in U.S. Pat. No. 2006-0152981, which is incorporated by reference in its entirety. Additionally, the controller 7340 and the flash memory 7350 may constitute a memory card with a non-volatile memory for storing data.

Figure 98:
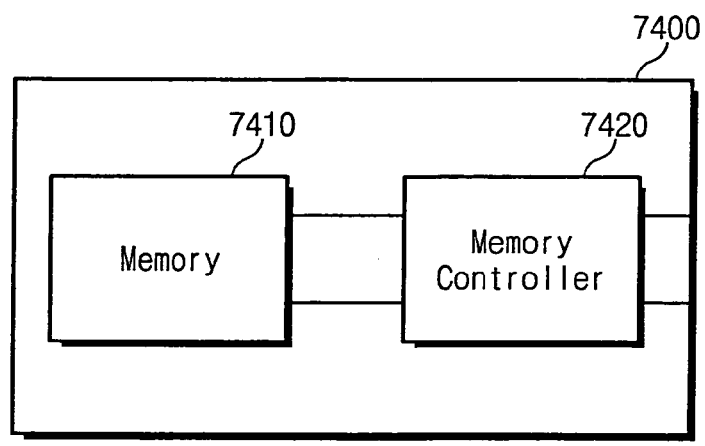
FIG. 98 is a block diagram of a memory-based storage device according to another exemplary embodiment of the present invention.

FIG. 98 is a block diagram of a memory-based storage device according to another exemplary embodiment of the present invention.

A memory-based storage device of FIG. 98 is realized with a card 7400 including a memory 7410 and a memory controller 7420. For example, the card 7400 may be a memory card such as a flash memory card. That is, the card 7400 may be a card satisfying certain industrial standards to be used in electron devices such as a digital camera, a personal computer, etc. It will be understood that the card 7400 controls the memory 7410 through the memory controller 7420 based on control signals received from other devices (e.g., the external devices).

Figure 99:
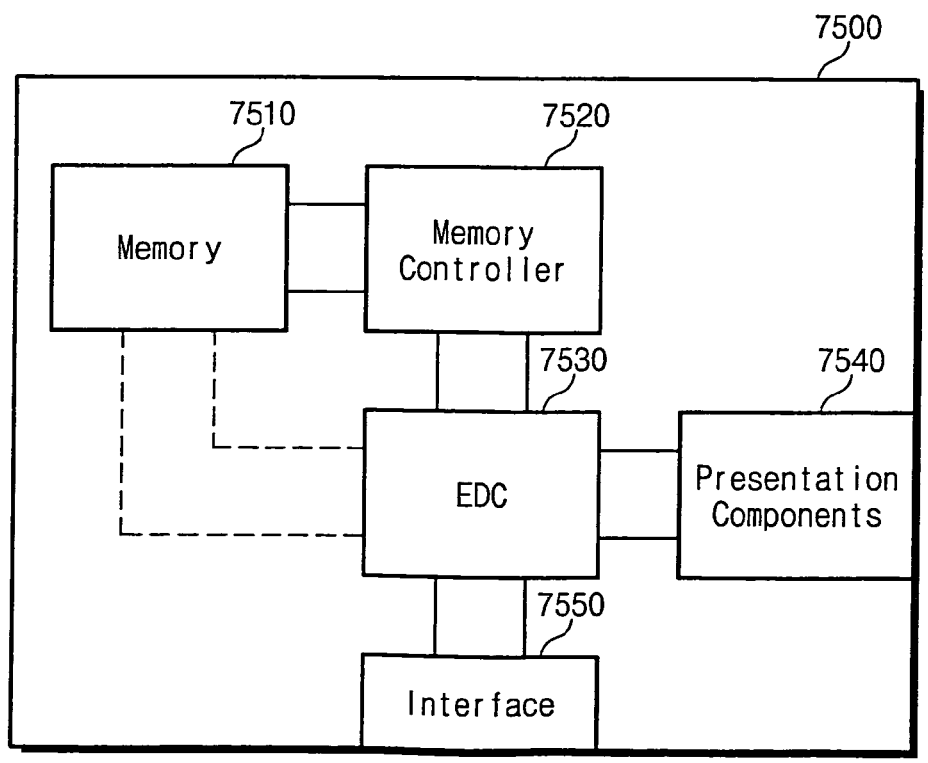
FIG. 99 is a block diagram illustrating a memory system including a memory-based storage device according to another exemplary embodiment of the present invention.

FIG. 99 is a block diagram illustrating a memory system including a memory-based storage device according to another exemplary embodiment of the present invention.

The memory system of FIG. 99 represents a portable device 7500. The portable device 7500 may be an MP3 player, a video player, a combination of a video and audio player, etc. As illustrated, the portable device 7500 includes a memory 7510 and a memory controller 7520. The portable device 7500 may include an encoder and decoder (EDC) 7530, presentation components 7540, and an interface 7550.

Data (video, audio, etc) processed by the EDC 7530 are inputted into the memory 7510 through the memory controller 7520, or outputted from the memory 7510. As illustrated using the dotted lines of FIG. 99, data are directly inputted from the EDC 7530 into the memory 7510, and/or data are directly outputted from the memory 7510 into the EDC 7530.

The EDC 7530 can encode data to store them in the memory 7510. For example, the EDC 7530 may perform an MP3 encoding operation on audio data to store them in the memory 7510. In another method, the EDC 7530 may perform an MPEG encoding operation (e.g., MPEG2, MPEG4, etc.) on video data to store them in the memory 7510. Furthermore, the EDC 7530 may include a plurality of encoders in order to encode various types of data according to different formats. For example, the EDC 7530 may include an MP3 encoder for audio data and an MPEG encoder for video data.

The EDC 7530 can decode an output from the memory 7510. For example, the EDC 7530 may perform an MP3 decoding operation on audio data outputted from the memory 7510. In another method, the EDC 7530 may perform an MPEG decoding operation (e.g., MPEG2, MPEG4, etc.) on video data outputted from the memory 7510. Furthermore, the EDC 7530 may include a plurality of decoders in order to decode various types of data according to different formats. For example, the EDC 7530 may include an MP3 decoder for audio data and an MPEG decoder for video data.

It will be also understood that the EDC 7530 includes only decoders. For example, the already encoded data can be received by the EDC 7530 or transferred to the memory controller 7520 and/or the memory 7510.

The EDC 7530 can receive data for encoding through the interface 7550 or already encoded data. The interface 7550 may comply with well-known industrial standards (e.g., firmware, USB, etc.). The interface 7550 may include at least one interface. For example, the interface 7550 may include a firmware interface, a USB interface, etc. Data from the memory 7510 may be outputted through the interface 7550.

The presentation components 7540 may display data, outputted from the memory and/or decoded by the EDC 7530, to a user. For example, the presentation components 7540 includes a speaker jack for outputting audio data or include s display screen for outputting video data.

A flash memory system according to a seventh embodiment of the present invention may achieve high data reliability by managing read history. In addition, the flash memory system according to the seventh embodiment of the present invention may achieve speed-up by means of the multi-thread function described in the first embodiment, the free page described in the second embodiment, and the microcode described in the third embodiment as well as by managing read history. Performance of the flash memory system according to the seventh embodiment of the present invention may be improved through achievement of high data reliability and speed-up.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory system comprising:
 a memory device configured to store data; and
 an accelerator configured to control the memory device based on micro-codes, the accelerator connected to the memory device via a system bus, the accelerator configured to store the micro-codes, and including a channel control sequencer configured to perform operations according to the micro-codes.

2. The memory system of claim 1, wherein the channel control sequencer is configured to decode the micro-codes and performs operations according to the decoded micro-codes.

3. The memory system of claim 1, wherein the memory device comprises:
a memory; and
an interface block configured to interface the memory.

4. The memory system of claim 3, wherein the micro-codes are instructions for controlling the memory.

5. The memory system of claim 4, wherein the instructions include at least one of "Read&Load", "Read&Verify", "Write", "Wait For Event", "END", "Read&Load&Index Increment", "Mov", "Add", "Sub", "Or", "And", "Shift Left", "Shift Right", "Swap", "Jump Backward", "Jump Backward If Equal", "Jump Backward If Not Equal", "Jump Forward", "Jump Forward If Equal", "Jump Forward If Not Equal", "Jump Backward & Link", "Jump Forward & Link", "Return" and "Block Memory Transfer".

6. The memory system of claim 1, wherein the memory is a One-NAND flash memory.

7. The memory system of claim 1 wherein the accelerator further comprises:
a direct memory access (DMA) unit configured to transfer data from the memory device to the system bus, in response to the channel control sequencer.

8. The memory system of claim 1 wherein the accelerator further comprises:
an error correction code block configured to correct errors in data stored in the memory device.

9. The memory system of claim 8, wherein the memory device is a NAND flash memory.

10. The memory system of claim 1 further comprising:
a processor configured to control the accelerator and connected to the system bus.

11. A driving method of a memory system including a memory device and an accelerator comprising:
loading micro-codes for controlling the memory device to the accelerator; and
storing the loaded micro-codes; and
performing operations based on the micro-codes under control of a host.

12. The driving method of claim 11, further comprising:
receiving an operation instruction at the accelerator from a processor; and wherein
the performing step-performs operations at the accelerator in response to the operation instruction based on the micro-codes.

13. The driving method of claim 12, further comprising:
ending the micro-codes and generating an interruption.

14. The driving method of claim 11, wherein the micro-codes control the memory device.

15. The driving method of claim 11, wherein the micro-codes indicate a source address and a target address of the memory device.

* * * * *